United States Patent
Mimura et al.

(10) Patent No.: US 6,772,937 B2
(45) Date of Patent: Aug. 10, 2004

(54) METHOD AND APPARATUS FOR APPLYING VISCOUS MATERIAL

(75) Inventors: Toshinori Mimura, Sakai (JP); Hiroaki Onishi, Nakakoma-gun (JP); Hiroshi Yamauchi, Katano (JP); Toshiaki Yamauchi, Yawata (JP); Jun Shirai, Toyonaka (JP); Yoshiyuki Nagai, Toyonaka (JP); Muneyoshi Fujiwara, Katano (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 157 days.

(21) Appl. No.: 09/840,073

(22) Filed: Apr. 24, 2001

(65) Prior Publication Data

US 2002/0038814 A1 Apr. 4, 2002

(30) Foreign Application Priority Data

| Apr. 24, 2000 | (JP) | 2000-123181 |
| Apr. 24, 2000 | (JP) | 2000-123182 |
| Apr. 24, 2000 | (JP) | 2000-123183 |
| Apr. 24, 2000 | (JP) | 2000-123184 |
| Apr. 24, 2000 | (JP) | 2000-123185 |
| Apr. 20, 2001 | (JP) | 2001-122924 |

(51) Int. Cl.$^7$ .......................... B23K 31/02; B23K 1/00; B05C 1/00

(52) U.S. Cl. .......................... 228/256; 228/25; 228/33; 228/43; 228/214; 118/200; 118/209; 118/313; 118/413

(58) Field of Search .............................. 228/256, 214, 228/233, 33, 43, 25; 222/103, 105, 1, 72; 118/200, 209, 216–222, 225, 255, 313, 413

(56) References Cited

U.S. PATENT DOCUMENTS 3,554,107 A * 1/1971 McCarthy et al. ... 101/DIG. 45
3,895,748 A * 7/1975 Klingenberg ............... 118/411

(List continued on next page.)

FOREIGN PATENT DOCUMENTS

| JP | 4-284249 | 10/1992 |
| JP | 10-512507 | 12/1998 |
| JP | 2000-62138 | 2/2000 |

Primary Examiner—Tom Dunn
Assistant Examiner—L. Edmondson
(74) Attorney, Agent, or Firm—Wenderoth, Lind & Ponack, L.L.P.

(57) ABSTRACT

By using an application unit having: a storage chamber for a viscous material; a discharge hole, for the viscous material, provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, a screen mask having openings corresponding to the application object or the application object itself and the discharge hole of the application unit are brought into contact with each other, either the application unit and the screen mask or the application unit and the application object are moved relative to each other while the discharge pressure is imparted to the viscous material in the storage chamber, and the viscous material is applied onto the application object while the storage chamber is replenished at all times with the viscous material by the viscous-material feeding device with a pressure smaller than the discharge pressure imparted by the discharge-pressure adjusting device.

13 Claims, 79 Drawing Sheets

U.S. PATENT DOCUMENTS

| | | | | |
|---|---|---|---|---|
| 4,187,644 A | * | 2/1980 | Fitzpatrick | 141/18 |
| 4,303,108 A | * | 12/1981 | Akers et al. | 141/18 |
| 4,576,113 A | * | 3/1986 | Kambara et al. | 118/315 |
| 4,753,163 A | * | 6/1988 | Blaak | 101/120 |
| 4,981,238 A | * | 1/1991 | Wenmaekers | 141/18 |
| 5,100,699 A | * | 3/1992 | Roeser | 101/120 |
| 5,713,843 A | * | 2/1998 | Vangsness | 401/134 |
| 5,730,819 A | * | 3/1998 | Retti | 141/18 |
| 6,042,024 A | * | 3/2000 | Gilmore | 222/105 |
| 6,059,749 A | * | 5/2000 | Marx | 128/200.21 |
| 6,161,727 A | * | 12/2000 | Gordon et al. | 220/327 |
| 6,196,126 B1 | * | 3/2001 | Smith et al. | 101/114 |
| 6,345,734 B2 | * | 2/2002 | Schalow et al. | 222/103 |
| 6,361,606 B1 | * | 3/2002 | Jairazbhoy | 118/410 |

\* cited by examiner

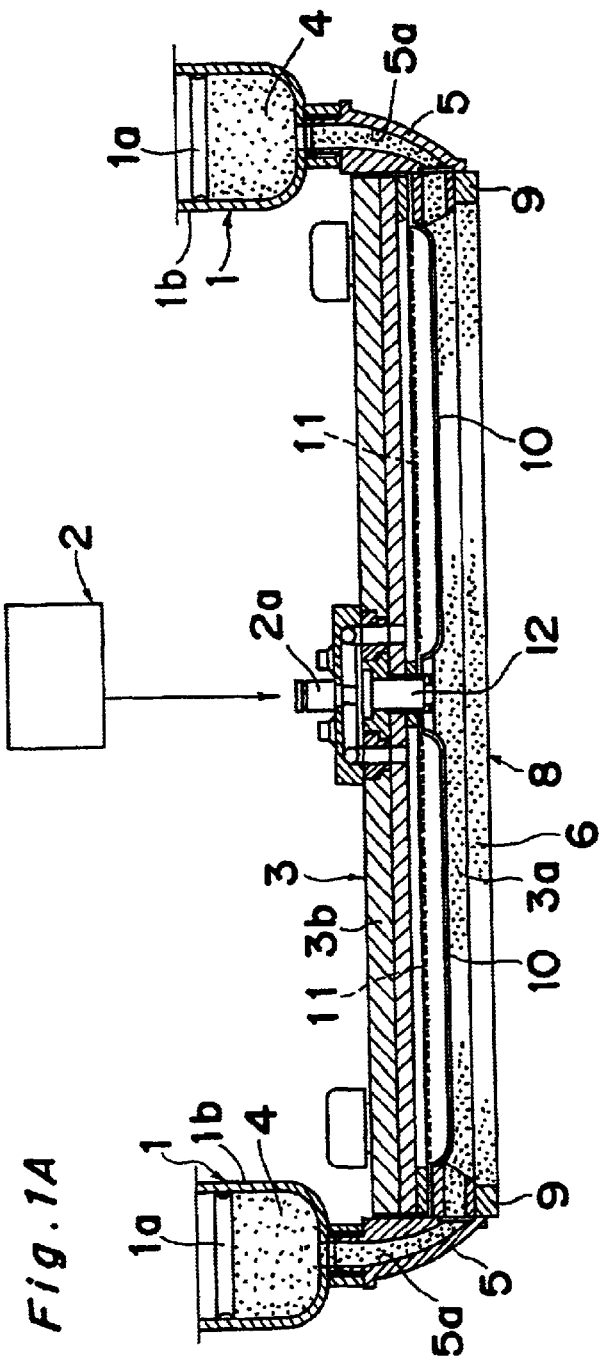
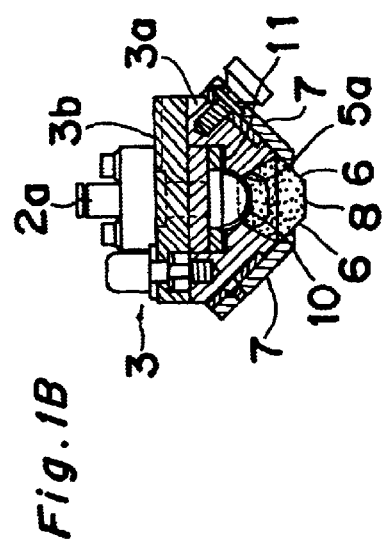

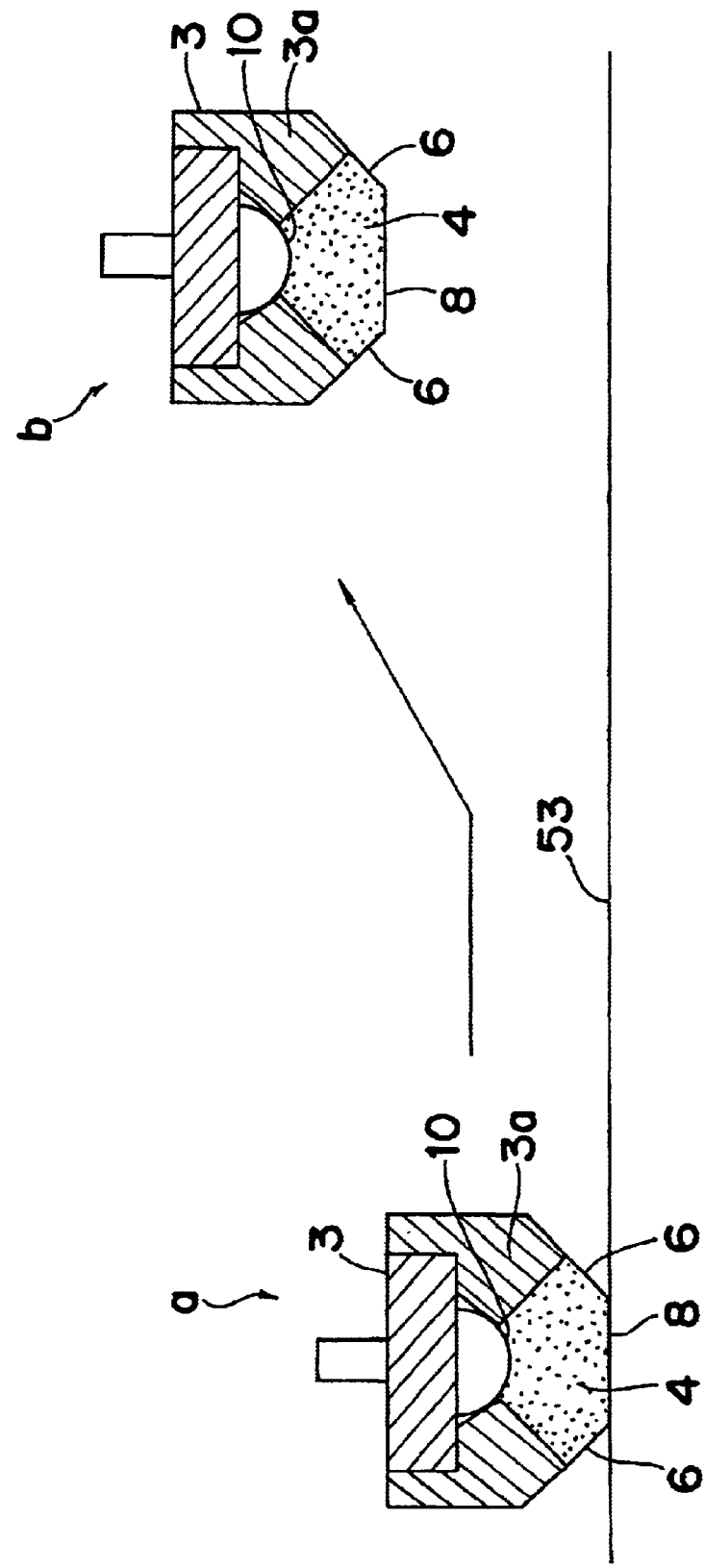

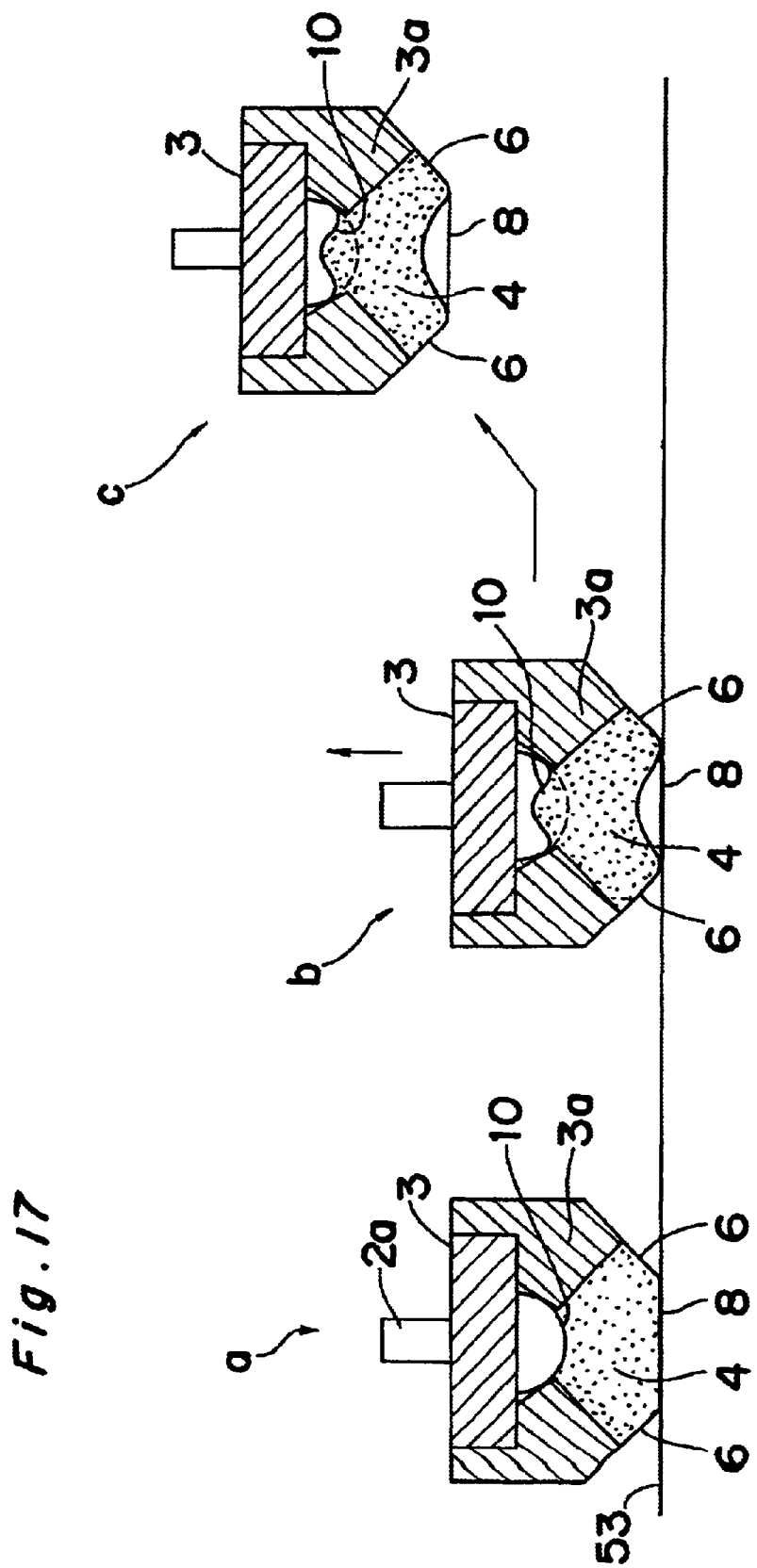

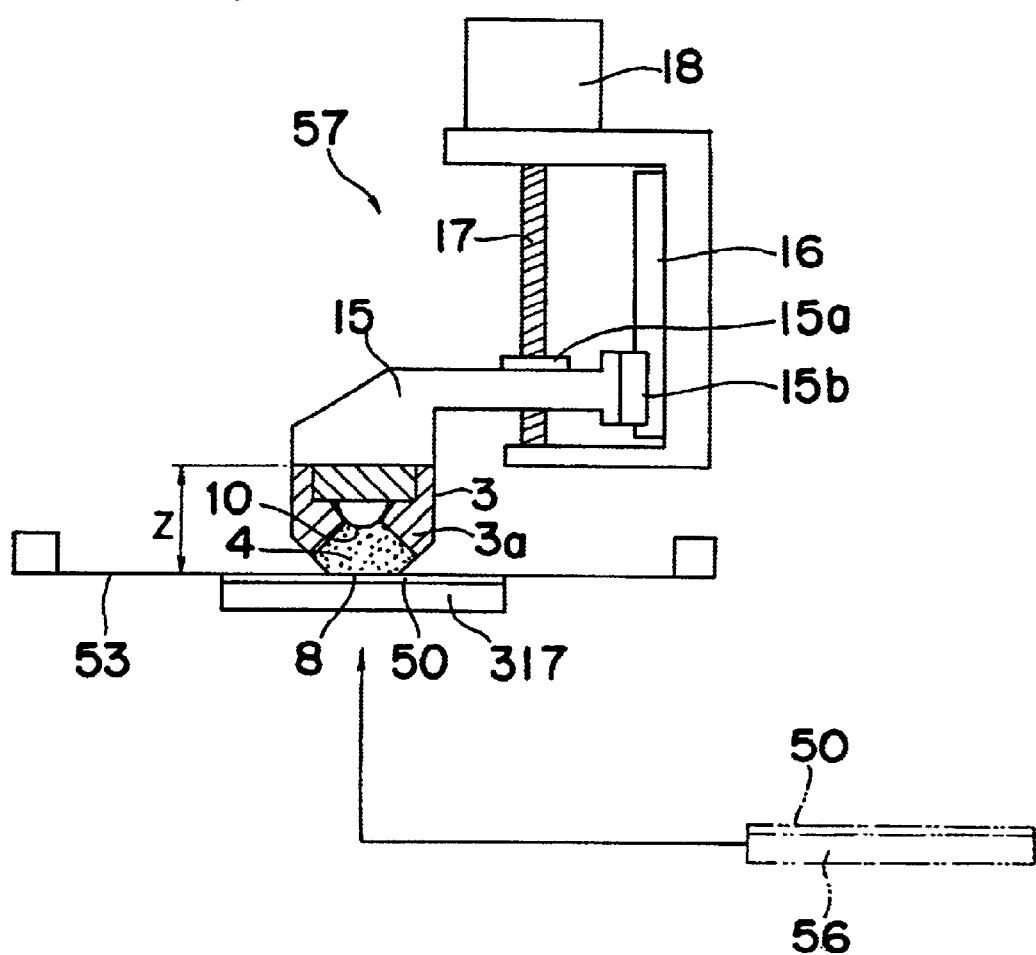

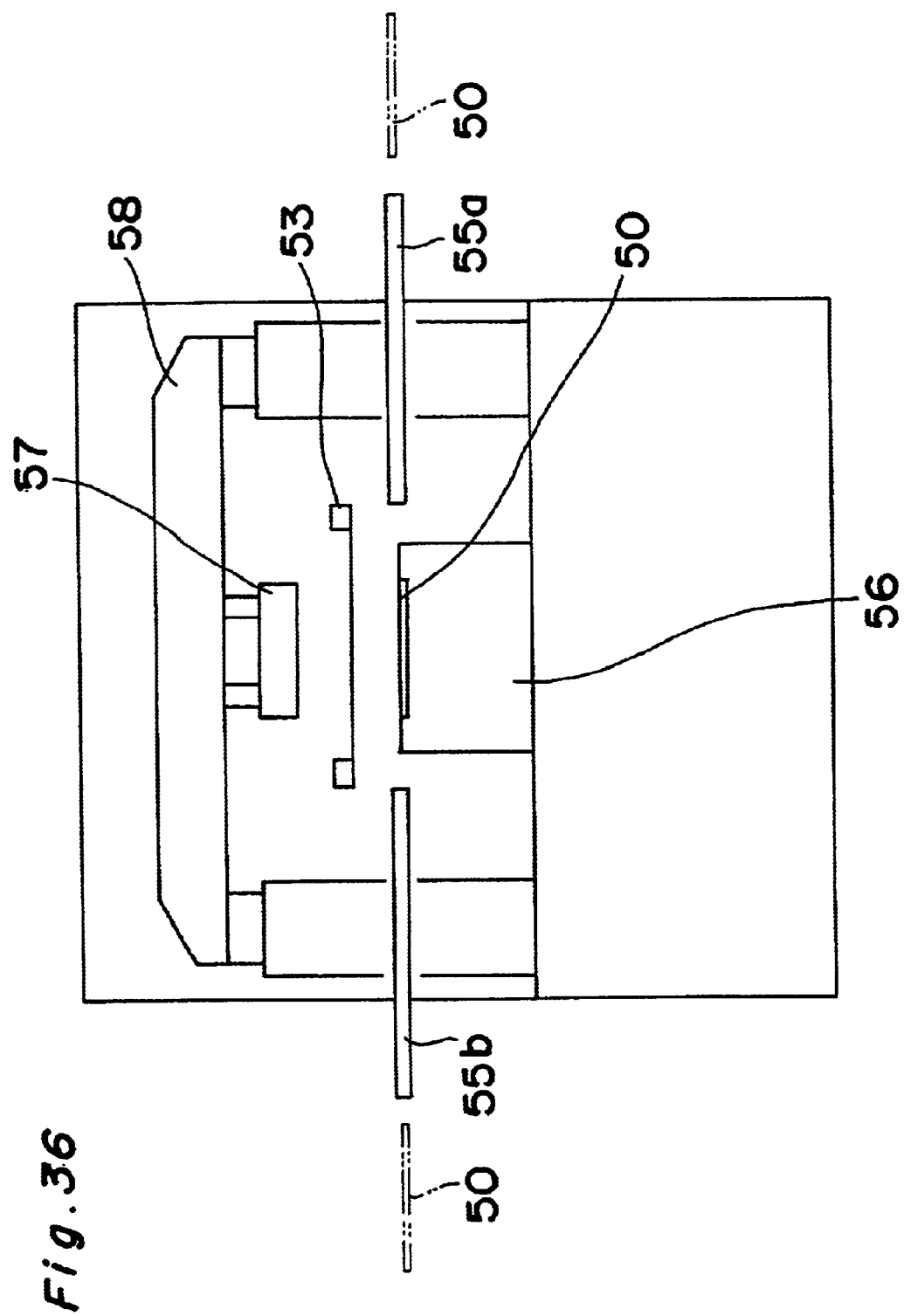

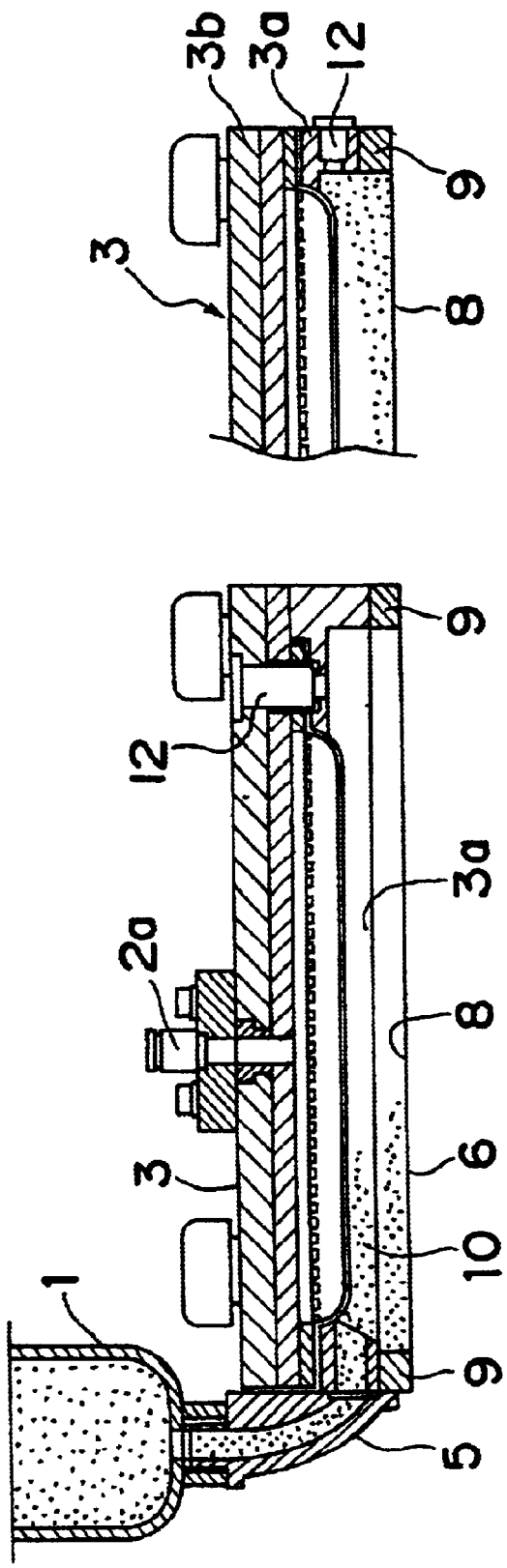

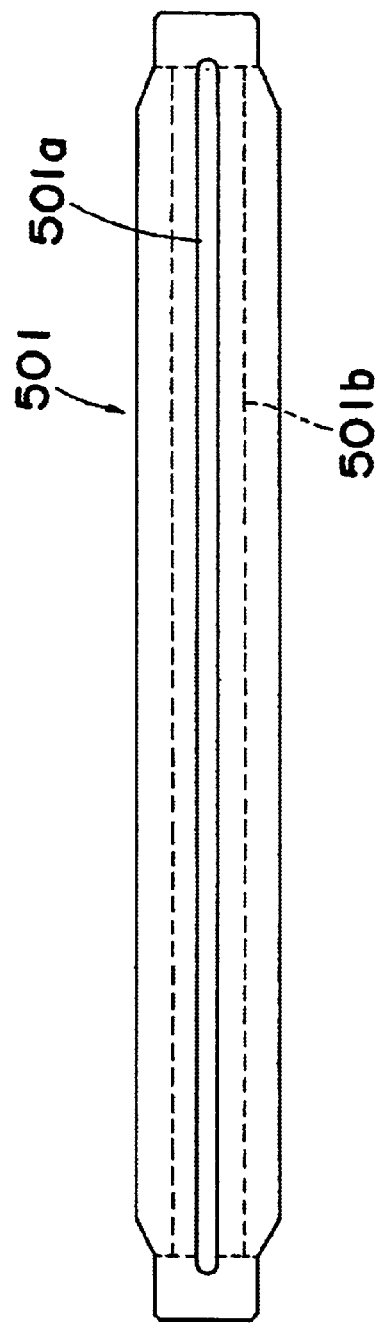
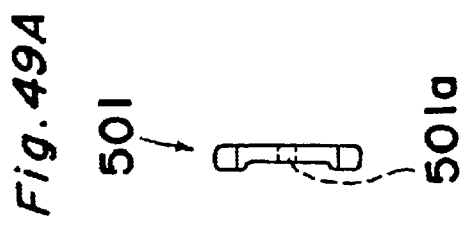
Fig.49B
Fig.49A

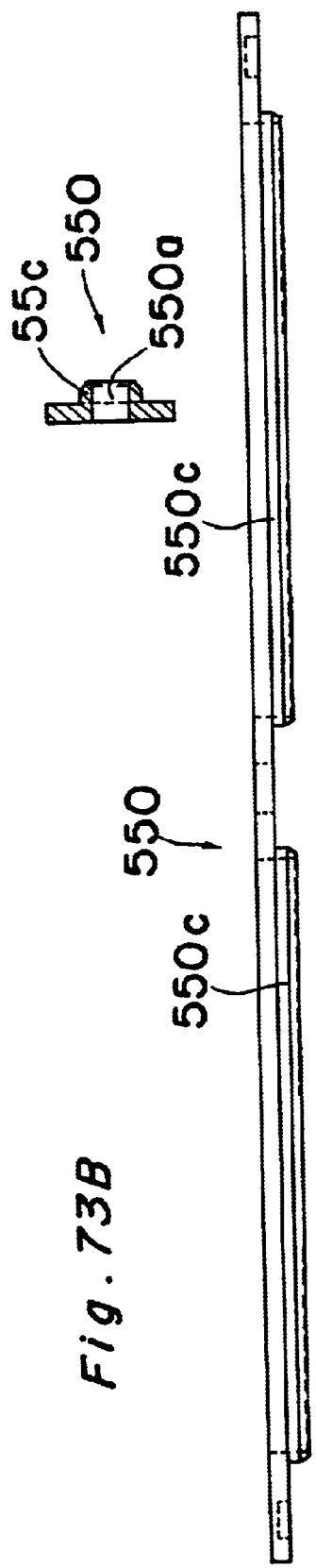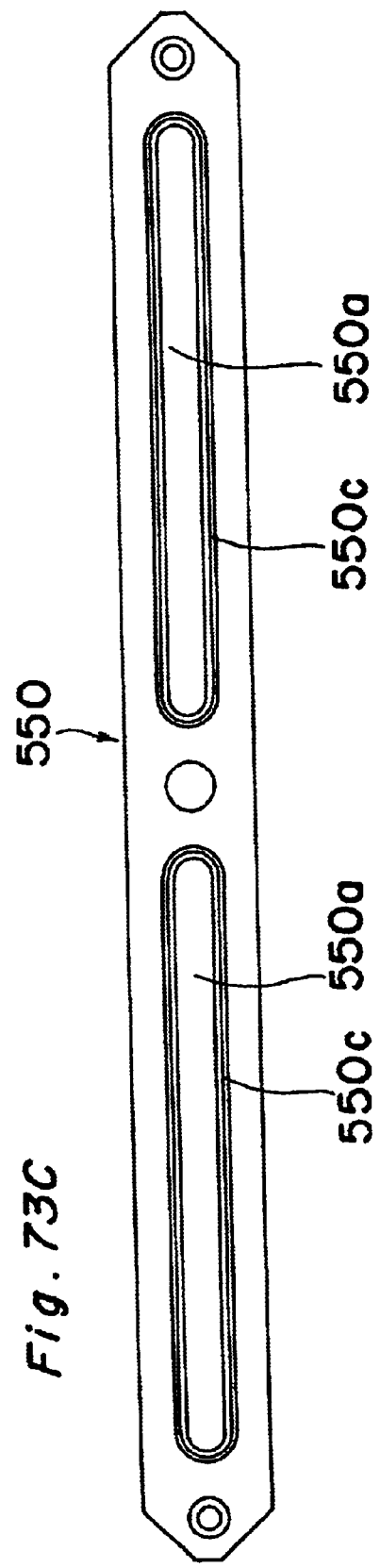

*Fig. 76*

| | CONDITIONS | NORMAL PATTERN | | | FINE PATTERN | | | |
|---|---|---|---|---|---|---|---|---|
| TYPE OF SOLDER | | HIGH SPEED | MIDDLE SPEED | LOW SPEED | HIGH SPEED | MIDDLE SPEED | LOW SPEED | |
| A COMPANY | TYPE a | | | | | | | |
| | TYPE b | | | | | | | |
| | TYPE c | | | | | | | |
| | | | | | | | | |
| B COMPANY | TYPE 1 | | | | | | | |
| | TYPE 2 | | | | | | | |
| | | | | | | | | |
| | | | | | | | | |
| | | | | | | | | |

METHOD AND APPARATUS FOR APPLYING VISCOUS MATERIAL

BACKGROUND OF THE PRESENT INVENTION

The present invention relates to viscous material application method and apparatus for applying a viscous material such as adhesive, solder paste or electrically conductive paste to a circuit board or other application object, which is an object to which the viscous material is to be applied, via a screen mask in a specified pattern.

As a conventional viscous material application apparatus, there has generally been known a screen printing apparatus which applies a viscous material 4 such as adhesive or solder paste onto lands 51 of a circuit board or the like, which is the application object 50, via a screen mask 53 as shown in FIGS. 12A–12E.

The screen mask 53 has openings 52 formed as through holes provided in a specified pattern corresponding to the lands 51 of the application object 50, and the application object 50 is positioned by an unshown table section so as to be in contact with the screen mask 53 as shown in FIGS. 12A and 12B. Next, as shown in FIG. 12C, the viscous material 4 fed to an end of the screen mask 53 is moved in a specified direction by a squeegee 54, so that the viscous material 4 is filled into the openings 52. Next, the application object 50 is separated away from the screen mask 53 as shown in FIG. 12D, by which the viscous material 4 within the openings 52 is transferred onto the lands 51 of the application object 50 so that the viscous material 4 is applied onto the lands 51 of the application object 50 as shown in FIG. 12E.

Also, the inventor has proposed in Japanese Patent Application 10-232164 (Unexamined Japanese Patent Publication 2000-62138) a tightly closed type squeegee including, on a filling unit movable on a screen mask, a chamber which has a tightly closed structure capable of shutting off print paste from the atmospheric air and also has a discharge hole in opposition to the screen mask and which is to be filled with print paste, a pressurizing device for pressurizing the print paste in the chamber to push the print paste out of the discharge hole, a pair of scraper blades which slide in press contact with the screen mask back and forth along the direction of move of the filling unit, a paste tank which forms a part of the pressurizing device and which is removably mountable, and a shutter mechanism which can open and close the discharge hole.

However, in this conventional viscous material application apparatus, since the apparatus adopts a method that the squeegee 54 is moved on the screen mask 53 to thereby fill the viscous material 4 into the openings 52, and since the viscous material 4 is in contact with the air at all times, the viscous material 4 easily tends to vary in state, causing an issue that stable application becomes unachievable and another issue that the viscous material 4 overflowing the squeegee 54 needs to be scraped into the squeegee 54.

Also, there is a large amount of know-how for obtaining proper application state, and skilled engineers are necessitated therefor. In particular, it is more difficult to achieve the proper application while recent years' demand for finer pitches of the openings 52 is met and moreover a demand for faster speed is satisfied. This has been a cause of another issue that increasingly larger amount of know-how and skillfulness is required.

On the other hand, in the structure of above-mentioned Japanese Patent Application 10-232164 (Unexamined Japanese Patent Publication 2000-62138), indeed the viscous material 4 does not need scraping up, and moreover the viscous material 4 is kept away from contact with the air, thus preventable from any changes in state. However, since one device is shared for feeding the viscous material toward the discharge hole as well as for imparting a discharge pressure thereto, it is difficult to control the discharge pressure at high precision because of viscous resistance or the like, and moreover the responsivity is poor. As a result of this, there have been an issue that finer pitches and higher speeds cannot be satisfied. Particularly with high-viscosity viscous materials such as solder paste, pressure is highly transferable near the place at which the feeding device and the chamber are communicating with each other, causing the discharge pressure to become higher with the result of greater variations in the discharge pressure, as an issue.

Then, it is conceivable to provide a storage chamber which communicates with the discharge hole and a device which imparts a discharge pressure to this storage chamber, and further to provide a device for feeding the viscous material to the storage chamber. In this case, however, when the viscous material within the storage chamber decreases so that the discharge pressure can no longer be imparted, there arises a need for feeding the viscous material into the storage chamber, which would interrupt the application operation during the feed. This would cause an issue of decrease in productivity. Furthermore, during the feed of the viscous material to the storage chamber by pushing out the viscous material from the feeding device to the storage chamber, the pressure that has arisen to the storage chamber remains (residual pressure), causing a further issue that it becomes difficult to control the discharge pressure at high precision.

Accordingly, in view of these and other issues, an object of the present invention is to provide viscous material application apparatus and method by which a viscous material can be prevented from contact with the air at all times so as to be applied stably, and in which the viscous material never overflows during the operation based on an arrangement that a viscous-material storage chamber provided therefor so as to communicate with a discharge hole is constantly replenished with the viscous material, and also in which even if the viscous material is fed at high pressure so as to reduce the time for feeding the viscous material to the storage chamber, it never affects the discharge control, and further in which the discharge amount by one-time feed of the viscous material can be increased.

SUMMARY OF THE PRESENT INVENTION

In order to achieve the above object, the present invention has the following constitutions.

According to a first aspect of the present invention, there is provided a method for applying a viscous material, by using an application unit having: a storage chamber for the viscous material; a discharge hole, for the viscous material, provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprising:

bringing a screen mask having openings corresponding to the application object or the application object itself and the discharge hole of the application unit into contact with each other;

moving either the application unit and the screen mask or the application unit and the application object relative to each other while imparting the discharge pressure to the viscous material in the storage chamber; and applying the viscous material onto the application object while replenishing the storage chamber at all times with the viscous material by the viscous-material feeding device with a pressure smaller than the discharge pressure imparted by the discharge-pressure adjusting device.

According to a second aspect of the present invention, there is provided a method for applying a viscous material, by using an application unit having: a storage chamber for the viscous material; a discharge hole for the viscous material provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprising:

bringing a screen mask having openings corresponding to the application object or the application object itself and the discharge hole of the application unit into contact with each other;

moving either the application unit and the screen mask or the application unit and the application object relative to each other while imparting the discharge pressure to the viscous material in the storage chamber; and pressure-feeding the viscous material into the storage chamber with the discharge hole pressed against the screen mask or the application object and, after an end of the feed, removing a residual pressure inside the storage chamber, and thereafter applying the viscous material onto the application object.

According to a third aspect of the present invention, there is provided a method for applying a viscous material as described in the second aspect, wherein the residual pressure is removed by changing a capacity of the storage chamber.

According to a fourth aspect of the present invention, there is provided a method for applying a viscous material as described in the third aspect, wherein the residual pressure is removed by changing a capacity of an inflatable-and-deflatable bag part disposed as a constituent element of the discharge-pressure adjusting device so as to confront inside of the storage chamber.

According to a fifth aspect of the present invention, there is provided a method for applying a viscous material as described in the third aspect, wherein the residual pressure is removed by changing a press amount of the elastically deformable discharge hole.

According to a sixth aspect of the present invention, there is provided a method for applying a viscous material, by using an application unit: having a storage chamber for the viscous material; a discharge hole for the viscous material provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprising:

bringing a screen mask having openings corresponding to the application object or the application object itself and the discharge hole of the application unit into contact with each other;

moving either the application unit and the screen mask or the application unit and the application object relative to each other while imparting the discharge pressure to the viscous material in the storage chamber; and applying the viscous material onto the application object while an inflatable-and-deflatable bag part disposed as a constituent element of the discharge-pressure adjusting device so as to confront inside of the storage chamber is set deflatable so that a press amount of the elastically deformable discharge hole is increased.

According to a seventh aspect of the present invention, there is provided a method for applying a viscous material as described in the sixth aspect, wherein when the viscous material is fed into the storage chamber, the bag part is set deflatable so that the press amount of the elastically deformable discharge hole is increased.

According to an eighth aspect of the present invention, there is provided a method for applying a viscous material, by using an application unit having: a storage chamber for the viscous material; a discharge hole for the viscous material provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprising:

bringing a screen mask having openings corresponding to an application object or the application object itself and the discharge hole of the application unit into contact with each other;

moving either the application unit and the screen mask or the application unit and the application object relative to each other while imparting the discharge pressure to the viscous material in the storage chamber; and applying the viscous material onto the application object in a state in which a residual pressure is removed by changing a capacity of any of a plurality of inflatable-and-deflatable bag parts provided so as to confront inside of the storage chamber, while any of the other bag parts is set deflatable so that the press amount of the elastically deformable discharge hole is increased.

According to a ninth aspect of the present invention, there is provided an apparatus for applying a viscous material, comprising:

an application unit having: a storage chamber for the viscous material; a discharge hole for the viscous material provided so as to communicate with the storage chamber and being brought into contact with a screen mask having openings corresponding to an application object or with the application object itself; and a discharge-pressure adjusting device for imparting a discharge pressure to the viscous material stored in the storage chamber, where a viscous-material feeding device for feeding the viscous material to the storage chamber is coupled to the application unit; and a relative moving device for moving either the application unit and the screen mask or the application unit and the application object relative to each other while imparting the discharge pressure to the viscous material in the storage chamber, thus the viscous material being applied onto the application object, wherein the viscous-material feeding device replenishes the storage chamber at all times with the viscous material with a pressure smaller than the discharge pressure imparted by the discharge-pressure adjusting device.

According to a tenth aspect of the present invention, there is provided an apparatus for applying a viscous material, comprising:

an application unit having: a storage chamber for the viscous material; a discharge hole for the viscous material provided so as to communicate with the storage chamber and being brought into contact with a screen mask having openings corresponding to an application object or with the application object itself; and a discharge-pressure adjusting device for imparting a discharge pressure to the viscous material stored in the storage chamber, where a viscous-material feeding device for feeding the viscous material to the storage chamber is coupled to the application unit; and a relative moving device for moving either the application unit and the screen mask or the application unit and the application object relative to each other while imparting the discharge pressure to the viscous material in the storage chamber, the viscous material applied onto the application object, the apparatus further comprising: a device for, after the viscous material is pressure-fed into the storage chamber, removing any residual pressure inside the storage chamber.

According to an eleventh aspect of the present invention, there is provided an apparatus for applying a viscous material as described in the tenth aspect, wherein the device for removing the residual pressure is a device for changing a capacity in the storage chamber.

According to a twelfth aspect of the present invention, there is provided an apparatus for applying a viscous material, comprising:

an application unit having: a storage chamber for the viscous material; a discharge hole for the viscous material provided so as to communicate with the storage chamber and being brought into contact with a screen mask having openings corresponding to an application object or with the application object itself; and a discharge-pressure adjusting device for imparting a discharge pressure to the viscous material stored in the storage chamber, where a viscous-material feeding device for feeding the viscous material to the storage chamber is coupled to the application unit; and a relative moving device for moving either the application unit and the screen mask or the application unit and the application object relative to each other while imparting the discharge pressure to the viscous material in the storage chamber, thus the viscous material being applied onto the application object, the apparatus further comprising: an inflatable-and-deflatable bag part provided so as to confront the inside of the storage chamber; a discharge hole which is elastically deformable; and a device for changing a press amount either between the application unit and the screen mask or between the application unit and the application object.

According to a thirteenth aspect of the present invention, there is provided an apparatus for applying a viscous material, comprising:

an application unit having: a storage chamber for the viscous material; a discharge hole for the viscous material provided so as to communicate with the storage chamber and being brought into contact with a screen mask having openings corresponding to an application object or with the application object itself; and a discharge-pressure adjusting device for imparting a discharge pressure to the viscous material stored in the storage chamber, where a viscous-material feeding device for feeding the viscous material to the storage chamber is coupled to the application unit; and a relative moving device for moving either the application unit and the screen mask or the application unit and the application object relative to each other while imparting the discharge pressure to the viscous material in the storage chamber with the discharge hole of the application unit kept in contact, thus the viscous material being applied onto the application object, the apparatus further comprising: a plurality of capacity-variable devices for varying an internal capacity of the storage chamber.

According to a fourteenth aspect of the present invention, there is provided an apparatus for applying a viscous material as described in the thirteenth aspect, wherein the capacity-variable devices are inflatable-and-deflatable bag parts confronting the inside of the storage chamber.

In the viscous material application method of the present invention, by using an application unit having: the storage chamber for the viscous material; the discharge hole for the viscous material provided so as to communicate with the storage chamber, where the viscous-material feeding device for feeding the viscous material to the storage chamber is coupled to the application unit; and the discharge-pressure adjusting device for imparting the discharge pressure to the viscous material stored in the storage chamber, the method comprises: bringing the screen mask having openings corresponding to the application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, wherein the storage chamber is replenished at all times with the viscous material by the viscous-material feeding device with the pressure smaller than the discharge pressure imparted by the discharge-pressure adjusting device. Therefore, since the viscous material is stored in the storage chamber, the viscous material is kept away from contact with the air at all times, so that the viscous material can be prevented from deterioration and thus applied stably. Moreover, once the viscous material is filled in the storage chamber at the beginning, the viscous material is thereafter re-fed at all times during application operations without affecting the control of the discharge pressure and without thereby deteriorating the application quality. Thus, the application production can be continuously carried out so that the productivity can be improved.

Also, in the viscous material application method of the present invention, the viscous material is pressure-fed into the storage chamber with the discharge hole pressed against the screen mask or the application object and, after an end of the feed, the residual pressure inside the storage chamber removed. Therefore, even if the viscous material is fed at high pressure so as to reduce the time for feeding the viscous material to the storage chamber, it never affects the discharge control, and the material feed time can be reduced without affecting the application quality so that the productivity can be enhanced.

In the removal of the residual pressure, changing the capacity of the storage chamber allows the residual pressure to be removed simply and instantaneously. More specifically, changing the capacity of the inflatable-and-deflatable bag part provided as a constituent element of the discharge-pressure adjusting device so as to confront the inside of the storage chamber, or changing the press amount of the elastically deformable discharge hole to thereby change the capacity makes it possible to remove the residual pressure.

Also, in the viscous material application method of the present invention, the inflatable-and-deflatable bag part provided as a constituent element of the discharge-pressure adjusting device so as to confront the inside of the storage chamber is set deflatable so that the press amount of the elastically deformable discharge hole is increased. Therefore, the bag part is deflated in response to the press amount of the discharge hole, so that the amount of the viscous material to which the discharge pressure can be imparted by an inflation of the bag part is increased correspondingly, thus allowing the discharge amount of the viscous material to be increased.

Further, when the bag part is set into a deflatable state so that the press amount of the elastically deformable discharge hole is increased at the time of feed of the viscous material into the storage chamber, the feed amount of the viscous material to the storage chamber is increased, so that the discharge amount of the viscous material can be increased.

Also, in the viscous material application method of the present invention, the residual pressure is removed by changing the capacity of any of a plurality of inflatable-and-deflatable bag parts provided so as to confront inside of the storage chamber, while any of the other bag parts is set deflatable so that the press amount of the elastically deformable discharge hole is increased. Therefore, the residual pressure in the material feed can be removed by control of the plurality of bag parts even without changing the press amount of the discharge hole, and moreover the discharge amount of the viscous material can be increased.

Further, in the viscous material application apparatus of the present invention, the apparatus comprises the application unit having: the storage chamber for the viscous material; the discharge hole for the viscous material provided so as to communicate with the storage chamber; and the discharge-pressure adjusting device for imparting the discharge pressure to the viscous material stored in the storage chamber, where the viscous-material feeding device for feeding the viscous material to the storage chamber is coupled to the application unit, the apparatus performing: bringing the screen mask having the openings corresponding to the application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, where the viscous-material feeding device feeds the viscous material at all times into the storage chamber with the pressure smaller than the discharge pressure imparted by the discharge-pressure adjusting device. Therefore, since the viscous material is re-fed at all times during the application as described above, continuous production can be fulfilled so that the productivity can be improved.

Also, in the viscous material application apparatus of the present invention, the apparatus further comprises the device for, after the viscous material is pressure-fed into the storage chamber, removing any residual pressure inside the storage chamber. Therefore, even if the viscous material is fed to the storage chamber at high pressure as described above, it never affects the discharge control, and the viscous-material feed time can be reduced without affecting the application quality so that the productivity can be enhanced.

Also, in the case where the device for removing the residual pressure is implemented by the device that makes the internal capacity of the storage chamber changed, the residual pressure can be removed simply and instantaneously, preferably.

Also, in the viscous material application apparatus of the present invention, the apparatus comprises the inflatable-and-deflatable bag part provided so as to confront the inside of the storage chamber, the discharge hole which is elastically deformable, and the device for changing the press amount either between the application unit and the screen mask or between the application unit and the application object. Therefore, the residual pressure after the feed of the viscous material to the storage chamber can be removed by executing the individual methods described above, so that the discharge amount of the viscous material by one-time feed of the viscous material can be increased.

Also, in the case where the plurality of capacity-variable devices for varying the internal capacity of the storage chamber are provided, the residual pressure in material feed can be removed and moreover the discharge amount of the viscous material can be increased, by control of the capacity-variable devices even without changing the press amount of the discharge hole as described above. Furthermore, a variety of forms of application can be developed by selective use of the plurality of capacity-variable devices.

Also, in the case where the capacity-variable devices are inflatable-and-deflatable bag parts confronting the inside of the storage chamber, the viscous material application apparatus can be simplified in construction and structured compact, and moreover a pressure can be imparted uniformly over the entire viscous material while the responsivity can be enhanced, preferably.

According to a fifteenth aspect of the present invention, there is provided a method for applying a viscous material, by using an application unit having: a storage chamber for the viscous material; a discharge hole for the viscous material provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprising:

bringing a screen mask having openings corresponding to the application object or the application object itself and the discharge hole of the application unit into contact with each other;

moving either the application unit and the screen mask or the application unit and the application object relative to each other while imparting the discharge pressure to the viscous material in the storage chamber;

applying the viscous material onto the application object; and after an end of the application, storing the application material into the storage chamber in separation of the application unit from the screen mask or the application object.

According to a sixteenth aspect of the present invention, there is provided a method for applying a viscous material as described in the fifteenth aspect, wherein the viscous material is stored into the storage chamber by expanding an internal space of the storage chamber.

According to a seventeenth aspect of the present invention, there is provided a method for applying a viscous material, by using an application unit having: a storage chamber for the viscous material; a discharge hole for the viscous material provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprising:

bringing a screen mask having openings corresponding to the application object or the application object itself and the discharge hole of the application unit into contact with each other;

moving either the application unit and the screen mask or the application unit and the application object relative to each other while imparting the discharge pressure to the viscous material in the storage chamber;

applying the viscous material onto the application object by moving the application unit along the screen mask or the application object while the application unit is kept in contact with the screen mask or the application object; and after the application, separating the application unit from the screen mask or the application object while scraping up the viscous material by an end edge of the discharge hole that is kept in contact with the screen mask or the application object.

According to an eighteenth aspect of the present invention, there is provided a method for applying a viscous material, by using an application unit having: a storage chamber for the viscous material; a discharge hole for the viscous material provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprising: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, wherein in separation of the application unit from the screen mask or the application object, the application unit is separated from the screen mask or the application object while the application material is stored into the storage chamber and while the viscous material is scraped up by an end edge of the discharge hole that is kept in contact with the screen mask or the application object by moving the application unit along the screen mask or the application object with the application unit kept in contact with the screen mask or the application object.

According to a nineteenth aspect of the present invention, there is provided a method for applying a viscous material as described in the fifteenth aspect, the method further comprising: after the separation of the application unit from the screen mask or the application object, maintaining a state, as it is, that the viscous material is stored in the storage chamber.

According to a twentieth aspect of the present invention, there is provided a method for applying a viscous material as described in the fifteenth aspect, the method further comprising: after the separation of the application unit from the screen mask or the application object, closing the discharge hole of the application unit.

According to a twenty-first aspect of the present invention, there is provided an apparatus for applying a viscous material, the apparatus comprising an application unit having: a storage chamber for the viscous material; a discharge hole for the viscous material provided so as to communicate with the storage chamber; and a discharge-pressure adjusting device for imparting a discharge pressure to the viscous material stored in the storage chamber, where a viscous-material feeding device for feeding the viscous material to the storage chamber is coupled to the application unit, the apparatus performing: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the apparatus further comprising a device for storing the application material into the storage chamber in separation of the application unit from the screen mask or the application object.

According to a twenty-second aspect of the present invention, there is provided an apparatus for applying a viscous material as described in the twenty-first aspect, wherein the device for storing the application material into the storage chamber is an expansion device for expanding an internal space of the storage chamber.

According to a twenty-third aspect of the present invention, there is provided an apparatus for applying a viscous material as described in the twenty-second aspect of the present invention, wherein the expansion device is implemented in common use by the discharge-pressure adjusting device for imparting a discharge pressure to the viscous material in the storage chamber.

According to a twenty-fourth aspect of the present invention, there is provided an apparatus for applying a viscous material as described in the twenty-third aspect, wherein the discharge-pressure adjusting device and expansion device is provided so as to extend along a longitudinal direction of the storage chamber while at least partly confronting the storage chamber, and moreover is formed of a bag body whose interior space is expandable and contractible.

According to a twenty-fifth aspect of the present invention, there is provided an apparatus for applying a viscous material, the apparatus comprising an application unit having: a storage chamber for the viscous material; a discharge hole for the viscous material provided so as to communicate with the storage chamber; and a discharge-pressure adjusting device for imparting a discharge pressure to the viscous material stored in the storage chamber, where a viscous-material feeding device for feeding the viscous material to the storage chamber is coupled to the application unit, the apparatus performing: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the apparatus further comprising a discharge hole formed between fore ends of two blades which are provided so as to approach each other toward the screen mask or the application object, and a device for moving the application unit in such a direction that the application unit is separated away from the screen mask or the application object while moving the application unit along the screen mask or the application object.

According to a twenty-sixth aspect of the present invention, there is provided an apparatus for applying a viscous material, the apparatus comprising an application unit having: a storage chamber for the viscous material; a discharge hole for the viscous material provided so as to communicate with the storage chamber; and a discharge-pressure adjusting device for imparting a discharge pressure to the viscous material stored in the storage chamber, where a viscous-material feeding device for feeding the viscous material to the storage chamber is coupled to the application unit, the apparatus performing: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the apparatus further comprising a discharge hole formed between fore ends of two blades which are provided so as to approach each other toward the screen mask or the application object, a device for storing the viscous material into the storage chamber in separation of the application unit from the screen mask or the application object, and a device for moving the application unit in such a direction that the application unit is separated away from the screen mask or the application object while moving the application unit along the screen mask or the application object.

According to a twenty-seventh aspect of the present invention, there is provided an apparatus for applying a viscous material, the apparatus comprising an application unit having: a storage chamber for the viscous material; a discharge hole for the viscous material provided so as to communicate with the storage chamber; and a discharge-pressure adjusting device for imparting a discharge pressure to the viscous material stored in the storage chamber, where a viscous-material feeding device for feeding the viscous material to the storage chamber is coupled to the application unit, the apparatus performing: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the apparatus further comprising a cover for covering the discharge hole while the application unit is in its standby state separate away from the screen mask or the application object.

According to a twenty-eighth aspect of the present invention, there is provided an apparatus for applying a viscous material, the apparatus comprising an application unit having: a storage chamber for the viscous material; a discharge hole for the viscous material provided so as to communicate with the storage chamber; and a discharge-pressure adjusting device for imparting a discharge pressure to the viscous material stored in the storage chamber, where a viscous-material feeding device for feeding the viscous material to the storage chamber is coupled to the application unit, the apparatus performing: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the apparatus further comprising a bearer having a flat upper surface on which the application unit is to be placed with the discharge hole in close contact therewith while the application unit is in its standby state separate away from the screen mask or the application object.

In the viscous material application method of the present invention, by using an application unit having: a storage chamber for the viscous material; a discharge hole for the viscous material provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprises: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; applying the viscous material onto the application object; and storing the application material into the storage chamber in separation of the application unit from the screen mask or the application object. Therefore, since the application material is positively stored, the viscous material almost never remains on the screen mask or the application object, so that the labor for cleaning of the screen mask or the application object can be made unnecessary, and moreover automatic replacement becomes implementable.

Particularly in the case where the viscous material is stored into the storage chamber by expanding the internal space of the storage chamber, the viscous material present at the discharge hole part is drawn into the storage chamber, so that the viscous material can be stored simply and securely.

Also, in the case where the application unit is separated from the screen mask or the application object while the viscous material is scraped up by an end edge of the discharge hole that is kept in contact with the screen mask or the application object by moving the application unit along the screen mask or the application object with the application unit kept in contact with the screen mask or the application object, the viscous material almost never remains on the screen mask or the application object, so that the labor for cleaning of the screen mask or the application object can be made unnecessary, and moreover automatic replacement becomes implementable.

Also, in the case where with the above two methods used in combination, in separation of the application unit from the screen mask or the application object, the application unit is separated from the screen mask or the application object while the application material is stored into the storage chamber and while the viscous material is scraped up by an end edge of the discharge hole that is kept in contact with the screen mask or the application object by moving the application unit along the screen mask or the application object with the application unit kept in contact with the screen mask or the application object, the viscous material can further securely be prevented from remaining on the screen mask or the application object.

Also, in the case where after the separation of the application unit from the screen mask or the application object, the state that the viscous material is stored in the storage chamber is maintained as it is, the viscous material can be prevented effectively from dripping down from the discharge hole in the standby state of the application unit.

Also, in the case where after the application unit is separated from the screen mask or the application object, the discharge hole of the application unit is closed, so that state changes of the viscous material due to contact with the air at the discharge hole can be suppressed.

Further, in the viscous material application apparatus of the present invention, the apparatus comprises the application unit having: the storage chamber for the viscous material; the discharge hole for the viscous material provided so as to communicate with the storage chamber; and the discharge-pressure adjusting device for imparting the discharge pressure to the viscous material stored in the storage chamber, where the viscous-material feeding device for feeding the viscous material to the storage chamber is coupled to the application unit, the apparatus performing: bringing the screen mask having the openings corresponding to the application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the apparatus further comprising the device for storing the application material into the storage chamber in separation of the application unit from the screen mask or the application object. Therefore, since the viscous material almost never remains on the screen mask or the application object as described above, the labor for cleaning of the screen mask or the application object can be made unnecessary, and moreover automatic replacement becomes implementable.

Also, in the case where the device for storing the application material into the storage chamber is the expansion device for expanding the internal space of the storage chamber, the viscous material present at the discharge hole part can be drawn into the storage chamber, so that the viscous material can be stored simply and securely.

Also, in the case where the expansion device is implemented in common use by the discharge-pressure adjusting device for imparting a discharge pressure to the viscous material in the storage chamber, it is no longer necessary to provide an expansion device separately, allowing a lower price construction. Furthermore in the case where the discharge-pressure adjusting device and the expansion device is provided so as to extend along a longitudinal direction of the storage chamber while at least partly confronting the storage chamber, and moreover is formed of a bag body whose interior space is expandable and contractible, the viscous material can be restored securely over the entire discharge hole.

Also, in the case where the apparatus further comprises the discharge hole formed between the fore ends of the two blades which are provided so as to approach each other toward the screen mask or the application object, and the device for moving the application unit in such a direction that the application unit is separated away from the screen mask or the application object while moving the application unit along the screen mask or the application object, the viscous material can be separated away from the screen mask or the application object while the viscous material is scraped up by the blades. Therefore, the viscous material almost never remains on the screen mask or the application object, so that the labor for cleaning of the screen mask or the application object can be made unnecessary, and moreover automatic replacement becomes implementable.

Also, in the case where the apparatus further comprises the discharge hole formed between the fore ends of the two blades which are provided so as to approach each other toward the screen mask or the application object, the device for storing the viscous material into the storage chamber in separation of the application unit from the screen mask or the application object, and the device for moving the application unit in such a direction that the application unit is separated away from the screen mask or the application object while moving the application unit along the screen mask or the application object, the combined use of the two devices allows the viscous material to be further securely prevented from remaining on the screen mask or the application object.

Also, in the case where the apparatus further comprises the cover for covering the discharge hole while the application unit is in its standby state separate away from the screen mask or the application object, the discharge hole of the application unit is closed, so that state changes of the viscous material due to contact with the air at the discharge hole can be suppressed.

Also, in the case where the apparatus further comprises the bearer having the flat upper surface on which the application unit is to be placed with the discharge hole in close contact therewith while the application unit is in its standby state separate away from the screen mask or the application object, the discharge hole of the application unit is closed, so that state changes of the viscous material due to contact with the air at the discharge hole can be suppressed. Moreover, when the application unit is moved along the upper surface of the bearer at the time of reuse, the viscous material does not remain on the upper surface of the bearer and the application unit is filled with the viscous material up to the discharge hole. Therefore, the application operation can be started immediately, so that the productivity can be improved.

According to a twenty-ninth aspect of the present invention, there is provided a method for applying a viscous material, by using an application unit having: a storage chamber for the viscous material; a discharge hole for the viscous material provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprising: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the method further comprising iterating an operation of moving the application unit parallel and/or vertical to the screen mask or the application object or another object different from the application object, relative to each other, while the application unit is kept in contact with the screen mask or the application object or the different object at an opening-absent part of the screen mask or on the application object or on the different object, to thereby stir the viscous material in the storage chamber.

According to a thirtieth aspect of the present invention, there is provided a method for applying a viscous material as described in the twenty-ninth aspect, wherein during the stirring of the viscous material, the screen mask or the application object or an object different from the application object is supported on its one-side surface opposite to its surface with which the application unit is to be brought into contact.

According to a thirtieth-first aspect of the present invention, there is provided a method for applying a viscous material, by using an application unit having: a storage chamber for the viscous material; a discharge hole for the viscous material provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprising: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the method further comprising: iteratively increasing and decreasing an internal space of the storage chamber to thereby stir the viscous material in the storage chamber.

According to a thirty-second aspect of the present invention, there is provided a method for applying a viscous material, by using an application unit having: a storage chamber for the viscous material; a discharge hole for the viscous material provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprising: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the method further comprising: iterating, in combination, an operation of moving the application unit parallel and/or vertical to the screen mask or the application object or another object different from the application object, relative to each other, while the application unit is kept in contact with the screen mask or the application object or the different object at an opening-absent part of the screen mask or on the application object or on the different object, and an operation of increasing and decreasing an internal space of the storage chamber, to thereby stir the viscous material in the storage chamber.

According to a thirty-third aspect of the present invention, there is provided a method for applying a viscous material as described in the twenty-ninth aspect, the method further comprising measuring a viscosity of the viscous material and, upon an arrival at a specified viscosity, halting the stirring of the viscous material, and applying the viscous material onto the application object.

According to a thirty-fourth aspect of the present invention, there is provided a method for applying a viscous material, by using an application unit having: a storage chamber for the viscous material; a discharge hole for the viscous material provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprising: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the method further comprising: measuring a viscosity of the viscous material and, according to a detected viscosity, adjusting the viscous-material discharge pressure or halting the application.

According to a thirty-fifth aspect of the present invention, there is provided a method for applying a viscous material as described in the thirty-third aspect, the method further comprising: moving the application unit along the screen mask or the application object or the different object, relative to each other, while the discharge hole of the application unit is kept in contact with the screen mask or the application object or the different object, and detecting a differential pressure of the viscous material between both sides of a direction of the move in the storage chamber or detecting a moving load during the move or detecting an electric current flowing through a motor that drives the move, to thereby measure the viscosity of the viscous material.

According to a thirty-sixth aspect of the present invention, there is provided a method for applying a viscous material, by using an application unit having: a storage chamber for the viscous material; a discharge hole for the viscous material provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprising: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the method further comprising: preliminarily storing in a control section, a data table defining viscosity-adjusting conditions or application conditions such as viscosity-adjusting time, number of times of viscosity-adjusting operations, and discharge pressure according to qualities of the viscous material, patterns of application, characteristics of the application object or the like; and performing control of viscous-material viscosity adjustment or discharge-pressure adjustment by referencing the data table.

According to a thirty-seventh aspect of the present invention, there is provided an apparatus for applying a viscous material, comprising an application unit having: a storage chamber for the viscous material; a discharge hole for the viscous material provided so as to communicate with the storage chamber; and a discharge-pressure adjusting device for imparting a discharge pressure to the viscous material stored in the storage chamber, where a viscous-material feeding device for feeding the viscous material to the storage chamber is coupled to the application unit, the apparatus performs: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the apparatus further comprising a device for iterating an operation of moving the application unit parallel and/or vertical to the screen mask or the application object, relative to each other, while the application unit is kept in contact with the screen mask or the application object or another object different from the application object at an opening-absent part of the screen mask or on the application object or on the different object, or iterating an operation of inflating and deflating a capacity of the storage chamber, or iterating these operations in combination, to thereby adjust a viscosity of the viscous material in the storage chamber.

According to a thirty-eighth aspect of the present invention, there is provided an apparatus for applying a viscous material as described in the thirty-seventh aspect, the apparatus further comprising a device for detecting the viscosity of the viscous material in the storage chamber, whereby the viscosity adjusting device is controlled according to a detected viscosity.

According to a thirty-ninth aspect of the present invention, there is provided an apparatus for applying a viscous material, comprising an application unit having: a storage chamber for the viscous material; a discharge hole for the viscous material provided so as to communicate with the storage chamber; and a discharge-pressure adjusting device for imparting a discharge pressure to the viscous material stored in the storage chamber, where a viscous-material feeding device for feeding the viscous material to the storage chamber is coupled to the application unit, the apparatus performs: bringing a screen mask having openings corresponding to an application object or the application object and the discharge hole of the application unit into contact with each other; moving either the application unit and the screen mask or the application unit and the application object relative to each other while imparting the discharge pressure to the viscous material in the storage chamber; and applying the viscous material onto the application object, the apparatus further comprising a device for detecting a viscosity of the viscous material in the storage chamber, whereby a discharge pressure of the viscous material is adjusted according to a detected viscosity.

According to a fortieth aspect of the present invention, there is provided an apparatus for applying a viscous material as described in the thirty-eighth aspect, wherein the viscosity detecting device comprises pressure detecting devices provided on both sides of a direction of the move of the application unit in the storage chamber, whereby the viscosity is detected by a differential pressure between the pressure detecting devices.

According to a forty-first aspect of the present invention, there is provided an apparatus for applying a viscous material as described in the thirty-eighth aspect, wherein the viscosity detecting device comprises a device for detecting a moving load resulting during the relative move of the application unit as it is kept in contact with the screen mask or the application object or the different object, whereby the viscosity is detected by a magnitude of the load.

According to a forty-second aspect of the present invention, there is provided an apparatus for applying a viscous material as described in the thirty-eighth aspect, wherein the viscosity detecting device comprises a device for detecting an electric current flowing through a drive motor during the relative move of the application unit as the application unit is kept in contact with the screen mask or the application object or the different object, whereby the viscosity is detected by a magnitude of the current value.

According to a forty-third aspect of the present invention, there is provided an apparatus for applying a viscous material, the apparatus comprising an application unit having: a storage chamber for the viscous material; a discharge hole for the viscous material provided so as to communicate with the storage chamber; and a discharge-pressure adjusting device for imparting a discharge pressure to the viscous material stored in the storage chamber, where a viscous-material feeding device for feeding the viscous material to the storage chamber is coupled to the application unit, the apparatus performing: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the apparatus further comprising a data table stored in a control section, the table defining viscosity-adjusting conditions or application conditions such as viscosity-adjusting time, number of times of viscosity-adjusting operations, and discharge pressure according to qualities of the viscous material, patterns of application, characteristics of the application object, or the like.

In the viscous material application method of the present invention, by using an application unit having: a storage chamber for the viscous material; a discharge hole for the viscous material provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprising: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the method further comprising iterating an operation of moving the application unit parallel and/or vertical to the screen mask or the application object or another object different from the application object, relative to each other, while the application unit is kept in contact with the screen mask or the application object or the different object at an opening-absent part of the screen mask or on the application object or on the different object, to thereby stir the viscous material in the storage chamber. Therefore, the viscous material can be stirred effectively, and thus adjusted in its viscosity, without requiring the provision of any special stirring device at the discharge hole part and without adversely affecting high-precision control or responsivity of the discharge pressure. Thus, successful application quality can be obtained stably.

Also, in the case where during the stirring of the viscous material, the screen mask or the application object or the different object is supported on its one-side surface opposite to its surface with which the application unit is to be brought into contact, the screen mask or the application object or the different object, even if the application unit is pressed thereagainst, can be prevented from occurrence of flexure during the stirring operation.

Also, in the case where the internal space of the storage chamber is iteratively increased and decreased to thereby stir the viscous material in the storage chamber, the viscous material can likewise be stirred effectively, and thus adjusted in its viscosity, so that successful application quality can be obtained stably.

Also, in the case where the viscous material application method further comprises iterating, in combination, both an operation of moving the application unit parallel and/or vertical to the screen mask or the application object or another object different from the application object, relative to each other, while the application unit is kept in contact with the screen mask or the application object or the different object at an opening-absent part of the screen mask or on the application object or on the different object, and an operation of increasing and decreasing the space of the storage chamber, to thereby stir the viscous material in the storage chamber, the combined use of these two processes allows the viscous material to be stirred further effectively, and adjusted in its viscosity, so that successful application quality can be obtained stably.

Also, in the case where the viscous material application method further comprises measuring the viscosity of the viscous material and, upon an arrival at a specified viscosity, halting the stirring of the viscous material and applying the viscous material onto the application object, the viscous material can be applied in an optimum viscosity state by detecting the viscosity of the viscous material, so that successful application quality can be obtained.

Also, in the case where the viscous material application method further comprises measuring the viscosity of the viscous material and, according to a detected viscosity, adjusting the viscous-material discharge pressure or halting the application, a proper discharge pressure can be imparted according to the viscosity of the viscous material, so that successful application quality can be obtained.

Also, the viscous material application method further comprises moving the application unit along the screen mask or the application object or the different object, relative to each other, while the discharge hole of the application unit is kept in contact with the screen mask or the application object or the different object, and detecting a differential pressure of the viscous material between both sides of a direction of the move in the storage chamber or detecting a moving load during the move or detecting an electric current flowing through a motor that drives the move, to thereby measure the viscosity of the viscous material. Therefore, the viscosity of the viscous material stored in the storage chamber can be detected simply and accurately.

Also, the viscous material application method further comprises: performing control of viscous-material viscosity adjustment or discharge-pressure adjustment by preliminarily storing in a control section, a data table defining viscosity-adjusting time, discharge pressure, and number of applications for changing the number of times of viscosity-adjusting operations, or the like according to qualities of the viscous material, characteristics of the screen mask or the application object, or the like and referencing the data table. In this case, successful application quality can be obtained as in the above case without detecting the viscosity.

Also, in the viscous material application apparatus of the present invention, the apparatus comprises the application unit having: the storage chamber for the viscous material; the discharge hole for the viscous material provided so as to communicate with the storage chamber; and the discharge-pressure adjusting device for imparting a discharge pressure to the viscous material stored in the storage chamber, where the viscous-material feeding device for feeding the viscous material to the storage chamber is coupled to the application unit, the apparatus performs: bringing the screen mask having the openings corresponding to the application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the apparatus further comprising the device for iterating the operation of moving the application unit parallel and/or vertical to the screen mask or the application object, relative to each other, while the application unit is kept in contact with the screen mask or the application object or the another object different from the application object at the opening-absent part of the screen mask or on the application object or on the different object, or iterating the operation of inflating and deflating the capacity of the storage chamber, or iterating these operations in combination, to thereby adjust the viscosity of the viscous material in the storage chamber. Therefore, the viscous material can be stirred effectively, and thus adjusted in its viscosity, without adversely affecting high-precision control or responsivity of the discharge pressure as described above. Thus, successful application quality can be obtained stably.

Also, the viscous material application apparatus further comprises the device for detecting the viscosity of the viscous material in the storage chamber, whereby the viscosity adjusting device is controlled according to the detected viscosity. Then, the viscous material can be applied in an optimum viscosity state as described above, so that successful application quality can be obtained.

Also, the viscous material application apparatus further comprises the device for detecting the viscosity of the viscous material in the storage chamber, whereby the discharge pressure of the viscous material is adjusted according to the detected viscosity. In this case, a proper discharge pressure can be imparted according to the viscosity of the viscous material as described above, so that successful application quality can be obtained.

Also, in the viscous material application apparatus, it is preferable that the viscosity detecting device comprises the pressure detecting devices provided on both sides of the direction of the move of the application unit in the storage chamber, whereby the viscosity is detected by the differential pressure between the pressure detecting devices, or that the viscosity detecting device comprises the device for detecting the moving load resulting during the relative move of the application unit as the application unit is kept in contact with the screen mask or the application object or the different object, whereby the viscosity is detected by the magnitude of the load, or that the viscosity detecting device comprises the device for detecting the electric current flowing through the drive motor during the move of the application unit as the application unit is kept in contact with the screen mask or the application object or the different object, whereby the viscosity is detected by the magnitude of the current value. In any of these case, the viscosity of the viscous material in the storage chamber can be detected with a simple construction appropriately.

Also, the viscous material application apparatus further comprises comprising the data table stored in a control section, the table defining viscosity-adjusting time, discharge pressure, and number of applications for changing the times of viscosity-adjusting operations according to qualities of the viscous material, characteristics of the screen mask or the application object, or the like. In this case, the viscosity adjustment and the discharge-pressure adjustment of the viscous material can be controlled by referencing this data table as described above, so that successful application quality can be obtained as in the above case without detecting the viscosity.

According to a forty-fourth aspect of the present invention, there is provided an apparatus for applying a viscous material, comprising an application unit having: a storage chamber for the viscous material; a discharge hole for the viscous material provided so as to communicate with the storage chamber; and a discharge-pressure adjusting device for imparting a discharge pressure to the viscous material stored in the storage chamber, where a viscous-material feeding device for feeding the viscous material to the storage chamber is coupled to the application unit, the apparatus performs: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the apparatus further comprising an air bleeding device for discharging out air entrapped in the storage chamber at a time of feed of the viscous material into the storage chamber.

According to a forty-fifth aspect of the present invention, there is provided an apparatus for applying a viscous material as described in the forty-fourth aspect, wherein the air bleeding device is so provided as to confront an end portion inside the storage chamber on one side thereof opposite to the discharge hole.

According to a forty-sixth aspect of the present invention, there is provided an apparatus for applying a viscous material as described in the forty-fourth aspect, wherein the air bleeding device is provided at a vicinity of a final-arrival place of the viscous material in the feed of the viscous material to the storage chamber.

According to a forty-seventh aspect of the present invention, there is provided an apparatus for applying a viscous material as described in the forty-fourth aspect, wherein the air bleeding device is implemented by an air bleeder passage having a minute passage cross section that inhibits the viscous material from passing therethrough but permits the air to pass therethrough.

According to a forty-eighth aspect of the present invention, there is provided an apparatus for applying a viscous material as described in the forty-seventh aspect, wherein the air bleeding device is implemented by an air bleeding sheet in which pits and projections that form air bleeding passages are formed on at least one surface thereof, the air bleeding sheet being provided between or among junction surfaces of a plurality of members constituting the storage chamber.

According to a forty-ninth aspect of the present invention, there is provided an apparatus for applying a viscous material as described in the forty-seventh aspect, wherein the air bleeding device is implemented by an air bleeding sheet formed of a foamed body having communicating voids, the air bleeding sheet being provided between or among junction surfaces of a plurality of members constituting the storage chamber.

According to a fiftieth aspect of the present invention, there is provided an apparatus for applying a viscous material as described in the forty-seventh aspect, wherein the air bleeding device is formed of a foamed body having communicating voids, the foamed body being so provided that one end thereof confronts the storage chamber and the other end confronts outside.

According to a fifty-first aspect of the present invention, there is provided an apparatus for applying a viscous material as described in the forty-seventh aspect, wherein the air bleeding device is implemented by pits and projections which are formed so as to form air bleeder passages in a fixed portion provided between or among junction surfaces of a plurality of members constituting the storage chamber in a bag part serving as the discharge-pressure adjusting device.

According to a fifty-second aspect of the present invention, there is provided an apparatus for applying a viscous material as described in the forty-seventh aspect, wherein the air bleeding device is implemented by pits and projections which are formed so as to form air bleeding passages on at least one of junction surfaces of a plurality of members constituting the storage chamber.

According to a fifty-third aspect of the present invention, there is provided an apparatus for applying a viscous material as described in the fifty-second aspect, wherein the one of the junction surfaces of a plurality of members constituting the storage chamber, on which the pits and projections are formed, is subjected to a mold release treatment such as fluorine coating treatment.

In the viscous material application apparatus of the present invention, the apparatus comprises the application unit having: the storage chamber for the viscous material; the discharge hole for the viscous material provided so as to communicate with the storage chamber; and the discharge-pressure adjusting device for imparting the discharge pressure to the viscous material stored in the storage chamber, where the viscous-material feeding device for feeding the viscous material to the storage chamber is coupled to the application unit, the apparatus performs: bringing the screen mask having the openings corresponding to the application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the apparatus further comprising the air bleeding device for discharging out the air entrapped in the storage chamber at the time of the feed of the viscous material into the storage chamber. Therefore, since air never remains in the storage chamber at the end of the feed of the viscous material into the storage chamber, the discharge pressure can be controlled with high precision, so that high-quality application can be achieved.

Also, in the case where the air bleeding device is so provided as to confront the end portion inside the storage chamber on the one side thereof opposite to the discharge hole, air is more likely to be bled toward the discharge hole side and more likely to be entrapped on its opposite side, so that the air can be bled effectively.

Also, in the case where the air bleeding device is provided at the vicinity of the final-arrival place of the viscous material in the feed of the viscous material to the storage chamber, the residual air in the storage chamber flows toward the final-arrival place of the viscous material, so that the air can be discharged out securely and bled effectively.

Also, in the case where the air bleeding device is implemented by the air bleeder passage having the minute passage cross section that inhibits the viscous material from passing therethrough but permits the air to pass therethrough, the air within the storage chamber is discharged outside through the air bleeding passage in the feed of the viscous material to the storage chamber, where once the viscous material is filled in the storage chamber, the viscous material, although tending to enter the air bleeding passage and flow out, yet is inhibited from passing through due to its viscosity, surface tension, or the like. Then, the air bleeding passage is closed by the viscous material itself, causing the storage chamber to be closed. Thus, effective air bleeding can be achieved with a simple construction and low cost, without adversely affecting the discharge pressure.

More specifically, the air bleeding device may be implemented by: the air bleeding sheet in which the pits and projections that form the air bleeding passages are formed on at least one surface thereof, the air bleeding sheet being provided on the junction surfaces of the plurality of members constituting the storage chamber; or by the air bleeding sheet formed of the foamed body having the communicating voids, the air bleeding sheet being provided on the junction surfaces of the plurality of members constituting the storage chamber; or by the foamed body having the communicating voids, the foamed body being so provided that the one end thereof confronts the storage chamber and the other end confronts outside; or by the pits and projections which are formed so as to form the air bleeder passages in the fixed portion provided on the junction surfaces of the plurality of members constituting the storage chamber in the bag part serving as the discharge-pressure adjusting device; or by the pits and projections which are formed so as to form the air bleeding passages on at least one of the junction surfaces of the plurality of members constituting the storage chamber. In the latter two cases, since no additional component parts are needed, a cost reduction can be fulfilled. In the last case, subjecting the pits-and-projections-formed surface of the junction surfaces of the plurality of members constituting the storage chamber to the mold release treatment such as fluorine coating treatment makes it possible to simply remove the viscous material that has entered the air bleeding passages at the re-feed of the viscous material, thus allowing the air bleeding passage to be regenerated.

According to a fifty-fourth aspect of the present invention, there is provided a method for applying a viscous material, by using an application unit having: a storage chamber for the viscous material; a discharge hole for the viscous material provided so as to communicate with the storage chamber, where a viscous-material feeding device for feeding the viscous material to the storage chamber is coupled to the application unit; and a discharge-pressure adjusting device for imparting a discharge pressure to the viscous material stored in the storage chamber, the method comprising: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the method further comprising: in an operation of the application unit, pressing either the discharge hole and the screen mask or the discharge hole and the application object against each other; and, before the operation of the application unit and upon an end of the operation, performing such a positioning that either the discharge hole and the screen mask or the discharge hole and the application object are brought into contact with each other.

According to a fifty-fifth aspect of the present invention, there is provided a method for applying a viscous material as described in the fifty-fourth aspect, wherein the operation of the application unit is an operation of imparting the discharge pressure to the viscous material by the discharge-pressure adjusting device.

According to a fifty-sixth aspect of the present invention, there is provided a method for applying a viscous material as described in the fifty-fourth aspect, wherein the operation of the application unit is an operation of feeding the viscous material to the storage chamber by the viscous-material feeding device.

According to a fifty-seventh aspect of the present invention, there is provided a method for applying a viscous material as described in the fifty-fourth aspect, wherein the operation of the application unit includes an operation of imparting the discharge pressure to the viscous material by the discharge-pressure adjusting device and an operation of feeding the viscous material to the storage chamber by the viscous-material feeding device, the method further comprising changing an amount of the pressing at both of the operation of imparting the discharge pressure to the viscous material and the operation of feeding the viscous material to the storage chamber.

According to a fifty-eighth aspect of the present invention, there is provided a method for applying a viscous material as described in the fifty-sixth aspect, the method further comprising, in feed of the viscous material to the storage chamber, detecting a pressure at a vicinity of a final-arrival place of the viscous material to control the feed of the viscous material.

According to a fifty-ninth aspect of the present invention, there is provided a method for applying a viscous material as described in the fifty-sixth aspect, wherein the viscous material is fed to the storage chamber from both ends thereof by their respective viscous-material feeding devices, the method further comprising detecting pressure at both ends, or their vicinities, of the storage chamber to perform monitoring of feed states at both ends by the viscous-material feeding devices as well as feed control thereat.

According to a sixtieth aspect of the present invention, there is provided an apparatus for applying a viscous material, comprising an application unit having: a storage chamber for the viscous material; a discharge hole for the viscous material provided so as to communicate with the storage chamber; and a discharge-pressure adjusting device for imparting a discharge pressure to the viscous material stored in the storage chamber, where a viscous-material feeding device for feeding the viscous material to the storage chamber is coupled to the application unit, the apparatus performs: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the apparatus further comprising a positioning device for positioning the application unit or the screen mask or the application object either to a press position where either the discharge hole and the screen mask or the discharge hole and the application object are pressed against each other, or to a position where either the discharge hole and the screen mask or the discharge hole and the application object are brought into contact with each other.

According to a sixty-first aspect of the present invention, there is provided an apparatus for applying a viscous material as described in the sixtieth aspect, wherein the discharge hole comprises two blades formed of elastic thin plates and disposed in such a shape as to gradually narrow in width from a storage chamber side with a gap between their fore ends, and stoppers for closing their both end portions.

According to a sixty-second aspect of the present invention, there is provided an apparatus for applying a viscous material as described in the sixtieth aspect, wherein the discharge-pressure adjusting device comprises a bag body which is provided so as to extend along a longitudinal direction of the storage chamber while at least partly confronting the storage chamber and whose interior space is expandable and contractible, and a device for supplying and discharging a gas pressure to and from the bag body.

According to a sixty-third aspect of the present invention, there is provided an apparatus for applying a viscous material as described in the sixtieth aspect, wherein the positioning device performs positioning of at least one of the application unit and either the screen mask or the application object with a motor through position adjustment thereof.

According to a sixty-fourth aspect of the present invention, there is provided an apparatus for applying a viscous material as described in the sixtieth aspect, wherein the positioning device moves at least one of the application unit and either the screen mask or the application object with a cylinder and performs the positioning with a stopper device.

According to a sixty-fifth aspect of the present invention, there is provided an apparatus for applying a viscous material as described in the sixty-fourth aspect, wherein the stopper device is switchable among a singularity or plurality of positions where either the discharge hole and the screen mask or the discharge hole and the application object are pressed against each other, a position where either the discharge hole and the screen mask or the discharge hole and the application object are brought into contact with each other, and a positioning-released position.

According to a sixty-sixth aspect of the present invention, there is provided an apparatus for applying a viscous material, comprising an application unit having: a storage chamber for the viscous material; a discharge hole for the viscous material provided so as to communicate with the storage chamber; and a discharge-pressure adjusting device for imparting a discharge pressure to the viscous material stored in the storage chamber, where a viscous-material feeding device for feeding the viscous material to the storage chamber is coupled to the application unit, the apparatus performs: bringing a screen mask having openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, wherein the application unit further comprises a feed passage whose one end communicates with at least one longitudinal end of the storage chamber and whose other end is coupled to the viscous-material feeding device.

According to a sixty-seventh aspect of the present invention, there is provided an apparatus for applying a viscous material as described in the sixty-sixth aspect, wherein the feed passage is formed of a curved surface having such a cross-sectional shape that a cross-sectional area of the curved surface gradually increases from the other end coupled to the viscous-material feeding device toward the one end confronting the storage chamber while a width of the curved surface increases to become more closer to a width of the storage chamber.

According to a sixty-eighth aspect of the present invention, there is provided an apparatus for applying a viscous material as described in the sixty-sixth aspect, wherein at least one inner surface of either the storage chamber or the feed passage is subjected to a surface treatment for reducing frictional resistance such as fluorine coating.

According to a sixty-ninth aspect of the present invention, there is provided an apparatus for applying a viscous material as described in the sixty-eighth aspect, wherein a pressure detecting device is disposed at a vicinity of a final-arrival place of the fed viscous material in the storage chamber.

According to a seventieth aspect of the present invention, there is provided an apparatus for applying a viscous material as described in the sixty-ninth aspect, wherein the pressure detecting device is disposed on the feed passage at both ends or on both sides of the storage chamber.

In the viscous material application method of the present invention, by using the application unit having: the storage chamber for the viscous material; the discharge hole for the viscous material provided so as to communicate with the storage chamber, where the viscous-material feeding device for feeding the viscous material to the storage chamber is coupled to the application unit; and the discharge-pressure adjusting device for imparting the discharge pressure to the viscous material stored in the storage chamber, the method comprises: bringing the screen mask having openings corresponding to the application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the method further comprising: in the operation of the application unit, pressing either the discharge hole and the screen mask or the discharge hole and the application object against each other; and, before the operation of the application unit and upon the end of the operation, performing such a positioning that either the discharge hole and the screen mask or the discharge hole and the application object are brought into contact with each other. Therefore, since the viscous material is stored in the storage chamber, the viscous material is kept away from contact with the air at all times, so that the viscous material can be prevented from deterioration and thus applied stably. Besides, since the discharge hole is placed at such a position as to be in contact with either the screen mask or the application object before the operation or at the end of the operation, the screen mask, when used, is not deformed when the application object is separated from the screen mask, so that the viscous material is prevented from any impairment of transferability or that the application object is prevented from any occurrence of deformation. Furthermore, in the operation, since the discharge hole is pressed against the screen mask or the application object, the viscous material can securely be prevented from leaking even if the discharge pressure is set large to meet finer pitches or higher speeds, so that the viscous material can be applied stably.

The operation of the application unit includes the operation of imparting the discharge pressure to the viscous material by the discharge-pressure adjusting device, and the operation of feeding the viscous material to the storage chamber by the viscous-material feeding device. It may be preferable that an amount of the pressing is changed at the operation of imparting the discharge pressure to the viscous material and at the operation of feeding the viscous material to the storage chamber.

Also, it is preferable that, in the feed of the viscous material to the storage chamber, the pressure is detected at the vicinity of the final-arrival place of the viscous material to control the feed of the viscous material.

Also, it is also possible that the viscous material is fed to the storage chamber from both ends thereof by their respective viscous-material feeding devices, where the method further comprises detecting the pressures at both ends, or their vicinities, of the storage chamber to perform the monitoring of the feed states at both ends by the viscous-material feeding device as well as the feed control thereat.

Further, in the viscous material application apparatus of the present invention, the apparatus comprises the application unit having: the storage chamber for the viscous material; the discharge hole for the viscous material provided so as to communicate with the storage chamber; and the discharge-pressure adjusting device for imparting the discharge pressure to the viscous material stored in the storage chamber, where the viscous-material feeding device for feeding the viscous material to the storage chamber is coupled to the application unit, the apparatus performs: bringing the screen mask having the openings corresponding to the application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, the apparatus further comprising the positioning device for positioning the application unit or the screen mask or the application object either to a press position where either the discharge hole and the screen mask or the discharge hole and the application object are pressed against each other, or to a position where either the discharge hole and the screen mask or the discharge hole and the application object are brought into contact with each other. Therefore, the apparatus is enabled to execute the above application methods to produce their effects.

Also, in the case where the discharge hole comprises the two blades formed of the elastic thin plates and disposed in such a shape as to gradually narrow in width from the storage chamber side with a gap between their fore ends, and the stoppers for closing their both end portions, the positional control for switching between the press and the contact can be achieved simply- and properly.

Also, in the case where the discharge-pressure adjusting device comprises the bag body which is provided so as to extend along the longitudinal direction of the storage chamber while at least partly confronting the storage chamber and whose interior space is expandable and contractible, and the device for supplying and discharging the gas pressure to and from the bag body, the flexible bag body provided extending in the longitudinal direction of the storage chamber makes close contact with the viscous material in the storage chamber, thus enabled to apply the pressure directly to the viscous material, so that the discharge pressure can be controlled uniformly with good responsivity and high precision over the entire length of the storage chamber.

The positioning device may perform positioning of at least one of the application unit and either the screen mask or the application object with the motor through positional adjustment. Further, in the case where the positioning device moves at least one of the application unit and either the screen mask or the application object with the cylinder and performs its positioning with the stopper device, the positioning can be done while using the cylinder, so that the positioning can be achieved securely with simple control. Moreover, by throwing the stopper into an inactive state, the prior-art application method with the squeegee in which a constant pressure is used for the pressing become selectively workable.

Also, it is preferable that the stopper device is switchable among the singularity or plurality of positions where either the discharge hole and the screen mask or the discharge hole and the application object are pressed against each other, the position where either the discharge hole and the screen mask or the discharge hole and the application object are brought into contact with each other, and the positioning-released position.

Also, in the viscous material application apparatus of the present invention, the apparatus comprises the application unit having: the storage chamber for the viscous material; the discharge hole for the viscous material provided so as to communicate with the storage chamber; and the discharge-pressure adjusting device for imparting the discharge pressure to the viscous material stored in the storage chamber, where the viscous-material feeding device for feeding the viscous material to the storage chamber is coupled to the application unit, the apparatus performs: bringing the screen mask having the openings corresponding to an application object or the application object itself and the discharge hole of the application unit into contact with each other; moving either the application unit and the screen mask or the application unit and the application object relative to each other while imparting the discharge pressure to the viscous material in the storage chamber; and applying the viscous material onto the application object, wherein the application unit further comprises the feed passage whose one end communicates with at least one longitudinal end of the storage chamber and whose other end is coupled to the viscous-material feeding device. Therefore, since the viscous material is fed into the storage chamber from the end thereof, the viscous material in the storage chamber can be replaced efficiently with the material characteristics maintained, so that stable application quality can be obtained.

Also, in the case where the feed passage is formed of the curved surface having such a cross-sectional shape that the cross-sectional area of the curved surface gradually increases from the other end coupled to the viscous-material feeding device toward the one end confronting the storage chamber while the width of the curved surface increases to become more closer to the width of the storage chamber, the viscous material is accelerated to flow, allowing the viscous-material feeding force to be reduced and allowing the feed time to be shortened. Moreover, the viscous material becomes less likely to remain at the ends of the storage chamber, so that stable application quality can be obtained.

Also, in the case where at least one inner surface of either the storage chamber or the feed passage is subjected to the surface treatment for reducing frictional resistance such as fluorine coating, the moving resistance during the feed of the viscous material can be reduced so that the feed time can be shortened.

Also, in the case where the pressure detecting device is disposed at the vicinity of the final-arrival place of the fed viscous material in the storage chamber, a fullness of the viscous material in the storage chamber can be detected accurately.

Also, in the case where the pressure detecting device is disposed on the feed passage at both ends or on both sides of the storage chamber, the monitoring of feed state at both ends by the viscous-material feeding device as well as the feed control thereat can be performed.

According to a seventy-first aspect of the present invention, there is provided an apparatus for applying a viscous material, comprising:

an apparatus main-body having a storage chamber for storing therein a viscous material in communication with a discharge hole;

viscous-material feeding devices placed at both ends of the storage chamber and serving for pressure-feeding the viscous material;

a sheet- or bag-like discharge-pressure adjusting device which is placed in confrontation with interior of the storage chamber or with the storage chamber, and which is to be expanded to adjust a discharge pressure when the viscous material stored in the storage chamber is pressurized and discharged;

a moving device for moving the apparatus main-body on an application object, relative to each other, along a plane parallel to an application surface of the application object when the viscous material is discharged; and a flow-regulating member for, in a discharge of the viscous material, providing a stagnation point in a flow of the viscous material within the storage chamber generated during the move along the surface parallel to the application surface of the application object while the viscous material in the storage chamber is pressurized by the discharge-pressure adjusting device.

According to a seventy-second aspect of the present invention, there is provided an apparatus for applying a viscous material according to the first aspect, wherein the viscous-material feeding device feeds the viscous material continuously by replacement of a viscous-material feed cartridge, and wherein in order that the replacement of the viscous-material feed cartridge is carried out on a front side of an operator, the viscous-material feed cartridge, if positioned on a rear side of the operator, is moved along the plane parallel to the application surface of the application object so as to be placed on the front side, while a printing operation for one piece of the application object is performed, and thereafter halted on the front side of the operator.

According to a seventy-third aspect of the present invention, there is an apparatus for applying a viscous material, comprising:

an apparatus main-body having a storage chamber for storing therein a viscous material in communication with a discharge hole;

viscous-material feeding devices placed at both ends of the storage chamber and serving for pressure-feeding the viscous material;

a sheet- or bag-like discharge-pressure adjusting device which is placed in confrontation with interior of the storage chamber or with the storage chamber, and which is to be expanded to adjust a discharge pressure when the viscous material stored in the storage chamber is pressurized and discharged;

a moving device for moving the apparatus main-body on an application object, relative to each other, along a plane parallel to an application surface of the application object when the viscous material is discharged;

blades placed in a lower part of the apparatus main-body so as to be opposed to each other with a constant slope; and sponge-like sealing materials placed in vicinities of both ends of the blades, wherein the blades and the sealing materials of the apparatus main-body are brought into contact with the application object to make the blades flexed, whereby the storage chamber for the viscous material is closed.

According to a seventy-fourth aspect of the present invention, there is provided an apparatus for applying a viscous material according to the third aspect, wherein an angle to which the blades are flexed is 10° to 70°.

According to a seventy-fifth aspect of the present invention, there is provided an apparatus for applying a viscous material, comprising:

an apparatus main-body having a storage chamber for storing therein a viscous material in communication with a discharge hole;

viscous-material feeding devices placed at both ends of the storage chamber and serving for pressure-feeding the viscous material;

a sheet- or bag-like discharge-pressure adjusting device which is placed in confrontation with interior of the storage chamber or with the storage chamber, and which is to be expanded to adjust a discharge pressure when the viscous material stored in the storage chamber is pressurized and discharged;

a moving device for moving the apparatus main-body on an application object, relative to each other, along a plane parallel to an application surface of the application object when the viscous material is discharged; and an elevating-and-lowering driver device for elevating and lowering the apparatus main-body at least among a push-in origin position, a viscous-material feed position which is lower than the push-in origin position and at which the viscous material is fed, and a printing position which is lower than the push-in origin position and at which the viscous material is applied and printed onto the application object, wherein a push-in amount of the apparatus main-body to the application object at the viscous-material feed position is larger than a push-in amount of the apparatus main-body to the application object at the printing position.

It is noted that any arbitrary aspects out of the above various aspects, that is, the first to seventy-fifth aspects may be combined, as required, so that their respective effects can be produced.

BRIEF DESCRIPTION OF THE DRAWINGS

These and other aspects and features of the present invention will become clear from the following description taken in conjunction with the preferred embodiments thereof with reference to the accompanying drawings, in which:

FIGS. 1A and 1B are a longitudinal-section front view and a longitudinal-section side view, respectively, showing the construction of an application head in a viscous material application apparatus according to a first embodiment of the present invention;

FIG. 16 is an explanatory view of a second process example of the separation step in which the application unit is separated from the screen mask in the second embodiment;

FIG. 17 is an explanatory view of a third process example of the separation step in which the application unit is separated from the screen mask in the second embodiment;

FIG. 21 is a partial cross-sectional side view showing the schematic construction of an application head part in the third embodiment;

FIG. 36 is a front view showing general construction of a viscous material application apparatus according to a fifth embodiment of the present invention;

FIGS. 44A and 44B are front views showing general construction of another modification of the fifth embodiment;

FIGS. 49A and 49B are a side view and a plan view, respectively, of the partitioning plate of the viscous material application apparatus according to the sixth embodiment of the present invention;

FIGS. 73A, 73B, and 73C are a longitudinal-section side view, a front view, and a plan view, respectively, of the sheet holder in the viscous material application apparatus according to the seventh embodiment of the present invention;

FIGS. 75 and 76 are views of a data input screen and a table, respectively, in controlling the printing operation of the viscous material application apparatus according to the seventh embodiment of the present invention;

DETAILED DESCRIPTION OF THE PREFERRED EMBODIMENTS

Figure 2A:
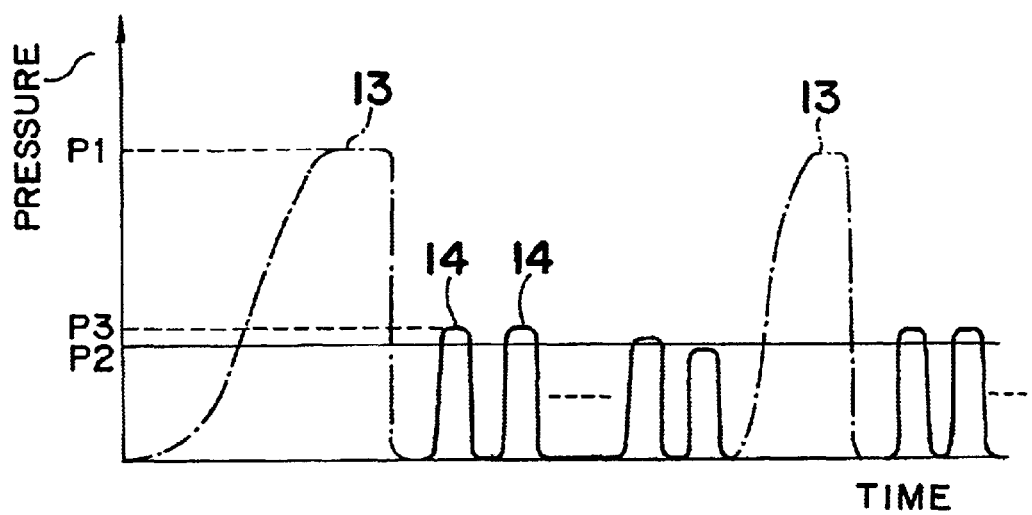
FIGS. 2A and 2B are graphs showing pressure changes inside a storage chamber in two methods for feeding a viscous material to the storage chamber in the first embodiment.

Before the description of the present invention proceeds, it is to be noted that like parts are designated by like reference numerals throughout the accompanying drawings.

Hereinbelow, embodiments according to the present invention are described in detail with reference to the accompanying drawings.

(First Embodiment)

A viscous material application apparatus of a first embodiment of the present invention is described below with reference to FIGS. 1 to 7.

An application head in the viscous material application apparatus of the first embodiment is composed mainly of a material feed section 1, an air feed section 2, and an application unit 3 as shown in FIG. 1. In the material feed section 1, a viscous material 4 such as adhesive or solder paste is stored in a syringe-like storage tank 1b, where as a plunger 1a is activated by compressed air serving for material feed, the viscous material 4 is pressurized and pressure-fed so as to be filled up in a chamber 3a, which is a storage chamber for the viscous material 4 in the application unit 3.

The chamber 3a of the application unit 3 and the material feed section 1 are coupled to each other by joints 5, and the viscous material 4 is fed into the chamber 3a by passing through feed passages 5a provided in the joints 5.

On both sides under the chamber 3a, two blades 6 each formed of a thin plate having elasticity are attached with blade holders 7 so as to approach each other downward with a gap of about 10 mm formed between their fore ends, where a discharge hole 8 for discharging out the viscous material 4 is formed by the opening between the two blades 6. The blades 6 are each formed of a thin plate of copper, stainless, resin, or the like having a thickness of, for example, about 0.1 to 0.5 mm, where resin materials such as polyimides or polyamides-imides are particularly preferable.

Stoppers 9 are disposed at both ends of the two blades 6 to prevent the viscous material 4 from leaking from the chamber 3a. The stoppers 9 are held by the joints 5 so as not to be disengaged by the pressure applied to the viscous material 4.

On one side of the chamber 3a opposite to the discharge hole 8, that is, on the upper side of the chamber 3a, a bag (inflatable-and-deflatable bag part or bag member, or sheet or bag) 10 formed of a sheet having depressions is disposed along the longitudinal direction of the chamber 3a over the generally entire length so as to partly confront the inside of the chamber 3a in opposition to the discharge hole 8, the bag 10 being sandwiched and fixed by the chamber 3a and a plate 3b that closes the upper part of the chamber 3a. The sheet or bag 10 is so made as to be increased and decreased in internal capacity by air being fed and discharged from the air feed section 2 via an air port 2a. The sheet or bag 10 is formed of a resin material, such as urethane elastomer, polyethylene, or nylon, having a thickness of about 0.03 to 1 mm, and more preferably, about 0.3 to 0.5 mm. It is noted that the sheet or bag 10, although varying depending on the pressure of the air fed, may be broken when its film thickness is too thin, and may result in a poor inflation-and-deflation responsivity when the film thickness is too thick.

After the viscous material is fed into the chamber 3a, feeding air to the sheet or bag 10 causes the viscous material 4 to be pressed at a specified pressure so that a discharge pressure for application of the viscous material 4 can be given. Discharging the air from the sheet or bag 10 allows the discharge pressure to be released instantaneously.

In a portion of the sheet or bag 10 sandwiched and fixed by the chamber 3a and the plate 3b, an air bleeding sheet 11 for bleeding the air is disposed at the underside of the sheet or bag 10, so that at the first feed of the viscous material 4 from the material feed section 1 into the chamber 3a, the air within the chamber 3a can be bled from the air bleeding sheet 11.

In the center of the chamber 3a, the sheet or bag 10 is not provided, and a pressure detecting device 12 for detecting the pressure of the viscous material 4 in the chamber 3a is provided at that place.

Next, pressure variations inside the chamber 3a during the feed of the viscous material 4 and its application onto an application object 50, which is an object to which the viscous material is to be applied, are explained in two methods of feeding the viscous material 4 into the chamber (storage chamber) of the application unit 3 with reference to FIG. 2.

Figure 2B:
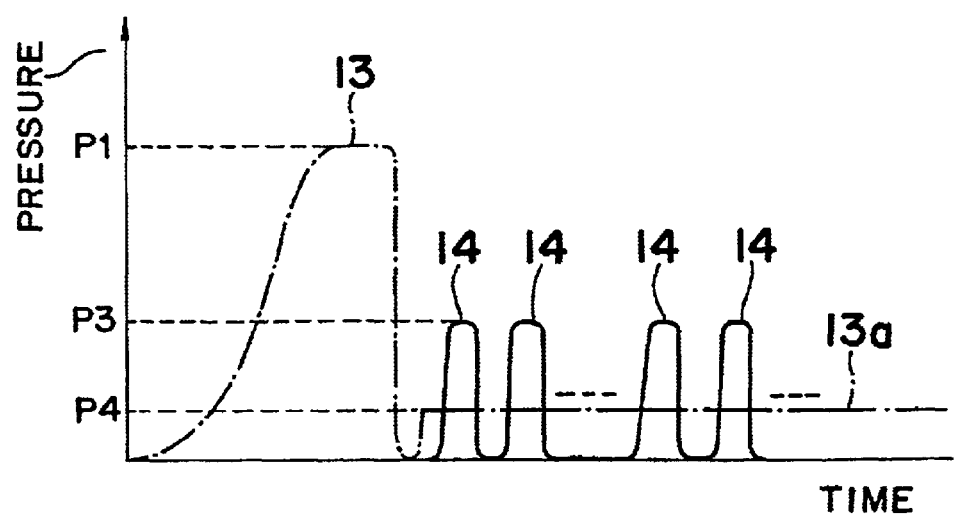

In FIG. 2, FIG. 2A shows pressure variations in a first feed method, and FIG. 2B shows pressure variations in a second feed method.

Referring to FIG. 2A showing the first feed method, the detected pressure is 0 at the beginning because no viscous material 4 is present in the chamber 3a, but the pressure goes higher gradually as the viscous material 4 is fed from the material feed section 1 into the chamber 3a. In the figure, a feed pressure 13 inside the chamber 3a at the time of feed by the material feed section 1 is depicted by one-dot chain line. Given that the pressure resulting upon a full feed of the viscous material 4 into the chamber 3a, being assumed to be P1, is preliminarily registered in a control section of the viscous material application apparatus, then the pressure detected by the pressure detecting device 12 reaches P1 or higher, meaning that the viscous material 4 has been fed enough into the chamber 3a, causes the feed to be halted.

Next, in the application of the viscous material 4 onto the application object 50, the sheet or bag 10 is pressurized by the air feed section 2 so that the pressure of the viscous material 4 inside the chamber 3a becomes a pressure P3 equal to or higher than a pressure P2 necessary for the application. In this connection, discharge pressure 14 inside the chamber 3a during the application is shown by solid line.

Next, because repeating the application causes the viscous material 4 in the chamber 3a to decrease in amount so that the discharge pressure 14 falls below the pressure P2, which is necessary for application, here arises a need for feeding the viscous material 4 into the chamber 3a. After the feed, application operation can be carried out in a similar manner.

However, since the pressure P1 inside the chamber 3a during the feed of the viscous material 4 is set larger than the pressure P3 for application so that the feed can be completed in shorter time, it is necessary to keep the application operation halted while the viscous material 4 is being fed.

Thus, referring to FIG. 2B showing the second feed method, although the viscous material 4 is fed up to the pressure P1 similarly at beginning stages because the chamber 3a is empty, yet thereafter the viscous material 4 is kept being fed into the chamber 3a at all times at a feed pressure 13a, which is a pressure P4 lower than the pressure P3 for application, for example, at a discharge pressure P3 of 0.1 to 0.15 kgf/cm², which is about one half of the pressure P3 that is normally 0.2 to 0.3 kgf/cm². By adopting such a feed method, the application operation can be carried out continuously without halting the application operation on account of material feed.

In this case, the feed pressure 13a (P4) is set to a pressure that is as high as possible within such a limit that the viscous material 4 does not leak from the discharge hole 8 even if a screen mask 53 is not supported from the underside. However, some viscous materials 4, depending on their characteristic, are difficult to feed with such a pressure. In such a case, the pressure P4 may be applied while the screen mask 53 is supported.

The feed pressure into the chamber 3a needs to be a pressure at a place where the viscous material 4 has come into the chamber 3a via the joints 5, i.e. in the case of the chamber 3a of the first embodiment, a pressure at both end portions of the chamber 3a. This is due to the fact that increase in the pressure at both end portions equal to or higher than the discharge pressure would give rise to pressure variations in the longitudinal direction of the chamber 3a.

The pressures P1 to P4, although largely depending on characteristics and productivity of the viscous material 4, are set to a relationship, for example, that (P1=0.1 MPa)>(P3= 0.03 MPa)>(P2=0.025 MPa)>(P4=0.01 MPa).

Next, operations of the application unit 3 during the feed of the viscous material 4 into the chamber 3a, and during the subsequent application are explained with reference to FIGS. 3 to 7.

Figure 3:
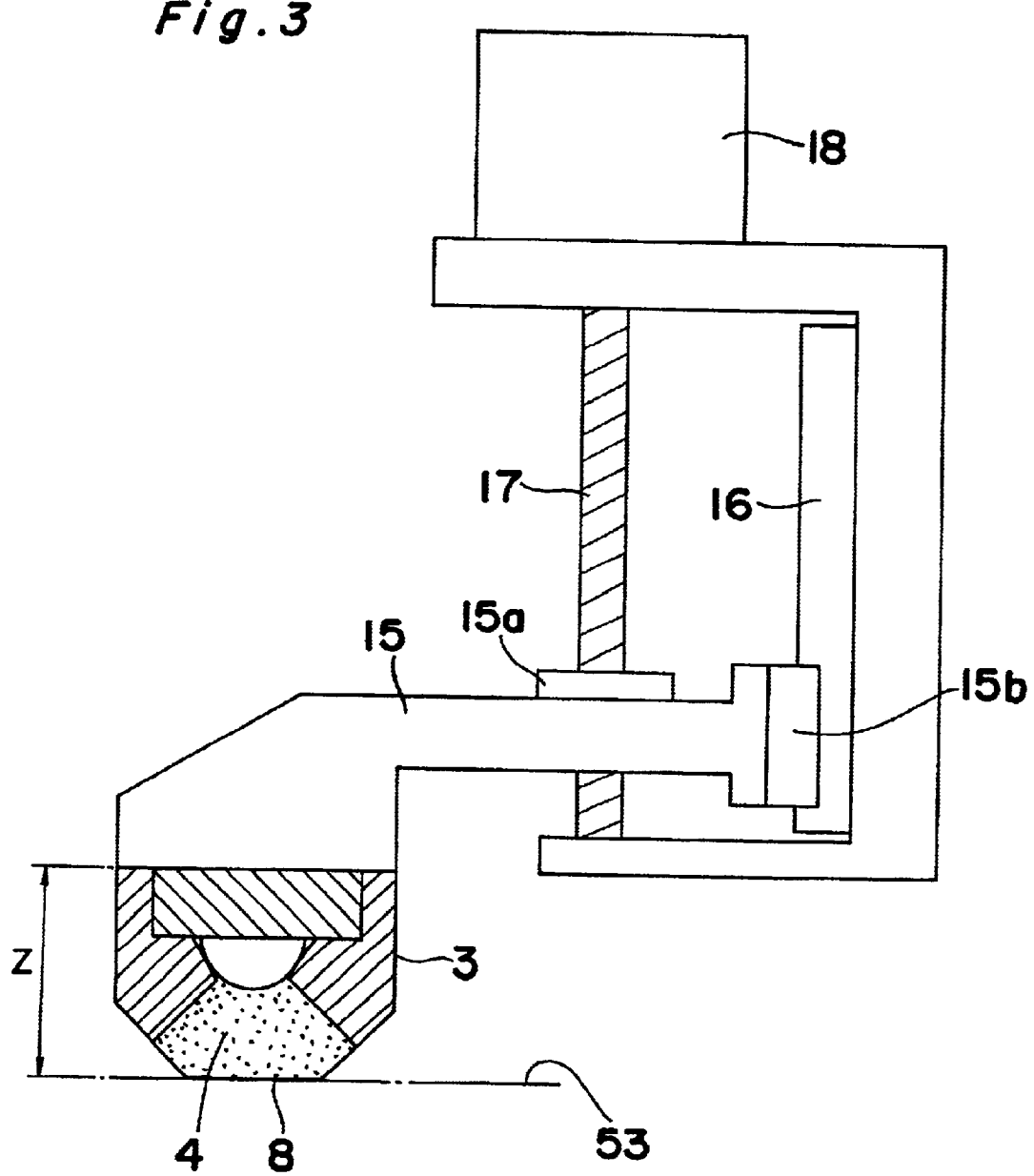
FIG. 3 is a schematic diagram of a vertical positioning device for positioning a vertical position of an application unit in the first embodiment.

As shown in FIG. 3, the application unit 3 is up- and -down movably supported by a guide 16 via a slide portion 15b of a bracket 15, and also is up-and-down drivable by a feed screw mechanism 17 and a motor 18, where a nut portion 15a of the bracket 15 is screwed to the feed screw mechanism 17, thus the application unit 3 being positionable at any arbitrary vertical position. In this case, the height of the application unit 3 with the discharge hole 8 kept in contact with the screen mask 53 is assumed to be Z.

Figure 4A:
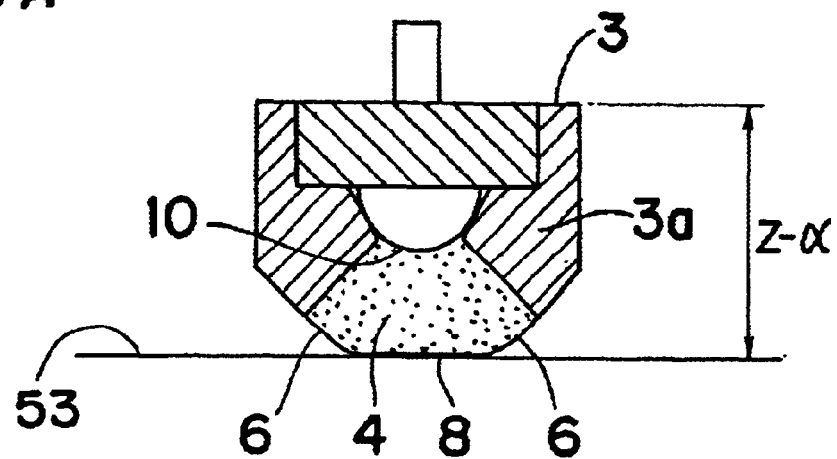
FIGS. 4A and 4B are longitudinal-section side views of main parts showing a viscous-material feed state and an application state in the same embodiment.

FIG. 4 shows a first operational aspect of feed and application. At times other than when the viscous material 4 is fed into the chamber 3a and when the application is carried out, the discharge hole 8 is brought into contact with the screen mask 53 as shown in FIG. 3, so that the height of the application unit 3 becomes Z. However, when the viscous material 4 is fed into the chamber 3a, the discharge hole 8 is pressed against the screen mask 53 as shown in FIG. 4A, so that the height of the application unit 3 becomes Z-α. Also, at the time of feed, air is fed to the sheet or bag 10 so that the sheet or bag 10 is preliminarily inflated. Since the height of the application unit 3 is changeable by virtue of the discharge hole 8's elastic deformability effectuated by the flexure of the blades 6, and since the blades 6 and the screen mask 53 are normally kept in contact with each other, the viscous material 4 within the chamber 3a never leaks. When the feed of the viscous material 4 is completed, the air of the sheet or bag 10 is discharged out. As a result of this, the residual pressure inside the chamber 3a due to the feed of the viscous material 4 is absorbed, so that the pressure inside the chamber 3a immediately after the feed can instantaneously be brought to nearly 0 as shown in FIG. 2. Thus, such a possibility that the discharge pressure during the application may vary due to the residual pressure and, as a result, that the application quality may degrade, can be prevented. After the end of this feed, the application unit 3 is lifted up to the height Z where the discharge hole 8 makes contact with the screen mask 53, whereas the application unit 3 may enter the subsequent application operation in the position as it is.

Figure 4B:
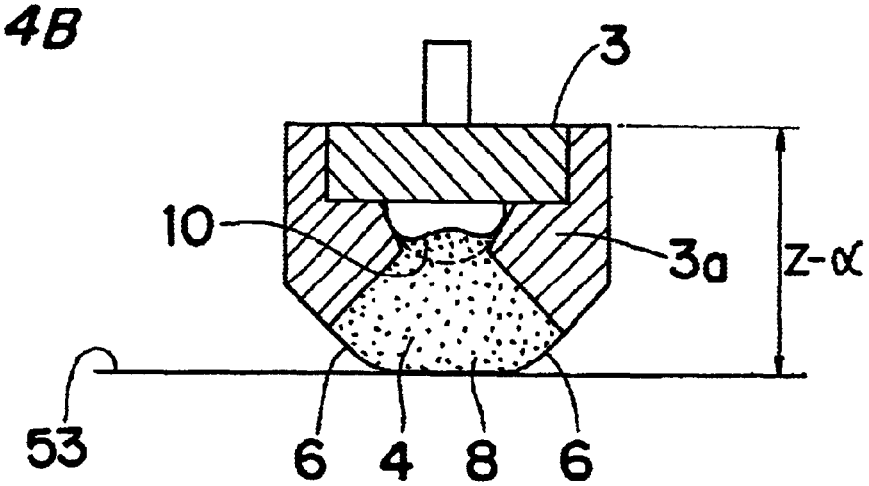

Next, for application operation, the discharge hole 8 is pressed against the screen mask 53 once again as shown in FIG. 4B so that the height of the application unit 3 becomes Z-α. In this case, since the residual pressure inside the chamber 3a has been removed and since the chamber 3a is freely deflatable by air-discharging-out of the sheet or bag 10, the viscous material 4 is never subject to pressure in this state, so that the discharge pressure can be controlled with high precision only with the subsequent air pressure to the bag 10. Thus, a high-quality application state can be achieved.

However, in this operational aspect, the viscous material 4 can only be fed or applied in amounts no more than those corresponding to capacities to which the sheet or bag 10 increases or decreases in the states of FIGS. 4A and 4B. Thus, the discharge amount by one-time feed results in a small one.

Next, second and third operational aspects in which the discharge amount can be increased so that larger amounts of application to the application object 50 can be achieved are explained with reference to FIGS. 5 and 6.

Figure 5A:
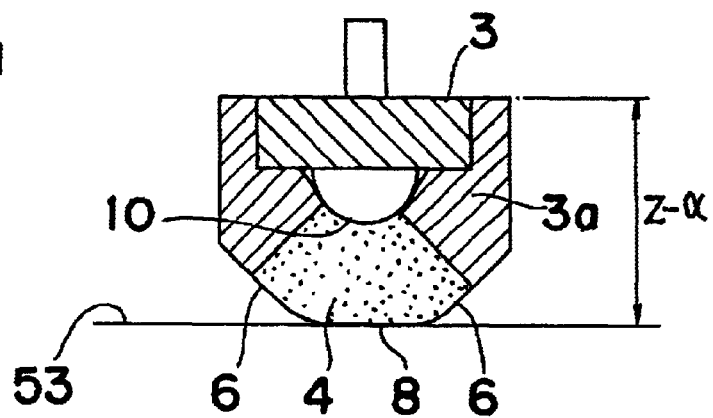
FIGS. 5A, 5B, and 5C are longitudinal-section side views of main parts showing a viscous-material feed state, a residual-pressure removal state, and an application state in working a method of increasing a discharge amount of the viscous material in the same embodiment.
Figure 5B:
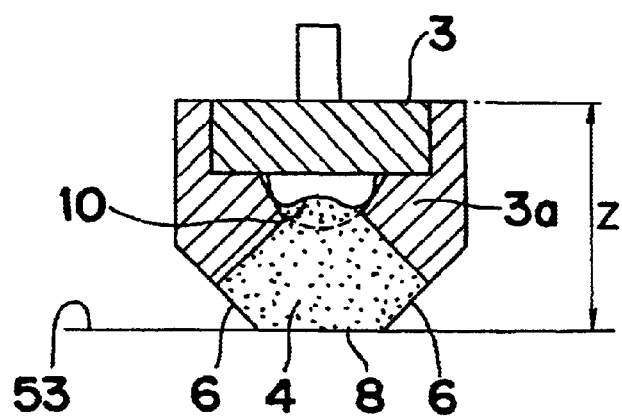
Figure 5C:
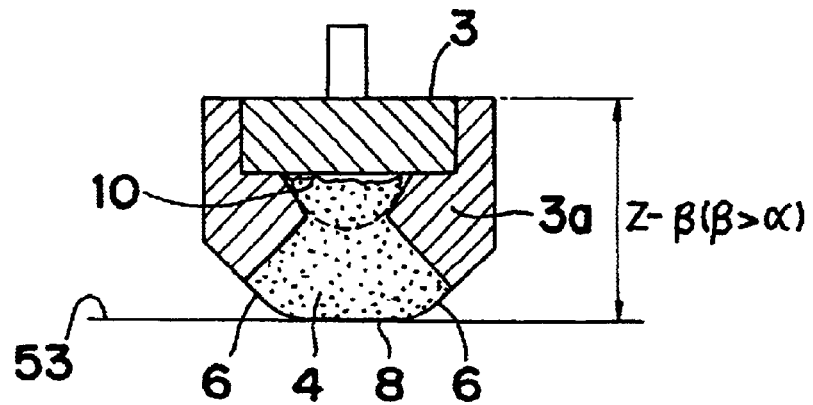

FIG. 5 shows a second operational aspect of feed and application. FIG. 5A depicts a state in which the viscous material 4 is fed to the application unit 3, where with the height of the application unit 3 set to Z-α, the sheet or bag 10 is fed with air so as to be expanded, in which state the viscous material 4 is fed. After the end of the feed, the air in the sheet or bag 10 is discharged out, and as shown in FIG. 5B, the sheet or bag 10 is deflated, making any residual pressure removed. However, since the sheet or bag 10 is not completely deflated even in this state, the sheet or bag 10 is completely deflated for application by setting the height of the application unit 3 to Z-β(β>α) as shown in FIG. 5C. As a result, the discharge pressure can be applied to the viscous material 4 until the sheet or bag 10 is completely expanded, making it possible to increase the discharge amount so that larger amounts of application to the application object 50 can be achieved.

Figure 6A:
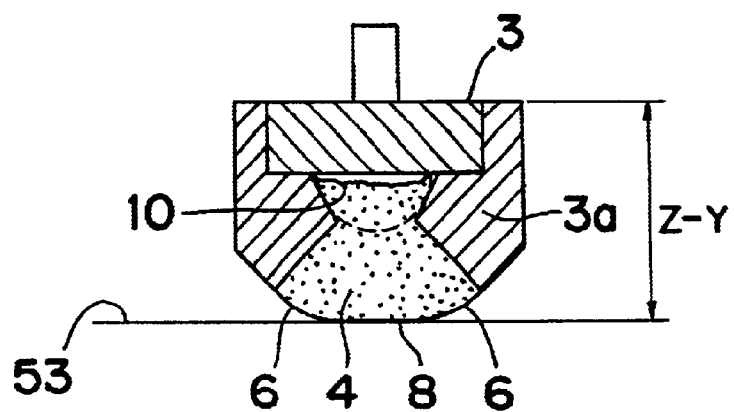
FIGS. 6A, 6B, and 6C are longitudinal-section side views of main parts showing a viscous-material feed state, a residual-pressure removal state, and an application state in working another method of increasing the discharge amount of the viscous material in the same embodiment.
Figure 6B:
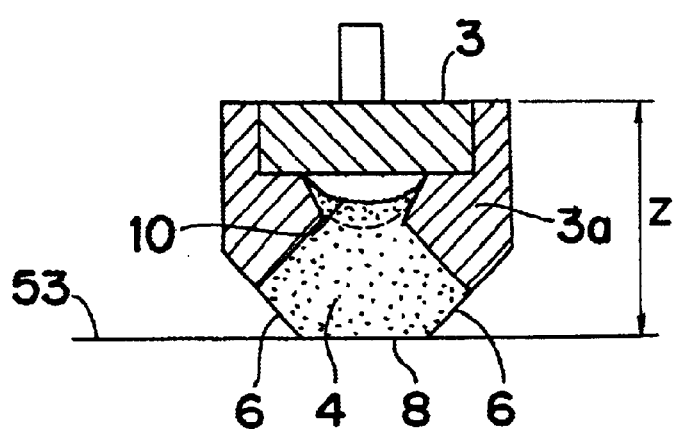
Figure 6C:
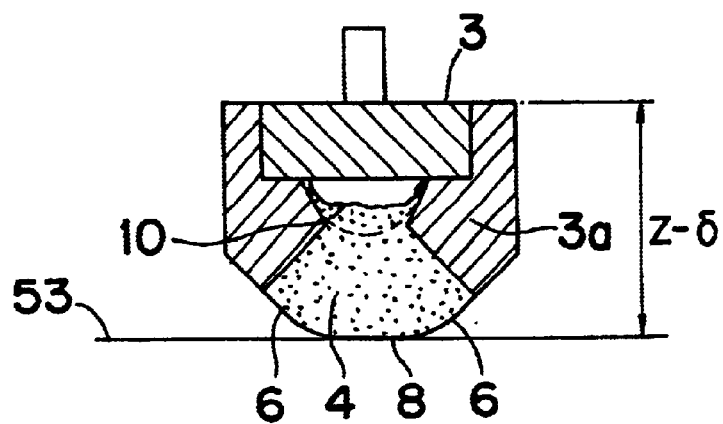
Figure 7A:
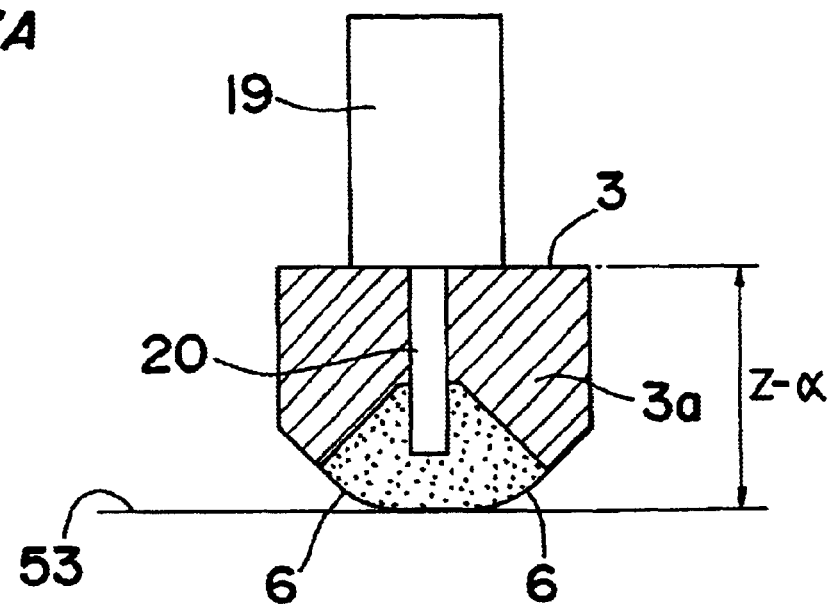
FIGS. 7A and 7B are longitudinal-section side views of main parts showing examples in which another discharge-pressure adjusting device is applied in the same embodiment.
Figure 7B:
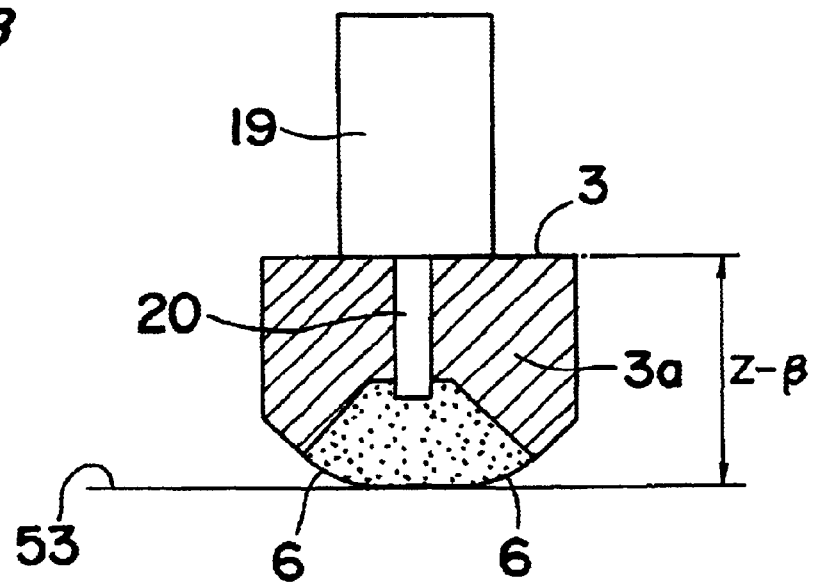

FIG. 6 shows a third operational aspect of feed and application. FIG. 6A depicts a state in which the viscous material 4 is fed to the application unit 3, where with the height of the application unit 3 set to Z-γ, the sheet or bag 10 is not fed with air but kept deflatable, in which state the viscous material 4 is fed until the sheet or bag 10 is completely deflated. Next, after the end of the feed, the application unit 3 is lifted up to the height Z at which the discharge hole 8 makes contact with the screen mask 53, by which the capacity in the chamber 3a is increased, so that the residual pressure is removed. Next, for application, as shown in FIG. 6C, with the height of the application unit 3 set to Z-δ, the discharge hole 8 is pressed against the screen mask 53 to a specified extent. This press amount δ is such an extent that the viscous material 4 does not leak even if the discharge pressure for application acts on the inside of the chamber 3a, and in this state, some marginal space needs to be left in the sheet or bag 10 so that the residual pressure becomes 0. Therefore, the height Z-δ of the application unit 3 in FIG. 6A, or δ, is set so that the viscous material 4 can be fed into the chamber 3*a* to such an extent. Also in this operational aspect, the discharge pressure can be applied to the viscous material 4 until the sheet or bag 10 is completely expanded from the state shown in FIG. 6C. Thus, the discharge amount can be increased so that larger amounts the application to the application object 50 can be achieved.

The first embodiment has been described above on an example in which the sheet or bag 10 is used as the device for applying the discharge pressure to the viscous material 4, removing the residual pressure in the chamber 3*a*, and increasing the discharge amount of the viscous material 4. Otherwise, an object 20 may be intruded into or extruded from the chamber 3*a* by using a cylinder 19 shown in FIG. 7 and an unshown motor or other driver device.

Further, although an example using the motor 18 as a positioning device for vertically positioning the application unit 3 has been shown, a combination of a cylinder and a stopper may be used so that the vertical position can be selected and, thereby, the positioning can be achieved.

Figure 8:
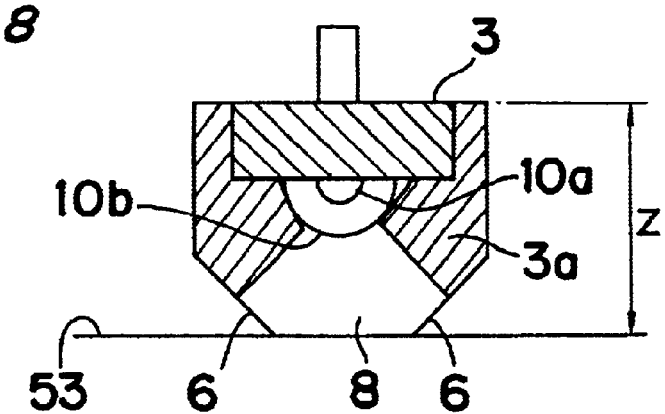
FIG. 8 is a longitudinal-section side view showing a main-part construction of an application unit in another embodiment of the viscous material application apparatus according to the present invention.

Next, another embodiment of the viscous material application apparatus of the present invention is described with reference to FIGS. 8 to 10. In this embodiment, as shown in FIG. 8, two sheets or bags 10*a*, 10*b* are disposed in an inner-and-outer double layer so as to confront the chamber 3*a* of the application unit 3, and the sheets or bags 10*a*, 10*b* are used at different occasions, respectively, one for when the viscous material 4 is fed into the chamber 3*a* and the other for when the discharge pressure is applied to the viscous material 4.

Figure 9A:
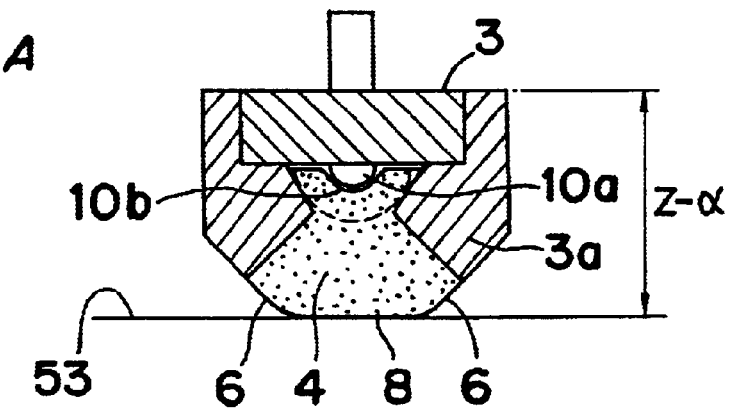
FIGS. 9A and 9B are longitudinal-section side views of main parts showing a viscous-material feed state and an application state in the same embodiment.
Figure 9B:
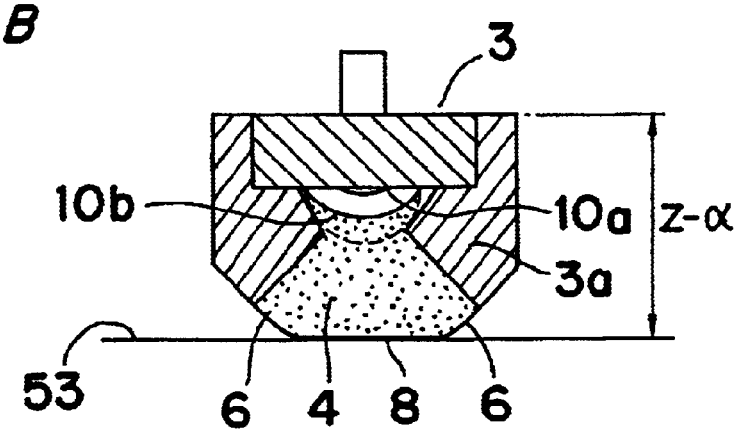

More specifically, when the viscous material 4 is fed into the chamber 3*a*, the sheet or bag 10*a* is first expanded so as to be deflatable as shown in FIG. 9A. Then, after the end of the feed of the viscous material 4, the sheet or bag 10*a* is deflated, by which the residual pressure is removed. When the discharge pressure is applied to the viscous material 4 to do application, the sheet or bag 10*b* is expanded as shown in FIG. 9B, where the viscous material 4 is applied from the discharge hole 8. In either case, indeed the height position of the application unit 3 relative to the screen mask 53 is constant as in the case of FIG. 4, but the sheet or bag 10*b* for use of discharge can be used from its deflated state so that the number of times the viscous material 4 is applied can be increased as in the cases of FIGS. 5 and 6.

Figure 10A:
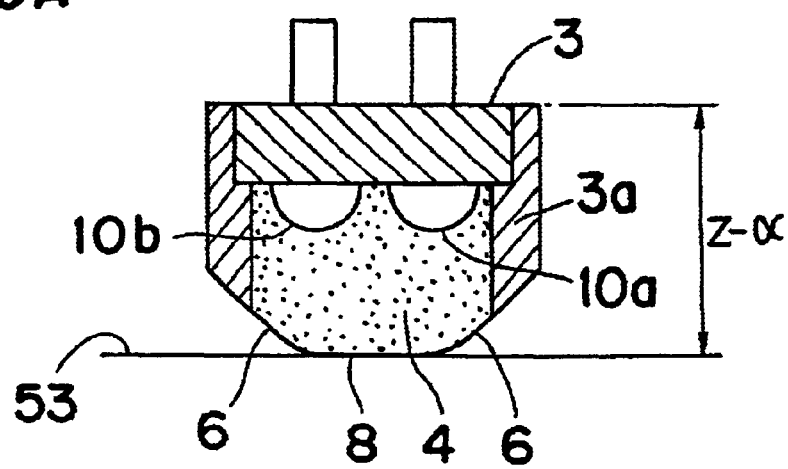
FIGS. 10A and 10B are longitudinal-section side views showing the construction of modifications of the application units in the same embodiment.
Figure 10B:
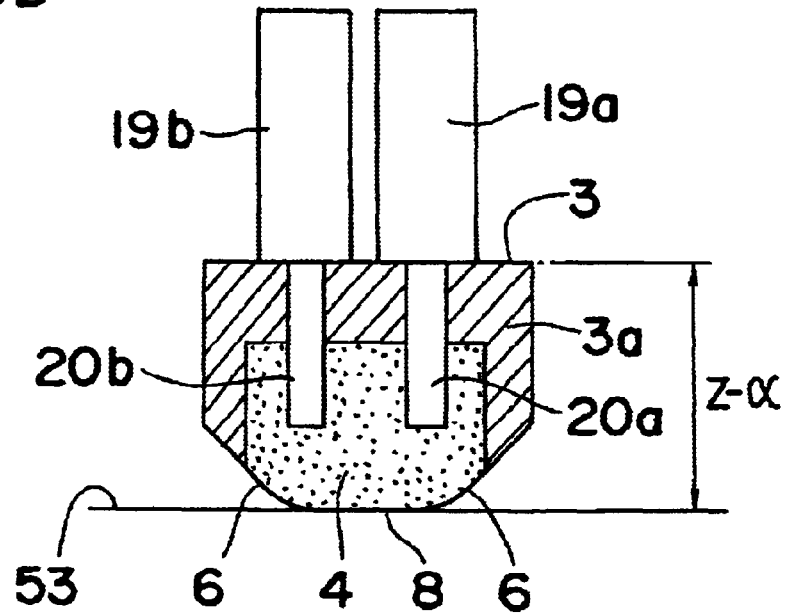

In addition, the sheets or bags 10*a*, 10*b* may also be disposed in parallel as shown in FIG. 10A. Otherwise, as shown in FIG. 10B, objects 20*a*, 20*b* that can be intruded into and extruded from the chamber 3*a* with cylinders 19*a*, 19*b* and an unshown motor or the like may be used instead of the sheets or bags 10*a*, 10*b*, so that the capacity in the chamber 3*a* can be varied, in which case also similar effects can be obtained. Furthermore, although an example in which two sheets or bags 10*a*, 10*b* or objects 20*a*, 20*b* are used has been shown in FIGS. 8 to 10, yet three or more of those may also be used.

A plurality of bags or cylinders or the like may be controlled independently of each other or one another with independent air feed sections 2 provided respectively. However, since the feed of the viscous material 4 and the application thereof are effected at different times, independently, it is preferred that air paths for their courses are switched over so that one air feed section 2 can be shared therebetween.

The above embodiment has been described only on an example in which the screen mask 53 is not moved but the application unit 3 side is moved. However, it is also possible that without moving the application unit 3, conversely, the screen mask 53 or the application object 50 is moved, in which case similar operations and their effects can be fulfilled.

Figure 11A:
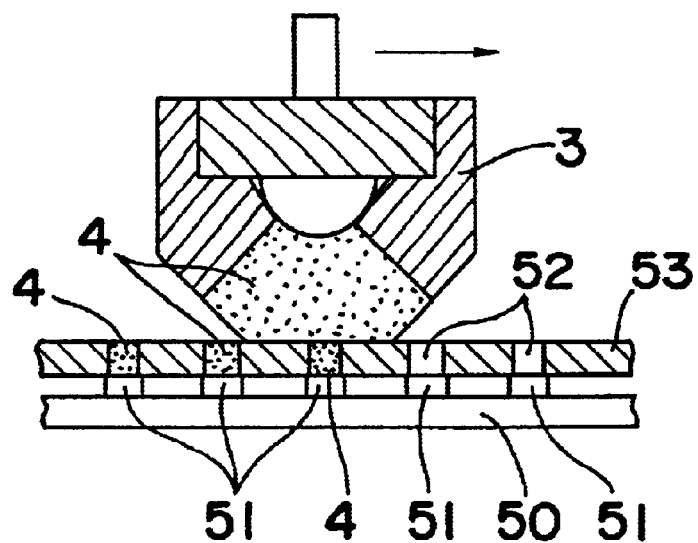
FIGS. 11A and 11B are explanatory views of other application examples of individual embodiments of the present invention.
Figure 11B:
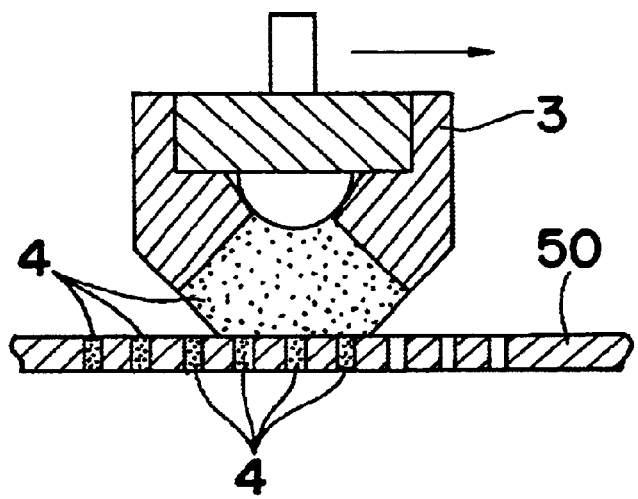

Also, the above embodiment has been shown on an example in which with the application object 50 placed at the underside of the screen mask 53 as shown in FIG. 11A, the viscous material 4 discharged out from the application unit 3 is applied and printed onto the lands 51 of the application object 50 through the openings 52 of the screen mask 53. Otherwise, the present invention can also be applied to cases in which the viscous material 4 is filled and applied into recessed portions or through holes formed in the application object 50 as shown in FIG. 11B, in which case also similar effects can be fulfilled.

According to the viscous material application method and apparatus of the present invention, as apparent from the above description, since the viscous material is stored in the storage chamber, the viscous material is kept away from contact with air at all times, so that the viscous material can be prevented from deterioration and thus applied stably. Moreover, since the viscous material is fed into the storage chamber by the viscous material feeding apparatus at all times with a pressure smaller than the discharge pressure imparted by the discharge-pressure adjusting device, the viscous material is fed at all times without affecting the control of the discharge pressure, thus enabling an improvement in productivity without deteriorating the application quality.

Further, in the case where the viscous material is pressurized and fed into the storage chamber with the discharge hole pressed against the screen mask and then, after the end of the feed, the residual pressure in the storage chamber is removed, the viscous material can be fed to the storage chamber at a high pressure to reduce the feed time without affecting the discharge control. Thus, the productivity can be enhanced by virtue of the reduced feed time of the viscous material without affecting the application quality.

Further, in the case where the inflatable-and-deflatable bag part disposed so as to confront the storage chamber as a constituent element of the discharge-pressure adjusting device is set contractable and, in this state, the press amount of the elastically deformable discharge hole is increased, the bag part is deflated in response to the press amount of the discharge hole, so that the amount of the viscous material to which the discharge pressure can be imparted is increased correspondingly, thus allowing the discharge amount of the viscous material to be increased. Further, when the bag part is set into a contractable state and the press amount of the elastically deformable discharge hole is increased at the time of feed of the viscous material into the storage chamber, the feed amount of the viscous material to the storage chamber is increased, so that the discharge amount of the viscous material can be increased.

Further, in the case where the residual pressure is removed by changing the capacity of any of the plurality of inflatable-and-contractable bag parts disposed so as to confront the inside of the storage chamber and, in this state, the press amount of the elastically deformable discharge hole is increased with any of the other bag parts set contractable, the residual pressure in material feed can be removed by control of the plurality of bag parts even without changing the press amount of the discharge hole, and moreover the discharge amount of the viscous material can be increased.

Further, in the case where the inflatable-and-deflatable bag parts disposed to confront the inside of the storage chamber, the elastically deformable discharge hole, and the device for changing the press amount between the application unit and the screen mask are provided, the residual pressure after the feed of the viscous material to the storage chamber by executing the individual methods described above can be removed, so that the discharge amount of the viscous material by one-time feed of the viscous material can be increased.

Further, in the case where the plurality of capacity-variable devices that make the internal capacity of the storage chamber changed are provided, the residual pressure at the time of feed can be removed by control of the capacity-variable devices and moreover the discharge amount of the viscous material can be increased even without changing the press amount of the discharge hole as described above, and furthermore a variety of forms of application can be developed by selective use of the plurality of capacity-variable devices.

Further, in the case where the capacity-variable device is implemented by a bag part that is inflatable and deflatable in confrontation to the inside of the storage chamber, the viscous material application apparatus can be simplified in construction and structured compact, and moreover a pressure can be imparted uniformly over the entire viscous material while the responsivity can be enhanced, preferably.

(Second Embodiment)

A second embodiment of the present invention relates to viscous material application method and apparatus for applying a viscous material such as adhesive, solder paste, or electrically conductive paste to a circuit board or other application object via a screen mask in a specified pattern.

As a conventional viscous material application apparatus, there has generally been known a screen printing device in which a viscous material 4 such as adhesive or solder paste is applied onto lands 51 of a circuit board or the like, which is an application object 50, via a screen mask 53 as shown in FIGS. 12A–12E.

Figure 12A:
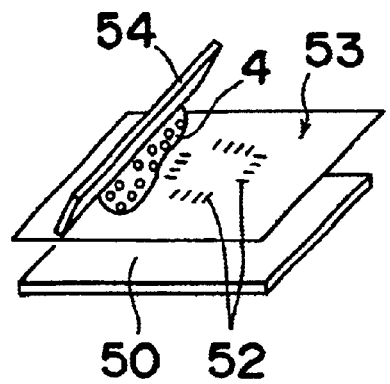
FIGS. 12A, 12B, 12C, 12D, and 12E are explanatory views of a screen printing method according to the prior art.
Figure 12B:
Figure 12C:
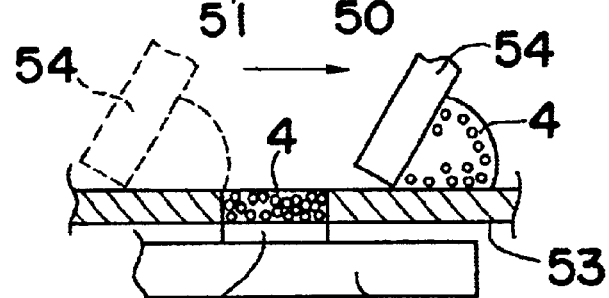
Figure 12D:
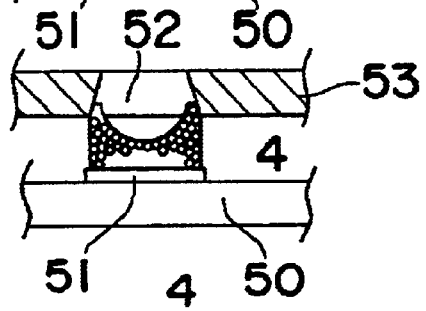
Figure 12E:
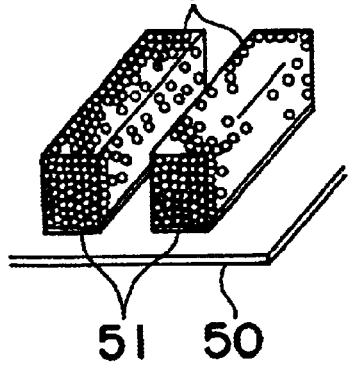

The screen mask 53 has openings 52 formed as through holes provided in a specified pattern corresponding to the lands 51 of the application object 50, and the application object 50 is positioned by an unshown table section so as to be in contact with the screen mask 53 as shown in FIGS. 12A and 12B. Next, as shown in FIG. 12C, the viscous material 4 fed to an end of the screen mask 53 is moved in a specified direction by a squeegee 54, so that the viscous material 4 is filled into openings 52. Next, the application object 50 is separated away from the screen mask 53 as shown in FIG. 12D, by which the viscous material 4 within the openings 52 is transferred onto the lands 51 of the application object 50 so that the viscous material 4 is applied onto the lands 51 of the application object 50 as shown in FIG. 12E.

Also, Unexamined Japanese Patent Publication 4-284249 discloses a tightly closed squeegee including a closed container for containing therein the viscous material in an air-shutoff state, a discharge hole communicating with the closed container and substantially making tightly close contact with the screen mask, a stirring roller for adjusting the viscosity of the viscous material at a vicinity of the discharge hole, and a discharge-pressure supplying device for supplying a gas pressure onto a piston placed on the viscous material inside the closed container to thereby press the viscous material and discharge out the viscous material from the discharge hole.

However, in this conventional viscous material application apparatus, since the apparatus adopts a method that the squeegee 54 is moved on the screen mask 53 to thereby fill the viscous material 4 into the openings 52, and since the viscous material 4 is in contact with the air at all times, the viscous material 4 tends to vary in state, causing an issue that stable application becomes unachievable and another issue that the viscous material 4 overflowing the squeegee 54 needs to be scraped into the squeegee 54.

In particular, upon an end of a sequence of application operations, after the squeegee 54 is separated from the screen mask 53, the viscous material 4 would remain on the screen mask 53. This would cause an issue that cleaning for the viscous material 4 takes time and labor while the viscous material 4 remaining on the screen mask 53 is wasteful.

Meanwhile, in the apparatus of the technique disclosed in Unexamined Japanese Patent Publication 4-284249, there is no need for scraping up the viscous material while the viscous material 4 is out of contact with the air so that variations in the state of the viscous material 4 can be suppressed. Furthermore, even upon an end of a sequence of application operations, when the tightly closed squeegee is separated from the screen mask, indeed almost all viscous material is collected as it is accommodated in the discharge hole, but some viscous material sticking to the screen mask would remain on the screen mask side, which would cause the issue that the cleaning thereof would take time and labor. Therefore, this patent publication discloses a technique that the move of the tightly closed squeegee in its separation from the screen mask is performed which has components of parallel and perpendicular directions with respect to the screen. However, the squeegee member constituting the discharge hole is provided in a broken, inverted V-like shape, which increasingly widens toward the screen mask, so as to have the same function as the conventional squeegee, the viscous material that has stuck to the screen mask immediately before the separation of the tightly closed squeegee from the screen mask cannot be scraped up enough by the squeegee member even if the tightly closed squeegee is moved as described above. As a result, the viscous material would still unavoidably remain on the screen mask side, causing an issue that the cleaning thereof would take time and labor.

In view of these and other issues of the prior art, an object of the present invention is to provide viscous material application method and apparatus in which the viscous material can be prevented from making contact with the air at all times so that a stable application can be achieved, the viscous material never overflows during the operation and the viscous material almost never remains on the screen mask at the time of separating the application unit from the screen mask so that the labor for cleaning of the screen mask can be made unnecessary, and moreover automatic replacement becomes implementable.

Hereinbelow, the viscous material application apparatus according to the second embodiment of the present invention is described with reference to FIGS. 1 to 19.

General construction of an application head in the viscous material application apparatus is shown in FIG. 1. In FIG. 1, the application head is composed mainly of a material feed section 1, an air feed section 2, and an application unit 203. In the material feed section 1, a viscous material 4 such as adhesive or solder paste is stored in a syringe-like storage tank 1b, where as a plunger 1a is activated by compressed air serving for material feed, the viscous material 4 is pressurized and pressure-fed so as to be filled up in a chamber 203a, which is a storage chamber for the viscous material 4 in the application unit 203.

The chamber 203a of the application unit 203 and the material feed section 1 are coupled to each other by joints 5, and the viscous material 4 is fed into the chamber 203a by passing through feed passages 5a provided in the joints 5.

On both sides under the chamber 203a, two blades 6 each formed of a thin plate having elasticity are attached with blade holders 7 so as to approach each other downward with a gap of about 10 mm formed between their fore ends, where a discharge hole 8 for discharging out the viscous material 4 is formed by the opening between the two blades 6. The blades 6 are each formed of a thin plate of copper, stainless, resin, or the like having a thickness of, for example, about 0.1 to 0.5 mm, where resin materials such as polyimides or polyamides-imides are particularly preferable.

Stoppers 9 are disposed at both ends of the two blades 6 to prevent the viscous material 4 from leaking from the chamber 203a. The stoppers 9 are held by the joints 5 so as not to be disengaged by the pressure applied to the viscous material 4.

On one side of the chamber 203a opposite to the discharge hole 8, that is, on the upper side of the chamber 203a, a sheet or bag 10 formed of a sheet having depressions is disposed along the longitudinal direction of the chamber 203a over the generally entire length so as to partly confront the inside of the chamber 203a in opposition to the discharge hole 8, the sheet or bag 10 being sandwiched and fixed by the chamber 203a and a plate 203b that closes the upper part of the chamber 203a. The sheet or bag 10 is so made as to be increased and decreased in internal capacity by air being fed and discharged from the air feed section 2 via an air port 2a. The sheet or bag 10 is formed of a resin material, such as urethane elastomer, polyethylene, or nylon, having a thickness of about 0.03 to 1 mm, and more preferably, about 0.3 to 0.5 mm. It is noted that the sheet or bag 10, although varying depending on the pressure of the air fed, may be broken when its thickness is too thin, and may result in a poor inflation-and-deflation responsivity when the thickness is too thick.

After the viscous material is fed into the chamber 203a, feeding air to the sheet or bag 10 causes the viscous material 4 to be pressed at a specified pressure so that a discharge pressure for application of the viscous material 4 can be given. Discharging the air from the sheet or bag 10 allows the discharge pressure to be released instantaneously.

In a portion of the sheet or bag 10 sandwiched and fixed by the chamber 203a and the plate 203b, an air bleeding sheet 11 for bleeding the air is disposed at the underside of the sheet or bag 10, so that at the first feed of the viscous material 4 from the material feed section 1 into the chamber 203a, the air within the chamber 203a can be bled from the air bleeding sheet 11.

In the center of the chamber 203a, the sheet or bag 10 is not provided, and the pressure detecting device 12 for detecting the pressure of the viscous material 4 in the chamber 203a is provided at that place.

Next, in the operation of releasing the application head from the screen mask 53 into a standby state after iterating a specified number of times the operation of applying the viscous material 4 to the application object 50 via the screen mask 53 with the application head as described above, the method of collecting the viscous material 4 into the chamber 203a of the application unit 203 so that the viscous material 4 does not remain on the screen mask 53 is explained with reference to FIGS. 13 to 15.

Figure 13A:
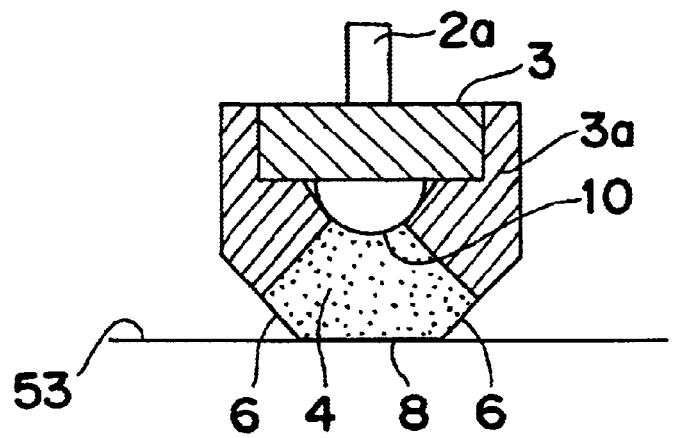
FIGS. 13A, 13B, and 13C are explanatory views of a first process example of a separation step in which an application unit is separated from a screen mask in a second embodiment of the present invention.

Referring to FIG. 13, with the application process ended, the chamber 203a of the application unit 203 is filled with the viscous material 4 as shown in FIG. 13A, where the viscous material 4 is in contact with the screen mask 53 at the discharge hole 8. Lifting the application unit 203 as it is in this state would cause the viscous material 4 to remain much on the screen mask 53. In the case where the application is done with the use of the prior-art squeegee 54, all the viscous material 4 would be left on the screen mask 53.

Figure 13B:
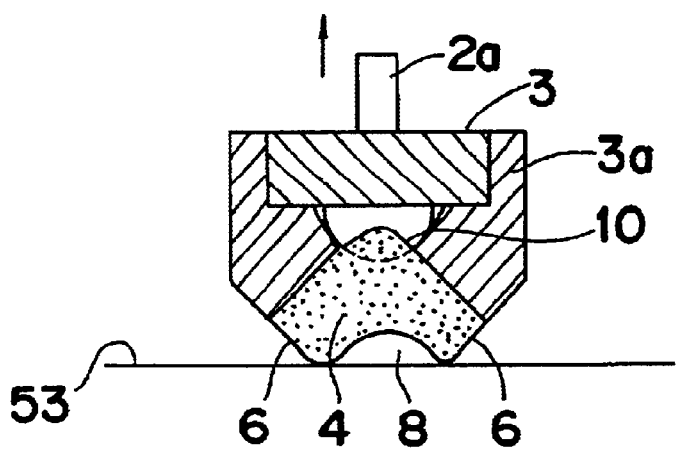
Figure 13C:
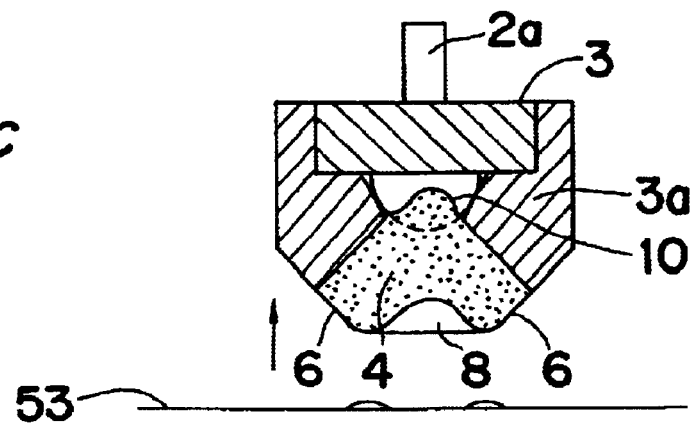

Therefore, the sheet or bag 10 is deflated as shown in FIG. 13B so that the storage space for the viscous material 4 inside the chamber 203a is expanded in such a direction as to go away from the discharge hole 8, by which the viscous material 4 present at the discharge hole 8 part is moved and collected into the chamber 203a. Thereafter, the application unit 203 is lifted away from the screen mask 53 as shown in FIG. 13C. It is noted that the collection speed for the viscous material 4, that is, the expansion speed of the storage space for the viscous material 4 inside the chamber 203a and the lifting speed of the application unit 203 after the collection are preferably selected depending on the size of the discharge hole 8 and the properties of the viscous material 4. With preferable settings of these speeds, the viscous material 4 can almost completely be prevented from remaining on the screen mask 53.

Since the viscous material 4 on the screen mask 53 is collected into the chamber 203a as shown above, the application unit 203 can be separated from the screen mask 53 and then becomes in a standby state without leaving a residue of the viscous material 4 on the screen mask 53 almost at all. Also, since the sheet or bag 10, which is the discharge-pressure adjusting device, is used in common also as the device for expanding the storage space inside the chamber 203a, the construction cost can be lowered. Besides, by the use of the sheet or bag 10 that extends along the longitudinal direction of the chamber 203a while confronting the chamber 203a, the viscous material 4 can be collected securely from over the entire discharge hole 8.

Figure 14A:
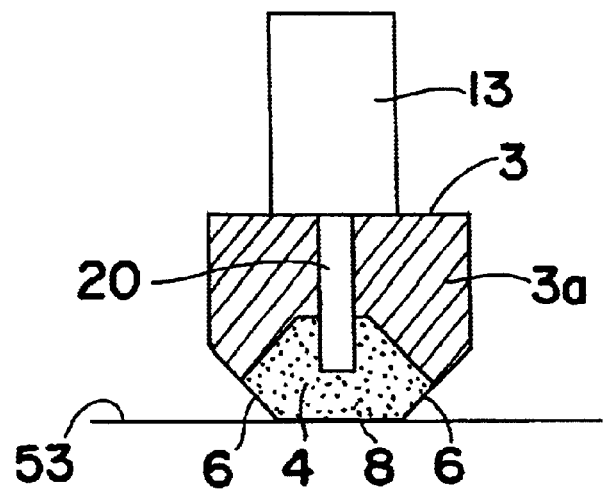
FIGS. 14A, 14B, and 14C are explanatory views of a modification of the first separation step in the second embodiment.
Figure 14B:
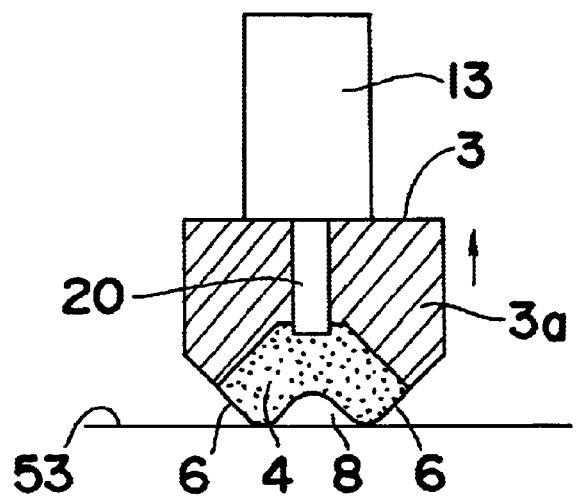
Figure 14C:
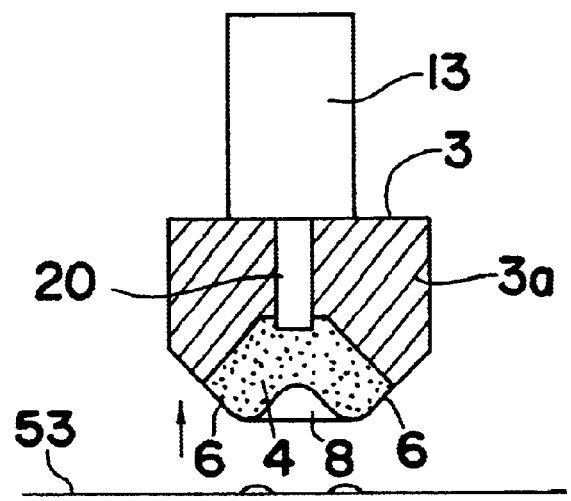

FIG. 13 shows an example in which the sheet or bag 10 is used as the expansion device for the storage space inside the chamber 203a. Otherwise, in an application unit 203 in which, as shown in FIG. 14, an in-and-out member (plunging-and-withdrawing member) 20 is provided so as to be plungeable into and withdrawable from the chamber 203a, where the viscous material 4 is pressurized by plunging the in-and-out member 20 into the chamber 203a with a push-pull device 13 such as a cylinder so that the viscous material 4 is discharged out from the discharge hole 8 so as to be applied, it is also possible that, as shown in the state of FIG. 14A to FIG. 14B, the viscous material 4 of the discharge hole 8 can be moved into the chamber 203a, thereby collected, by withdrawing out the in-and-out member 20 with the push-pull device 13, similarly also in this case. Then, as shown in FIG. 14C, even after the application unit 203 is separated away from the screen mask 53, the viscous material 4 almost never remains on the screen mask 53.

Figure 15A:
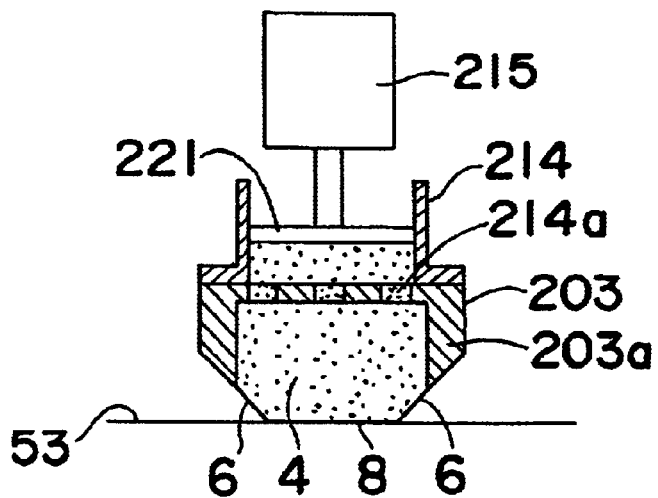
FIGS. 15A, 15B, and 15C are explanatory views of another modification of the first separation step in the second embodiment.
Figure 15B:
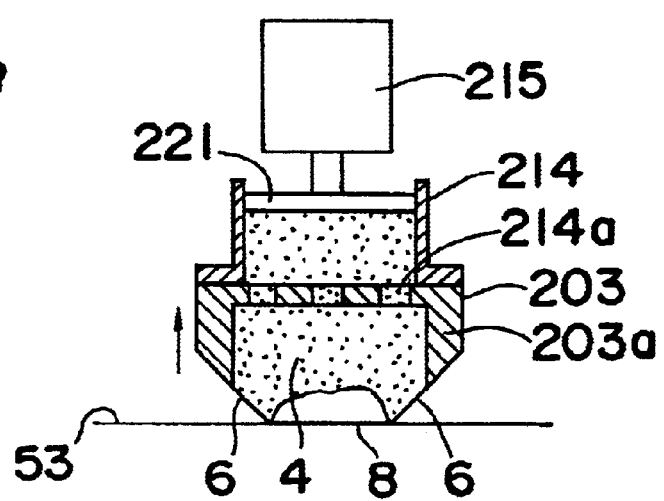
Figure 15C:
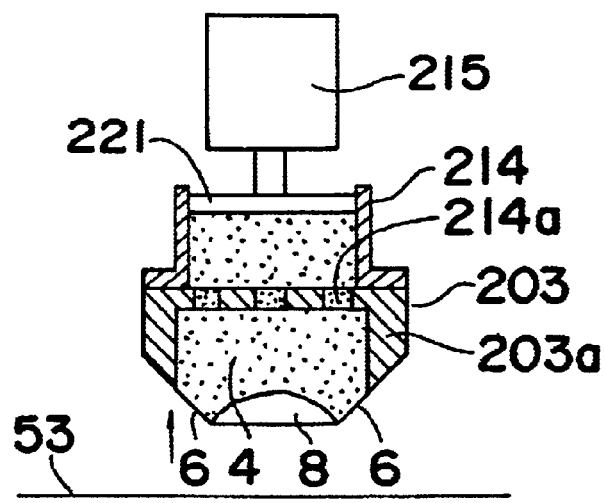

Furthermore, also in an application unit 203 in which, as shown in FIG. 15, a container 214 having the viscous material 4 stored therein is provided on the top of the chamber 203a and communicated with the inside of the chamber 203a via through holes 214a, where the viscous material 4 is fed into the chamber 203a and further discharged out from the discharge hole 8, thereby applied, by pressing a plunger 221 placed on the viscous material 4 of the container 214 with a push-pull device 215 such as a cylinder, it is also possible that, as shown in the state of FIG. 15A to FIG. 15B, the viscous material 4 of the discharge hole 8 can be moved into the chamber 203a, thereby collected, by pulling in the plunger 221 with the push-pull device 215, similarly also in this case. Then, as shown in FIG. 15C, even after the application unit 203 is separated away from the screen mask 53, the viscous material 4 almost never remains on the screen mask 53. In this case, the inside of the chamber 203a and the inside of the container 14 are communicated with each other via the through holes 214a, and their storage space for the viscous material 4 is expanded to collect the viscous material 4. Therefore, the storage chamber of the present invention in this case is assumed to be composed of the chamber 203a and the container 214.

Next, the method for collecting the viscous material 4 without expanding a space that can accommodate therein the viscous material 4 contained in the chamber 203a so that the viscous material 4 will not remain on the screen mask 53 in separation of the application unit 203 from the screen mask 53 is explained with reference to FIG. 16.

Referring to FIG. 16, the chamber 203a of the application unit 203 is filled with the viscous material 4 as in the case of FIG. 13A, where the viscous material 4 is in contact with the screen mask 53 at the discharge hole 8. In this case, since the viscous material 4 in contact with the screen mask 53 at the discharge hole 8 is not pressed against the screen mask 53, moving the application unit 203 horizontally along the screen mask 53 without pressurizing the sheet or bag 10 causes the viscous material 4 in contact with the screen mask 53 at the discharge hole 8 to be slid on the screen mask 53 and scraped up by the blades 6. Then, with this moving operation continued, lifting the application unit 203 so that the application unit 203 is separated away from the screen mask 53 allows the viscous material 4 to be collected into the chamber 203a without remaining on the screen mask 53.

Also in the application unit 203 having the construction of FIG. 14 or 15, the viscous material 4 can be collected without remaining on the screen mask 53 almost at all, likewise.

Further, as shown by "a, b, c" in FIG. 17, the above two collection methods may be used in combination. More specifically, as described in FIGS. 13 to 15, after or while the viscous material 4 of the discharge hole 8 is collected into the chamber 203a by expanding the space inside the chamber 203a, moving the application unit 203 horizontally along the screen mask 53 as described in FIG. 16 allows the viscous material 4 to be collected more securely without remaining on the screen mask 53.

In the case of the collection method for the viscous material 4 in which the application unit 203 is moved horizontally along the screen mask 53, pressing the application unit 203 against the screen mask 53 before moving the application unit 203 allows the scraping effect of the blades 6 to increase so that the viscous material 4 can be collected more securely into the chamber 203a. Further, it is preferable that the table section for conveying and positioning an unshown application object to the screen mask 53 is brought into contact with the underside of the screen mask 53, in which case the screen mask 53 will not be flexed by the collecting operation.

In the state in which the application unit 203 that has collected the viscous material 4 into the chamber 203a in this way is lifted from the screen mask 53 to become in a standby state, allowing the space that accommodates therein the viscous material 4 inside the chamber 203a to stand as it is expanded makes it possible to prevent the viscous material 4 from dripping down from the discharge hole 8, even if the viscous material 4 is so left for a long time.

Figure 18:
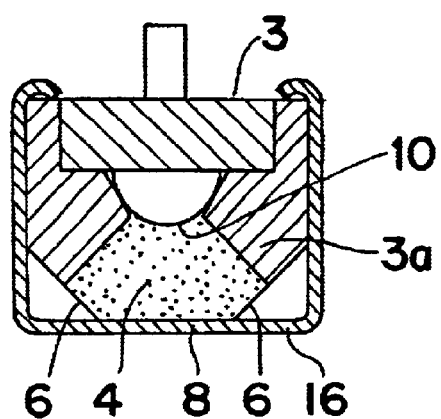
FIG. 18 is a longitudinal sectional view showing an example of a standby state of the application unit in the second embodiment.

In the case where the viscous material 4 is low in viscosity, as shown in FIG. 18, the viscous material 4 can be prevented from dripping down from the discharge hole 8 by attaching a cover 16 so as to cover the discharge hole 8 therewith after collecting the viscous material 4 into the chamber 203a of the application unit 203.

Figure 19:
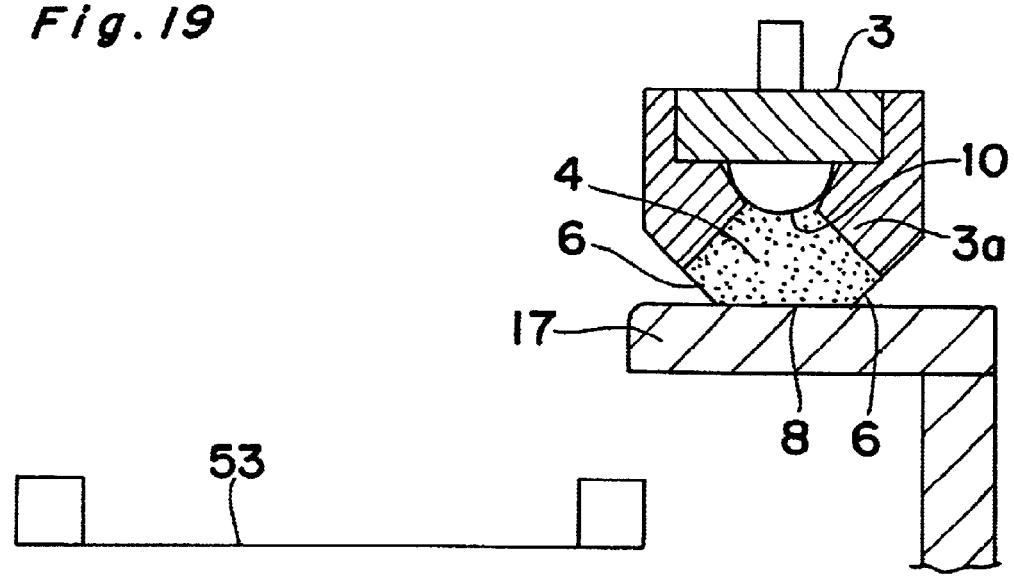
FIG. 19 is a longitudinal sectional view showing another example of the standby state of the application unit in the second embodiment.

Also, as shown in FIG. 19, a bearer 17 having a flat upper surface may be provided in a sideways upper part of the screen mask 53 in the viscous material application apparatus, where the application unit 203 is set in a standby state with its discharge hole 8 kept in tightly close contact with the bearer 17. With such a bearer 17 provided, the discharge hole 8 of the application unit 203 is completely closed, so that state changes of the viscous material 4 due to contact with the air at the discharge hole 8 can be suppressed. Moreover, when the application unit 203 is moved along the upper surface of the bearer 17 at the time of reuse, the viscous material 4 does not remain on the upper surface of the bearer 17 and the application unit 203 is filled with the viscous material 4 up to the discharge hole 8. Therefore, the application operation can be started immediately, so that the productivity can be improved.

The above second embodiment has been described only on an example in which the screen mask 53 is not moved but the application unit 203 side is moved. However, it is also possible that without moving the application unit 203, conversely, the screen mask 53 or the application object 50 is moved, in which case similar operations and their effects can be fulfilled.

Also, the above second embodiment has been shown on an example in which with the application object 50 placed at the underside of the screen mask 53 as shown in FIG. 11A, the viscous material 4 discharged out from the application unit 203 is applied and printed onto the lands 51 of the application object 50 through the openings 52 of the screen mask 53. Otherwise, the present invention can also be applied to cases in which the viscous material 4 is filled and applied into recessed portions or through holes formed in the application object 50 as shown in FIG. 11B, in which case also similar effects can be fulfilled.

According to the viscous material application method and apparatus of the present invention, as apparent from the above description, since the application material is stored in the storage chamber in separation of the application unit from the screen mask or the application object, the viscous material is positively stored, so that the viscous material does not remain on the screen mask or the application object. Thus, the labor for cleaning of the screen mask and the application object can be made unnecessary, and moreover automatic replacement becomes implementable.

Particularly in the case where the viscous material is stored into the storage chamber by expanding the internal space of the storage chamber in such a direction that the space goes away from the discharge hole, the viscous material present at the discharge hole part is drawn into the storage chamber, so that the viscous material can be stored simply and securely.

Also, in the case where the application unit is separated from the screen mask or the application object while the viscous material is scraped up by an end edge of the discharge hole that is kept in contact with the screen mask or the application object by moving the application unit along the screen mask or the application object with the application unit kept in contact with the screen mask or the application object, the viscous material does not remain on the screen mask or the application object, so that the labor for cleaning of the screen mask or the application object can be made unnecessary, and moreover automatic replacement becomes implementable.

Also, with the above two methods used in combination, the viscous material can further securely be prevented from remaining on the screen mask or the application object.

Also, in the case where after the separation of the application unit from the screen mask or the application object, the state that the viscous material is stored in the storage chamber is maintained as it is, the viscous material can be prevented effectively from dripping down from the discharge hole in the standby state of the application unit.

Also, in the case where after the application unit is separated from the screen mask or the application object, the discharge hole of the application unit is closed, so that state changes of the viscous material due to contact with the air at the discharge hole can be suppressed.

Also, in the case where the viscous material application apparatus further comprises the bearer having the flat upper surface on which the application unit is to be placed with the discharge hole in tightly close contact therewith while the application unit is in its standby state separate away from the screen mask or the application object, the discharge hole of the application unit is closed, so that state changes of the viscous material due to contact with the air at the discharge hole can be suppressed. Moreover, when the application unit is moved along the upper surface of the bearer at the time of reuse, the viscous material does not remain on the upper surface of the bearer and the application unit is filled with the viscous material up to the discharge hole. Therefore, the application operation can be started immediately, so that the productivity can be improved.

(Third Embodiment)

A third embodiment of the present invention relates to viscous material application method and apparatus for applying a viscous material such as adhesive, solder paste, or electrically conductive paste to a circuit board or other application object via a screen mask or directly in a specified pattern.

As a conventional viscous material application apparatus, there has generally been known a screen printing device in which a viscous material 4 such as adhesive or solder paste is applied onto lands 51 of a circuit board or the like, which is an application object 50, via a screen mask 53 as shown in FIGS. 12A–12E.

The screen mask 53 has openings 52 formed as through holes provided in a specified pattern corresponding to the lands 51 of the application object 50, and the application object 50 is positioned by an unshown table section so as to be in contact with the screen mask 53 as shown in FIGS. 12A and 12B. Next, as shown in FIG. 12C, the viscous material 4 fed to an end of the screen mask 53 is moved in a specified direction by a squeegee 54, so that the viscous material 4 is filled into the openings 52. Next, the application object 50 is separated away from the screen mask 53 as shown in FIG. 12D, by which the viscous material 4 within the openings 52 is transferred onto the lands 51 of the application object 50 so that the viscous material 4 is applied onto the lands 51 of the application object 50 as shown in FIG. 12E.

Also, the inventor has proposed in Japanese Patent Application 10-232164 (Unexamined Japanese Patent Publication 2000-62138) a tightly closed type squeegee including, on a filling unit movable on a screen mask, a chamber which has a tightly closed structure capable of shutting off print paste from the atmospheric air and also has a discharge hole in opposition to the screen mask and which is to be filled with print paste, a pressurizing device for pressurizing the print paste in the chamber to push the print paste out of the discharge hole, a pair of scraper blades which slide in press contact with the screen mask back and forth along the direction of move of the filling unit, a paste tank which forms a part of the pressurizing device and which is removably mountable, and a shutter mechanism which can open and close the discharge hole.

However, in this conventional viscous material application apparatus, since the apparatus adopts a method that the squeegee 54 is moved on the screen mask 53 to thereby fill the viscous material 4 into the openings 52, and since the viscous material 4 is in contact with the air at all times, the viscous material 4 tends to vary in state, causing an issue that stable application becomes unachievable, another issue that the viscous material 4 overflowing the squeegee 54 needs to be scraped into the squeegee 54, still another issue that the viscosity of the viscous material can hardly be controlled and a further issue that skillfulness and a large amount of know-how are needed to adjust application conditions in accordance with viscosity changes to thereby maintain the application quality.

Meanwhile, in the apparatus of the technique disclosed in the aforementioned Japanese Patent Application 10-232164 (Unexamined Japanese Patent Publication 2000-62138), there is no need for scraping up the viscous material while the viscous material 4 is out of contact with the air so that variations in the state of the viscous material 4 can be suppressed. However, there is no device for stirring the viscous material that has once been fed into the chamber, causing an issue that the application quality may be unstable. For example, in the field of production, immediately after an initial feed of the viscous material to the chamber upon a start of production, or immediately after a start of production subsequent to a long-time halt of equipment due to equipment trouble, the viscous material within the chamber would be too lower in fluidity to achieve sufficient application, which may cause quality defects such as so-called 'lacks.'

In view of these and other issues of the prior art, an object of the present invention is to provide viscous material application method and apparatus in which the viscous material can be prevented from making contact with the air at all times so that a stable application can be achieved, the viscous material never overflows during the operation, the discharge pressure can be controlled with high precision and good responsivity while the viscosity can be controlled, and the discharge pressure can be controlled according to the viscosity, so that high-quality application can be achieved.

Hereinbelow, a viscous material application apparatus according to the third embodiment of the present invention is described with reference to FIGS. 20 to 26.

Figure 20:
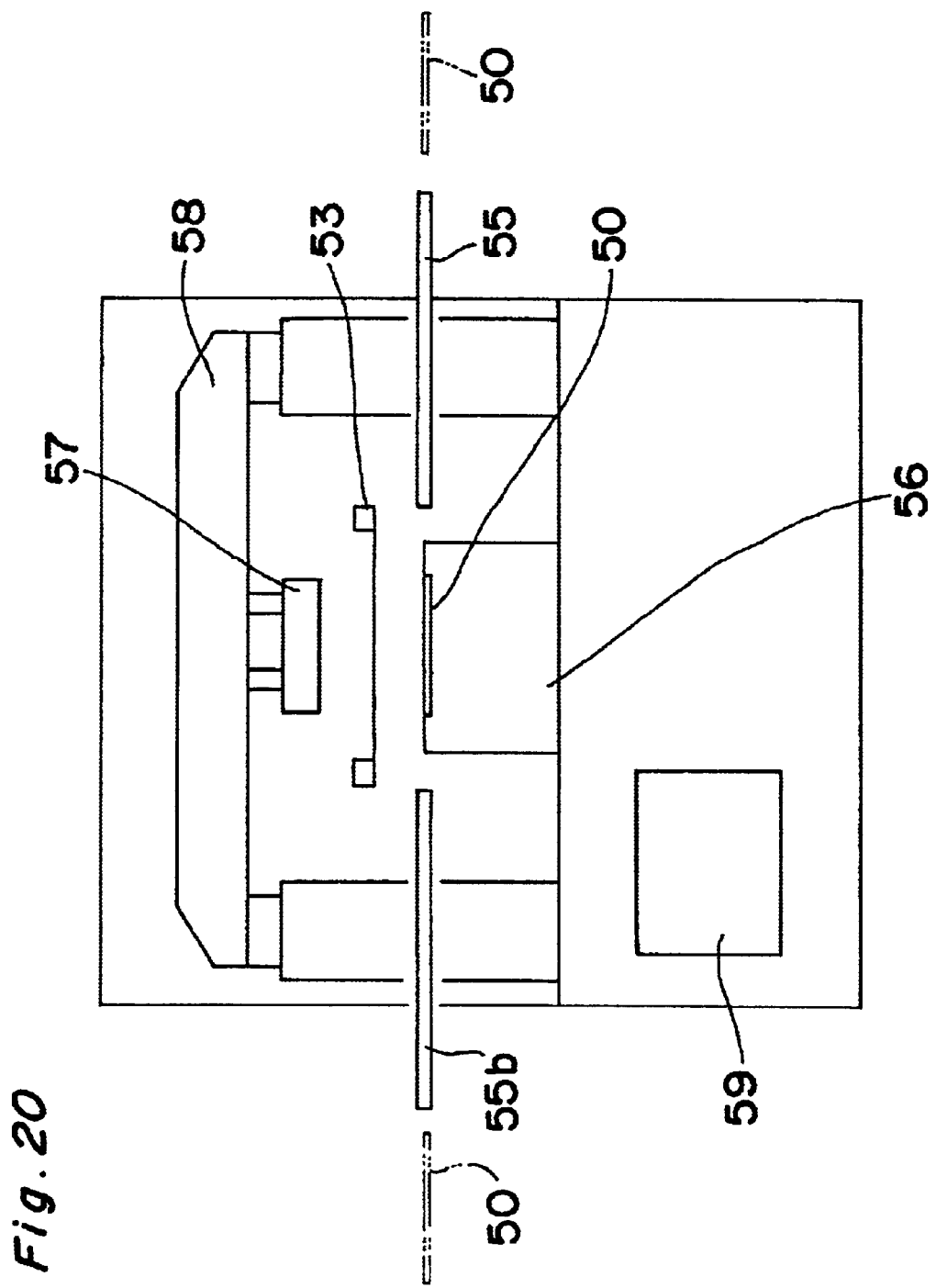
FIG. 20 is a front view showing the general schematic construction of a viscous material application apparatus according to a third embodiment of the present invention.

In FIG. 20, which shows general schematic construction of the viscous material application apparatus, an application object 50 is conveyed into the apparatus by a conveyor section 55a, and fixedly positioned to a table section 56 disposed under a screen mask 53. The table section 56 has an up-down mechanism (not shown) for putting the application object 50 into contact with the screen mask 53. Also, an X-, Y-, and θ-positioning mechanism (not shown) for aligning the application object 50 and the screen mask 53 with each other in their relative positions in X-, Y-, and θ-directions is provided either in the table section 56 or the screen mask 53.

An application head 57 is disposed above the screen mask 53. After the application object 50 is brought into contact with the screen mask 53, the application head 57 is pressed against the screen mask 53 and, in this state, moved by a horizontal driver device 58, by which the viscous material is applied onto the application object 50. After an end of the application, the application object 50 is conveyed to the subsequent step by a conveyor section 55b. The individual mechanical sections mentioned above are integrally controlled by a control section 59.

The application head 57 is composed mainly of a material feed section 1, an air feed section 2, and an application unit 3 as shown in FIG. 1. In the material feed section 1, the viscous material 4 such as adhesive or solder paste is stored in the syringe-like storage tank 1*b*, where as a plunger 1*a* is activated by compressed air serving for material feed, the viscous material 4 is pressurized and pressure-fed so as to be filled up in the chamber 3*a*, which is a storage chamber for the viscous material 4 in the application unit 3.

The chamber 3*a* of the application unit 3 and the material feed section 1 are coupled to each other by the joints 5, and the viscous material 4 is fed into the chamber 3*a* by passing through the feed passages 5*a* provided in the joints 5.

On both sides under the chamber 3*a*, the two blades 6 each formed of a thin plate having elasticity are attached with the blade holders 7 so as to approach each other downward with the gap of about 10 mm formed between their fore ends, where the discharge hole 8 for discharging out the viscous material 4 is formed by the opening between the two blades 6. The blades 6 are each formed of a thin plate of copper, stainless, resin, or the like having a thickness of, for example, about 0.1 to 0.5 mm, where resin materials such as polyimides or polyamides-imides are particularly preferable.

The stoppers 9 are disposed at both ends of the two blades 6 to prevent the viscous material 4 from leaking from the chamber 3*a*. The stoppers 9 are held by the joints 5 so as not to be disengaged by the pressure applied to the viscous material 4.

On one side of the chamber 3*a* opposite to the discharge hole 8, that is, on the upper side of the chamber 3*a*, the sheet or bag 10 formed of a sheet having the depressions is disposed along the longitudinal direction of the chamber 3*a* over the generally entire length so as to partly confront the inside of the chamber 3*a* in opposition to the discharge hole 8, the sheet or bag 10 being sandwiched and fixed by the chamber 3*a* and the plate 3*b* that closes the upper part of the chamber 3*a*. The sheet or bag 10 is so made as to be increased and decreased in internal capacity by air being fed and discharged from the air feed section 2 via the air port 2*a*. The sheet or bag 10 is formed of a resin material, such as urethane elastomer, polyethylene, or nylon, having a thickness of about 0.03 to 1 mm, and more preferably, about 0.3 to 0.5 mm. It is noted that the sheet or bag 10, although varying depending on the pressure of the air fed, may be broken when its thickness is too thin, and may result in a poor inflation-and-deflation responsivity when the thickness is too thick.

After the viscous material is fed into the chamber 3*a*, feeding air to the sheet or bag 10 causes the viscous material 4 to be pressed at a specified pressure so that a discharge pressure for application of the viscous material 4 can be given. Discharging the air from the sheet or bag 10 allows the discharge pressure to be released instantaneously.

In a portion of the sheet or bag 10 sandwiched and fixed by the chamber 3*a* and the plate 3*b*, an air bleeding sheet 411 for bleeding the air is disposed at the underside of the sheet or bag 10, so that at the first feed of the viscous material 4 from the material feed section 1 into the chamber 3*a*, the air within the chamber 3*a* can be bled from the air bleeding sheet 11.

In the center of the chamber 3*a*, the sheet or bag 10 is not provided, and the pressure detecting device 12 for detecting the pressure of the viscous material 4 in the chamber 3*a* is provided at that place.

Next, methods of fluidizing and stirring in the chamber 3*a* the viscous material stored in the chamber 3*a* of the application unit 3 having the above constitution are explained with reference to FIGS. 21 to 26.

Referring to FIG. 21, the application unit 3 is supported by the guide 16 via the bracket 15 so as to be movable in up-and-down directions, which are far-and-near directions with respect to the screen mask 53, and also is constructed so as to be positionable to any arbitrary position in up-and-down directions by the feed screw mechanism 17 and the motor 18. In this case, the height of the application unit 3 with the discharge hole 8 kept in contact with the screen mask 53 is assumed to be Z. The table section 56 movably disposed under the screen mask 53 holds the application object 50 and brings the application object 50 into contact with the screen mask 53 in order to apply the viscous material 4 onto the application object 50. After the application, the table section 56 discharges the application object 50 to the subsequent step.

Even at an initial feed of the viscous material 4 into the chamber 3*a* in a state in which the chamber 3*a* is in an empty state, or during an application operation, it is often the case that the viscous material 4 is of poor fluidity when the application operation has halted for a certain time period due to occurrence of some equipment trouble or a wait for supply of the application object 50 or the like. Therefore, it is preferable that the viscous material 4 inside the chamber 3*a* is preliminarily fluidized before an application so that a stably successful application state can be achieved.

Figure 22A:
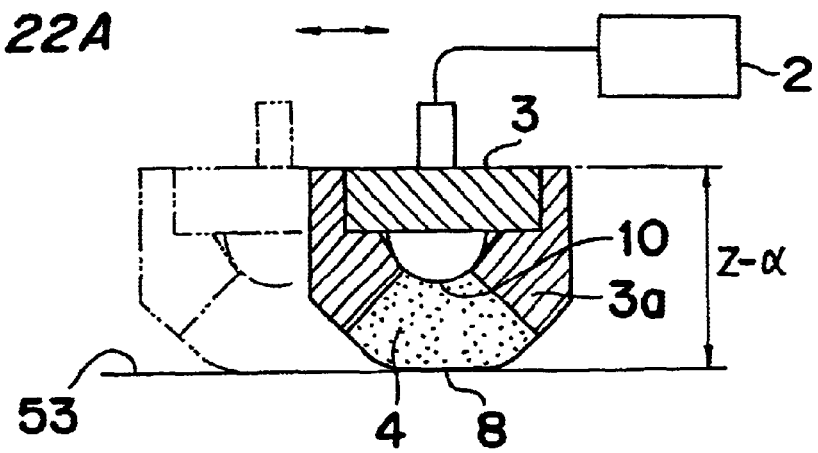
FIGS. 22A, 22B, and 22C are explanatory views of a first method of stirring the viscous material in the third embodiment.
Figure 22B:
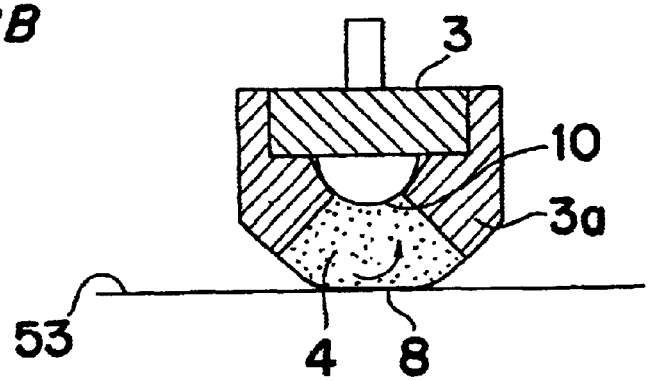
Figure 22C:
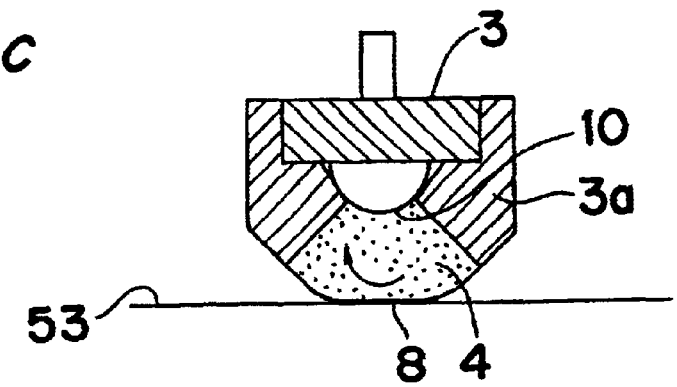

Accordingly, while the table section 56 is kept in contact with the screen mask 53 to thereby support the screen mask 53, the application unit 3 is pressed against the screen mask 53 by the motor 18, which is an up-down driver device, so that the height of the application unit 3 is set to Z-$\alpha$, as shown in FIG. 22A. Then, the sheet or bag 10 is expanded to apply a pressure to the viscous material 4, and the application unit 3 is reciprocatively moved at an opening-absent part of the screen mask 53 by the horizontal driver device 58 (see FIG. 20) as indicated by arrows. As a result of this, as shown in FIGS. 22B and 22C, the viscous material 4 inside the chamber 3*a* is moved while rolling within the chamber 3*a*, thus allowing the viscosity of the viscous material 4 to be adjusted.

As to conditions for the reciprocating operation, which may vary depending on the kind of the viscous material 4, for example, the pressure of the air feed section 2 is 0.3 MPa, the push-in amount $\alpha$ into the screen mask 53 is 1 mm, the reciprocating operation speed is 50 mm/s, the reciprocating stroke is 20 mm, and the number of reciprocations is 10.

Since the viscous material 4 is low in fluidity at initial stages of the reciprocating operation, it may be preferable that the pressure of the air feed section 2 is set to a lower pressure, or that the reciprocating operation speed is set lower first and then the pressure of the air feed section 2 is set higher in the last half or the reciprocating operation is set to higher. These processes can be performed automatically with reciprocating-operation set data preliminarily inputted in the control section 59. Otherwise, it is also possible that, as described later, while the viscosity of the viscous material 4 in the chamber 3*a* is detected, the operation is halted when the viscosity has reached a specified viscosity.

Figure 23A:
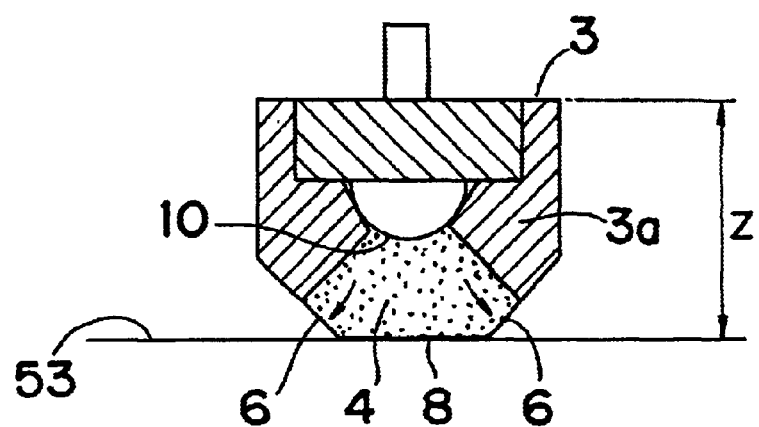
FIGS. 23A and 23B are explanatory views of a second method of stirring the viscous material in the third embodiment.
Figure 23B:
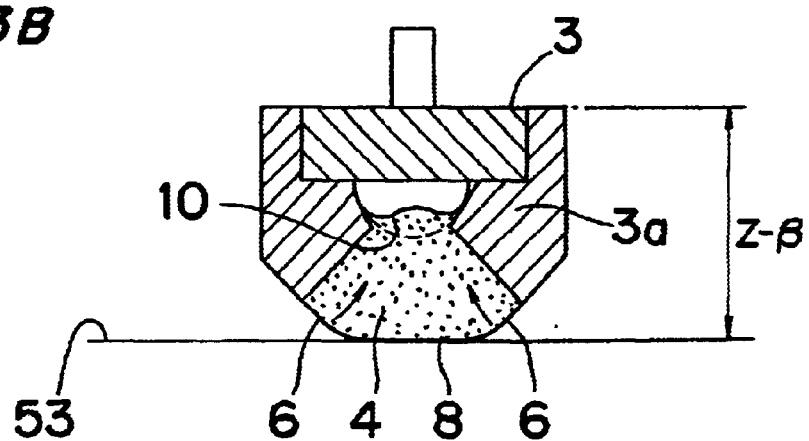

Further, since the viscous material 4 in the chamber 3*a* is forcedly fluidized also in side and upper parts of the chamber 3*a*, it is also possible that, as shown in FIGS. 23A and 23B, with the sheet or bag 10 set deflatable, the application unit 3 is iteratively moved up and down between two heights, i.e., a position (Z) where the application unit 3 makes contact with the screen mask 53 and a position (Z-$\beta$) where the application unit 3 is pressed against the screen mask 53, so that the viscous material 4 in the chamber 3*a* is fluidized by making use of the flexure of the blades 6. If this part is low in fluidity in application operation, the internal pressure of the chamber 3*a* may be larger than expected. Therefore, it is preferable that the viscous material 4 is preliminarily fluidized and stirred by using the above method.

Figure 24A:
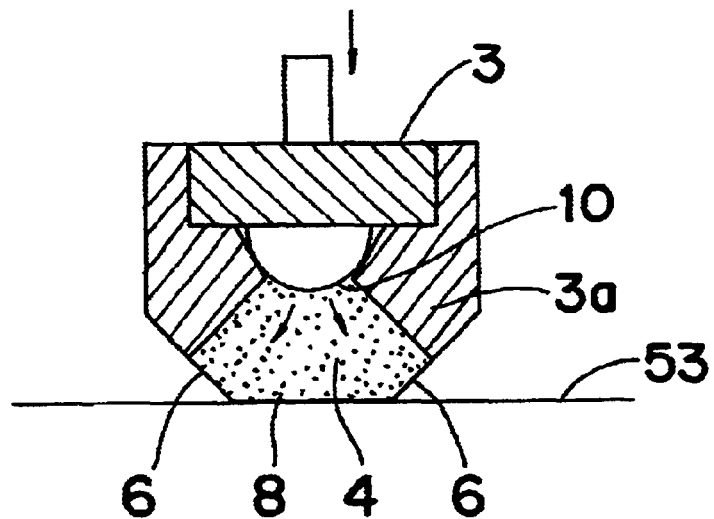
FIGS. 24A and 24B are explanatory views of a third method of stirring the viscous material in the third embodiment.
Figure 24B:
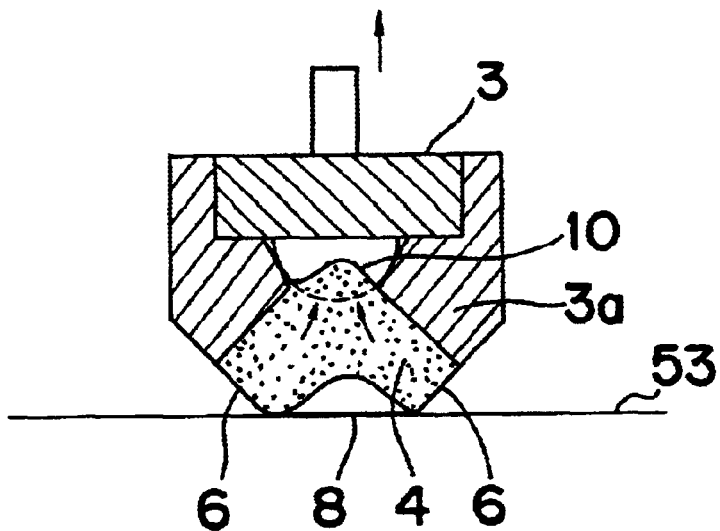

Also, the viscous material 4 in the chamber 3a may be moved by iterating the feed and discharge of air to and from the sheet or bag 10 as shown in FIGS. 24A and 24B, in which case similar effects can be obtained.

Figure 25A:
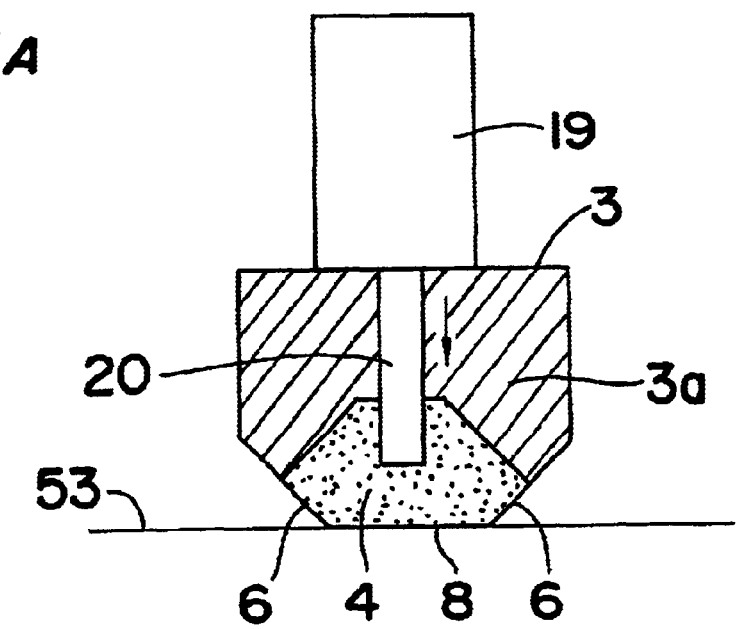
FIGS. 25A and 25B are explanatory views of a modification of the third method of stirring the viscous material in the third embodiment.
Figure 25B:
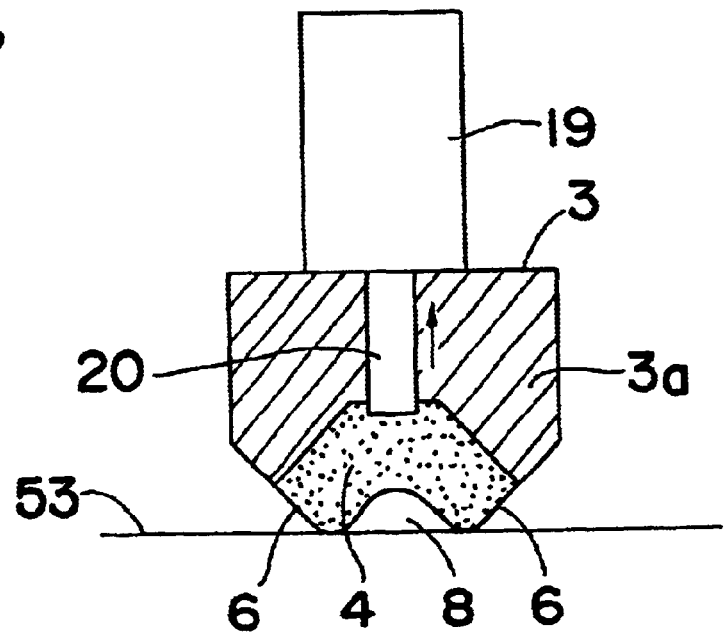

Also, in an application unit 3 in which, as shown in FIG. 25, the in-and-out member 20 provided so as to be plungeable into and withdrawable from the chamber 3a instead of the sheet or bag 10 is driven in and out by the push-pull device 19 such as a cylinder, where the viscous material 4 is pressurized by the in-and-out member 20 so that the viscous material 4 is applied from the discharge hole 8, similar effects can be obtained by iterating the in-and-out operations of the in-and-out member 20 to move the viscous material 4 in the chamber 3a as shown in FIGS. 25A and 25B.

Figure 26A:
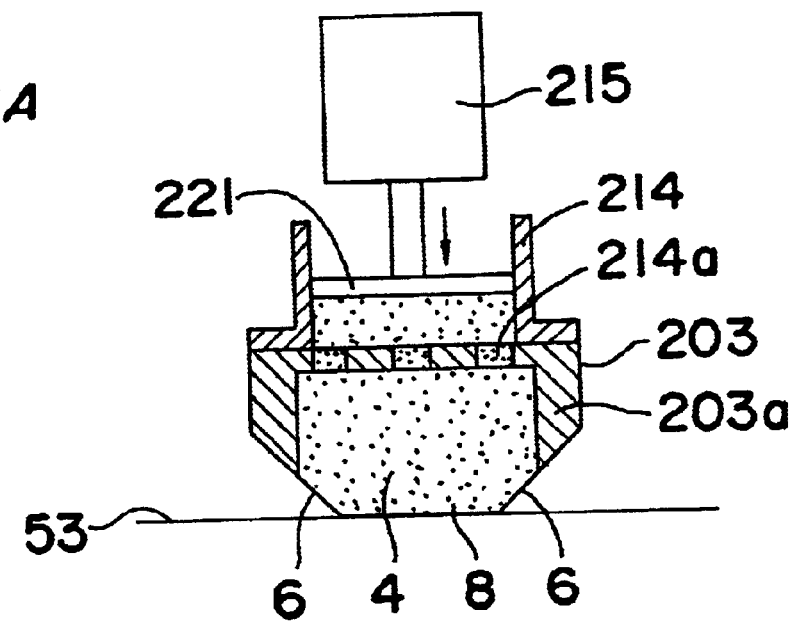
FIGS. 26A and 26B are explanatory views of another modification of the third method of stirring the viscous material in the third embodiment.
Figure 26B:
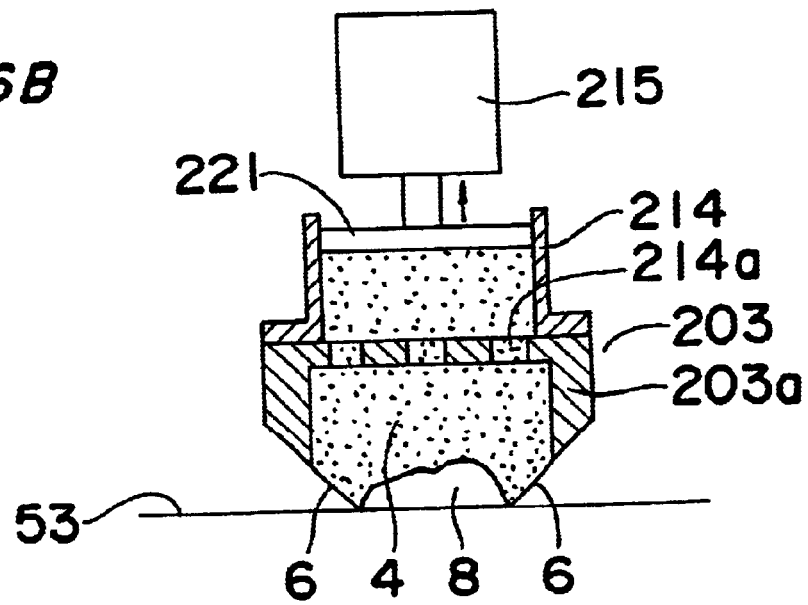

Also, in an application unit 203 in which, as shown in FIG. 26, the container 214 having the viscous material 4 stored therein is provided on the top of the chamber 203a and communicated with the inside of the chamber 203a via through holes 214a, where the viscous material 4 is fed into the chamber 203a by pressing the plunger 221 placed on the top of the viscous material 4 in the container 214 with a push-pull device 215 such as a cylinder, while the discharge pressure is imparted, it is also possible that, as shown in FIGS. 26A and 26B, similar effects can be obtained by moving the viscous material 4 in the chamber 203a by iterating the push and pull of the plunger 221.

Next, a viscous material application method according to other embodiments of the present invention are explained with reference to FIGS. 27 to 30.

Figure 27:
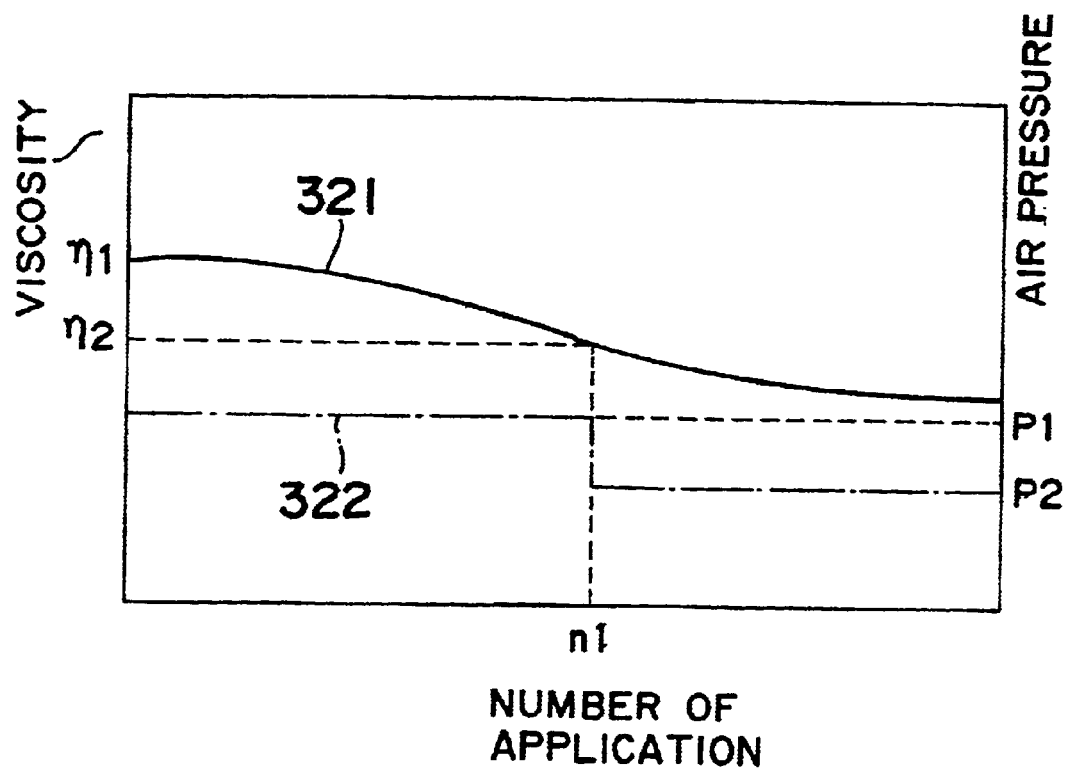
FIG. 27 is an explanatory view of a method of changing the discharge pressure by viscosity change of the viscous material in another embodiment of the viscous material application apparatus according to the present invention.

FIG. 27 shows a relationship among the number of times of applications, a variation in viscosity 321 of the viscous material 4, and pressure 322 of the air feed section 2 during an application operation in this embodiment. At the beginning of the application, the application is performed with a pressure P1 of the air feed section 2, where the viscosity of the viscous material 4 at that time is η1. As the application is repeated, the viscosity gradually lowers so that application is attainable even at low pressure, and therefore the pressure is changed to a pressure P2 of the air feed section 2 in the 'n1'th and following applications, with which the application is continued. As a result of this, smears of the viscous material 4, which are likely to occur with low viscosity, can be prevented, so that high-quality application can be achieved stably. Timings of changing the discharge pressure for the viscous material 4 as well as discharge pressures for individual cases have been stored in the control section 59 as a data table according to qualities of the viscous material 4, characteristics of the screen mask 53, and the like. Performing control according to the table allows high-quality application to be achieved stably.

In the application method in which the pressure of the air feed section 2 is set according to the viscosity of the viscous material 4 as shown above, the timing of change may be set previously according to the number of times of applications in the manner shown above, and otherwise, with the measurement of the viscosity of the viscous material 4, the pressure of the air feed section 2 may be changed as occasion demands during the move and stir of the viscous material 4 inside the chamber 3a, 203a while the viscous material 4 is actually applied.

Now respective methods of measuring the viscosity of the viscous material 4 inside the chamber 3a are explained with reference to FIGS. 28 to 30.

Figure 28A:
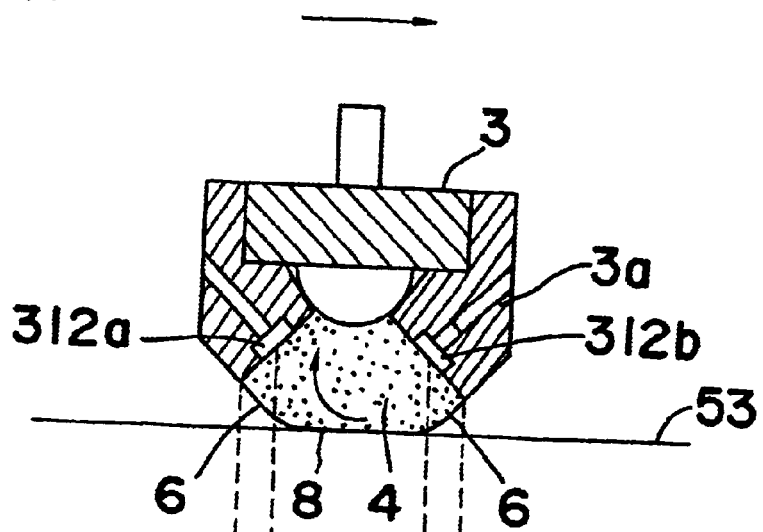
FIGS. 28A and 28B are an explanatory view and a graph, respectively, of a first method of measuring the viscosity of the viscous material in the same embodiment.
Figure 28B:
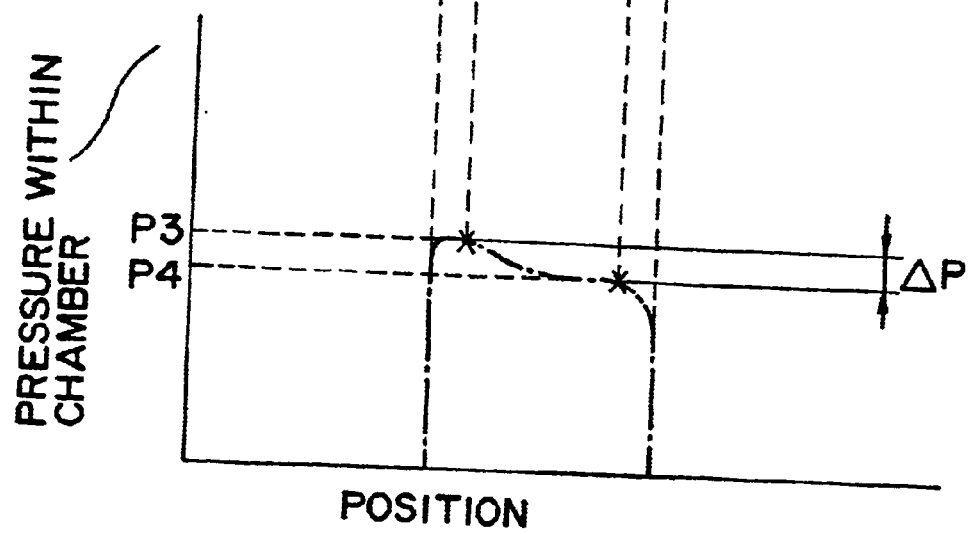

In the case of FIG. 28A, pressure detecting devices 312a, 312b constructed by a plurality of pressure sensors are disposed in the chamber 3a on both sides of the direction of move of the application unit 3, where a pressure difference at a move of the application unit 3 is detected. For example, as the chamber 3a is moved to the right, the viscous material 4 is moved clockwise, so that pressures detected by the pressure detecting devices 312a, 312b are P3 and P4, respectively, as shown in FIG. 28B. From a pressure difference ΔP between these pressures P3 and P4, the fluidity of the viscous material 4 can be decided. Low viscosity of the viscous material 4, which means high fluidity, results in a small pressure difference ΔP, and high viscosity of the viscous material 4, which means low fluidity, results in a large pressure difference ΔP. Therefore, the viscosity of the viscous material 4 can be determined by providing at least two pressure detecting devices 312a, 312b. In addition, while a change in the air pressure from the air feed section 2 causes the measured pressures P3 and P4 to change, the pressure difference ΔP can be regarded as corresponding to the fluidity of the viscous material 4, where the value of the pressure difference ΔP almost never changes regardless of the pressure of the air feed section 2. Therefore, this method is effective as a method for measuring the viscosity indirectly.

Figure 29A:
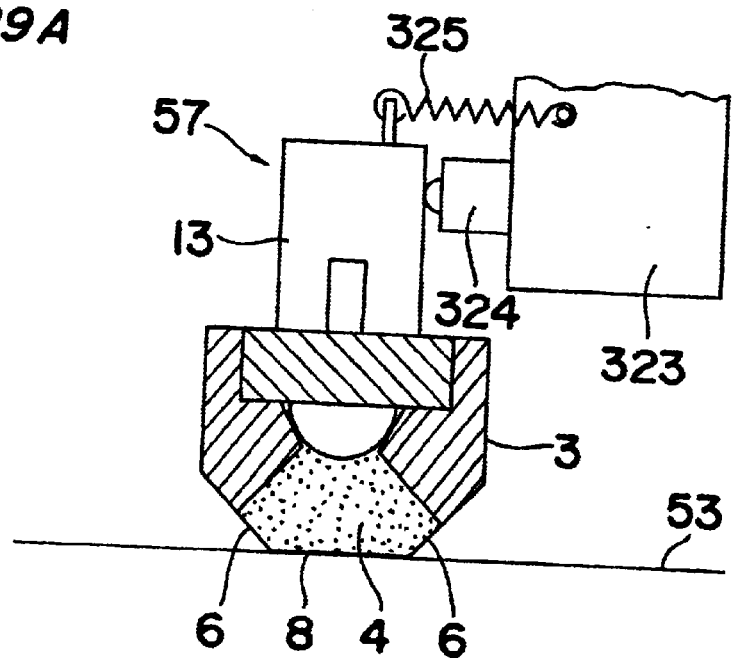
FIGS. 29A and 29B are explanatory views of a second method of measuring the viscosity of the viscous material in the same embodiment.
Figure 29B:
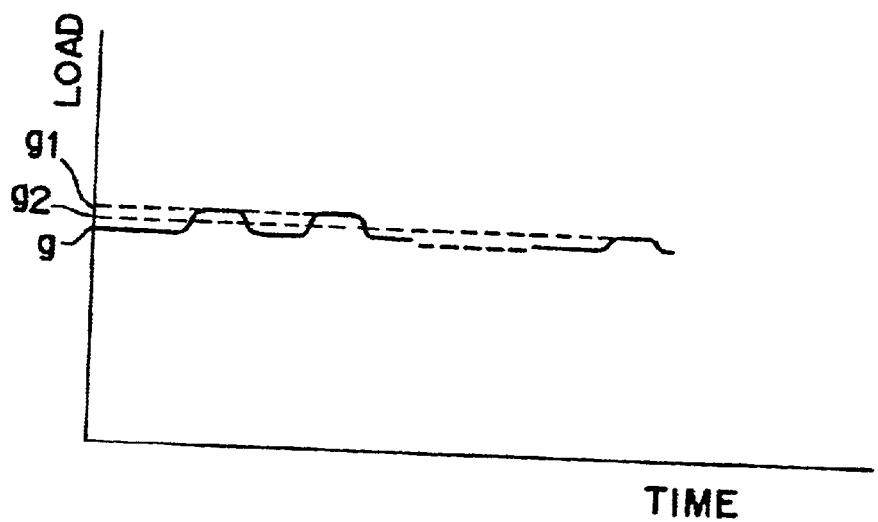

FIG. 29A shows an application head 57, in which the application unit 3 is mounted so as to be pressed against a support member 323 at a constant load via a load cell 324 with a pressing device such as a spring 325 or the like. The application head 57 can be moved on the screen mask 53 by a horizontal driver device 58, where a moving resistance that the application unit 3 undergoes during the move on the screen mask 53 is detected by the load cell 324. The load due to the moving resistance varies depending on the viscosity of the viscous material 4 present at the discharge hole 8 that is in contact with the screen mask 53, a state of the change being shown FIG. 29B.

The application unit 3 is pressed against a support member 23 with a constant load g, where applying a pressure to the viscous material 4 to move the application unit 3 horizontally along the screen mask 53 causes the load to be g1. In early stages, the viscosity of the viscous material 4 is high and therefore the viscous material 4 inside the chamber 3a is low in fluidity. However, repeating the horizontal move causes the viscosity of the viscous material 4 to lower and the load to become smaller as well. For example, it may previously be set that when the load becomes g2 or less, the viscosity of the viscous material 4 is decided as having been stabilized, where the application is started, or that with extents of changes from the initial load g1 accumulated as data, the stabilization of the viscosity of the viscous material 4 is decided from a change amount of the load.

Figure 30A:
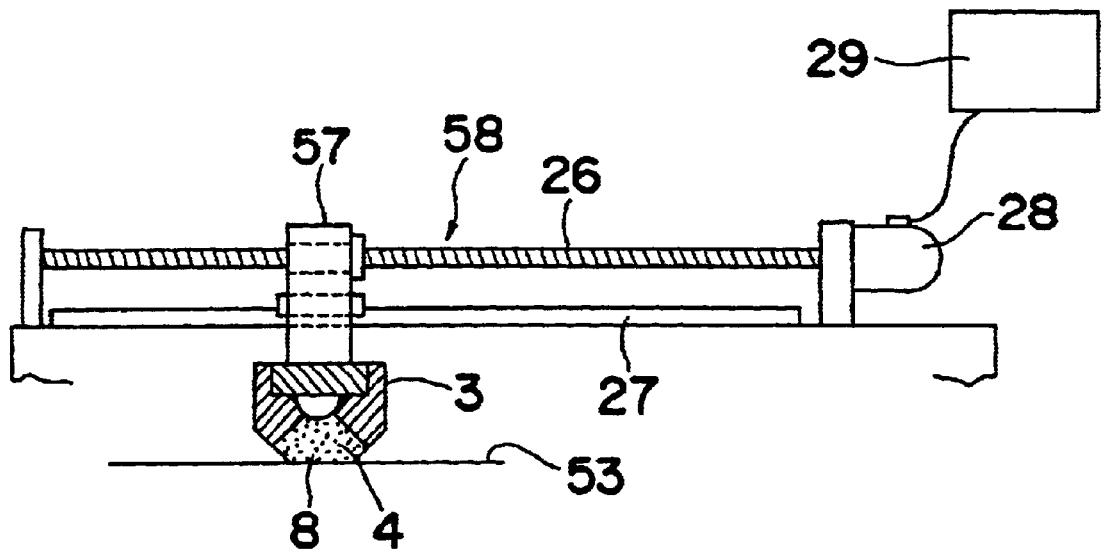
FIGS. 30A and 30B are an explanatory view and a graph, respectively, of a third method of measuring the viscosity of the viscous material in the same embodiment.

FIG. 30A shows the horizontal driver device 58, where the application head 57 is driven along the screen mask 53 by a feed screw mechanism 26, a guide 27, and a motor 28. Load during the move of the application unit 3 on the screen mask 53 is detected from the current value of a driver 29 of the motor 28.

Figure 30B:
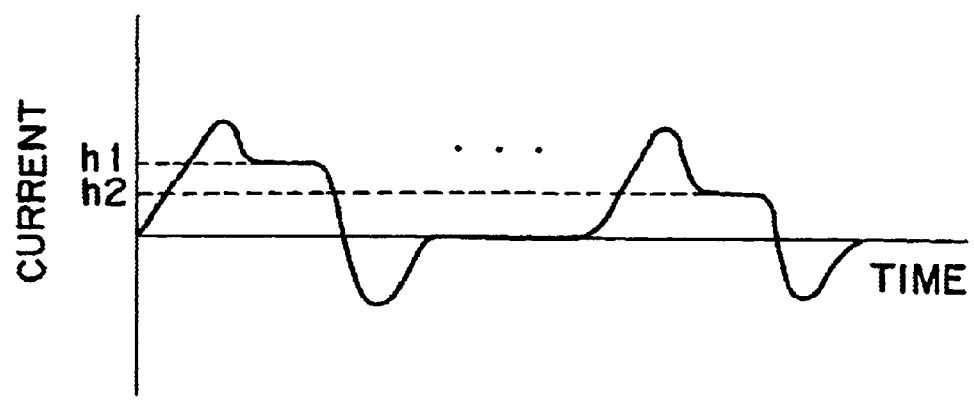

More specifically, when the application unit 3 is moved horizontally along the screen mask 53 with a pressure applied to the viscous material 4, the current of the driver 29 becomes h1 as shown in FIG. 30B. Although the viscous material 4 inside the chamber 3a is low in fluidity because of high viscosity of the viscous material 4 in the beginning, repeating the horizontal move causes the viscosity of the viscous material 4 to lower and the load to become smaller as well, thus the current value also being smaller. Accordingly, it may previously be set that when the current value becomes h2 or less, the viscosity of the viscous material 4 is decided as having been stabilized, where the application is started, or that with extents of changes from the initial current value h1 accumulated as data, the stabilization of the viscosity of the viscous material 4 is decided from a change amount of the current value.

This embodiment has been explained on an example in which the sheet or bag 10 is used as the discharge-pressure adjusting device of the application unit 3. Otherwise, as shown in FIG. 25 or 26, even in the case where an in-and-out member 317 is put into and out of the chamber 3a, or in the case where the container 214 is provided on the top of the chamber 3a so as to communicate therewith via the through holes 214a, where the plunger 221 is pulled and pushed, the application conditions can be changed according to the viscosity of the viscous material 4, similarly.

Also, a method of changing the pressure of the air feed section 2 according to the number of times of applications in response to viscosity changes of the viscous material 4 has been explained as shown in FIG. 27. Otherwise, it is also possible that with the viscosity of the viscous material 4 indirectly but actually measured by the aforementioned method, a timing for changing the conditions experimentally determined is determined by referencing the data table stored in the control section 59, allowing the application conditions to be determined in more accordance with the actual application state, by which the application of the viscous material 4 onto the application object 50 can be achieved more stably, preferably.

Also, it has been described in FIGS. 27 to 30 that the discharge pressure for the viscous material 4 is changed in response to changes in the viscosity of the viscous material 4 resulting from the application. However, this method may also be used similarly for the stabilization of the viscosity of the viscous material 4 before the application as described in FIGS. 21 to 26. For example, in the case where the operation is ended not by counting the number of times of reciprocations, but by detecting a change in the viscosity of the viscous material 4, a constant state can be reproduced at all times even with occurrence of differences in ambient environments or differences in characteristics among the lots of the viscous material 4.

Also, the above embodiments have been described only on an example in which the screen mask 53 is not moved but the application unit 3 side is moved. However, it is also possible that without moving the application unit 3, conversely, the screen mask 53 or the application object 50 is moved, in which case similar operations and their effects can be fulfilled.

Also, the above embodiments have been shown on an example in which with the application object 50 placed at the underside of the screen mask 53 as shown in FIG. 11A, the viscous material 4 discharged out from the application unit 3 is applied and printed onto the lands 51 of the application object 50 through the openings 52 of the screen mask 53. Otherwise, the present invention can also be applied to cases in which the viscous material 4 is filled and applied into recessed portions or through holes formed in the application object 50 as shown in FIG. 11B, in which case also similar effects can be fulfilled.

According to the viscous material application method and apparatus of the present invention, the viscous material in the storage chamber is stirred by iterating an operation of moving the application unit parallel and/or vertical to the screen mask or the application object or another object different from the application object, relative to each other, while the application unit is kept in contact with the screen mask or the application object or the different object at an opening-absent part of the screen mask or on the application object or on the different object. Therefore, the viscous material can be stirred effectively, and thus adjusted in its viscosity, without providing any special stirring device at the discharge hole part and without adversely affecting high-precision control or responsivity of the discharge pressure. Thus, successful application quality can be obtained stably.

Further, in the case where the viscous material in the storage chamber is stirred by iteratively increasing and decreasing the internal space of the storage chamber, the viscous material can be stirred effectively and adjusted in its viscosity, similarly. Thus, successful application quality can be obtained stably.

Also, in the case where the above two methods are used in combination, the viscous material can be stirred more effectively and adjusted in its viscosity, so that successful application quality can be obtained stably.

Also, in the case where with the viscosity of the viscous material measured, upon an arrival at a specified viscosity, the stirring of the viscous material is halted and the viscous material is applied onto the application object, the viscous material can be applied in an optimum viscosity state so that successful application quality can be obtained.

Also, in the case where with the viscosity of the viscous material measured, the viscous-material discharge pressure is adjusted or the application is halted according to a detected viscosity, a proper discharge pressure can be imparted according to the viscosity of the viscous material so that successful application quality can be obtained.

Also, in the case where the viscosity of the viscous material is measured by moving the application unit along the screen mask or the application object or the different object, relative to each other, while the discharge hole of the application unit is kept in contact with the screen mask or the application object or the different object, and detecting a differential pressure of the viscous material between both sides of a direction of move in the storage chamber or detecting a moving load during the move or detecting an electric current flowing through a motor that drives the move, the viscosity of the viscous material stored in the storage chamber can be detected simply and accurately.

Also, in the case where the control of viscous-material viscosity adjustment or discharge-pressure adjustment is performed by preliminarily storing in the control section the data table defining viscosity-adjusting conditions or application conditions such as viscosity-adjusting time, number of times of viscosity-adjusting operations, and discharge pressure according to qualities of the viscous material, patterns of application, characteristics of the application object, or the like and then referencing the data table, successful application quality can be obtained as in the above cases without detecting the viscosity.

(Fourth Embodiment)

A fourth embodiment of the present invention relates to viscous material application method and apparatus for applying a viscous material such as adhesive, solder paste, or electrically conductive paste to a circuit board or other application object via a screen mask in a specified pattern.

As a conventional viscous material application apparatus, there has generally been known a screen printing device in which a viscous material 4 such as adhesive or solder paste is applied onto lands 51 of a circuit board or the like, which is an application object 50, via a screen mask 53 as shown in FIGS. 12A–12E.

The screen mask 53 has openings 52 formed as through holes provided in a specified pattern corresponding to the lands 51 of the application object 50, and the application object 50 is positioned by an unshown table section so as to be in contact with the screen mask 53 as shown in FIGS. 12A and 12B. Next, as shown in FIG. 12C, the viscous material 4 fed to an end of the screen mask 53 is moved in a specified direction by a squeegee 54, so that the viscous material 4 is filled into the openings 52. Next, the application object 50 is separated away from the screen mask 53 as shown in FIG. 12D, by which the viscous material 4 within the openings 52 is transferred onto the lands 51 of the application object 50 so that the viscous material 4 is applied onto the lands 51 of the application object 50 as shown in FIG. 12E.

Also, the inventor has developed in Japanese Patent Application 10-232164 (Unexamined Japanese Patent Publication 2000-62138) a tightly closed type squeegee characterized by including, on a filling unit movable on a screen mask, a chamber which has a tightly closed structure capable of shutting off print paste from the atmospheric air and also has a discharge hole in opposition to the screen mask and which is to be filled with print paste, a pressurizing device for pressurizing the print paste in the chamber to push the print paste out of the discharge hole, a pair of scraper blades which slide in press contact with the screen mask back and forth along the direction of move of the filling unit, a paste tank which forms a part of the pressurizing device and which is removably mountable, and a shutter mechanism which can open and close the discharge hole.

However, in this conventional viscous material application apparatus, since the apparatus adopts a method that the squeegee 54 is moved on the screen mask 53 to thereby fill the viscous material 4 into the openings 52, and since the viscous material 4 is in contact with the air at all times, the viscous material 4 tends to vary in state, causing an issue that stable application becomes unachievable, and another issue that the viscous material 4 overflowing the squeegee 54 needs to be scraped into the squeegee 54.

Also, there is a large amount of know-how for obtaining proper application state, and skilled engineers are necessitated therefor. In particular, it is more difficult to achieve the proper application while recent years' demand for finer pitches of the openings 52 is met and moreover a demand for faster speed is satisfied. This has been a cause of another issue that increasingly larger amount of know-how and skillfulness is required.

On the other hand, in the structure of above-mentioned Japanese Patent Application 10-232164 (Unexamined Japanese Patent Publication 2000-62138), indeed the viscous material 4 does not need scraping up, and moreover the viscous material 4 is kept away from contact with the air, thus preventable from any changes in state. However, there is a possibility that air that has been present within the chamber may be entrapped during the feed and filling of the viscous material into the chamber, causing an issue that when the discharge pressure is imparted in the state as it is, the discharge pressure cannot be controlled with high precision, resulting in deteriorated application quality. The effects of this would be larger particularly in attempt to meet finer pitches or higher speeds. More specifically, with air entrapped within the chamber, particularly in the case of high-viscosity viscous materials such as solder paste, even if the discharge pressure is imparted, the entrapped air is compressed, causing the pressure to be relaxed, in vicinities of the air entrapment. This may cause issues of occurrence of phenomena that a desired pressure cannot be reached, or that the air entrapped by repeated applications sneaks to the discharge hole with the result of 'lacks,' which means that the application lacks.

In view of these and other issues of the prior art, an object of the present invention is to provide a viscous material application apparatus in which the viscous material can be prevented from making contact with the air at all times so that a stable application can be achieved, the viscous material never overflows during the operation and the discharge pressure can be controlled with high precision so that high-quality application can be achieved.

Hereinbelow, the viscous material application apparatus according to the fourth embodiment of the present invention is described with reference to FIG. 1 and FIGS. 31 to 34B.

An application head in the viscous material application apparatus of the fourth embodiment is composed mainly of a material feed section 401, an air feed section 402, and an application unit 403 as shown in FIG. 1. In the material feed section 401, a viscous material 4 such as adhesive or solder paste is stored in a syringe-like storage tank 401b, where as a plunger 401a is activated by compressed air serving for material feed, the viscous material 4 is pressurized and pressure-fed so as to be filled up in a chamber 403a, which is a storage chamber for the viscous material 4 in the application unit 403.

The chamber 403a of the application unit 403 and the material feed section 401 are coupled to each other by joints 405, and the viscous material 4 is fed into the chamber 403a by passing through feed passages 405a provided in the joints 405.

On both sides under the chamber 403a, two blades 406 each formed of a thin plate having elasticity are attached with blade holders 407 so as to approach each other downward with a gap of about 10 mm formed between their fore ends, where a discharge hole 408 for discharging out the viscous material 4 is formed by the opening between the two blades 406. The blades 406 are each formed of a thin plate of copper, stainless, resin, or the like having a thickness of, for example, about 0.1 to 0.5 mm, where resin materials such as polyimides or polyamides-imides are particularly preferable.

Stoppers 409 are disposed at both ends of the two blades 406 to prevent the viscous material 4 from leaking from the chamber 403a. The stoppers 409 are held by the joints 405 so as not to be disengaged by the pressure applied to the viscous material 4.

On one side of the chamber 403a opposite to the discharge hole 408, that is, on the upper side of the chamber 403a, a sheet or bag 410 formed of a sheet having depressions is disposed along the longitudinal direction of the chamber 403a over the generally entire length so as to partly confront the inside of the chamber 403a in opposition to the discharge hole 408, the sheet or bag 410 being sandwiched and fixed by junction surfaces of the chamber 403a and a plate 403b that closes the upper part of the chamber 403a. The sheet or bag 410 is so made as to be increased and decreased in internal capacity by air being fed and discharged from the air feed section 402 via an air port 402a. The sheet or bag 410 is formed of a resin material, such as urethane elastomer, polyethylene, or nylon, having a thickness of about 0.03 to 1 mm, and more preferably, about 0.3 to 0.5 mm. It is noted that the sheet or bag 410, although varying depending on the pressure of the air fed, may be broken when its thickness is too thin, and may result in a poor inflation-and-deflation responsivity when the thickness is too thick.

After the viscous material is fed into the chamber 403a, feeding air to the sheet or bag 410 causes the viscous material 4 to be pressed at a specified pressure so that a discharge pressure for application of the viscous material 4 can be given. Discharging the air from the sheet or bag 410 allows the discharge pressure to be released instantaneously. In the center of the chamber 403a, the sheet or bag 410 is not provided, and a pressure detecting device 412 for detecting the pressure of the viscous material 4 in the chamber 403a is provided at that place.

Figure 31A:
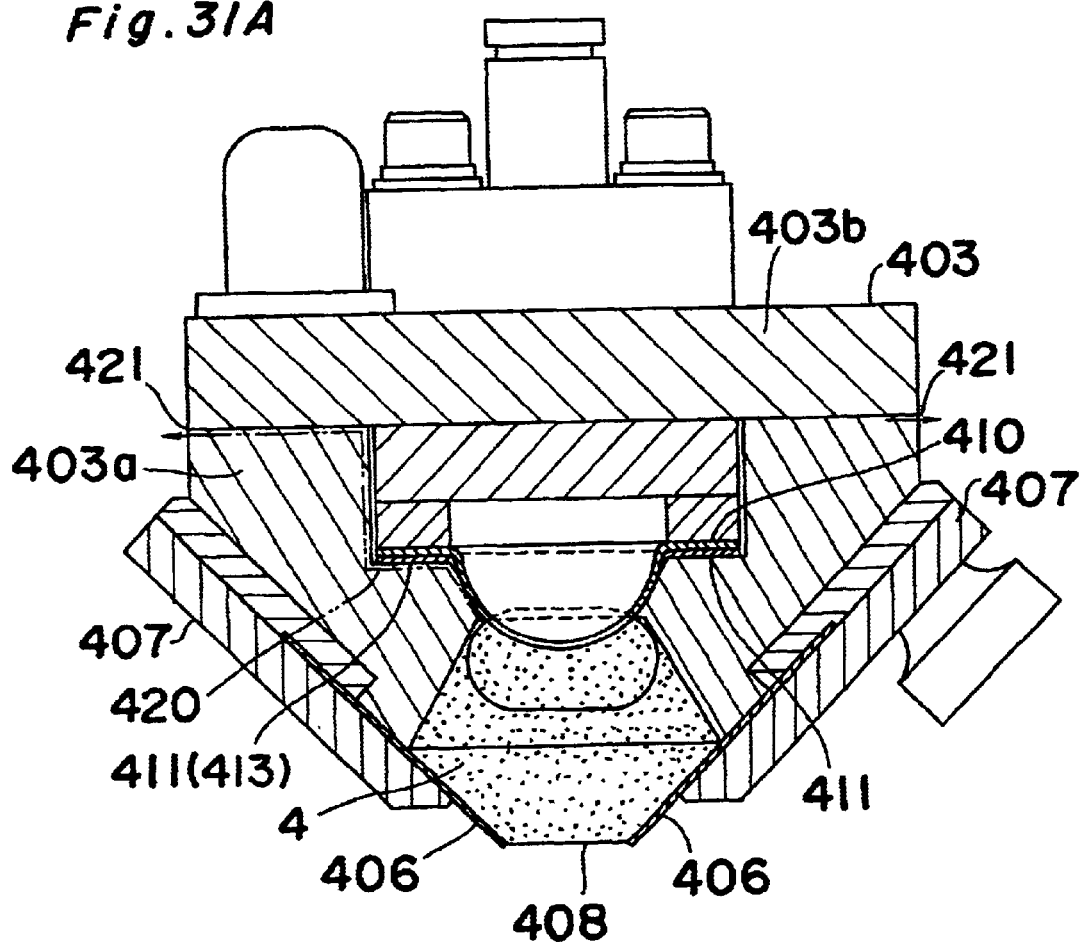
FIGS. 31A, 31B, and 31C are an enlarged longitudinal-section side view showing detailed construction of an application unit, a partial perspective view of an air bleeding sheet, and a sectional view as viewed along the arrows A—A of FIG. 31B, in a fourth embodiment of the present invention.

In a fixed portion of the sheet or bag 410 sandwiched and fixed by the chamber 403a and the plate 403b, as shown in detail in FIG. 31A, an air bleeding sheet 411 for bleeding the air is disposed at the underside of the sheet or bag 410, so that at the first feed of the viscous material 4 from the material feed section 401 into the chamber 403a, the air within the chamber 403a can be bled outside from the air bleeding sheet 411.

Figure 31B:
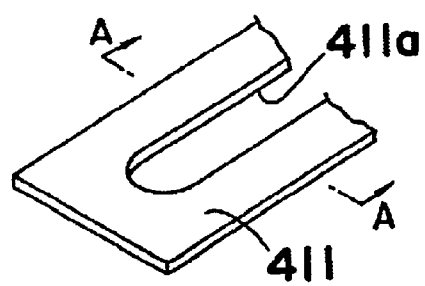
Figure 31C:
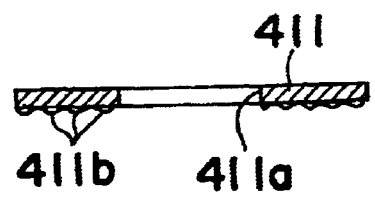

The air bleeding sheet 411, which is formed of a resin sheet or metal sheet, has openings 411a for the depression portions of the sheet serving as the sheet or bag 410 to pass through, and is formed into such a configuration as to overlap the fixed portions around the depression portions as shown in FIGS. 31B and 31C. On the underside of the air bleeding sheet 411 that overlaps divisional surfaces on the chamber 403a side, pits and projections 411b are provided to form minute air bleeding passages 420 continuing from the inner peripheral edge to the outer peripheral edge. As a result of this, the air within the chamber 403a is discharged out by passing through the air bleeding passage 420 and the junction surfaces between the chamber 403a and the plate 403b, as indicated by imaginary lines. The size of the passage cross section of the air bleeding passage 420 formed by the pits and projections 411b has only to be such that the air can be discharged out smoothly while the viscous material 4 cannot pass therethrough and, although varying depending on the properties of the viscous material 4, preferably being about 0.01 to 1 mm, more preferably about 0.05 to 0.6 mm, and optimally for solder paste as the viscous material 4, about 0.05 to 0.3 mm.

Figure 32A:
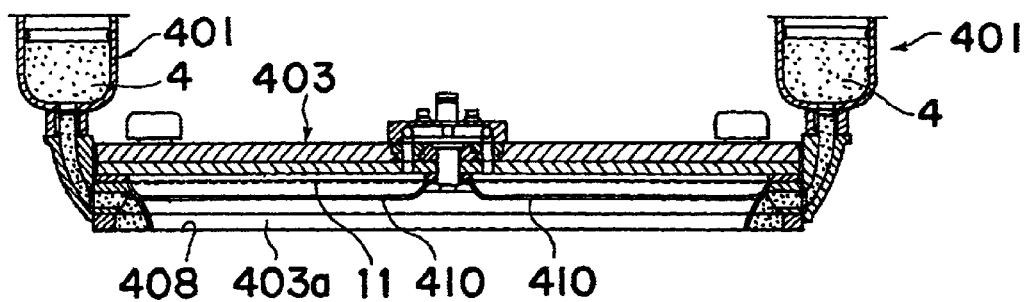
FIGS. 32A, 32B, and 32C are longitudinal-section front views for explaining a movement process of the viscous material within a chamber in the fourth embodiment.
Figure 32B:
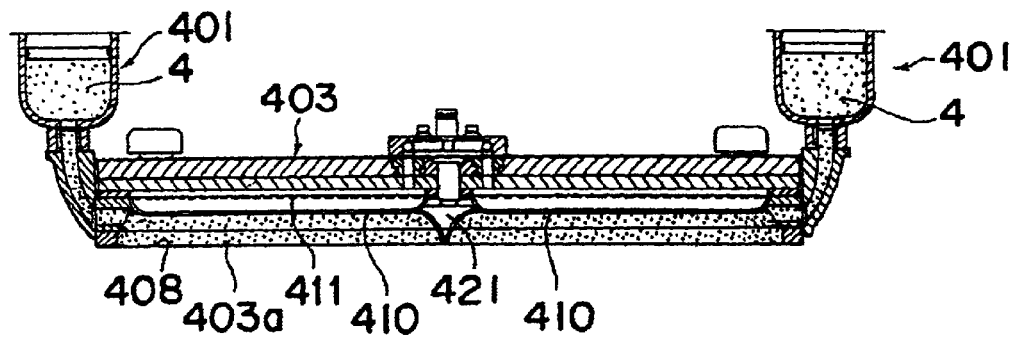
Figure 32C:
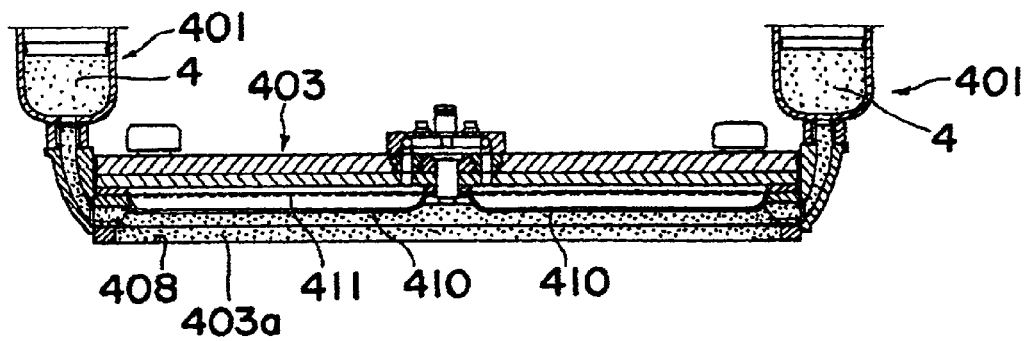

Next, an operation of feeding the viscous material 4 into the chamber 403a is explained with reference to FIG. 32. When the feed of the viscous material 4 from the material feed section 401 is started, the viscous material 4 flows into the chamber 403a from its both ends as shown in FIG. 32A. The inflow viscous material 4 flows toward the discharge hole 408 by its self-weight while being pushed by the subsequently fed viscous material 4 in succession, thus moving to a central portion of the chamber 403a, where air 321 is finally accumulated at an upper portion in the center of the chamber 403a on one side opposite to the discharge hole 408 as shown in FIG. 32B. This air 321 is all discharged outside through the air bleeding passage 420 formed by the air bleeding sheet 411 and, as shown in FIG. 32C, the chamber 403a is completely filled with the viscous material 4 without any residual air.

Also, since the sheet or bag 410 is fed with air from the air feed section 402, there is a possibility that the air may leak due to a positional shift of the fixed portion of the sheet or bag 410 unless the sheet or bag 410 is securely fixed. Therefore, the upper surface of the air bleeding sheet 411 to be in contact with the underside of the fixed portion of the sheet or bag 410 is formed into a smooth plane to ensure a tightly close contact.

In addition, when the viscous material 4 is newly fed with the chamber 403a once emptied, air has entered into the chamber 403a while the air bleeding passages 420 is closed with the viscous material 4 intruded thereinto. Accordingly, the air bleeding sheet 411 is replaced with another.

Figure 33A:
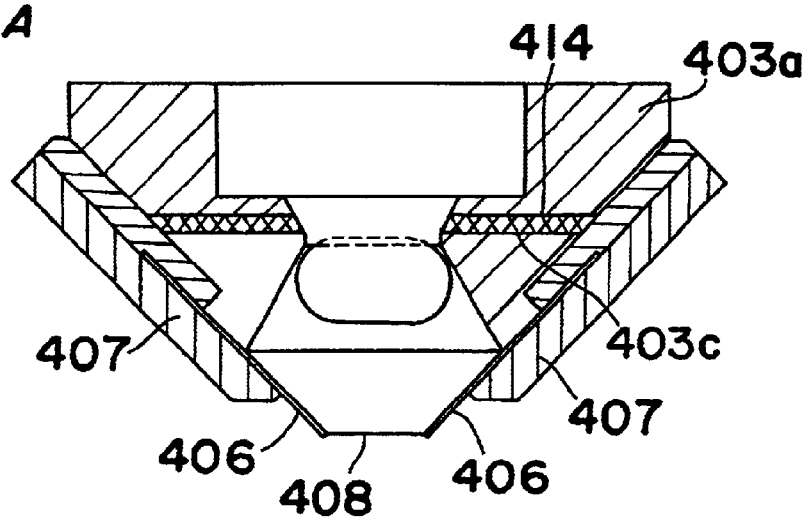
FIGS. 33A, 33B, and 33C are explanatory views of various modifications of the air bleeding device in the fourth embodiment.
Figure 33B:
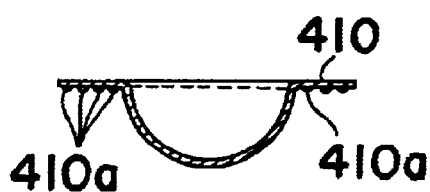
Figure 33C:
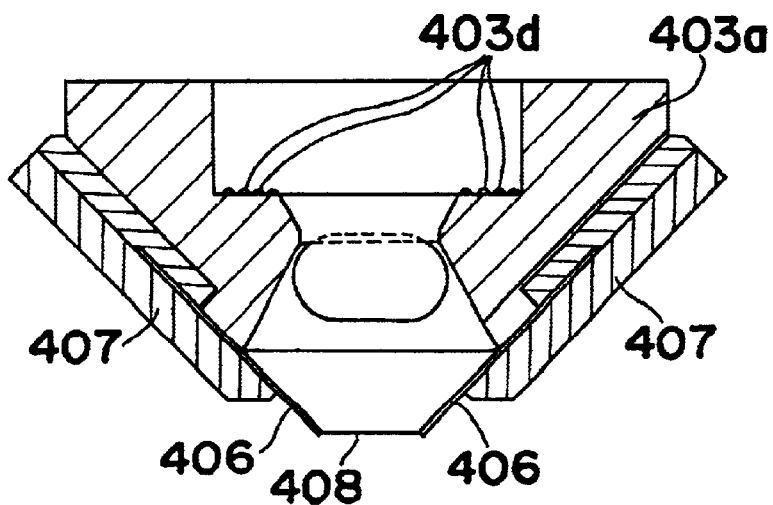

The above embodiment has been described on an example in which the air bleeding sheet 411 with the pits and projections 411b provided to form the air bleeding passage 420 is used as the air bleeding device. Otherwise, an air bleeding sheet 413 (see FIG. 31A) formed of continuous sponge-like foaming material bodies having communicating voids may be provided at the underside of the fixed portion of the sheet or bag 410 instead of the air bleeding sheet 411. It is also possible that, as shown in FIG. 33A, with through holes 403c formed in the chamber 403a, a continuous foaming material 414 may be inserted and set, or that, as shown in FIG. 33B, pits and projections 410a are provided on the underside of the fixed portion of the sheet or bag 410 to form air bleeding passages 420, or that, as shown in FIG. 33C, pits and projections 403d are formed on divisional surfaces of the chamber 403a by the plate 403b to form air bleeding passages 420. In any of these cases, air is bled through the air bleeding passages 420, so that similar effects can be obtained.

In the case where the pits and projections 403d are formed on the junction surface of the chamber 403a with the plate 403b, subjecting the divisional surfaces are to a mold release treatment such as fluorine coating treatment allows the viscous material 4 that has intruded into the air bleeding passages 420 to be simply removed when new viscous material is re-fed into the chamber 403a, so that the air bleeding passages 420 can be regenerated simply.

Also, the above embodiment has been shown on an example in which the air bleeding sheet 411 is provided over the entirety of the chamber 403a and fixed together with the sheet or bag 410. However, since the final-arrival place of the viscous material 4 is a constant place, an air bleeding device such as the air bleeding sheet 411 may be provided only in the vicinity of the place, in which case also similar effects can be obtained.

Figures 34A, 34B:
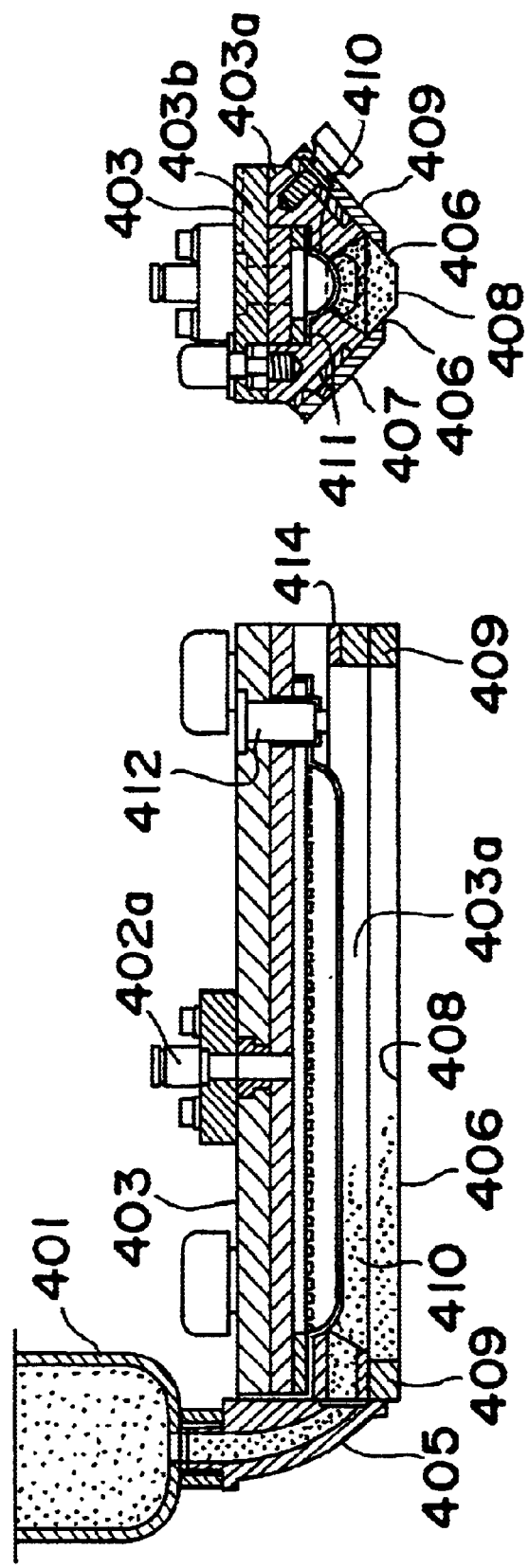
FIGS. 34A and 34B are a longitudinal-section front view and a longitudinal-section side view, respectively, showing a construction modification of the application unit in the fourth embodiment.

The above description has been made on an example, the viscous material 4 is fed from both ends of the application unit 403 as shown in FIG. 1. However, in the case of a small application object, the application unit 403 may be small sized, where the viscous material 4 may be fed from one-side end of the application unit 403 as shown in FIGS. 34A and 34B. In such a case also, although the air bleeding sheet 411 may be provided over the entirety of the chamber 403a and fixed together with the sheet or bag 410, yet a degassing device such as the continuous foaming material 414 may be provided at one end portion of the chamber 403a on one side opposite to the material feed section 401 side as shown in FIG. 34A, in which case also similar effects can be obtained.

Also, the sheet or bag 410 has been used as the device for pressurizing the viscous material 4 inside the chamber 403a in the above embodiment. However, also in a viscous material application apparatus in which, as shown in FIG. 35A, the material feed section 431, which is a viscous-material feeding device, is used both for feed of the viscous material 4 and for discharge-pressure adjustment, since air is accumulated within the chamber 403a as a result of the feed of the viscous material 4, the air within the chamber 403a can completely be discharged out by providing the air bleeding sheet 411 at the chamber 403a, similarly.

Figure 35A:
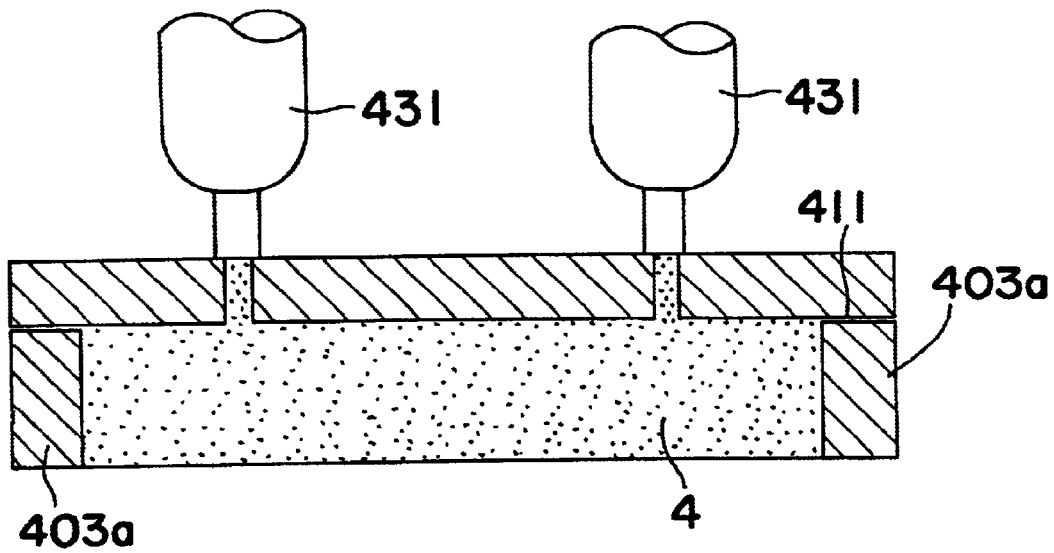
FIGS. 35A and 35B are longitudinal-section front views of other various embodiments of the viscous material application apparatus according to the present invention.
Figure 35B:
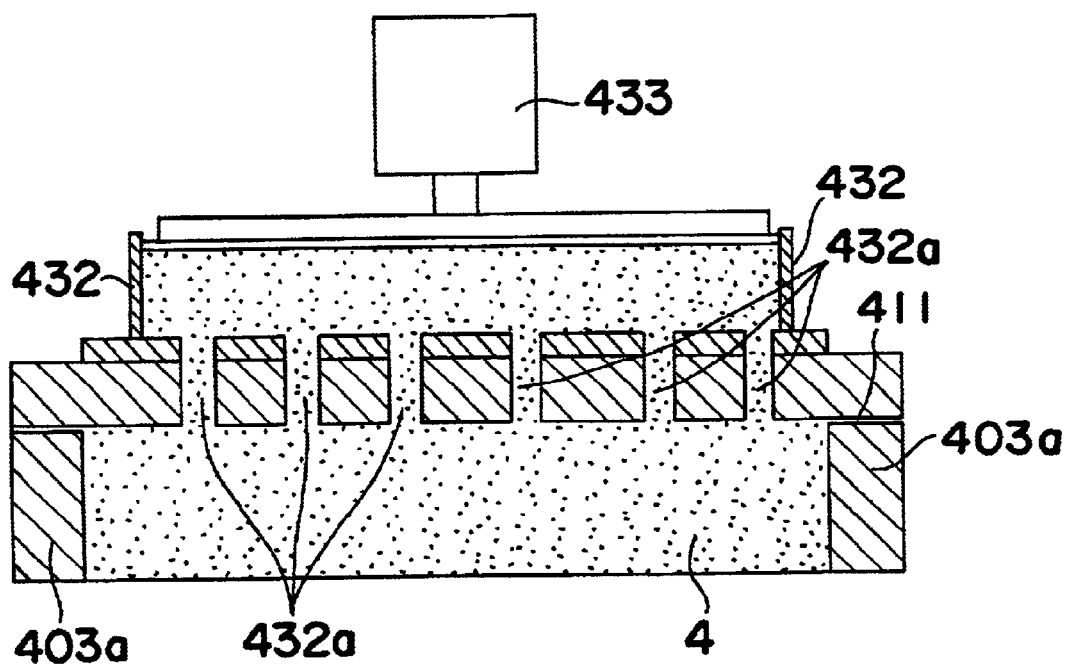

Also in a viscous material application apparatus in which, as shown in FIG. 35B, a container 432 having the viscous material 4 stored therein and having through holes 432a that allow the viscous material 4 to pass through is provided on the top of the chamber 403a, where the viscous material 4 is fed into the chamber 403a with a push-in device 433 such as a cylinder, since air is accumulated within the chamber 403a as a result of the feed of the viscous material 4, the air within the chamber 403a can completely be discharged out by providing the air bleeding sheet 411 at the chamber 403a, similarly.

The air bleeding sheet 411, which is an air bleeding device, may be partly provided in both cases of FIGS. 35A and 35B. In this case, however, since the final-arrival place of the viscous material 4 is unclear, it is preferred that the air bleeding sheet 411 is provided over the entire chamber 403a.

The above description has been made on an example in which the air bleeding sheet 411, 413, the continuous foaming material 414, or the like is used as the air bleeding device for discharging the air inside the chamber 403a. Also in the case where slits or through holes are provided in the chamber 403a, similar effects can be obtained, in which case since the viscous material 4 is accumulated in the slits or through holes, it is advisable to sufficiently clean the slits or through holes before newly feeding the viscous material 4.

Also, the above embodiment has been described only on an example in which the screen mask 53 is not moved but the application unit 403 side is moved. However, it is also possible that without moving the application unit 403, conversely, the screen mask 53 or the application object 50 is moved, in which case similar operations and their effects can be fulfilled.

Also, the above embodiment has been shown on an example in which with the application object 50 placed at the underside of the screen mask 53 as shown in FIG. 11A, the viscous material 4 discharged out from the application unit 403 is applied and printed onto the lands 51 of the application object 50 through the openings 52 of the screen mask 53. Otherwise, the present invention can also be applied to cases in which the viscous material 4 is filled and applied into recessed portions or through holes formed in the application object 50 as shown in FIG. 11B, in which case also similar effects can be fulfilled.

According to the viscous material application method and apparatus of the present invention, as apparent from the above description, since an air bleeding device for discharging out air entrapped in the storage chamber at a time of feed of the viscous material into the storage chamber is provided, air never remains in the storage chamber at an end of the feed of the viscous material into the storage chamber, so that the discharge pressure can be controlled with high precision and that high-quality application can be achieved.

Also, in the case where the air bleeding device is so provided as to confront an end portion inside the storage chamber on one side thereof opposite to the discharge hole, air is more likely to be bled toward the discharge hole side and more likely to be entrapped on its opposite side, so that the air can be bled effectively.

Also, in the case where the air bleeding device is provided at a vicinity of a final-arrival place of the viscous material in the feed of the viscous material to the storage chamber, the residual air in the storage chamber flows toward the final-arrival place of the viscous material, so that the air can be discharged out securely and bled effectively.

Also, in the case where the air bleeding device is implemented by air bleeding passages having minute passage cross sections that inhibit the viscous material from passing therethrough but permit the air to pass therethrough, the air within the storage chamber is discharged outside through the air bleeding passages in the feed of the viscous material to the storage chamber, where once the viscous material is filled in the storage chamber, the air bleeding passage is closed by the viscous material itself afterwards, causing the storage chamber to be tightly closed. Thus, effective air bleeding can be achieved with a simple construction and low cost, without adversely affecting the discharge pressure.

(Fifth Embodiment)

A fifth embodiment of the present invention relates to viscous material application method and apparatus for applying a viscous material such as adhesive, solder paste, or electrically conductive paste to a circuit board or other application object via a screen mask in a specified pattern.

As a conventional viscous material application apparatus, there has generally been known a screen printing device in which a viscous material 4 such as adhesive or solder paste is applied onto lands 51 of a circuit board or the like, which is an application object 50, via a screen mask 53 as shown in FIGS. 12A–12E.

The screen mask 53 has openings 52 formed as through holes provided in a specified pattern corresponding to the lands 51 of the application object 50, and the application object 50 is positioned by an unshown table section so as to be in contact with the screen mask 53 as shown in FIGS. 12A and 12B. Next, as shown in FIG. 12C, the viscous material 4 fed to an end of the screen mask 53 is moved in a specified direction by a squeegee 54, so that the viscous material 4 is filled into the openings 52. Next, the application object 50 is separated away from the screen mask 53 as shown in FIG. 12D, by which the viscous material 4 within the openings 52 is transferred onto the lands 51 of the application object 50 so that the viscous material 4 is applied onto the lands 51 of the application object 50 as shown in FIG. 12E.

Also, Unexamined Japanese Patent Publication 4-284249 discloses a tightly closed type squeegee including a closed container for containing therein the viscous material in an air-shutoff state, a discharge hole communicating with the closed container and substantially making tightly close contact with the screen mask, a stirring roller for adjusting the viscosity of the viscous material at a vicinity of the discharge hole, and a discharge-pressure supplying device for supplying a gas pressure onto a piston placed on the viscous material inside the closed container to thereby press the viscous material and discharge out the viscous material from the discharge hole.

However, in this conventional viscous material application apparatus, since the apparatus adopts a method that the squeegee 54 is moved on the screen mask 53 to thereby fill the viscous material 4 into the openings 52, and since the viscous material 4 is in contact with the air at all times, the viscous material 4 tends to vary in state, causing an issue that stable application becomes unachievable and another issue that the viscous material 4 overflowing the squeegee 54 needs to be scraped into the squeegee 54.

Also, there is a large amount of know-how for obtaining proper application state, and skilled engineers are necessitated therefor. In particular, it is more difficult to achieve the proper application while recent years' demand for finer pitches of the openings 52 is met and moreover a demand for faster speed is satisfied. This has been a cause of another issue that increasingly larger amount of know-how and skillfulness is required.

Meanwhile, in the structure disclosed in Unexamined Japanese Patent Publication 4-284249, there is no need for scraping up the viscous material while the viscous material 4 is out of contact with the air so that variations in the state of the viscous material 4 can be suppressed. However, since the discharge hole is only so positioned as to be substantially brought into close contact with the screen mask, the screen mask would be deformed upon the separation of the application object 50 from the screen mask in the case where a strong tight contact is sought in order to prevent the viscous material from overflowing while the demands for finer pitches or faster speed are met, causing an issue that the transferability of the viscous material is impaired. Conversely, in the case where the tight contact force is so set that the screen mask will not be deformed, increasing the discharge pressure so as to meet finer pitches or faster speed would cause an issue that the viscous material overflows.

In view of these and other issues of the prior art, an object of the present invention is to provide viscous material application method and apparatus in which the viscous material can be prevented from making contact with the air at all times so that a stable application can be achieved, and in which the viscous material never overflows during the operation and the screen mask is not deformed even upon the separation of the application object from the screen mask so that the possibility of impairment of the transferability of the viscous material is eliminated.

Hereinbelow, the viscous material application apparatus according to the fifth embodiment of the present invention is described with reference to FIGS. 36 to 43.

In FIG. 36, which shows general schematic construction of the viscous material application apparatus, an application object 50 is conveyed into the apparatus by a conveyor section 55a, and fixedly positioned to a table section 56 disposed under a screen mask 53. The table section 56 has an up-down mechanism (not shown) for putting the application object 50 into contact with the screen mask 53. Also, an X-, Y-, and θ-positioning mechanism (not shown) for aligning the application object 50 and the screen mask 53 with each other in their relative positions in X-, Y-, and θ-directions is provided either in the table section 56 or the screen mask 53.

An application head 57 is disposed above the screen mask 53. After the application object 50 is brought into contact with the screen mask 53, the application head 57 is pressed against the screen mask 53 and, in this state, moved by a horizontal driver device 58, by which the viscous material is applied onto the application object 50. After an end of the application, the application object 50 is conveyed to the subsequent step by a conveyor section 55b.

The application head 57 is composed mainly of the material feed section 1, the air feed section 2, and the application unit 3 as shown in FIG. 1. In the material feed section 1, the viscous material 4 such as adhesive or solder paste is stored in the syringe-like storage tank 1b, where as the plunger 1a is activated by compressed air serving for material feed, the viscous material 4 is pressurized and pressure-fed so as to be filled up in the chamber 3a, which is a storage chamber for the viscous material 4 in the application unit 3.

The chamber 3a of the application unit 3 and the material feed section 1 are coupled to each other by the joints 5, and the viscous material 4 is fed into the chamber 3a by passing through the feed passages 5a provided in the joints 5.

On both sides under the chamber 3a, the two blades 6 each formed of a thin plate having elasticity are attached with the blade holders 7 so as to approach each other downward with a gap of about 10 mm formed between their fore ends, where the discharge hole 8 for discharging out the viscous material 4 is formed by the opening between the two blades 6. The blades 6 are each formed of a thin plate of copper, stainless, resin, or the like having a thickness of, for example, about 0.1 to 0.5 mm, where resin materials such as polyimides or polyamides-imides are particularly preferable.

The stoppers 9 are disposed at both ends of the two blades 6 to prevent the viscous material 4 from leaking from the chamber 3a. The stoppers 9 are held by the joints 5 so as not to be disengaged by the pressure applied to the viscous material 4.

On one side of the chamber 3a opposite to the discharge hole 8, that is, on the upper side of the chamber 3a, the sheet or bag 10 formed of a sheet having the depressions is disposed along the longitudinal direction of the chamber 3a over the generally entire length so as to partly confront the inside of the chamber 3a in opposition to the discharge hole 8, the sheet or bag 10 being sandwiched and fixed by the chamber 3a and the plate 3bthat closes upper part of the chamber 3a. The sheet or bag 10 is so made as to be increased and decreased in internal capacity by air being fed and discharged from the air feed section 2 via the air port 2a. The sheet or bag 10 is formed of a resin material, such as urethane elastomer, polyethylene, or nylon, having a thickness of about 0.03 to 1 mm, and more preferably, about 0.3 to 0.5 mm. It is noted that the sheet or bag 10, although varying depending on the pressure of the air fed, may be broken when its thickness is too thin, and may result in a poor inflation-and-deflation responsivity when the thickness is too thick.

After the viscous material is fed into the chamber 3a, feeding air to the sheet or bag 10 causes the viscous material 4 to be pressed at a specified pressure so that a discharge pressure for application of the viscous material 4 can be given. Discharging the air from the sheet or bag 10 allows the discharge pressure to be released instantaneously.

Preferably, the discharge-pressure adjusting device such as the sheet or bag 10 is provided upward of the storage chamber such as the chamber 3a or on one side thereof opposite to the discharge hole 8.

In a portion of the sheet or bag 10 sandwiched and fixed by the chamber 3a and the plate 3b, the air bleeding sheet 11 for bleeding the air is disposed at the underside of the sheet or bag 10, so that at the first feed of the viscous material 4 from the material feed section 1 into the chamber 3a, the air within the chamber 3a can be bled from the air bleeding sheet 11.

In the center of the chamber 3a, the sheet or bag 10 is not provided, and the pressure detecting device 12 for detecting the pressure of the viscous material 4 in the chamber 3a is provided at that place.

Next, operation of the application unit 3 is described.

Figure 37:
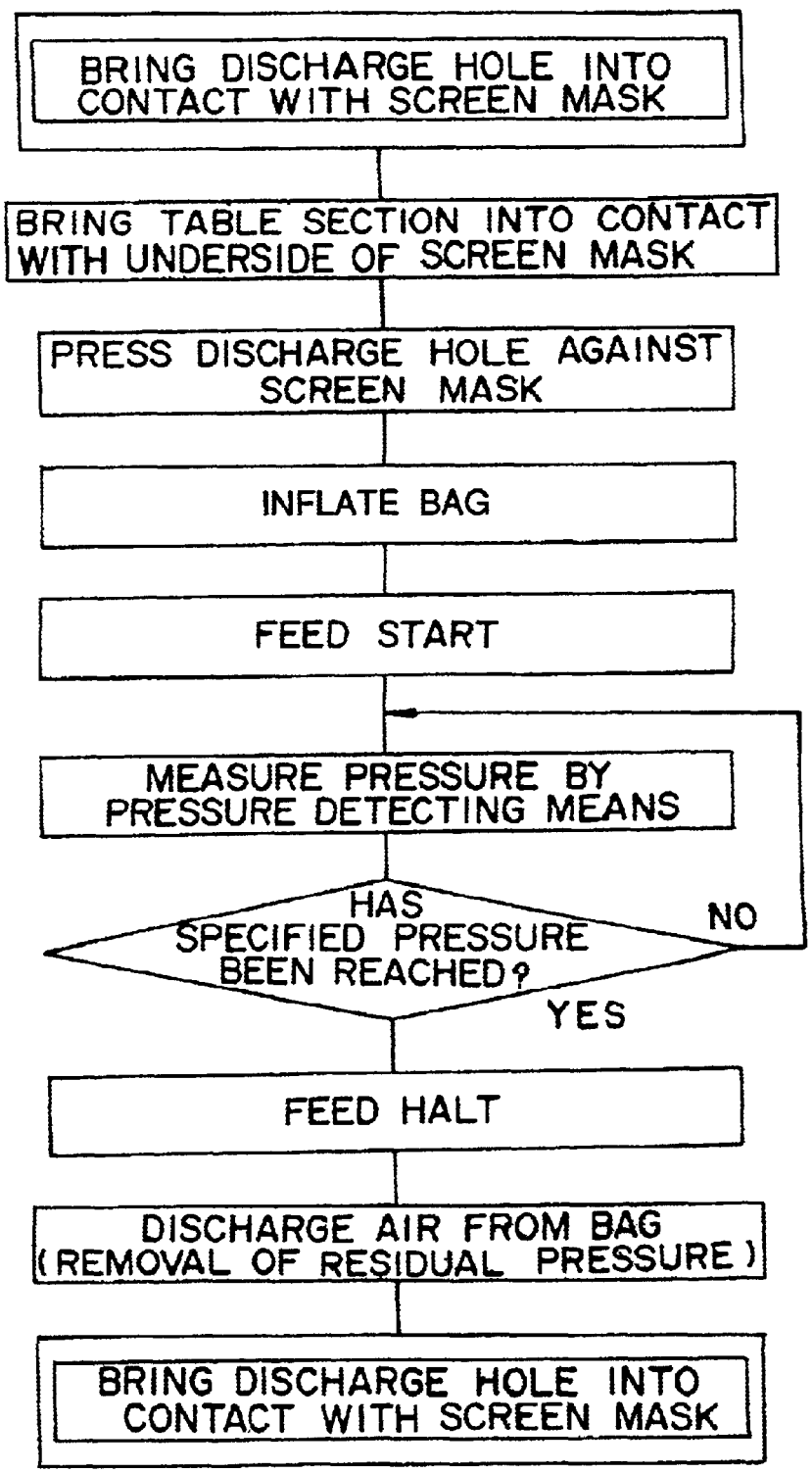
FIG. 37 is a flowchart of feed operation in the fifth embodiment.

The operation of feeding the viscous material 4 into the chamber 3a is explained with reference to FIG. 37. In an initial state with the viscous material 4 absent in the application unit 3, first, the application unit 3 is set to the application head 57, and thereafter the discharge hole 8 of the application unit 3 is brought into contact with the screen mask 53. Then, the table section 56 is brought into contact with the underside of the screen mask 53 so as to support the screen mask 53, and thereafter the discharge hole 8 is pressed against the screen mask 53. In this pressed state, the viscous material 4 is fed from the material feed section 1 into the application unit 3, by which the viscous material 4 can be prevented from overflowing onto the screen mask 53 even if the viscous material 4 is completely filled in the chamber 3a.

For the feed of the viscous material 4 into the chamber 3a, the sheet or bag 10 is preliminarily expanded. Then, when a pressure of the viscous material 4 detected by the pressure detecting device 12 placed in the chamber 3a has reached a specified pressure, the feed of the viscous material 4 is halted and discharging the air of the sheet or bag 10 is carried out, by which any residual pressure applied to the chamber 3a by the feed of the viscous material 4 can be removed. After that, the application unit 3 is lifted to a position where the discharge hole 8 makes contact with the screen mask 53, by which the screen mask 53 can be prevented from being deformed. Next, the table section 56 is lowered so as to be positioned to a position where the application object 50 can be carried in. A press amount with which the discharge hole 8 is pressed against the screen mask 53 in the feed of the viscous material 4 is preferably about 0.5 to 2 mm, taking into consideration that the push-out pressure for the material feed section 1 varies depending on the kind of the viscous material 4.

The feed of the viscous material 4 in a state in which the viscous material 4 is absent in the chamber 3a has been described above. Whereas the viscous material 4 needs to be re-fed to the chamber 3a because the viscous material 4 decreases in amount on and on by repeating the application operation, the viscous material 4 can be fed similarly also in this case. As to the timing of the re-feed, either a number of times of applications may be preliminarily set in the control section of the viscous material application apparatus, or with the internal pressure of the chamber 3a detected by the pressure detecting device 12 provided in the chamber 3a, the viscous material 4 may be re-fed when the pressure has reached a lower-limit value of the pressure necessary for the application.

Figure 38:
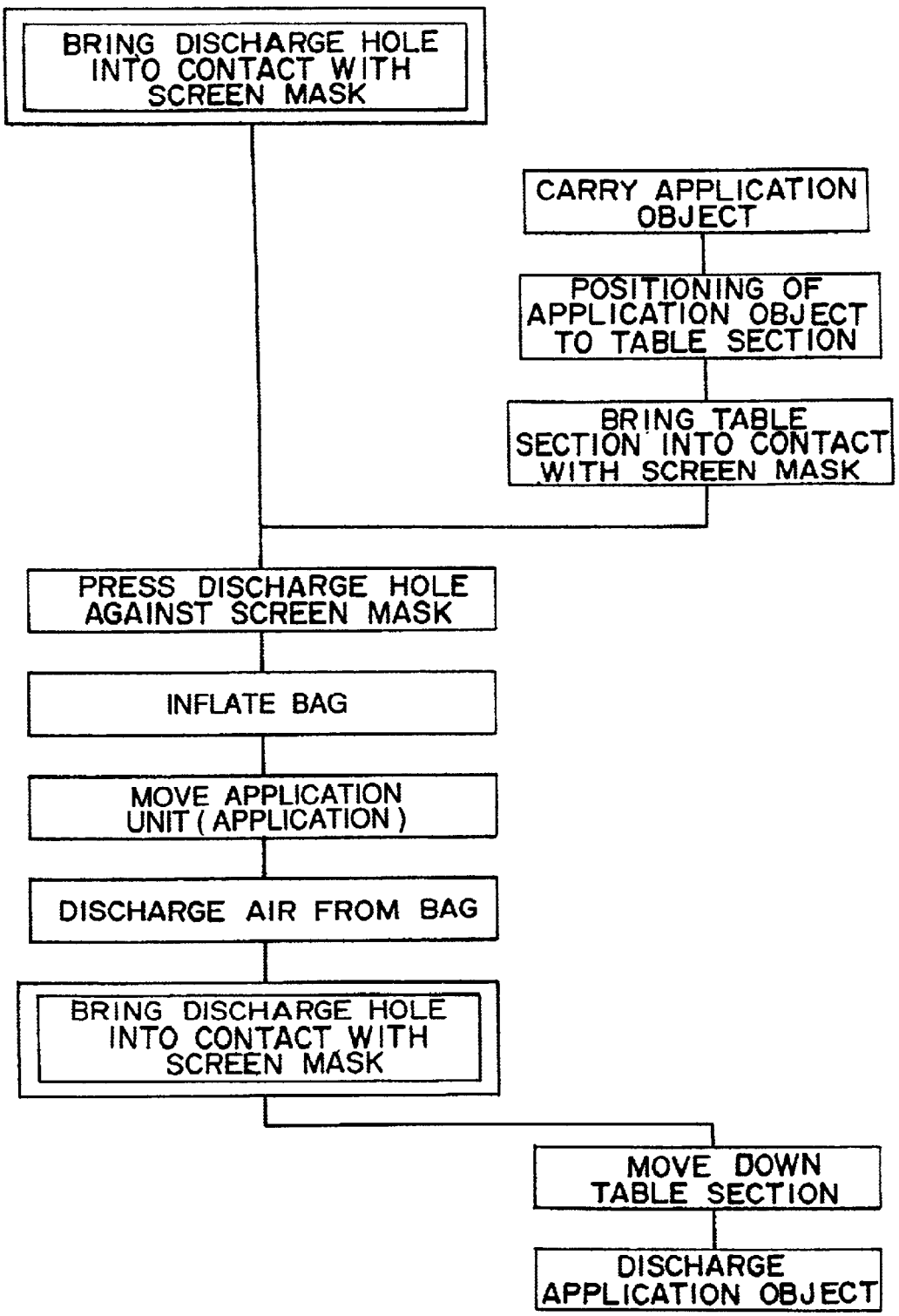
FIG. 38 is a flowchart of application operation in the fifth embodiment.

Next, the operation by the application unit 3 for applying the viscous material 4 onto the application object 50 is described with reference to FIG. 38.

The application object 50 is conveyed by the conveyor section 55a, and fixedly positioned to the table section 56. Then, the table section 56 is brought into contact with the underside of the screen mask 53, thereby putting the application object 50 into contact with the screen mask 53. After the viscous material 4 is fed into the chamber 3a, the discharge hole 8 of the application unit 3 is kept at all times in contact with the screen mask 53. After the table section 56 has come into contact with the screen mask 53, the discharge hole 8 is pressed against the screen mask 53.

In this state, air is fed from the air feed section 2 to the sheet or bag 10, by which a discharge pressure can be applied to the viscous material 4 inside the chamber 3a while the viscous material 4 can be prevented from overflowing onto the screen mask 53. In this connection, it is preferable to detect the pressure of the viscous material 4 by the pressure detecting device 12 provided inside the chamber 3a to thereby confirm that the detected pressure has reached a specified pressure necessary for the application, in which case occurrence of application failures can be prevented. Also, since the discharge pressure is applied to the viscous material 4 by applying air pressure to the sheet or bag 10 having flexibility and provided in the upper part within the chamber 3a over the generally entire longitudinal length of the chamber 3a, a specified discharge pressure can be imparted to the viscous material 4 generally uniformly with good responsivity and with high precision.

Then, moving the application unit 3 onto the screen mask 53 by the horizontal driver device 58 allows the viscous material 4 to be filled into the openings 52 of the screen mask 53. After the application unit 3 is moved so that the viscous material 4 can be filled into all the openings 52, the application unit 3 is released from being pressed against the screen mask 53 so as to be returned to the state in which the discharge hole 8 is in contact with the screen mask 53. Thereafter, the table section 56 is lowered to make the application object 50 separated from the screen mask 53, by which the viscous material 4 in the openings 52 is transferred onto the application object 50, while the screen mask 53 is not deformed, without causing occurrence of any transfer failures. After that, the application object 50 is conveyed out to the subsequent step by the conveyor section 55b.

As described above, for operations of the application unit 3 such as for the feed of the viscous material 4 or its application onto the application object 50, the application unit 3 is pressed against the screen mask 53. Out of operation, the application unit 3 is kept in contact with the screen mask 53. The pressing of the application unit 3 against the screen mask 53 is purposed to prevent the viscous material 4 from overflowing from within the chamber 3a and resultantly leaking onto the screen mask 53 as described before. The keeping of the application unit 3 in contact with the screen mask 53 with the application unit 3 out of operation is purposed to prevent the screen mask 53 from being damaged and to prevent the deformation of the screen mask 53 and resulting occurrence of transfer failures when the table section 56 is lowered so as to be separated from the screen mask 53. As a result of this, stabler application quality as well as longer life of the screen mask 53 can be obtained.

Next, detailed construction of the application head 57 for performing the above-described operations is explained with reference to FIG. 39.

The application unit 3 is fitted to the plate 14 via the block 13, and the plate 14 is fitted to the plate 16 via the pin 15 so as to be swingable about an axis of the pin 15. In this fitting structure, the screen mask 53 and the application unit 3 are not necessarily fitted parallel to each other, which is preferable to put the discharge hole 8 into tightly close contact with the screen mask 53. However, the application unit 3, without any measures taken, would be unstable because of its tilting or other reasons, and therefore the stoppers 17 are provided at both ends of the plate 16.

The plate 16, having the shafts 19 attached at both ends thereof and up-and-down movably supported by the guides 18, is so made as to be up-and-down movable in the vertical direction with respect to the screen mask 53 by the cylinder 20, which is the up-and-down driver device. Since the cylinder 20 is only capable of positioning to up-and-down two positions, stopper sections 21, 22 for use of stroke adjustment are provided, with the stroke of the cylinder 20 set in multiple stages, so that the application head 57 can arbitrarily be positioned to either a state of contact with the screen mask 53 or a state of press contact therewith. Also, by using the cylinder 20 like this, it becomes possible to exchangeably use the application unit 3 or the conventional squeegee.

Figure 40A:
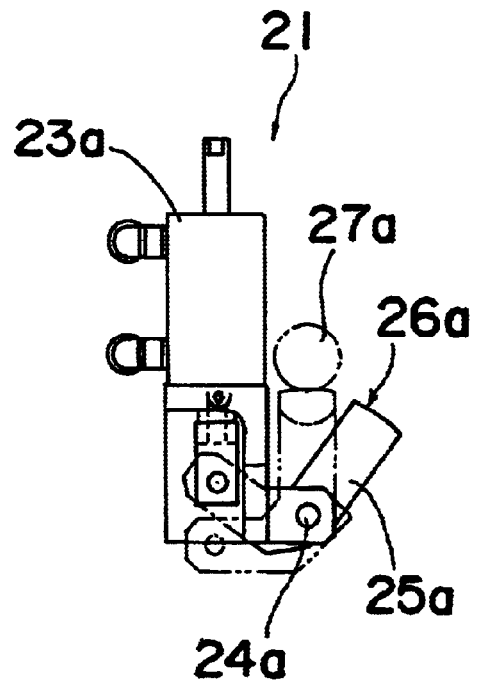
FIGS. 40A and 40B are side views showing the construction of a stopper part in the application head of the fifth embodiment.
Figure 40B:
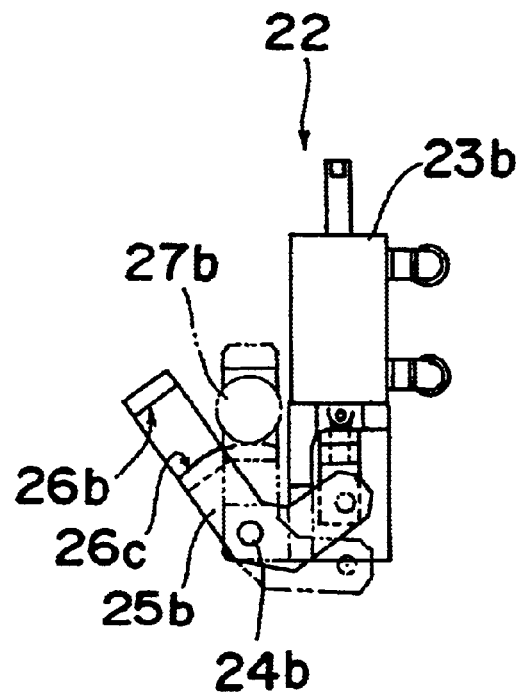

Next, construction of the stopper sections 21, 22 is explained with reference to FIG. 40, where FIG. 40A shows the stopper section 21 and FIG. 40B shows the stopper section 22. The two stopper sections 21, 22 are basically identical in construction to each other, and so their corresponding constituent components are designated by like reference numerals in the figures, where their differences are shown by adding a character 'a,' 'b', or 'c,' but the following description will be made by showing only reference numerals unless necessary. Each of the stopper sections 21, 22 is composed of the cylinder 23, the L-shaped lever 25 which is swingable on the pin 24 serving as a fulcrum and whose one end is coupled to the cylinder 23 and which has the working face 26 formed on the other end, and the cam follower 27 which is mounted at a fore end portion of the shaft 19 so as to be contactable with the working face 26. The lever 25a is provided with the working face 26a and the lever 25b is provided with the working faces 26b, 26c.

Figure 41A:
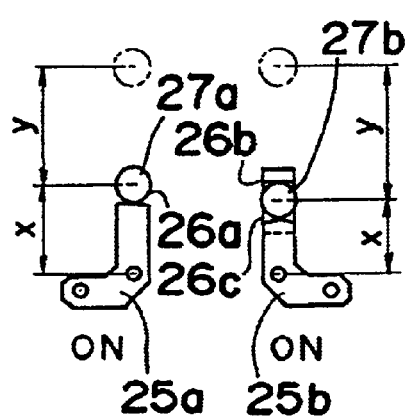
FIGS. 41A, 41B, 41C, and 41D are operation explanatory views of the stopper part in the application head of the fifth embodiment.

Next, operation of the stopper sections 21, 22 is explained with reference to FIG. 41. FIG. 41A shows a state in which the viscous material 4 is fed to the application unit 3, FIG. 41B shows a state in which the viscous material 4 is applied, FIG. 41C shows a state in which the discharge hole 8 is brought into contact with the screen mask 53, and FIG. 41D shows a state in which both stopper sections 21, 22 are in their positioning-released positions where the stopper sections 21, 22 have been released from the positioning action, showing a case where the conventional squeegee is used and where the application unit 3 is lifted without making contact with the screen mask 53.

For feed of the viscous material 4 to the application unit 3, as shown in FIG. 41A, while the cylinder 23a of the stopper section 21 is first turned on, the application unit 3 is lowered by the cylinder 20 so that the cam follower 27a makes contact with the working face 26a of the lever 25a. Thereafter, the cylinder 23b of the stopper section 22 is turned on, so that the working faces 26b, 26c of the lever 25b are positioned opposite to each other with an appropriate gap therebetween above and below the cam follower 27b. This state is a state in which, for example, the discharge hole 8 is pressed to 1 mm against the screen mask 53.

Figure 41B:
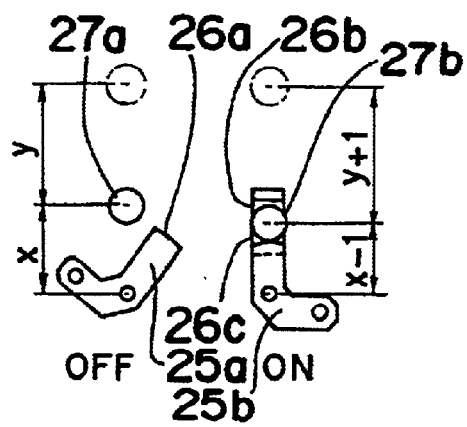

Next, for application of the viscous material 4, as shown in FIG. 41B, the cylinder 23a of the stopper section 21 is turned off, so that the cam follower 27a is separated from the working face 26a. Then, with the cylinder 23b of the stopper section 22 kept on, the application unit 3 is further lowered by the cylinder 20, so that the cam follower 27b makes contact with the working face 26c of the lever 25b. This state is a state in which, for example, the discharge hole 8 is pressed to 2 mm against the screen mask 53.

Figure 41C:
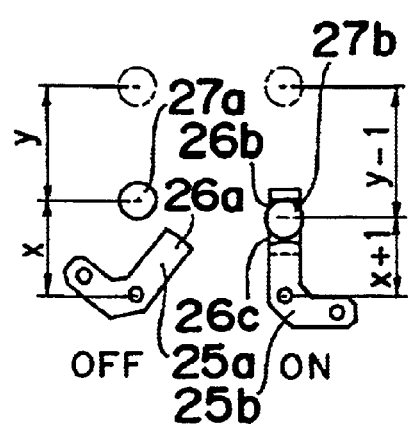
Figure 41D:
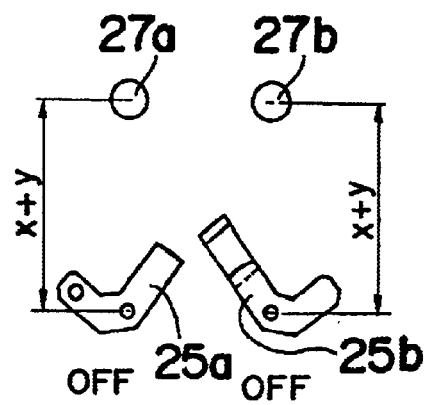

Next, for contact of the discharge hole 8 with the screen mask 53, as shown in FIG. 41C, with the cylinder 23a of the stopper section 21 turned off similarly, as the cylinder 23b of the stopper section 22 is kept on, the application unit 3 is lifted by the cylinder 20, so that the cam follower 27b makes contact with the working face 26b of the lever 25b. This state is a state in which the discharge hole 8 is in contact with the screen mask 53.

Next, for a standby state of the application unit 3 by lifting the application unit 3 largely upward, or for a state in which the conventional squeegee 54 is used, as shown in FIG. 41D, the cylinders 23a, 23b of the two stopper sections 21, 22 are both turned off. This state is a state in which the application unit 3 or the squeegee 54 can arbitrarily be moved up and down by the cylinder 20.

As shown above, in the case where the squeegee 54 is used, it is preferable that the application is performed only with an output load of the cylinder 20 without any up-and-down positioning. Meanwhile, in the case where the application is done with the application unit 3, since the viscous material 4 is stored in the application unit 3, the viscous material 4 varies in amount as a result of the application, where it is preferable that the application is done with the up-and-down positioning with respect to the screen mask 53.

Although the height of the viscous material 4 has been changed at the feed of the viscous material 4 into the chamber 3a and at the application of the viscous material 4 in FIG. 41, yet the feed and the application may be done at an equal height.

Figure 39:
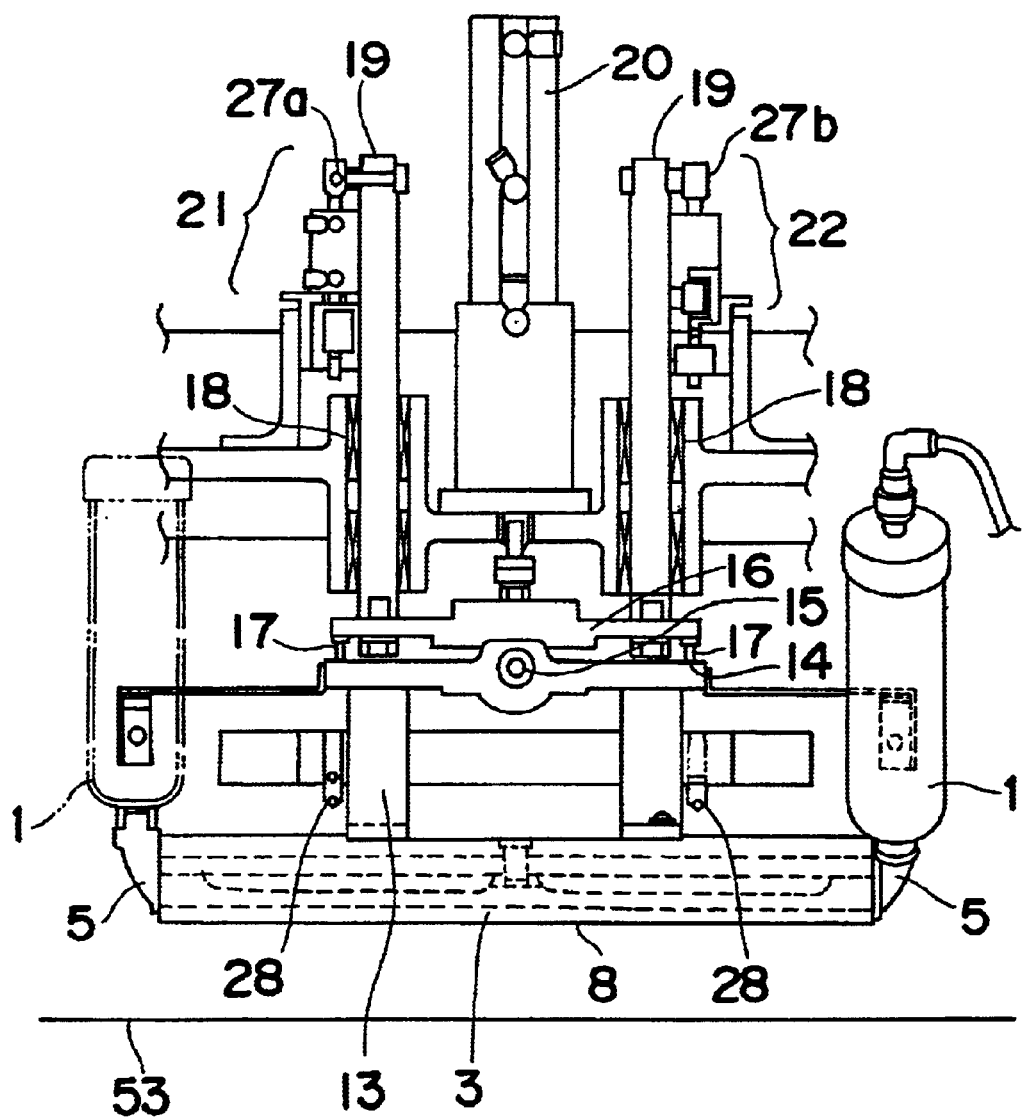
FIG. 39 is a partial cross-sectional front view showing the construction of the application head in the fifth embodiment.

Also, it is preferable that the same set of the guides 18 plus the shafts 19, the cylinder 20, and the stopper sections 21, 22 as those shown in FIG. 39 are provided one more set on the rear side, where the application unit 3 is supported by performing the same operations with a push-in lever 28, in which case the application unit 3 can be given a reactive force that pushes the screen mask 53.

In the above constitution, the up-and-down drive and the stroke adjustment of the application unit 3 are performed by the cylinder 20 and the stopper sections 21, 22. However, although not shown, a motor may also be used to perform the drive and the positioning, in which case also similar effects can be obtained.

Figure 42:
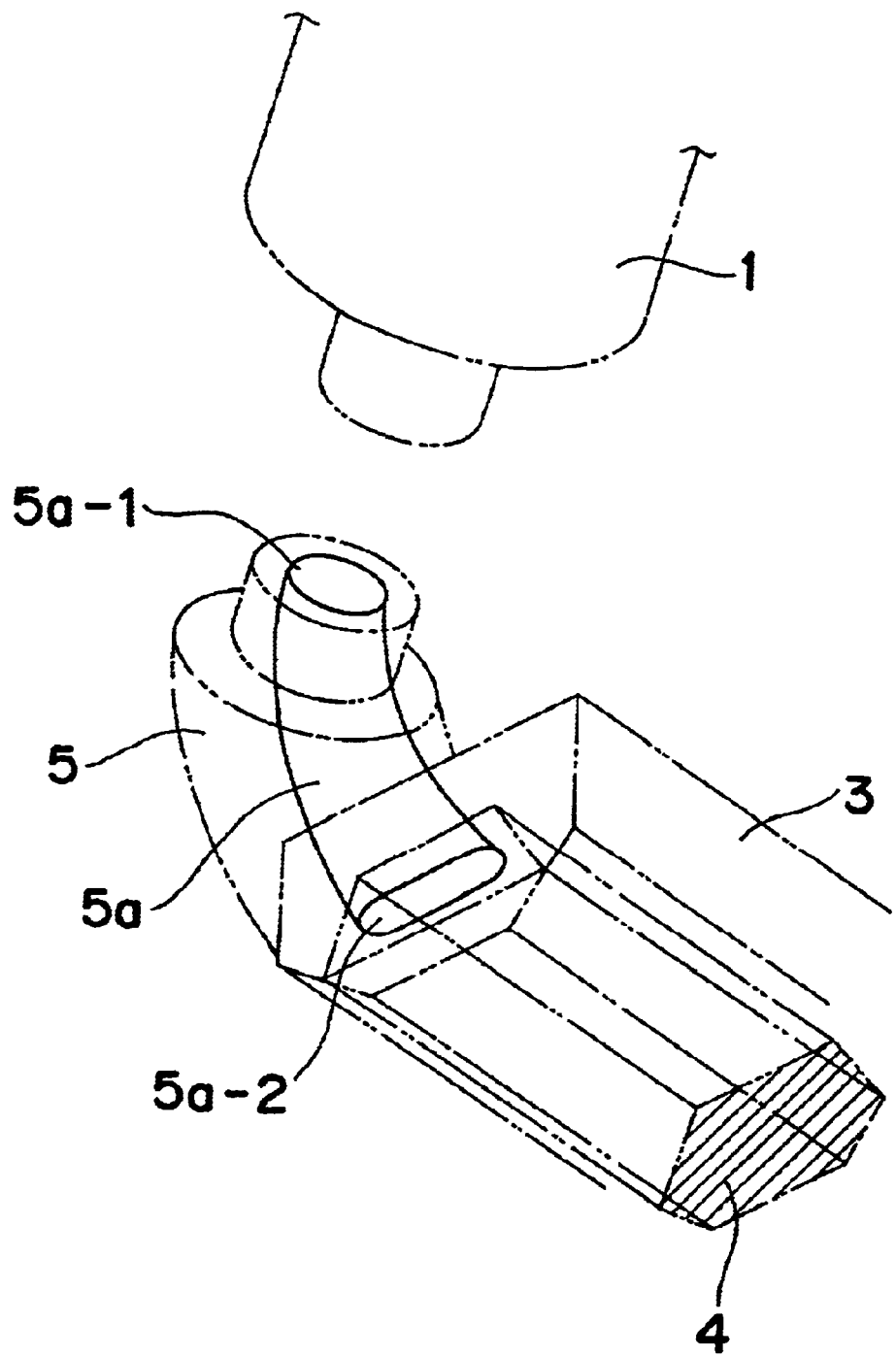
FIG. 42 is a perspective view showing a feed path of the viscous material in the fifth embodiment.

Next, details of the joint 5 for feeding the viscous material 4 from the material feed section 1 to the chamber 3a are described with reference to FIG. 42.

The joint 5 is coupled to the material feed section 1 and the application unit 3. The viscous material 4 is fed to the chamber 3a through the feed passage 5a formed as a through passage. The feed passage 5a has an inlet 5a-1 for the viscous material 4 for allowing the viscous material 4 to enter from the material feed section 1, and an outlet 5a-2 provided in confrontation with the chamber 3a and allowing the viscous material 4 to be fed to the chamber 3a. As the outlet of the material feed section 1 for the viscous material 4 has an diameter of about 8 mm, so the inlet 5a-1 is sized generally equal, but the chamber 3a is larger in cross section for storage of the viscous material 4. Thereafter, if the outlet 5a-2 is generally equal in size and shape to the inlet 5a-1, it would be difficult for the viscous material 4 present at the end of the chamber 3a to move toward the center of the chamber 3a. Accordingly, as shown in FIG. 42, the outlet 5a-2 is preferably made as large as possible. In this case, since the material feed section 1 is mounted vertical, the feed passage 5a has a curvature in the up-and-down direction and is formed of a curved surface having such a cross-sectional shape that the cross-sectional area gradually increases from the inlet 5a-1 toward the outlet 5a-2 while the width increases so as to approach the width of the chamber 3a. With such a constitution, the viscous material 4 is accelerated to flow and reduced in the force for its feed, so that the feeding time can be reduced and that the viscous material 4 present at the end of the chamber 3a can be moved toward the center securely.

Also, since new viscous material 4 is stored into the chamber 3a in succession by the feeding of the viscous material 4 from an end of the chamber 3a, old viscous material 4 does not remain in the chamber 3a as compared with the feeding from an intermediate point of the chamber 3a. Thus, stabler application quality can be obtained.

Also, in the case where the feed passage 5a within the joint 5 or the interior of the chamber 3a is subjected to a surface treatment such as fluorine coating, the time required for feeding can be reduced more or less, preferably.

Figure 43:
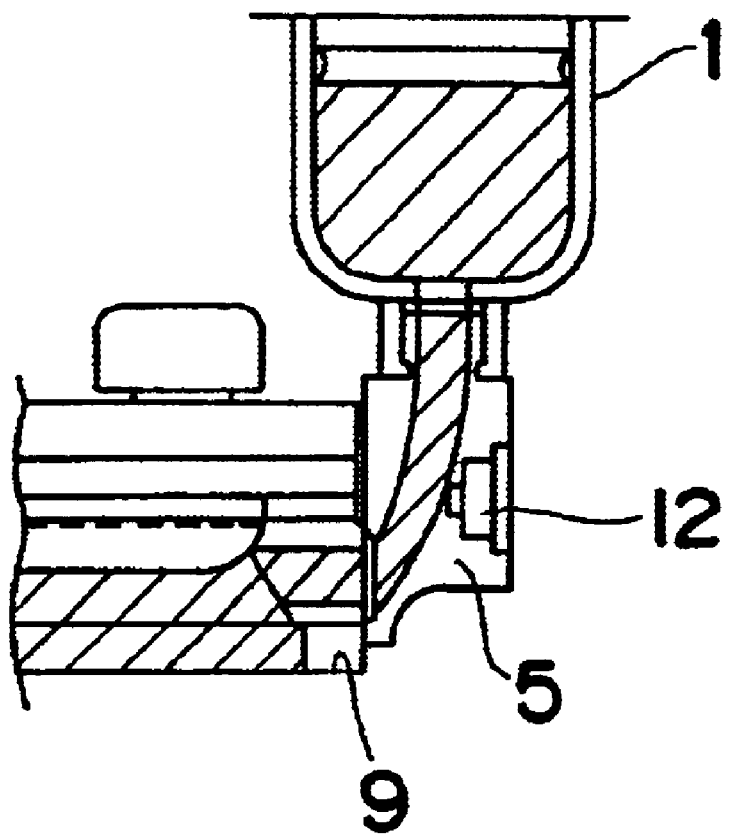
FIG. 43 is a longitudinal-section front view of a main part showing a modification of a disposal state of a pressure detecting device in the fifth embodiment.

In the above description, as shown in FIG. 2, the viscous material 4 is fed from both ends of the application unit 3, the pressure detecting device 12 is provided at a center at which the viscous material 4 finally arrives within the chamber 3a, and it is detected that the chamber 3a has been filled with the viscous material 4. Otherwise, it is also possible that, as shown in FIG. 43, the pressure detecting device 12 is provided also at both end portions inside the chamber 3a or on the feed passages 5a of the joints 5 at both ends, so that individual pressures of the viscous material 4 fed from material feed sections 1 at both ends are detected. By detecting the feed pressures of the viscous material 4 at both ends of the chamber 3a in this way, the balance of feed from both ends is detected, where if the balance is largely collapsed, an abnormal alarm can be issued or the air pressure for material feed can be adjusted. It is also possible that upon detection of an abnormality, the viscous material 4 is fed only from the one-end material feed section 1 where no abnormality has been detected out of the both-end material feed sections 1, while it is detected by the other pressure detecting device 12 that the chamber 3a has been filled with the viscous material 4. Even without any abnormalities, it is possible that the viscous material 4 is fed from either one material feed section 1 alternately according to the direction of move of the application unit 3. It is also possible that the material feed is performed on one side at a time, where upon an emptiness of one material feed section 1, the other material feed section 1 is used for feed, or that only at occurrence of emptiness of the viscous material 4 in either one material feed section 1, the other material feed section 1 is used for feed so that the operation is continued, in which case the pressure detecting device 12 can be used as a device for deciding that the material feed section 1 has been emptied.

Also, in the case of a small application object 50, the application unit 3 may also be small, where as shown in FIG. 44A or 44B, the viscous material 4 may be fed from a one-side end of the application unit 3. In this case, the pressure detecting device 12 is provided preferably at a one-side end opposite to the material feed section 1 at which the viscous material 4 finally arrives. The pressure detecting device 12 is provided above an end portion of the chamber 3a in FIG. 44A, and on an end wall of the chamber 3a in FIG. 44B.

Figure 45A:
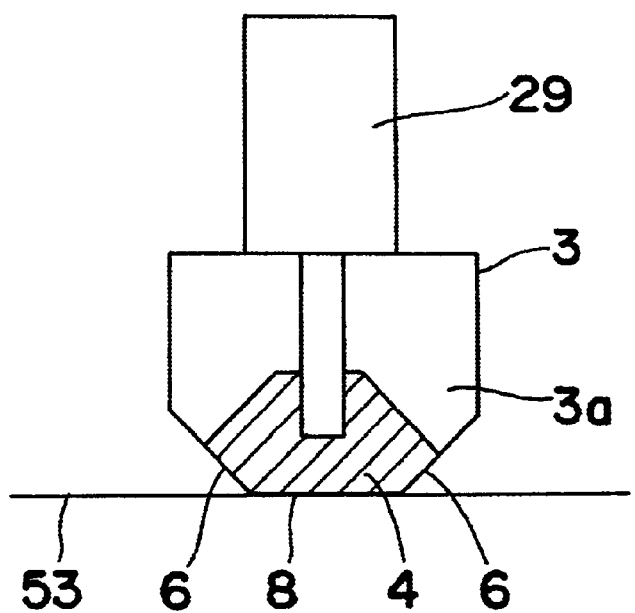
FIGS. 45A and 45B are longitudinal-section side views of other various embodiments of the viscous material application apparatus according to the present invention.
Figure 45B:
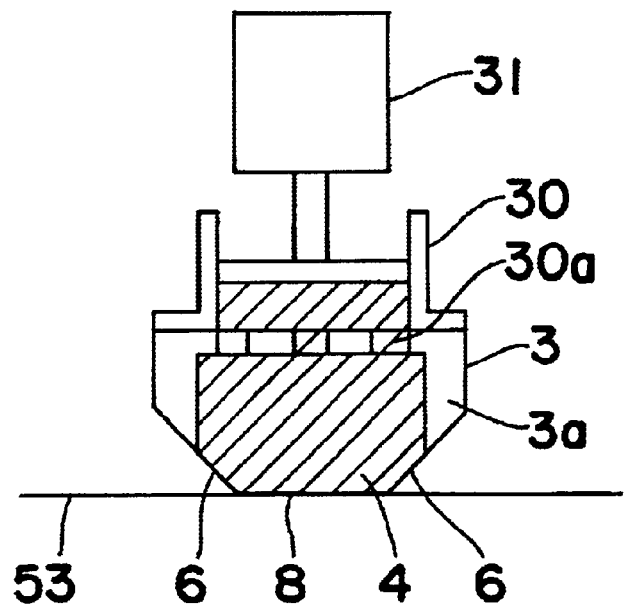

In the above fifth embodiment, the sheet or bag 10 has been used as a device for pressurizing the viscous material 4 within the chamber 3a. However, in the case where a pressurizing device 29 such as a piston is provided so as to confront the chamber 3a to thereby pressurize the viscous material 4 as shown in FIG. 45A, or in the case where a container 30 for storing the viscous material 4 therein and having through holes 30a that permit the viscous material 4 to pass through is provided on the top of the chamber 3a and where the viscous material 4 is fed, and pressurized, into the chamber 3a by a push-in device 31 such as a cylinder as shown in FIG. 45B, stable application can also be achieved similarly.

Also, the above fifth embodiment has been described only on an example in which the screen mask 53 is not moved but the application unit 3 side is moved. However, it is also possible that without moving the application unit 3, conversely, the screen mask 53 or the application object 50 is moved, in which case similar operations and their effects can be fulfilled.

Also, the above fifth embodiment has been shown on an example in which with the application object 50 placed at the underside of the screen mask 53 as shown in FIG. 11A, the viscous material 4 discharged out from, the application unit 3 is applied and printed onto the lands 51 of the application object 50 through the openings 52 of the screen mask 53. Otherwise, the present invention can also be applied to cases in which the viscous material 4 is filled and applied into recessed portions or through holes formed in the application object 50 as shown in FIG. 11B, in which case also similar effects can be fulfilled.

According to the viscous material application method and apparatus of the present invention, as apparent from the above description, since the viscous material is stored in the storage chamber, the viscous material is kept away from contact with air at all times, so that the viscous material can be prevented from deterioration and thus applied stably. Since the discharge hole is placed at such a position as to be in contact with either the screen mask or the application object before an operation or at an end of the operation, the screen mask, when used, is not deformed when the application object is separated from the screen mask, so that the viscous material is prevented from any impairment of transferability or that the application object is prevented from any occurrence of deformation Furthermore, in the operation, since the discharge hole is pressed against the screen mask or the application object, the viscous material can securely be prevented from leaking even if the discharge pressure is set large to meet finer pitches or higher speeds, so that the viscous material can be applied stably.

Also, according to the viscous material application apparatus of the present invention, since the application unit further includes the feed passage whose one end communicates with at least one longitudinal end of the storage chamber and whose other end is coupled to the viscous-material feeding device, the viscous material is fed from the end into the storage chamber, so that the viscous material in the storage chamber is replaced efficiently. Thus, material characteristics are maintained so that the application quality can be stabilized.

(Sixth Embodiment)

Next, a viscous material application apparatus according to the sixth embodiment of the present invention is described with reference to FIGS. 46A to 64E.

Increasing the moving speed of the squeegee would cause occurrence of unfilled portions. Therefore, a flow-regulating member is placed within the viscous-material storage chamber (pressurizing chamber), and the pressure of the viscous material in the storage chamber is locally increased by this flow-regulating member so that a peak portion higher than the other portions is presented in a leading-side portion on time base along the horizontal axis with respect to a trapezoidal waveform of a solder-filling pressure profile, where the horizontal axis represents time and the vertical axis represents pressure, in order that high quality printing can be achieved.

That is, in the conventional screen printing method using one platy squeegee, the mechanism of the generation of a pressure for filling the viscous material into the opening of the screen can be expressed by the following equation:

$$P = \mu v \sqrt{V} / \sin^2 \theta$$

where P is the internal pressure of solder (a pressure generated by squeegeeing), $\mu$ is the viscosity of solder, v is the moving speed of the squeegee, V is the volume of solder, and $\theta$ is the angle of the squeegee. According to this, the pressure (pressure waveform) in filling the viscous material into the openings of the screen can be represented as follows.

Figure 60:
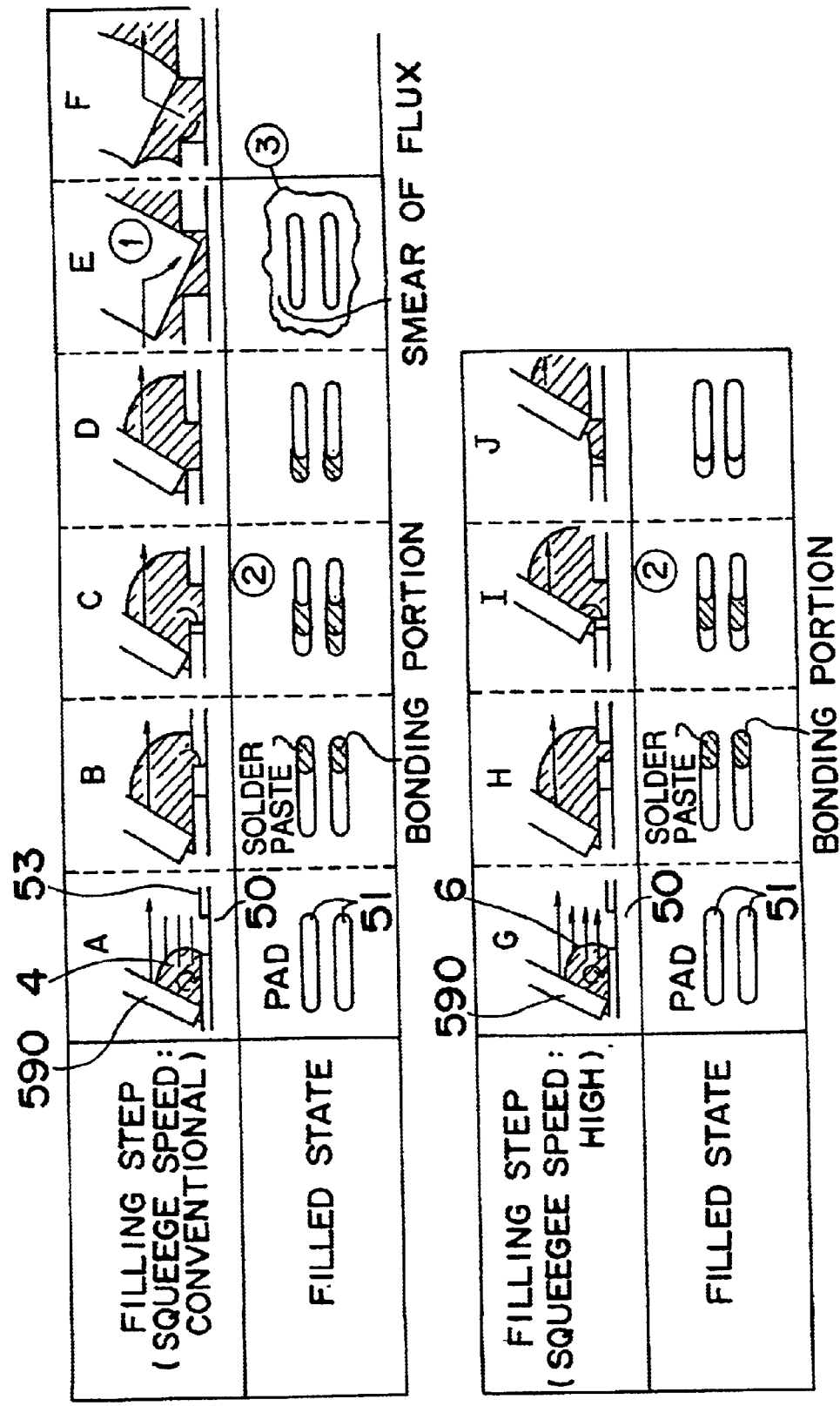
FIG. 60 is an explanatory view of a solder filling step with one platy squeegee according to the prior art.

An actual method by which the viscous material is filled into the opening of the screen is shown in FIG. 60.

It is noted that in the table of FIG. 60, the upper field shows a filling step and the lower field shows a filled state of the bottom face of solder.

At "A" in the table of FIG. 60, solder 4 which moves by being pushed by a squeegee 590 is slipping against a surface of the screen mask 53 while rolling.

At "B" in the table of FIG. 60, the solder 4, while slipping, passes through above the opening of the screen mask 53, where a bottom portion of the solder is cut off by a forward edge thereof.

At "C" in the table of FIG. 60, the solder cut off by the forward edge is filled on and on from the forward toward the squeegee side.

At "D" in the table of FIG. 60, the squeegee 509 passes through the opening area in a several tenths seconds, where the solder filling is completed one second or more earlier.

At "E" in the table of FIG. 60, bonding of the solder 4 and a pad is accelerated by the fallen squeegee 509.

At "F" in the table of FIG. 60, the scooping-in squeegee 509 rides on an edge of the screen mask 53 and, when going out, tends to pull out the filled solder.

According to this FIG. 60, when the one plate-shaped squeegee 590 moves on the screen mask 53, there arises a pressure distribution as shown above in the viscous material 4 placed forward of the squeegee, causing the occurrence of a so-called "rolling" phenomenon that the viscous material rotates forward of the squeegee. This rolling serves as a criterion for good or no good of printing in the actual production field. As to the reason of this, as seen in FIG. 60, after the delivery of the viscous material onto the opening of the screen by rolling, the moment the squeegee edge passes, that is, when the viscous material is pressed into the opening by the pressure peak, the viscous material is filled into the opening of the screen, and thereafter the screen and the printing object are separated from each other, by which the viscous material is transferred.

Figure 61:
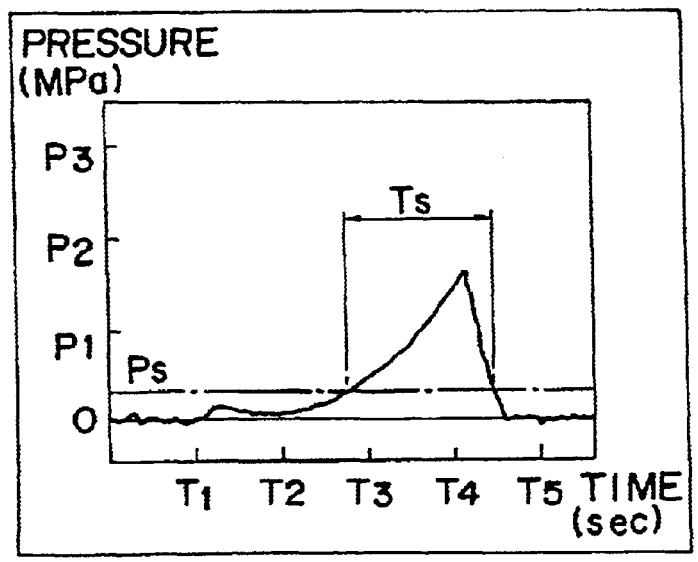
FIG. 61 is a chart showing a solder-filling pressure profile in printing with one platy squeegee according to the prior art.
Figure 62:
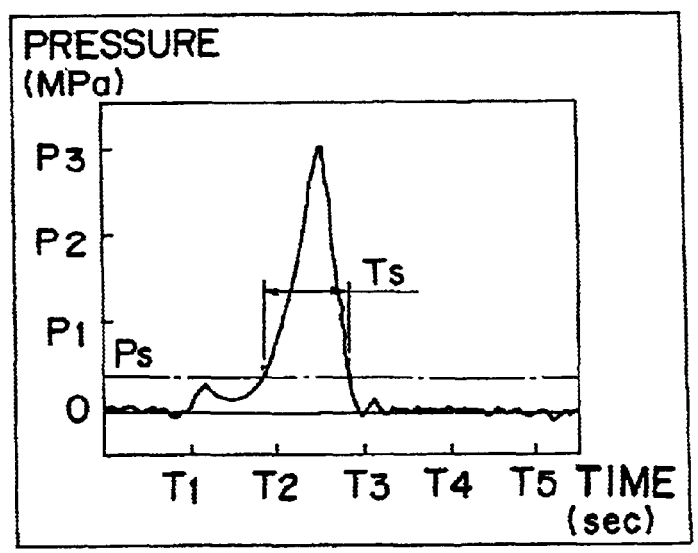
FIG. 62 is a chart showing a solder-filling pressure profile in fast printing with one platy squeegee according to the prior art.
Figure 63:
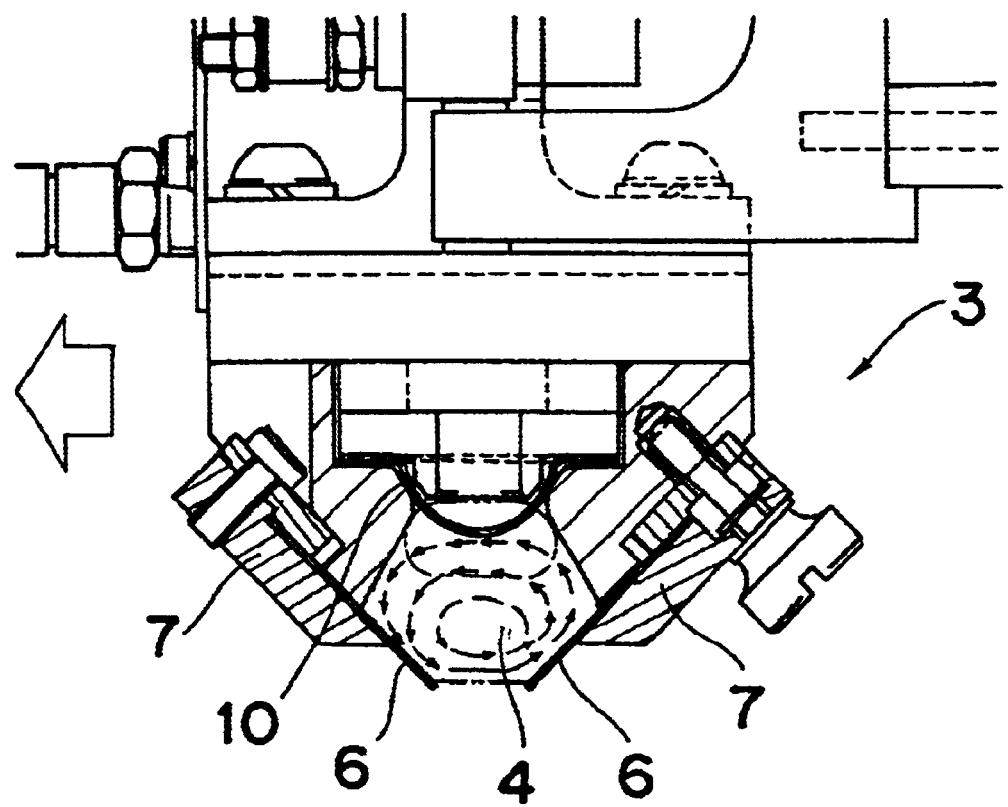
FIG. 63 is a longitudinal-section front view of a tightly closed squeegee head without a partitioning plate according to the foregoing embodiment.

However, with the pressure waveform by the printing method using the squeegee (see the profile of pressure for pushing the viscous material of FIG. 61 (printing material) into the screen opening (filling pressure), there are limitations in printing at higher speeds that will be further demanded in the future. This is because printing at a high speed would involve occurrence of "slippage" between the rolling viscous material and the screen, which causes the squeegee to pass through above the opening before delivering sufficient viscous material onto the screen opening, thus resulting in a state that the viscous material cannot be filled to the entire opening (which is referred to unfilling). The larger the opening is, the more considerably this phenomenon occurs. Given this phenomenon in pressure waveform, on the assumption that the pressure Ps is a "pressure for delivering the viscous material to above the opening," it can be understood that in printing at high speed, the time Ts during which the pressure is over the pressure Ps is a dramatically shortened time as shown in FIG. 62, as compared with FIG. 61. That is, it is shown that the time for feeding the viscous material to above the opening has been shortened.

It is noted that in the case of high-speed filling, the solder 4 that moves by being pushed by the squeegee 590 is slipping against the surface of the screen mask 53, while rolling, at "G" of FIG. 60.

At "H" in the table of FIG. 60, the solder 4 passes through above the opening of the screen mask 53, while slipping, with its bottom portion cut off by the forward edge.

At "I" in the table of FIG. 60, the solder cut off by the forward edge is filled on and on from the forward toward the squeegee side.

At "J" in the table of FIG. 60, the squeegee 590 passes through above the opening before delivering sufficient viscous material onto the opening of the screen mask, resulting in a state that the viscous material cannot be filled to the entire opening.

It is noted that in FIG. 60, shaded portions represent the solder paste and blackened portions represent the bonding portion between the solder paste and the solder.

Further, a tightly closed squeegee head (application unit) without a partitioning plate as shown in FIG. 63 and FIGS. 64A to 64E is one according to the above embodiment for applying the viscous material 4 such as adhesive or solder paste onto the lands 51 of the circuit board or the like, which is the application object 50, via the screen mask 53.

Figure 64A:
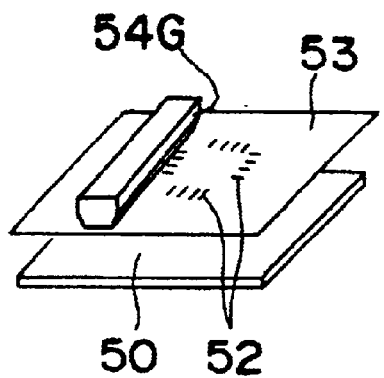
FIGS. 64A, 64B, 64C, 64D, and 64E are explanatory views of a screen printing method according to the prior art.
Figure 64B:
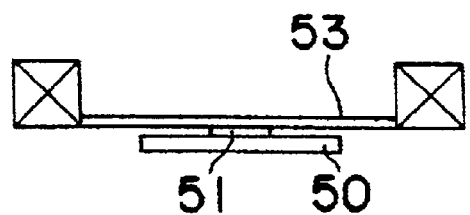
Figure 64C:
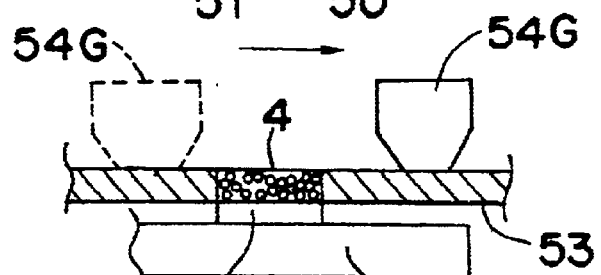
Figure 64D:
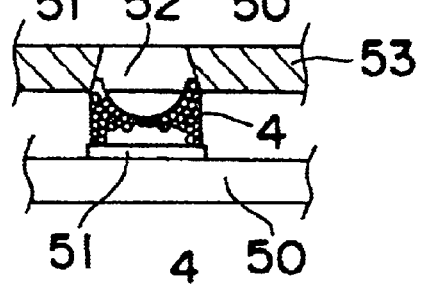
Figure 64E:
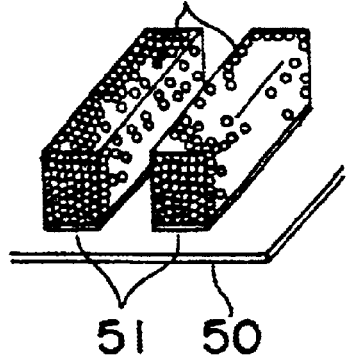

The screen mask 53 has the openings 52 formed as through holes provided in a specified pattern corresponding to the lands 51 of the application object 50, and the application object 50 is positioned by an unshown table section so as to be in contact with the screen mask 53 as shown in FIGS. 64A and 64B. Next, as shown in FIG. 64C, the viscous material 4 fed to an end of the screen mask 53 is moved in a specified direction by the squeegee 54, so that the viscous material 4 is filled into the openings 52. Next, the application object 50 is separated away from the screen mask 53 as shown in FIG. 64D, by which the viscous material 4 within the openings 52 is transferred onto the lands 51 of the application object 50 so that the viscous material 4 is applied onto the lands 51 of the application object 50 as shown in FIG. 64E.

Figure 46:
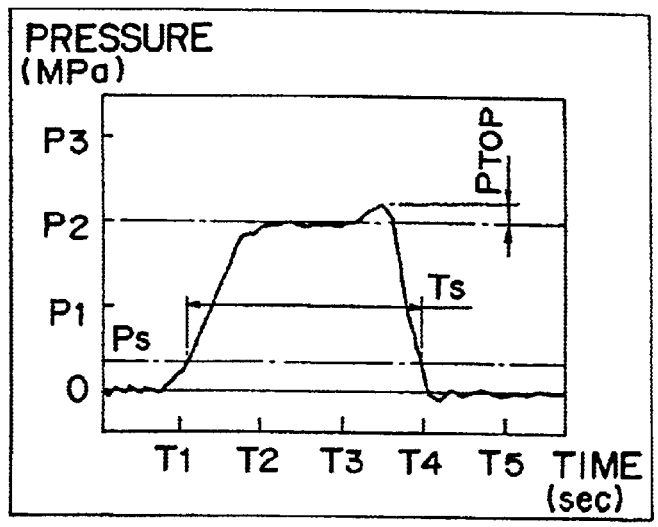
FIG. 46 is a chart showing a solder-filling pressure profile in printing with a partitioning plate removed in a viscous material application apparatus according to a sixth embodiment of the present invention.

The pressure waveform during the solder printing by such a tightly closed squeegee head without partitioning walls is as shown in FIG. 46. Decreasing the pressure setting by the squeegee may cause the occurrence of a phenomenon that the printed pattern is unstable because of a lack of the "pressing" process, while conversely increasing the pressure setting would cause all the processes to be "pressing" processes so that the viscous material would spread more than necessary between the screen and the printing object, inducing "smears." Consequently, with this pressure waveform, it is difficult to set conditions satisfying the two issues for patterns involving large and small openings in the screen.

Figure 47:
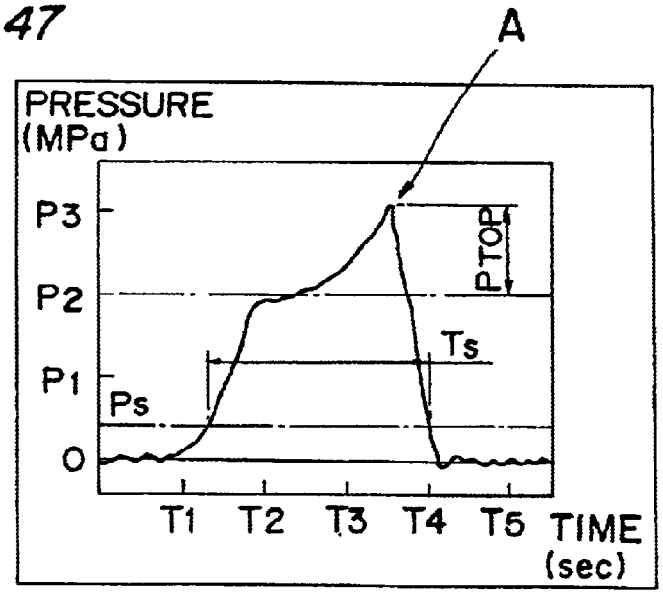
FIG. 47 is a chart showing a solder-filling pressure profile in printing with the partitioning plate set in the viscous material application apparatus according to the sixth embodiment of the present invention.
Figure 48:
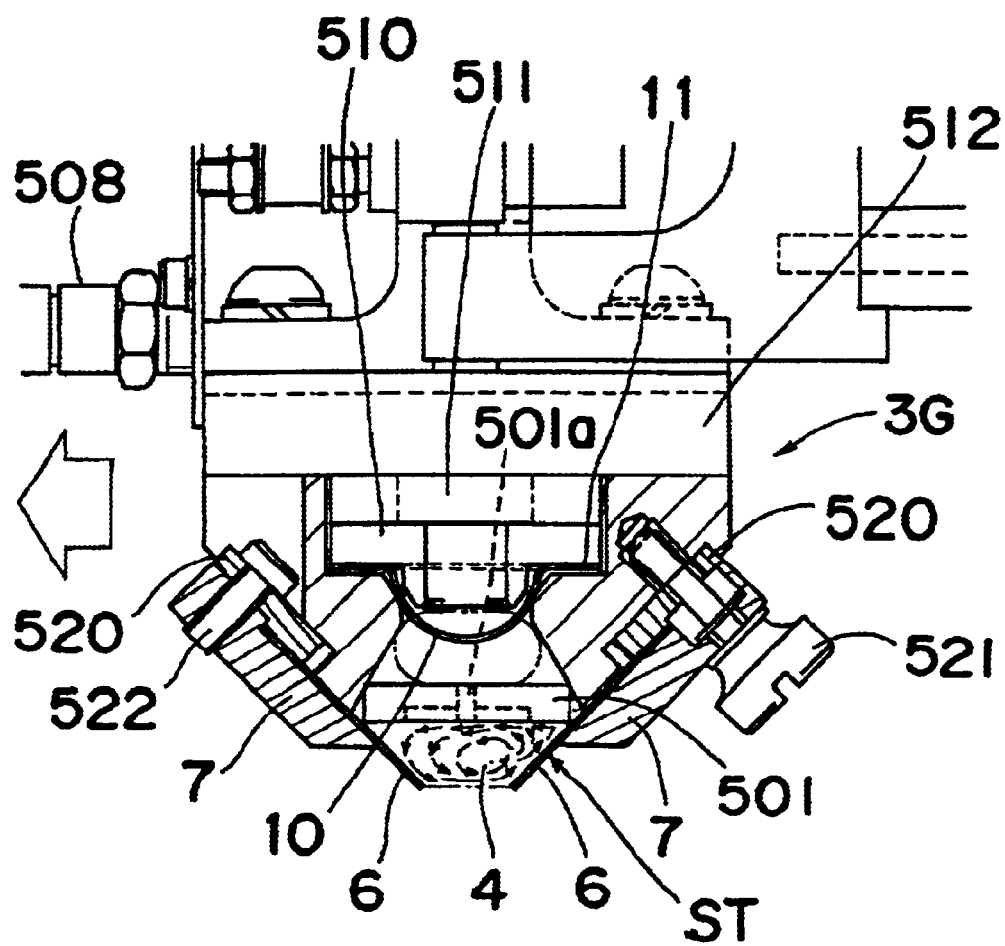
FIG. 48 is a partial longitudinal-section front view of the viscous material application apparatus according to the sixth embodiment of the present invention.

Therefore, in the sixth embodiment, as shown in FIG. 48 and FIGS. 49A and 49B, a partitioning plate (an example of the flow-regulating member) 501 having a through hole 501a is inserted into a viscous-material storage chamber, and a stagnation point ST is provided in the solder flow (rolling) during the move of the head, so that the filling pressure is increased. That is, the peak is elevated. More specifically, as shown in FIG. 47, high-speed printing is enabled by elevating a portion A, i.e. trapezoidal portion, of the pressure waveform, and printability is ensured by generating a peak portion located at a rear end of the trapezoidal portion on the time base.

As an example, if the viscous material is solder, its viscosity is 200 Pa·s and the squeegee speed is 10 to 200 mm/sec., a pressure of at least 0.01 to 0.04 MPa is necessary. In other words, the pressure is preferably increased by 40 to 80% relative to the set pressure.

In addition, in FIG. 48, reference numeral 520 denotes a blade fixing plate, and 521 and 522 denote fitting screws. The blade 6 has its upper end portion sandwiched between the blade fixing plate 520 and the blade holder 7 by fixing the blade fixing plate 520 to the blade holder 7 with the fitting screws 522, and the blade fixing plate 520 and the blade holder 7 are fixed to an apparatus main-body 513 by the fitting screws 521. Accordingly, as specified in a later-described eighth embodiment, the lower end portion of the blade 6 projecting downward from the blade holder 7 is made freely flexible.

Numeral 501b on FIGS. 49A and 49B denotes a recessed portion in a central bottom face of the partitioning plate 501.

Figure 50:
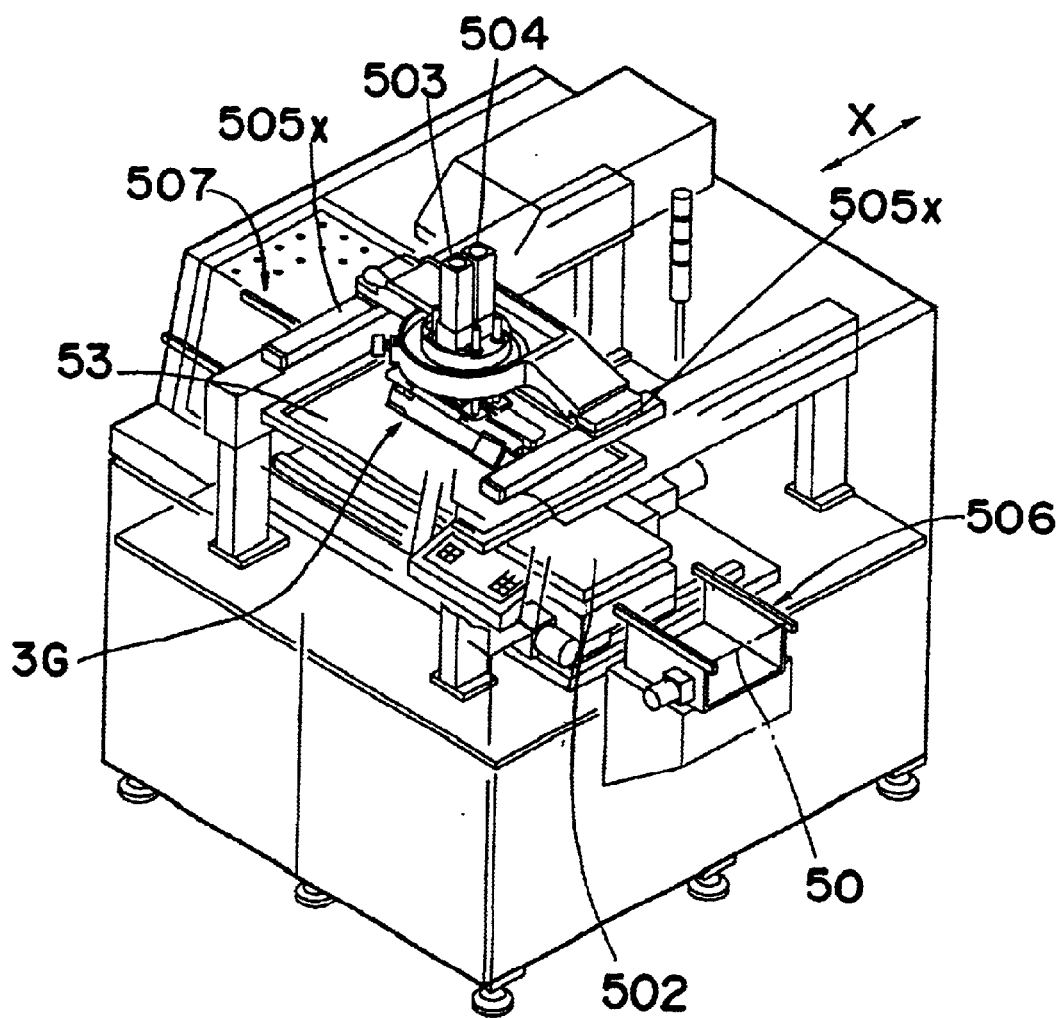
FIG. 50 is a perspective view of a whole printing unit equipped with the viscous material application apparatus according to the sixth embodiment of the present invention.
Figure 51:
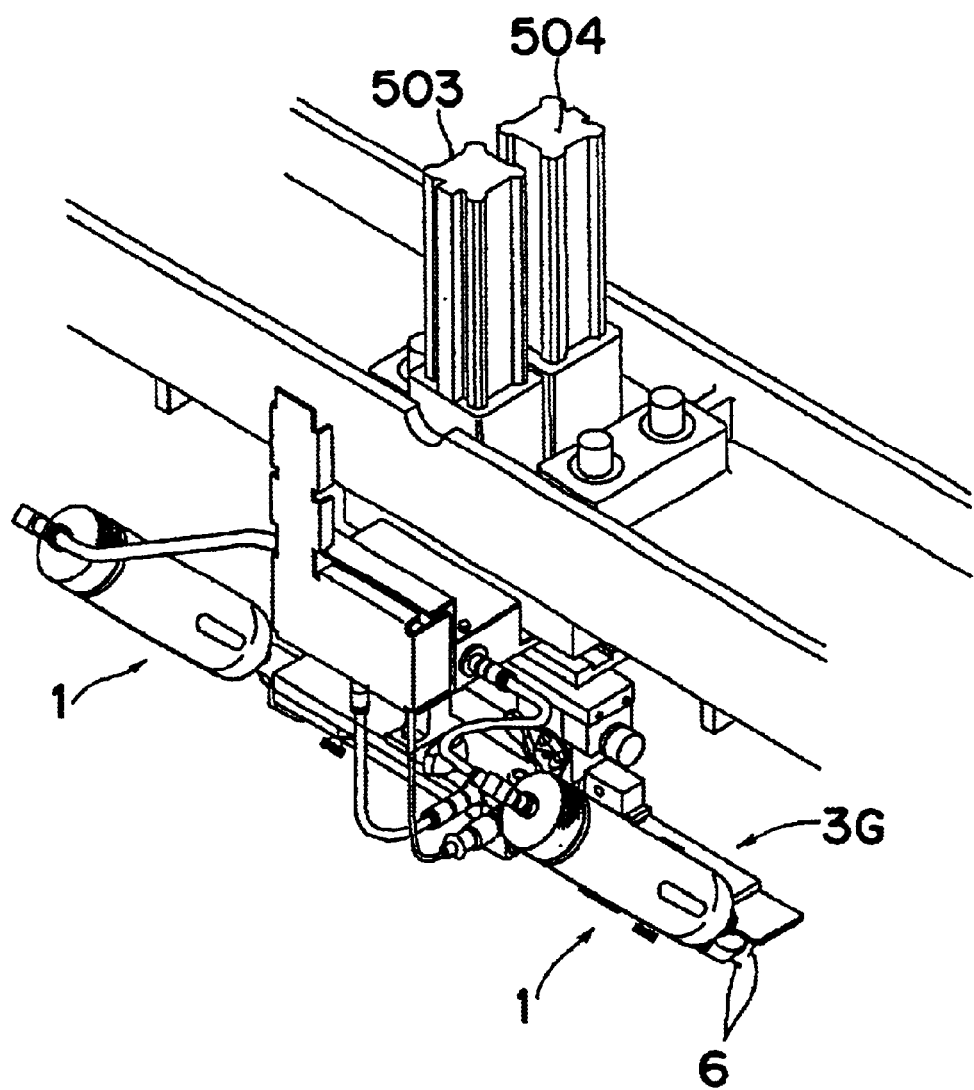
FIG. 51 is a partly enlarged perspective view of the viscous material application apparatus according to the sixth embodiment of the present invention.
Figure 52:
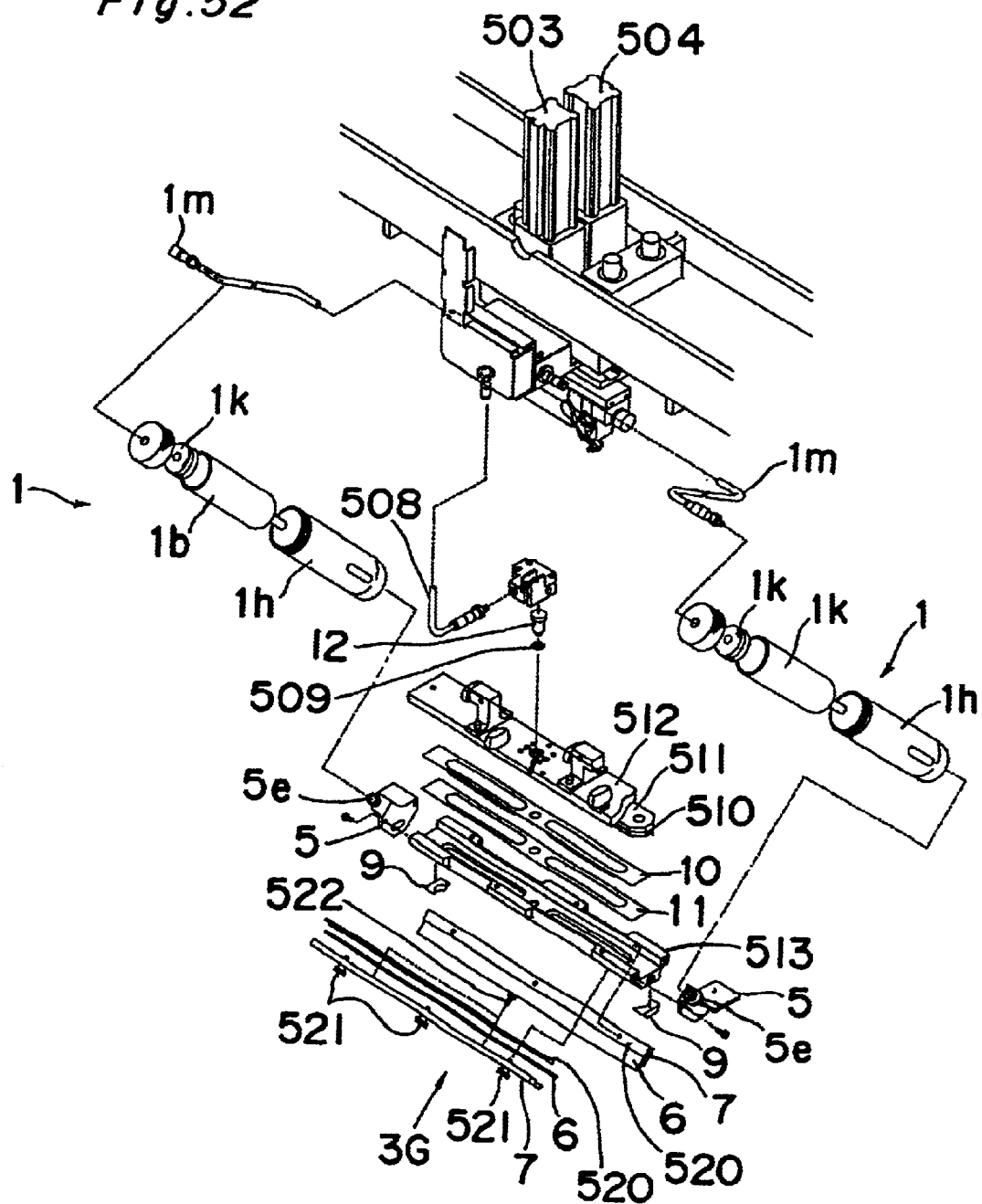
FIG. 52 is an exploded perspective view of the viscous material application apparatus according to the sixth embodiment of the present invention.
Figure 53:
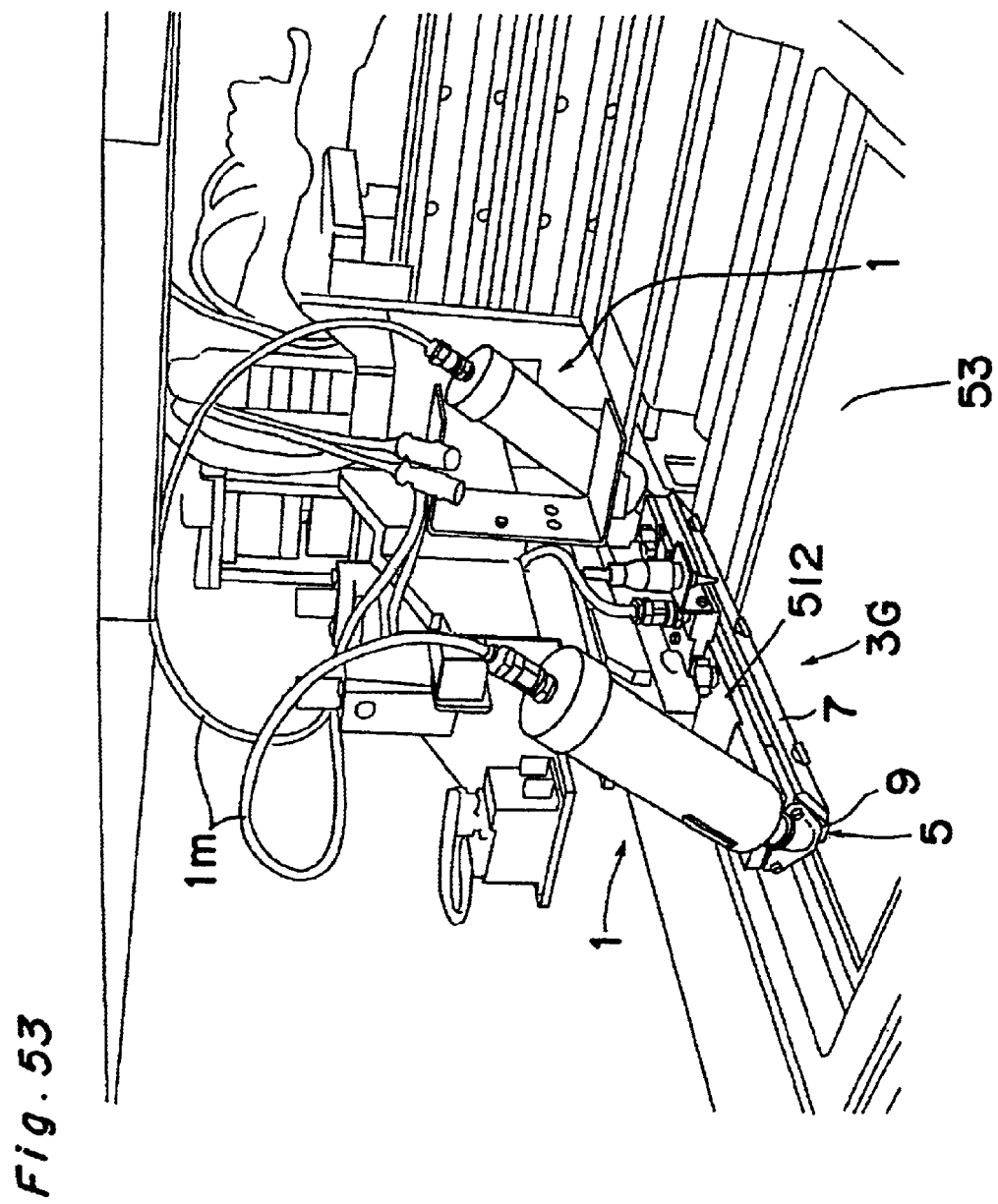
FIG. 53 is a perspective view of the viscous material application apparatus according to the sixth embodiment of the present invention.

FIG. 50 is a perspective view of a whole printing unit equipped with the viscous material application apparatus 3G according to the sixth embodiment of the present invention, where the viscous material application apparatus 3G is reciprocatively movable in an X-axis direction so as to be capable of printing solder onto different boards 50 in forward and backward moves, one board for each move. FIG. 51 is a partly enlarged perspective view of the viscous material application apparatus 3G, FIG. 52 is an exploded perspective view of the viscous material application apparatus 3G, and FIG. 53 is a perspective view of the viscous material application apparatus 3G within the printing unit. FIG. 53 shows a state in which a tightly closed type squeegee, which is the viscous material application apparatus 3G, is movable from the rear side of the operator, which is the left side, toward the operator side, which is the right side.

In these figures, reference numeral 502 denotes a stage for positioning and sucking-and-holding the application object, for example, the board 50 and further elevating the board 50 to a printing position for printing operation, 503 and 504 denote elevating-and-lowering driver devices, such as air cylinders or motors, which correspond to the driver device capable of up-and-down drive with the feed screw mechanism 17 and the motor 18 in the foregoing embodiment, 505x denotes a driver device for moving the viscous material application apparatus 3G in a lateral (e.g. horizontal) direction (X-axis direction in FIG. 50), that is, parallel to the application surface of the application object (the driver device being an example of the relative moving device or the moving device), 506 denotes a loader for carrying the board 50 into the stage 502, and 507 denotes an unloader for carrying the board 50 out of the stage 502. Further, reference numeral 508 denotes piping for feeding compressed air to a pressurizing sheet (an example of the sheet- or bag-like discharge-pressure adjusting device) 10, 509 denotes an O-ring, 510 denotes a sheet holder, 511 denotes an urethane rubber, 512 denotes an top cover, and 513 denotes the apparatus main-body of the viscous material application apparatus 3G. On the apparatus main-body 513, are mountable the air bleeding sheet 11, the pressurizing sheet 10, the sheet holder 510, the urethane rubber 511, and the top cover 521.

Also, reference numeral 5 denotes the joint, and 5e denotes the screw portion for mounting of a cartridge holder 1h, which is mounted by a lower end of the cartridge holder 1h being removably screwed in. The screw portion 5e for mounting of the cartridge holder is projected obliquely upward toward the operator side so as to facilitate the operator's work of taking out the cartridge out of a below-described cartridge holder for replacement and of mounting and removing the cartridge holder 1h to and from the screw portion 5e for mounting of the cartridge holder.

Further, reference numeral 9 denotes the side stoppers 9 formed of a sealing material, which is a flexible material such as sponge, the side stoppers 9 being placed at both end portions of the storage chamber and serving for closing both end portions of the storage chamber, 10 denotes the pressurizing sheet, 11 denotes the air bleeding sheet, and 12 denotes the pressure sensor.

Further, reference numeral 1 denotes the material feed section (an example of the viscous-material feeding device), 1b denotes a solder cartridge in which solder is stored, 1h denotes a cartridge holder into which the solder cartridge 1b is removably inserted and housed, 1k denotes a magnet which moves following a piston contained in the solder cartridge 1b and which is detected in position by a magnetic sensor to thereby enable the detection of a residual quantity of the solder within the solder cartridge 1b, and 1m denotes piping for injecting compressed air to pressure the piston contained in the solder cartridge 1b.

(First Modification)

Figure 54A:
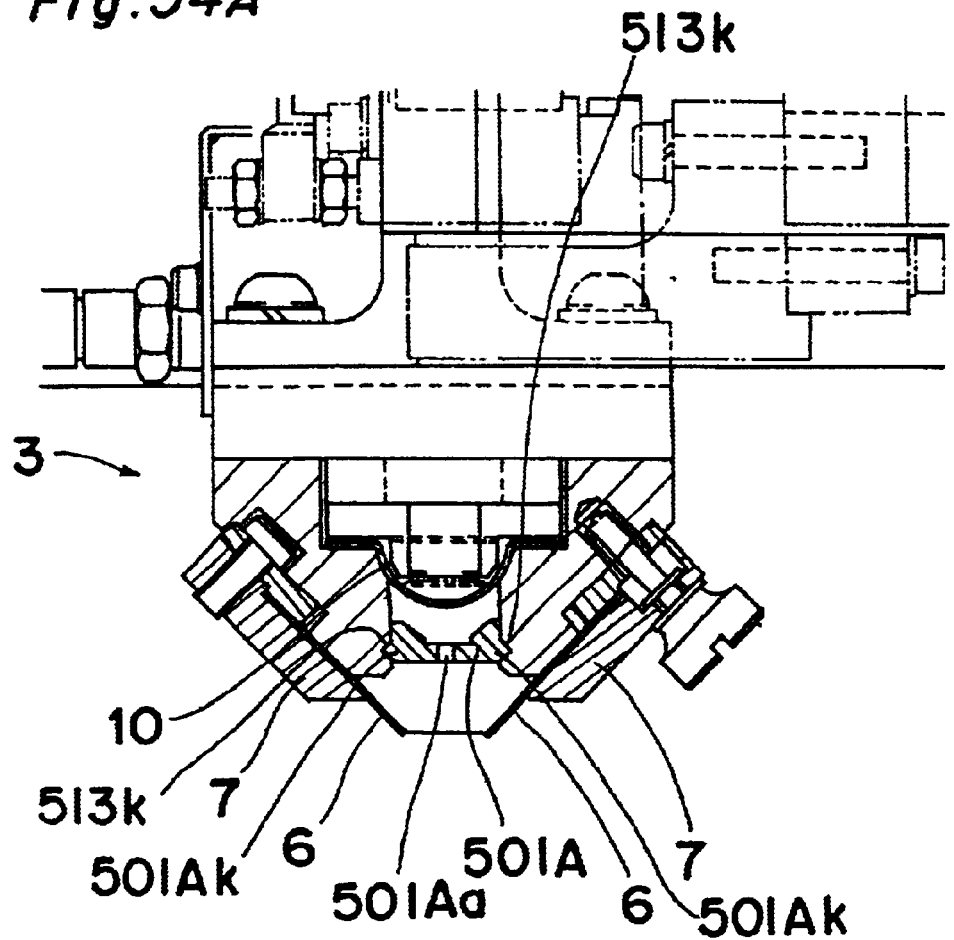
FIGS. 54A and 54B are a longitudinal-section front view of a viscous material application apparatus equipped with a partitioning plate, which is a first modification of the viscous material application apparatus according to the sixth embodiment of the present invention, and a perspective view of the partitioning plate, respectively.
Figure 54B:
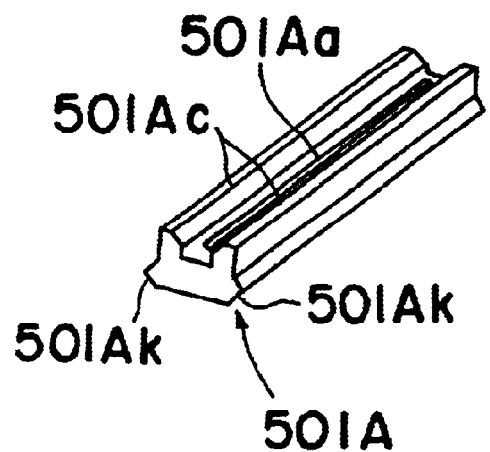
Figure 56A:
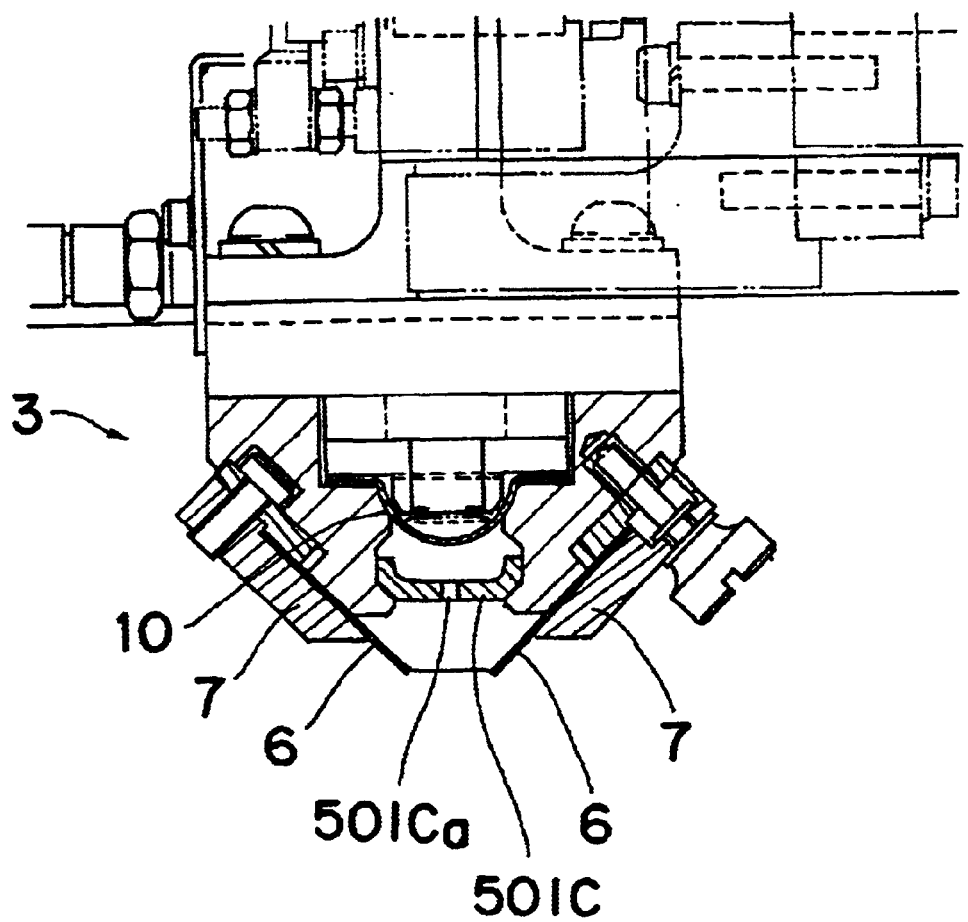
FIGS. 56A and 56B are a longitudinal-section front view of a viscous material application apparatus equipped with a partitioning plate, which is a third modification of the viscous material application apparatus according to the sixth embodiment of the present invention, and a perspective view of the partitioning plate, respectively.
Figure 56B:
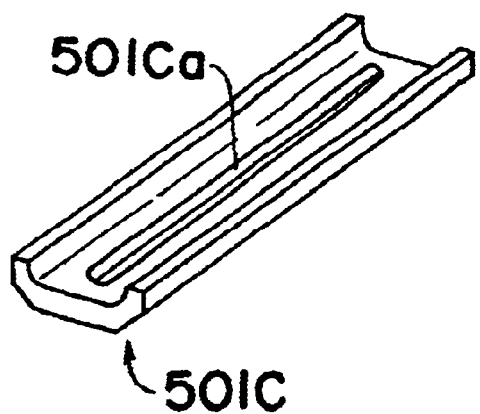
Figure 57A:
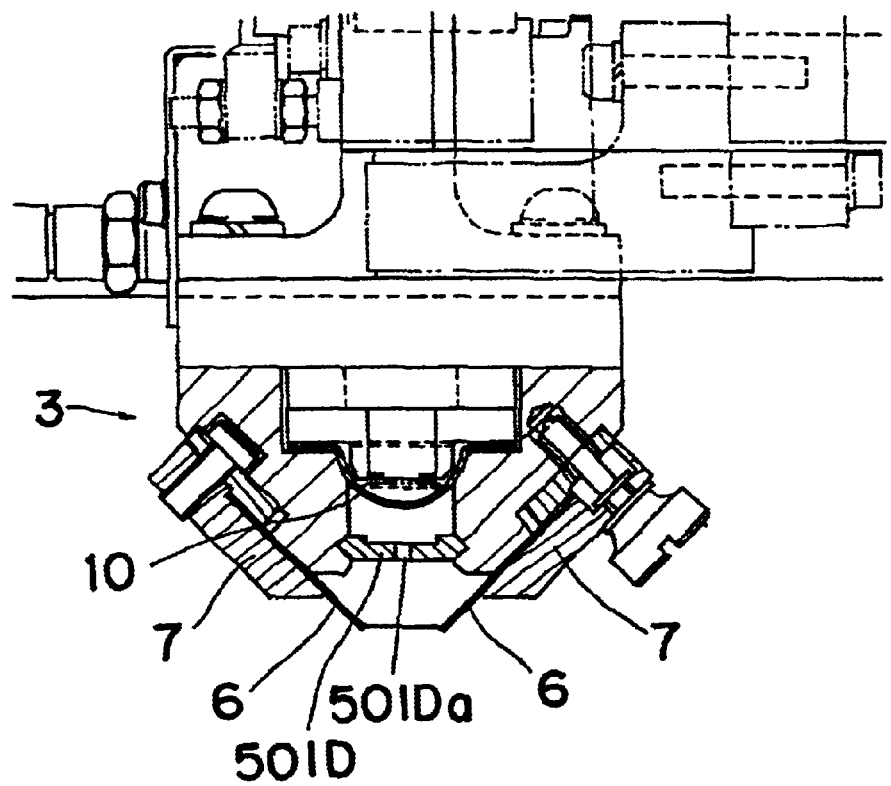
FIGS. 57A and 57B are a longitudinal-section front view of a viscous material application apparatus equipped with a partitioning plate, which is a fourth modification of the viscous material application apparatus according to the sixth embodiment of the present invention, and a perspective view of the partitioning plate, respectively.
Figure 57B:
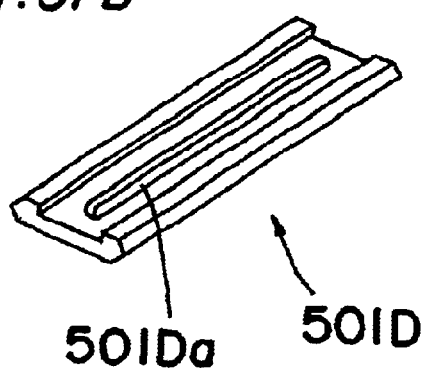

FIGS. 54A and 54B show a first modification of the sixth embodiment of the present invention, where engaging portions 501Ak each having a triangular cross-sectional shape and projecting laterally (i.e., along a plane parallel to the application surface of the application object) on widthwise both sides of a partitioning plate 501A are engaged with engaging recessed portions 513k of the apparatus main-body 513 each having a triangular cross-sectional shape, by which the partitioning plate 501A is placed near the pressurizing sheet 10 upward of the storage section. The mounting by such an engaging method is also the case with a second modification of FIGS. 55A and 55B and a fourth modification of FIGS. 57A and 57B shown below. A third modification of FIGS. 56A and 56B is one in which the projection-and-recess relation is inverted. Reference numeral 501Aa denotes a solder-feed through hole, and 501Ac denotes guide portions projecting upward on widthwise both sides of the top face of the partitioning plate 501A and having sloped surfaces for guiding the move of the solder toward the through hole 501Aa. Thus, the placement position of the partitioning plate 501A near the pressurizing sheet 10 allows the storage chamber to be enlarged.

(Second Modification)

Figure 55A:
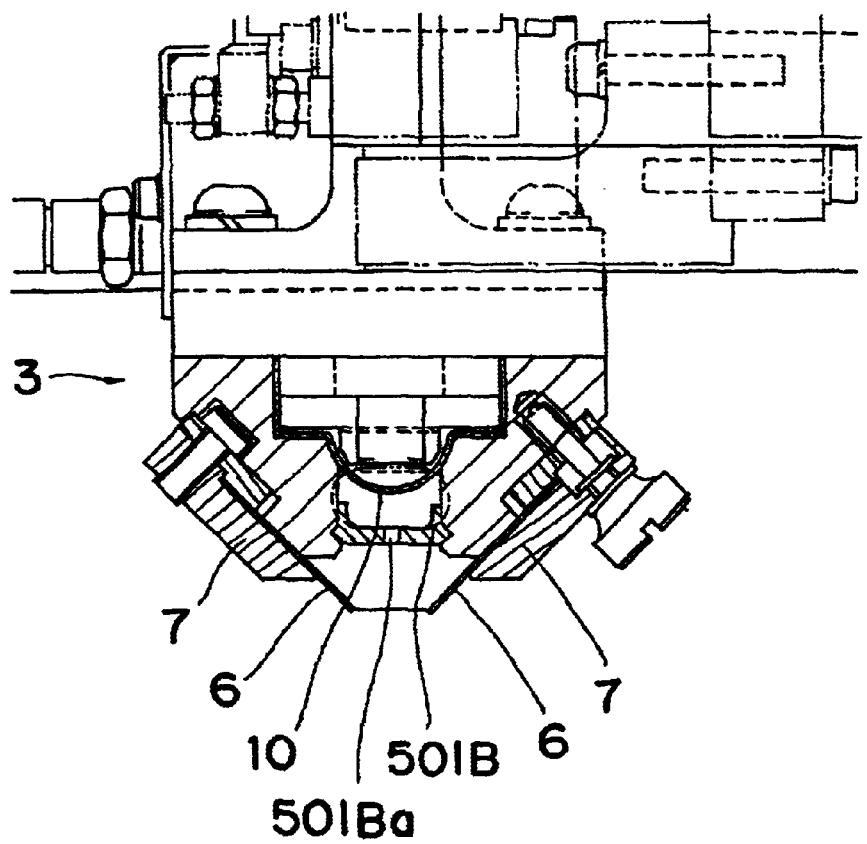
FIGS. 55A and 55B are a longitudinal-section front view of a viscous material application apparatus equipped with a partitioning plate, which is a second modification of the viscous material application apparatus according to the sixth embodiment of the present invention, and a perspective view of the partitioning plate, respectively.
Figure 55B:
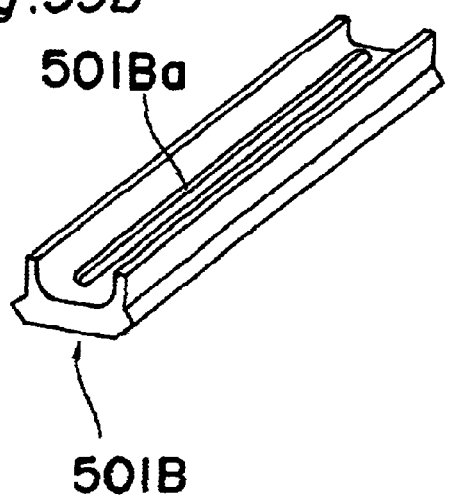

FIGS. 55A and 55B are longitudinal-section front view of a viscous material application apparatus equipped with a partitioning plate 501B, which is a second modification of the viscous material application apparatus according to the sixth embodiment of the present invention, and a perspective view of the partitioning plate 501B, respectively. Numeral 501Ba denotes a solder-feed through hole, which is formed by curving the top face side of the partitioning plate 501B so that the move of the solder is moved smoothly toward the through hole 501Aa.

(Third Modification)

FIGS. 56A and 56B are a longitudinal-section front view of a viscous material application apparatus equipped with a partitioning plate 501C, which is a third modification of the viscous material application apparatus according to the sixth embodiment of the present invention, and a perspective view of the partitioning plate, respectively. An engaging cutout having a triangular cross-sectional shape and formed at widthwise both end portions of the bottom face of the partitioning plate 501C is engaged with an engaging protrusion of the apparatus main-body 513 having a triangular cross-sectional shape, by which the partitioning plate is engaged and held. Also, numeral 501Ca denotes a solder-feed through hole, and the partitioning plate 501C is curved on its top face side, so that the move of the solder is guided toward the through hole 501Ca smoothly.

(Fourth Modification)

FIGS. 57A and 57B are a longitudinal-section front view of a viscous material application apparatus equipped with a generally plate-shaped partitioning plate 501D, which is a fourth modification of the viscous material application apparatus according to the sixth embodiment of the present invention, and a perspective view of the partitioning plate, respectively. Reference numeral 501Da denotes a solder-feed through hole.

(Fifth Modification)

Figure 58A:
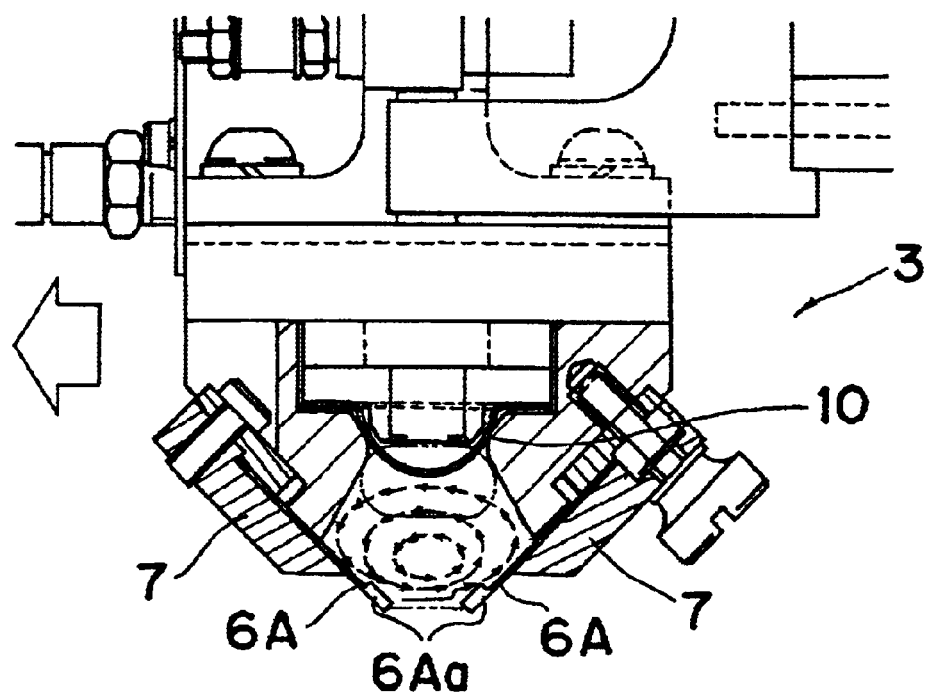
FIGS. 58A and 58B are a longitudinal-section front view of a viscous material application apparatus equipped with a blade, which is a fifth modification of the viscous material application apparatus according to the sixth embodiment of the present invention, and a perspective view of the blade, respectively.
Figure 58B:
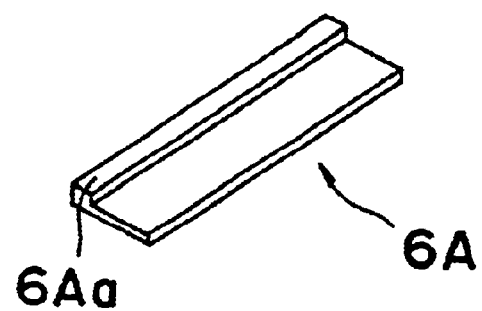

FIGS. 58A and 58B are a longitudinal-section front view of a viscous material application apparatus equipped with blades 6A serving as another example of the flow-regulating member instead of the partitioning plate, which is a fifth modification of the viscous material application apparatus according to the sixth embodiment of the present invention, and a perspective view of the blade 6A, respectively. That is, a thicker portion 6Aa is provided at a fore end of the blade 6A so that the convective pressure of the solder in the storage chamber is increased, in which case also operations and effects similar to those of the sixth embodiment can be fulfilled.

(Sixth Modification)

Figure 59:
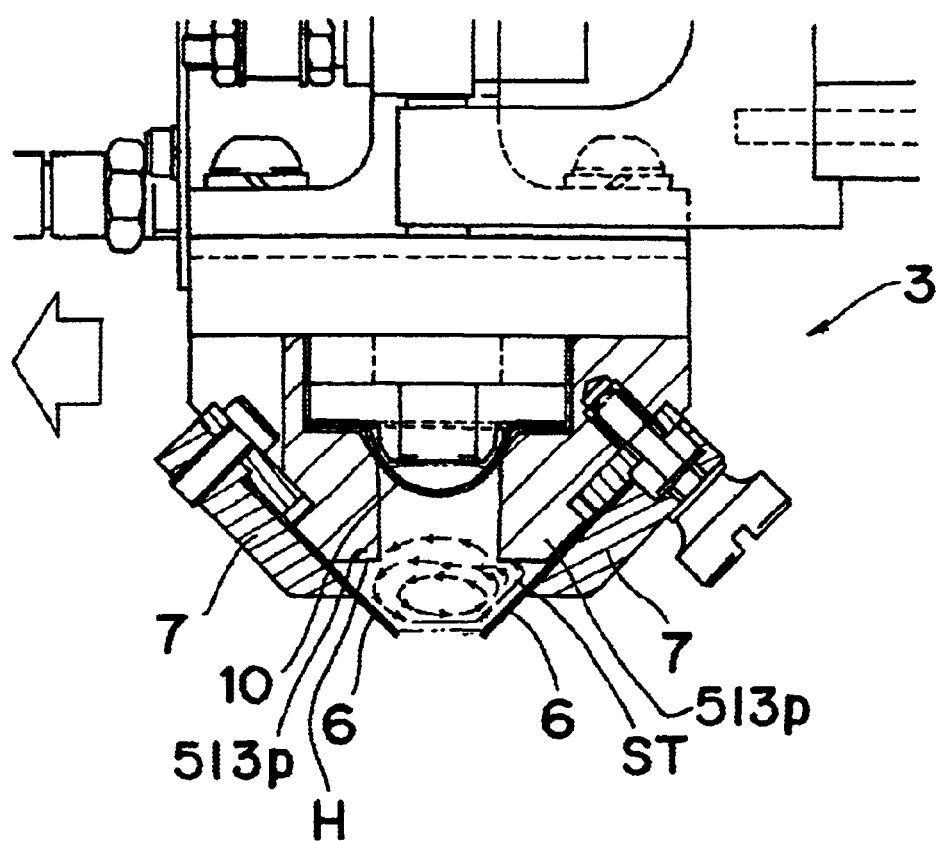
FIG. 59 is a longitudinal-section front view of a viscous material application apparatus in which the storage chamber on the apparatus main-body side is changed in configuration, which is a sixth modification of the viscous material application apparatus according to the sixth embodiment of the present invention.

FIG. 59 is a longitudinal-section front view of a viscous material application apparatus in which the storage chamber H on the apparatus main-body 513 side is changed in configuration, which is a sixth modification of the viscous material application apparatus according to the sixth embodiment of the present invention. That is, a pair of perpendicular walls 513p are provided as the walls of the apparatus main-body 513, and the storage chamber H is so shaped, generally directed downward, as shown by an arrow. As a result of this, a stagnation ST is formed at a corner portion formed by the perpendicular walls 513p and the blades 6. Also in this sixth modification, operations and effects similar to those of the above-described other modifications of the sixth embodiment can be fulfilled.

According to the sixth embodiment of the present invention, there is a feature that the pressure waveform is so made as to have a peak as in the conventional squeegee method and the control of a specified pressure can be achieved even at high speed as in the tightly closed type method. As a result, also with patterns in which large and small openings are mixed, good printing quality can be ensured.

(Seventh Embodiment)

Next, a viscous material application apparatus according to a seventh embodiment of the present invention is described with reference to FIGS. 65A to 76. In this description, the sheet or bag 10 is referred to as sheet 10. In the seventh embodiment, the printing position is located upper than the solder-feed position with respect to the screen mask 53, thus allowing the apparatus to freely followable to projections and recesses of the screen mask 53.

In conventional screen printing, solder feed by the operator or periodical re-feed in specified quantities by an automatic feeding unit would be involved after a temporary halt of the printing apparatus, or there have been some cases where stable sheet operation could not be obtained after the solder feeding into the solder storage chamber.

By contrast, in this seventh embodiment, enough viscous material to achieve printing (discharging) can automatically be fed at all times into a storage chamber of a tightly closed container (head). As a head structure for this purpose, a sheet holder 550 for preventing the sheet from reversal is added.

As an example, it is assumed that a push-in amount of the squeegee to the board 50 at the head push-in origin position (a state of positioning to a position POP) is 0 mm, that a push-in amount of the squeegee to the board 50 at the solder-feed position is 1.5 mm, and that a push-in amount of the squeegee to the board 50 at the printing position is 0.5 mm. In this case, the push-in amount of the squeegee to the board 50 at the solder-feed position is preferably at least a double or more of the push-in amount of the squeegee to the board 50 at the printing position.

A difference between the push-in amount of the squeegee to the board 50 at the solder-feed position and the push-in amount of the squeegee to the board 50 at the printing position is a residual pressure. This residual pressure, if remaining, would cause the occurrence of the reversal of the sheet so that the sheet could not be operated stably.

In order to lessen or eliminate this residual pressure, the sheet holder 550 for holding the sheet 10 is placed just above the sheet 10 and the push-in amount of the squeegee is lessened. If there is no sheet holder 550, then the sheet 10, in the worst case, would be inverted upside down, with the projected portions of the bumps completely upward due to the residual pressure, so that the capacity of the storage chamber would increase proportionally, thus causing the solder amount held in the storage chamber to increase. As a result of this, in maintenance or in replacement of the kind of solder, the solder in the storage chamber would be thrown away, causing an issue of increased waste amounts. As a solution to such issues, the sheet holder 550 is provided and the push-in amount of the squeegee is lessened, as described above.

Also, increases in the stroke for the squeegee push-in amount would cause air to be sucked into the storage chamber through the interface with the metal mask (screen mask). Therefore, the stroke is preferably small.

Figure 66A:
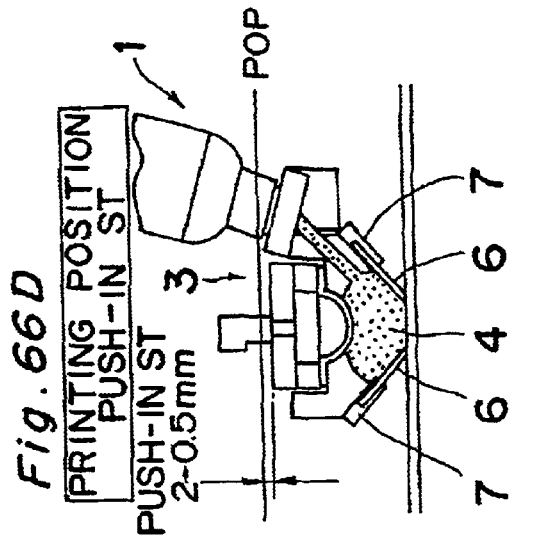
FIGS. 66A, 66B, 66C, and 66D are an explanatory view showing a state of voids generated in the viscous material application apparatus, explanatory views showing operational states at a printing position and a push-in origin position, and an explanatory view showing an operational state at the printing position, respectively.

More specifically, as shown in FIG. 66A showing the tightly closed-head discharge part, there arise voids 601 in the solder storage chamber. As a result, solder unfilling failures partly occur (continuous printing of about 20 to 30 sheets), the pressure inside the solder storage chamber abruptly lowers, the solder-feed operation is no longer performed during the printing (regardless of a good result of pressure check before printing operation), and moreover the voids 601 occur again in the solder storage chamber (repeatability of occurrence of voids).

Figure 66B:
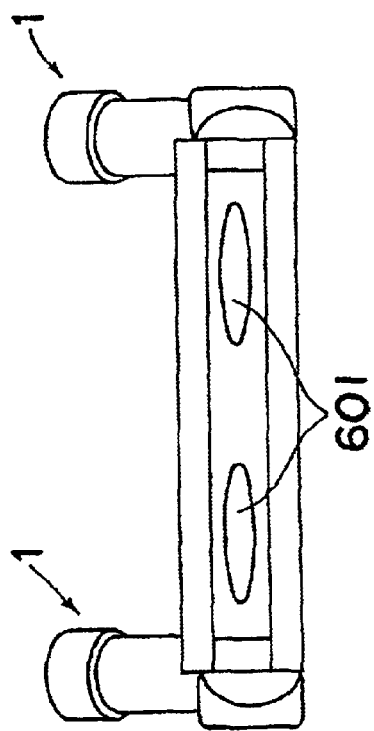
Figure 66C:
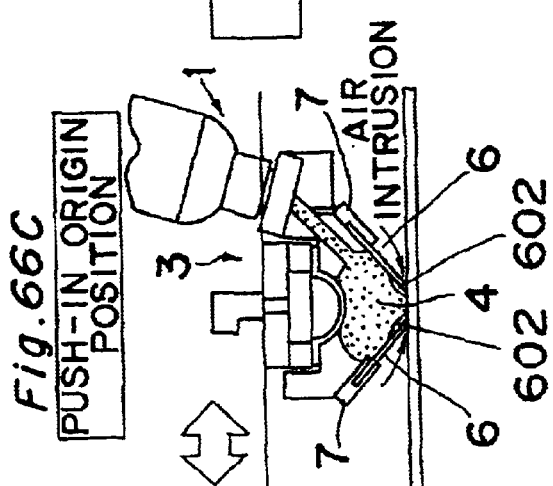

The occurrence of the voids 601 could be attributed primarily to the head push-in stroke in printing as shown in FIGS. 66B and 66C. That is, since air may intrude because of up-and-down operations of the head between the printing position and the origin position, there is a possibility that voids may occur. More specifically, since the deformation of the sheet 10 does not follow up the abrupt change (increase) in the internal capacity of the solder storage chamber resulting from the elevation of the head from the printing position (e.g., with an push-in amount of 2 mm) to the origin position (e.g., with an push-in amount of 0 mm), the interior of the solder storage chamber goes negative pressure, permitting air to intrude from under the blades 6 as indicated by numeral 602. Also, as this intruding action of air is iterated, the voids 601 in the solder storage chamber grow gradually. Further, at the pressure check before the printing operation, because of a tightly closed state in which the voids 601 have occurred in the solder storage chamber, the pressure increases so that the head begins to move, where the air in the solder storage chamber is discharged out at the mask opening, causing the pressure to decrease. Furthermore, since such pressure decreasing operation due to the discharge of the air is repeated, the solder feed on the way of operation is not performed.

Figure 66D:
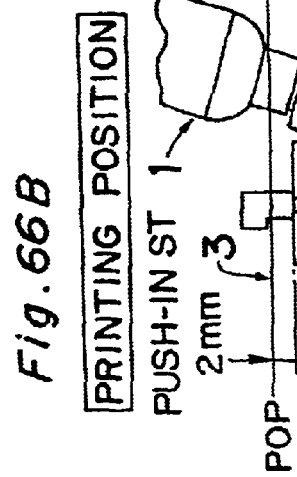

In order to prevent such occurrence of the voids 601, as shown in FIG. 66D, the head push-in amount is lessened, that is, the stroke is shortened. For example, as shown in FIG. 67D, the solder-feed method is changed, that is, the push-in amount in the state at the printing position after the completion of solder feed is changed from 2 mm to 0.5 mm.

Figure 65A:
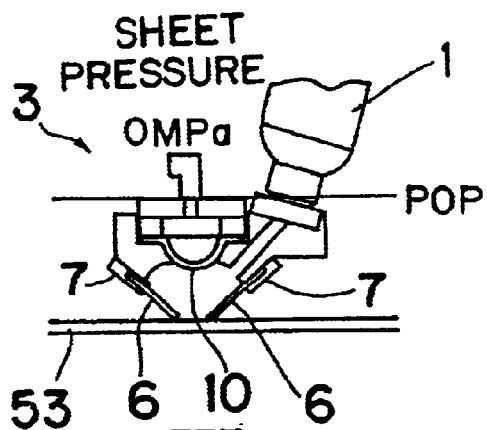
FIGS. 65A, 65B, 65C, and 65D are explanatory views showing operational states at a push-in origin position, a solder-feeding position, the push-in origin position, and a printing position, respectively, of a squeegee in the viscous material application apparatus without a sheet holder as in the foregoing embodiment, as compared with a viscous material application apparatus according to a seventh embodiment of the present invention.
Figure 65B:
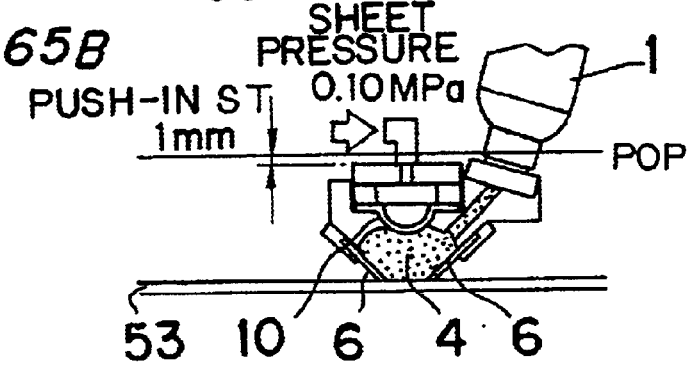
Figure 65C:
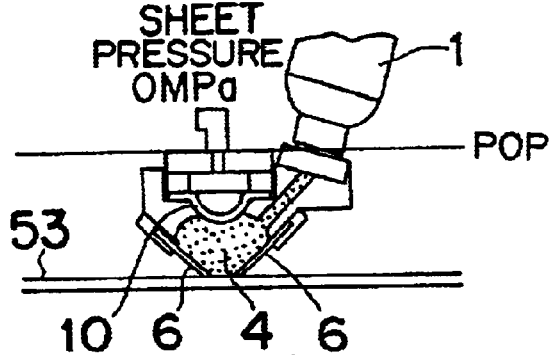
Figure 65D:
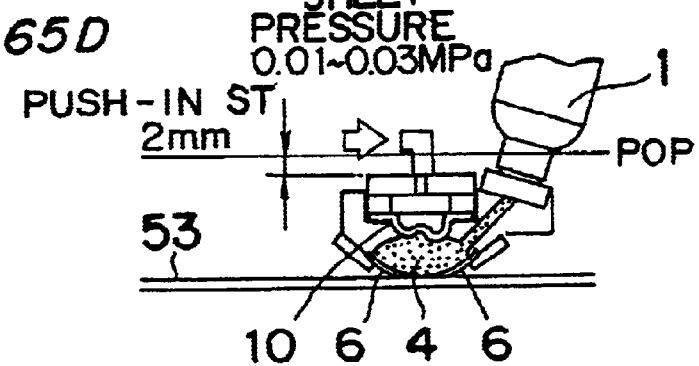

As an example, as shown in FIGS. 65A–65D, the sheet pressure is 0 MPa at the push-in origin position in FIG. 65A, 0.10 MPa at the solder-feeding position in FIG. 65B, 0 MPa at the push-in origin position in FIG. 65C, and 0.01 to 0.03 MPa at the printing position in FIG. 65D, while the push-in amount is 0 mm at the push-in origin position, 1 mm at the solder-feeding position, 0 mm at the push-in origin position, and 2 mm at the printing position. Thus, in the case where the solder feed has been completed in a downward-projected state, given a push-in amount of 0.5 mm, if the screen mask is flexed to project downward, the squeegee could not flow downward to the lowering extent of downward projection.

Figure 67A:
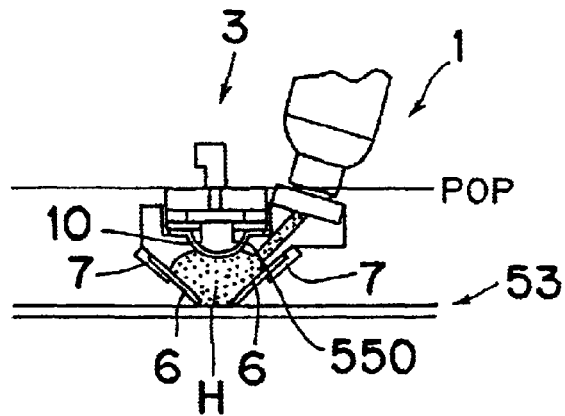
FIGS. 67A, 67B, 67C, and 67D are explanatory views showing operational states at the push-in origin position, the solder-feeding position, the push-in origin position, and the printing position, respectively, of the squeegee in the viscous material application apparatus according to the seventh embodiment.
Figure 67B:
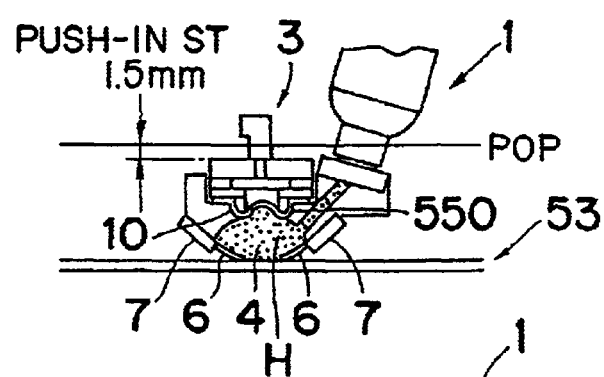
Figure 67C:
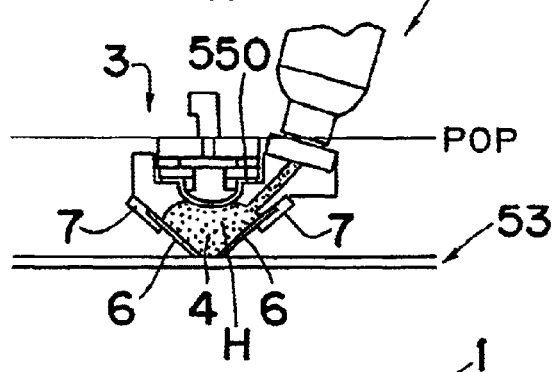
Figure 67D:
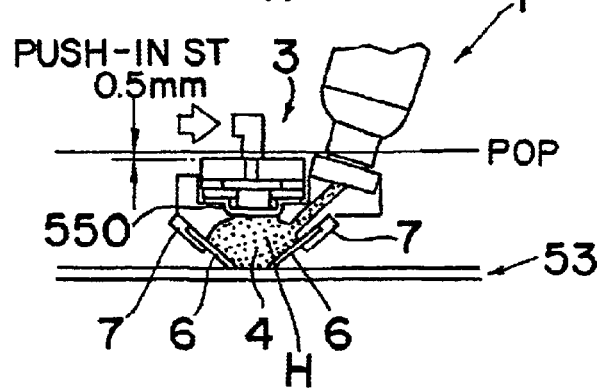

Meanwhile, in the seventh embodiment, as shown in FIGS. 67A–67D, the sheet pressure is 0 MPa at the push-in origin position in FIG. 67A (a state of positioning to the position POP), 0 to 0.06 MPa at the solder-feeding position in FIG. 67B, 0 MPa at the push-in origin position in FIG. 67C (a state of positioning to the position POP), and 0.01 to 0.03 MPa at the printing position in FIG. 67D, while the push-in amount is 0 mm at the push-in origin position, 1.5 mm at the solder-feeding position, 0 mm at the push-in origin position, and 0.5 mm at the printing position. Thus, by making the push-in amount at the printing position smaller than that at the solder-feeding position, the area where the sheet 10 is permitted to play is increased.

However, it is more preferable that the sheet holder 550 is operated at this printing position. Setting the push-in amount to 0 mm at the push-in origin position and 0.5 mm at the printing position allows any residual pressure to be absorbed. That is, setting the printing position upper than the solder-feeding position with respect to the screen mask 53 makes it possible to absorb the residual pressure.

Figure 68:
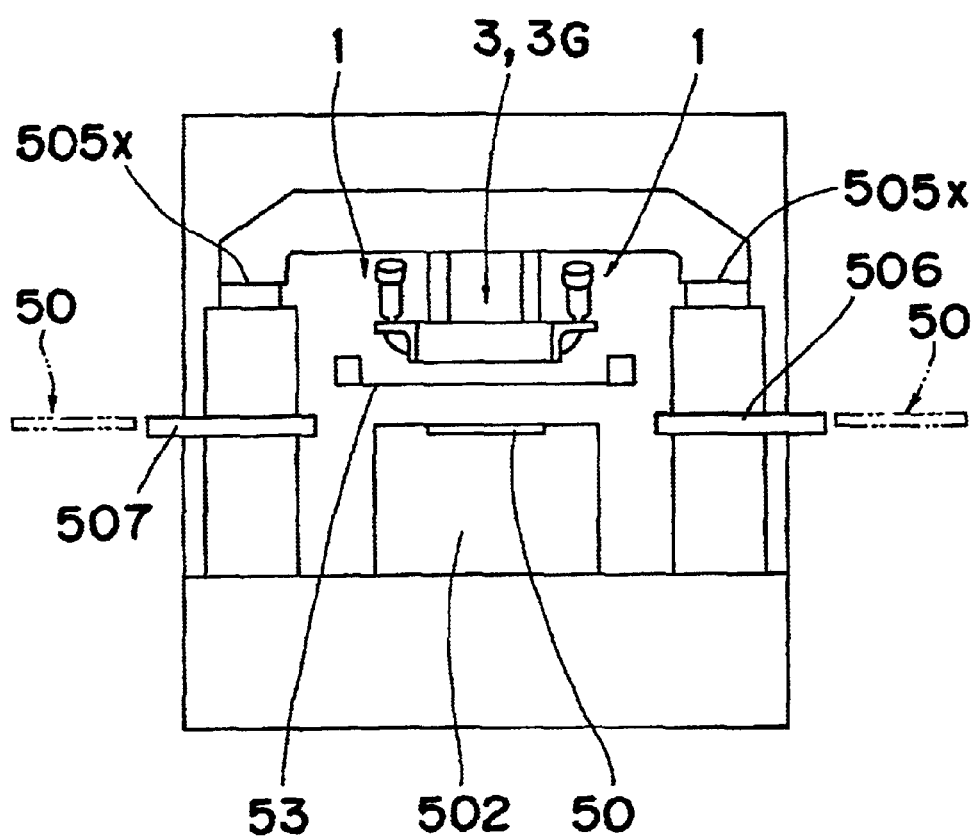
FIG. 68 is a front view of the viscous material application apparatus according to the seventh embodiment of the present invention as viewed from the front side, showing a state in which the squeegee is positioned at the squeegee push-in origin position.
Figure 69:
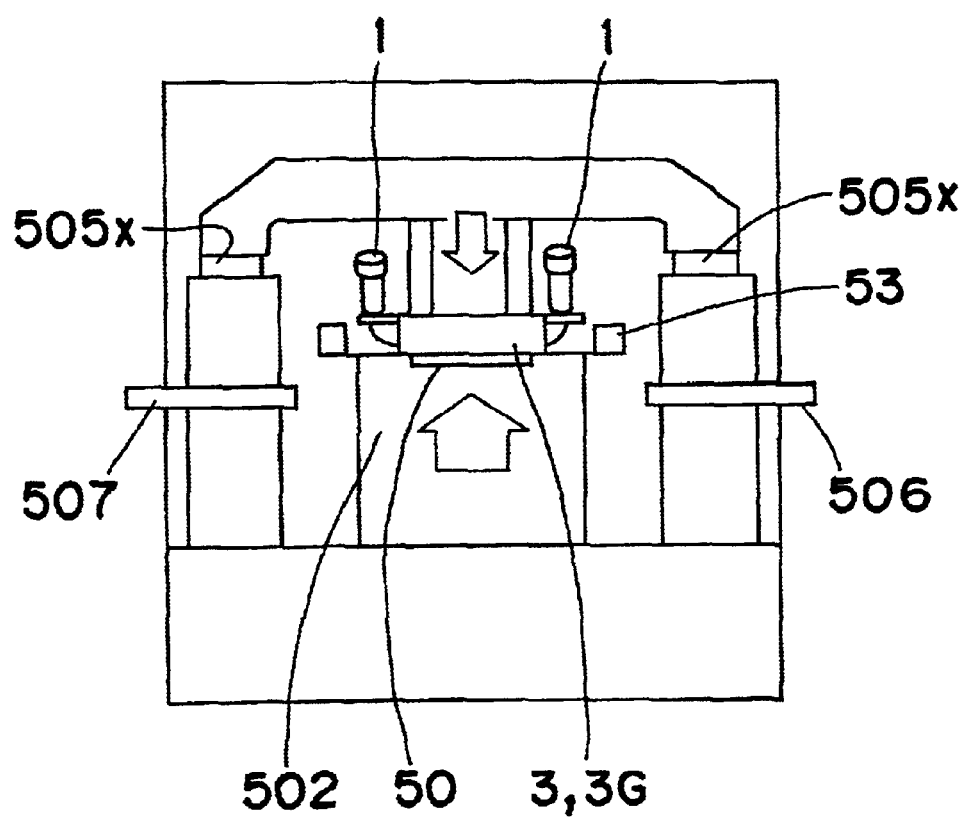
FIG. 69 is a front view of the viscous material application apparatus according to the seventh embodiment of the present invention as viewed from the front side, showing a state in which the squeegee is positioned at the squeegee printing position with the stage lifted.
Figure 70:
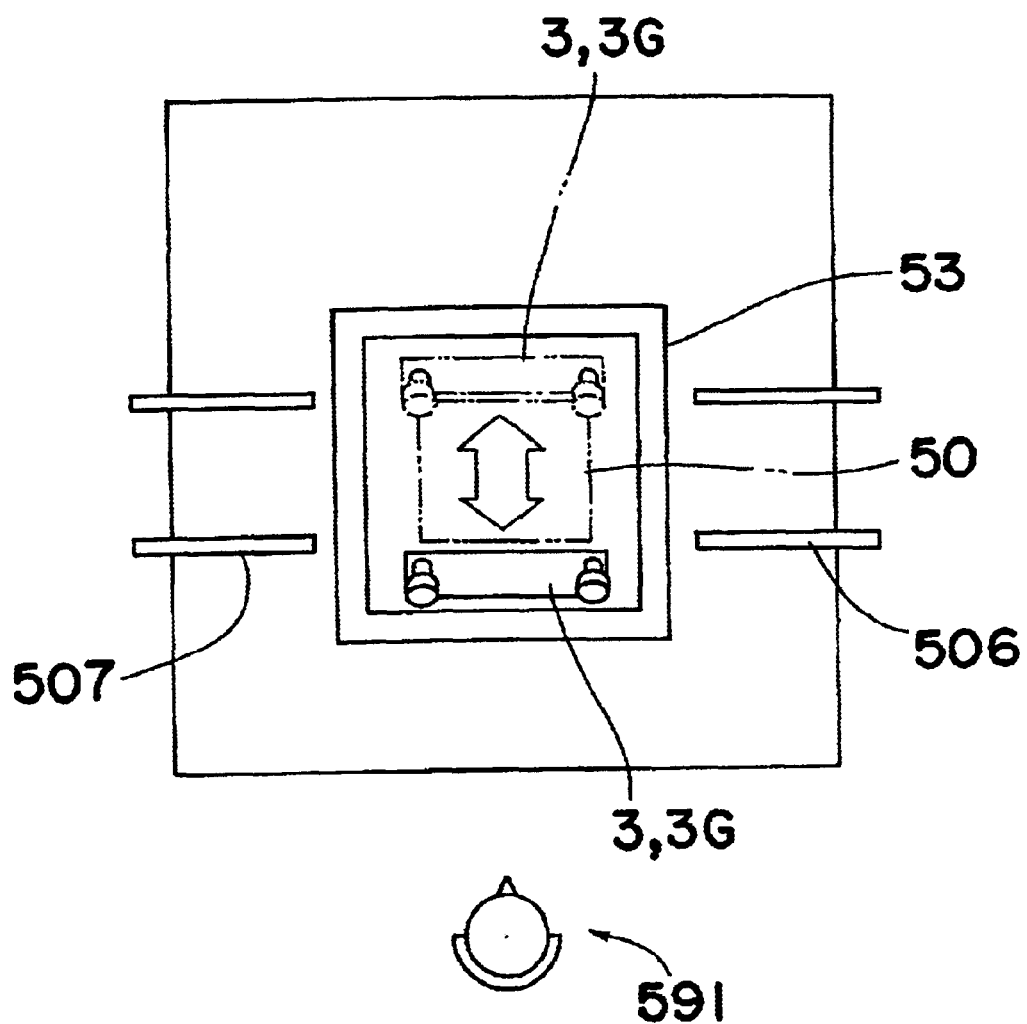
FIG. 70 is a plan view of the viscous material application apparatus according to the seventh embodiment of the present invention, being an explanatory view of solder cartridge replacement.
Figure 71:
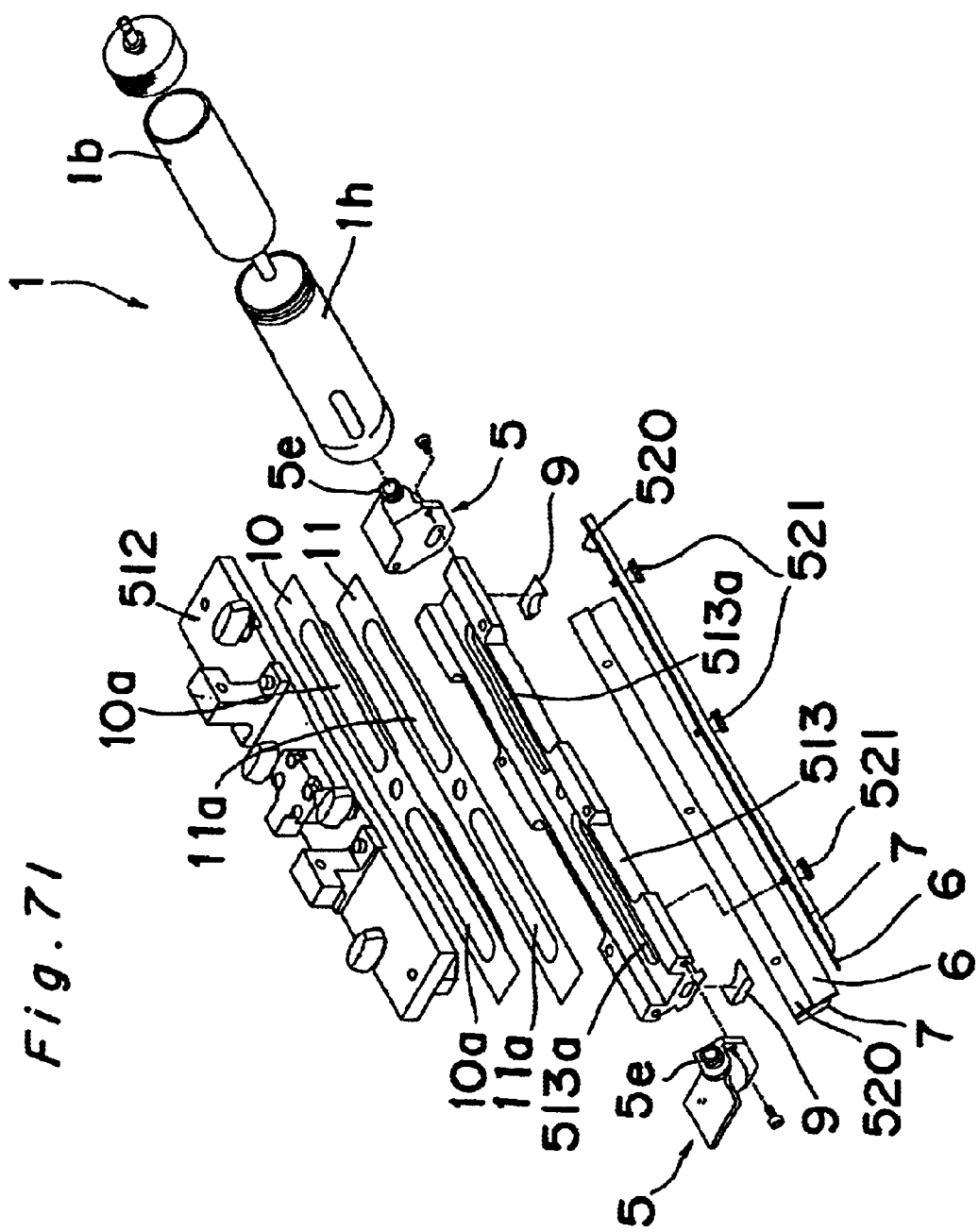
FIG. 71 is an exploded perspective view of the viscous material application apparatus according to the seventh embodiment of the present invention.
Figure 72:
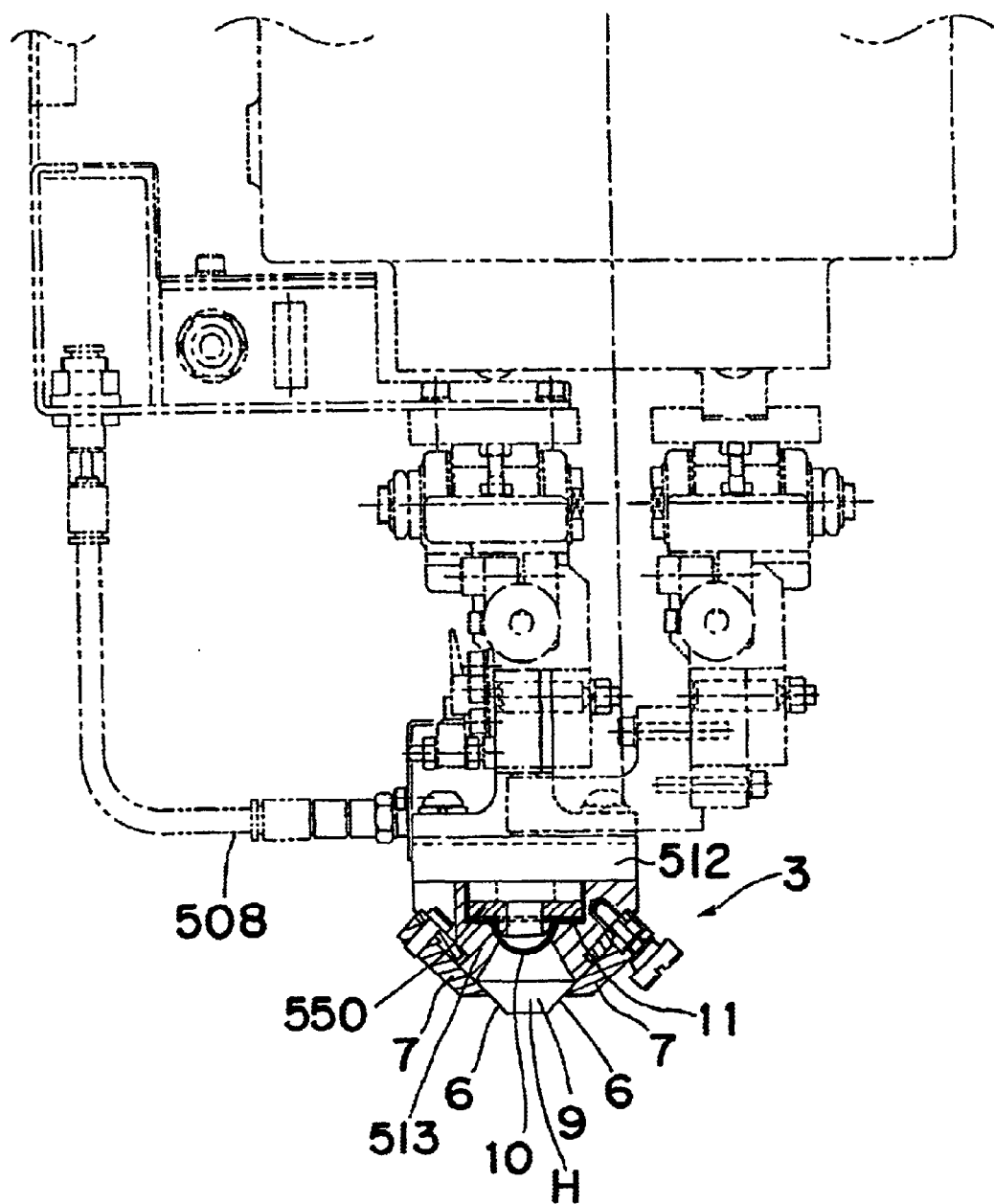
FIG. 72 is a partial longitudinal-section front view of the viscous material application apparatus according to the seventh embodiment of the present invention.
Figure 74A:
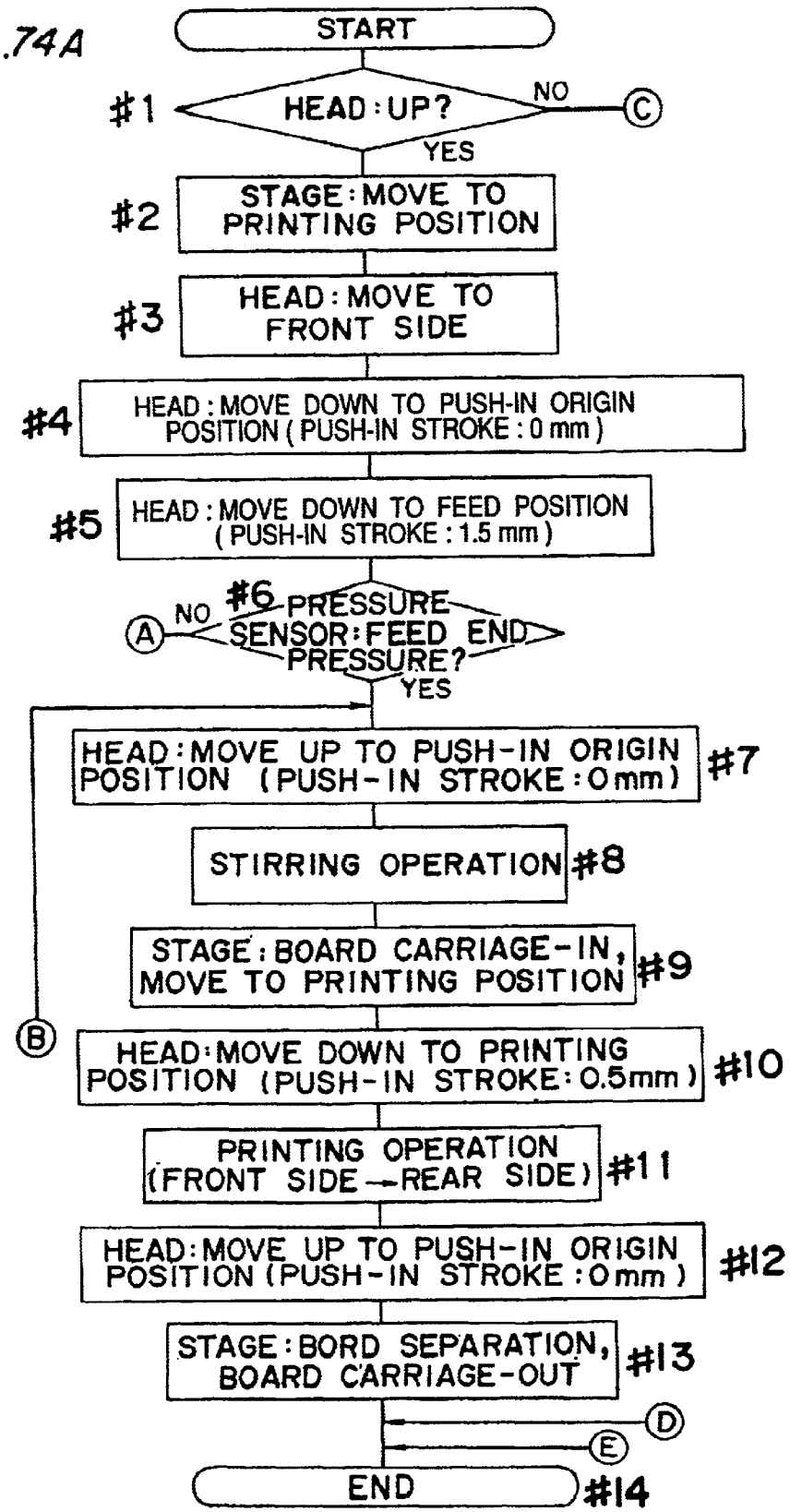
FIGS. 74A, 74B, 74C, and 74D are flowcharts showing operations of solder cartridge replacement in the viscous material application apparatus according to the seventh embodiment of the present invention.
Figure 74B:
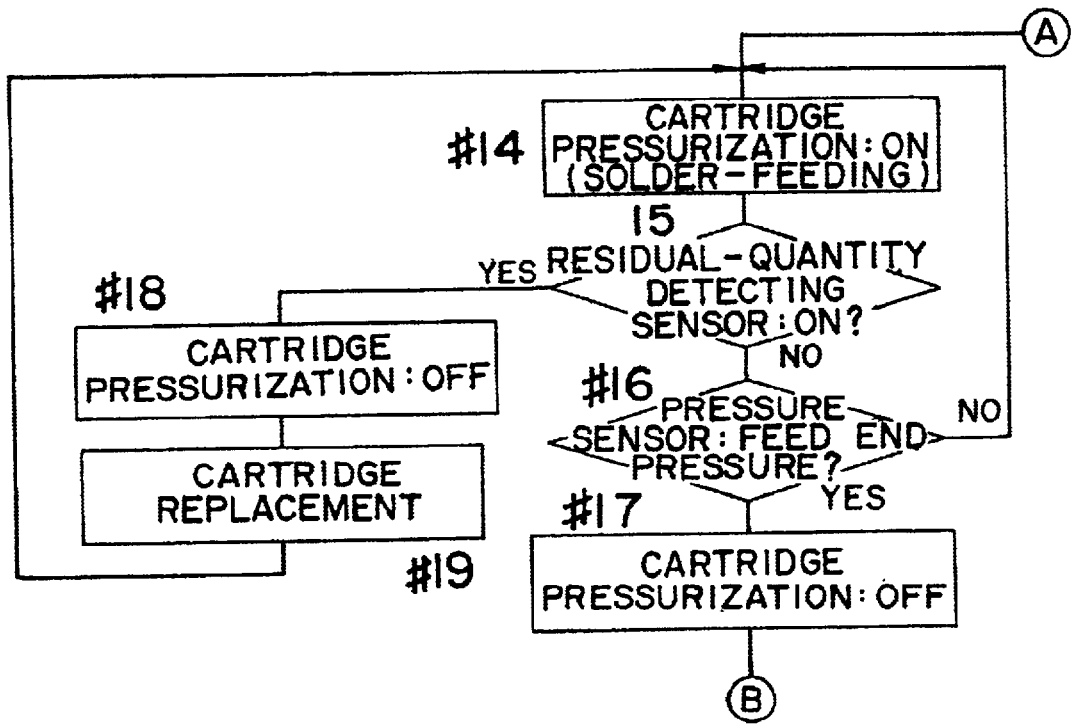
Figure 74C:
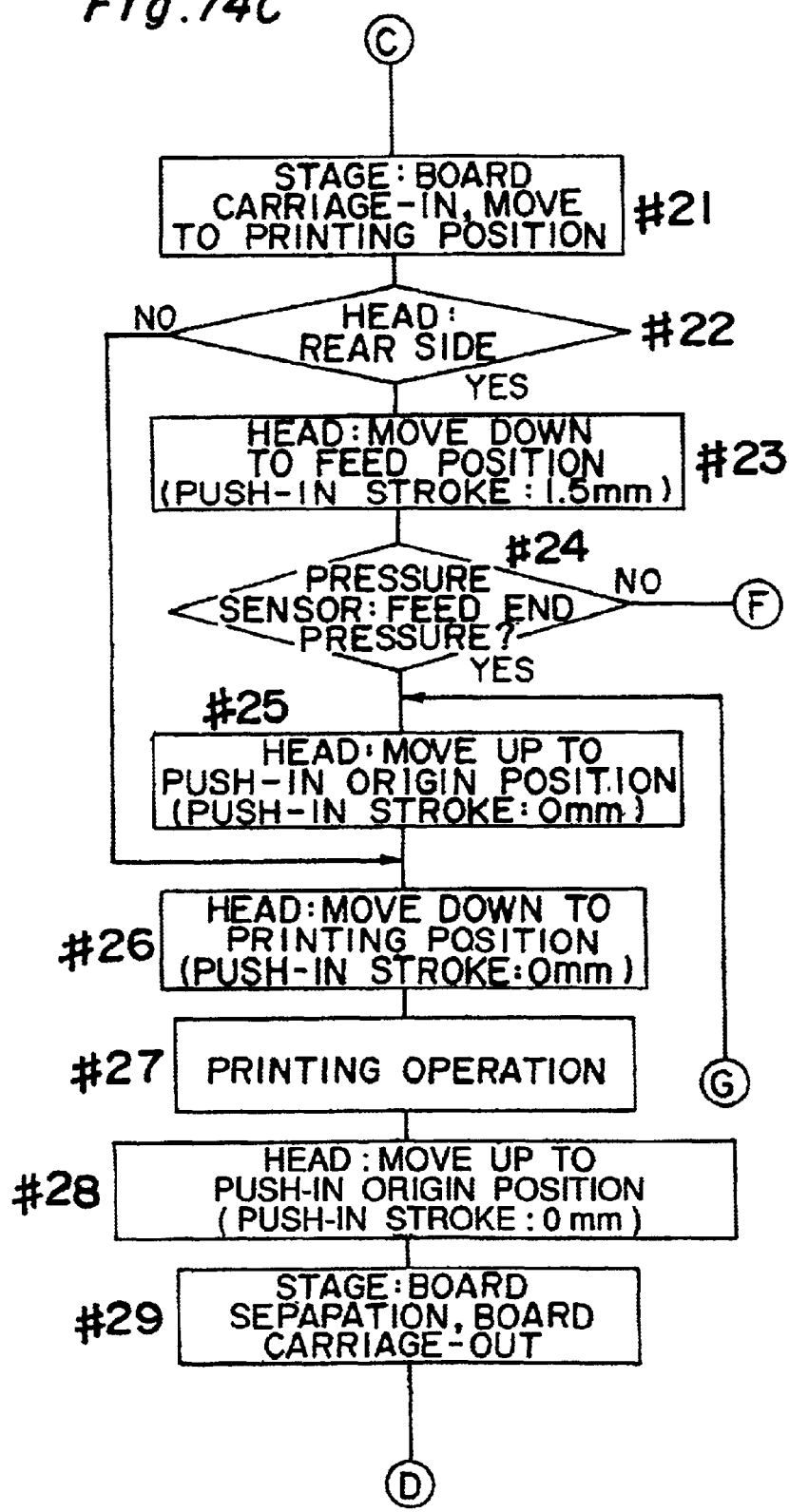
Figure 74D:
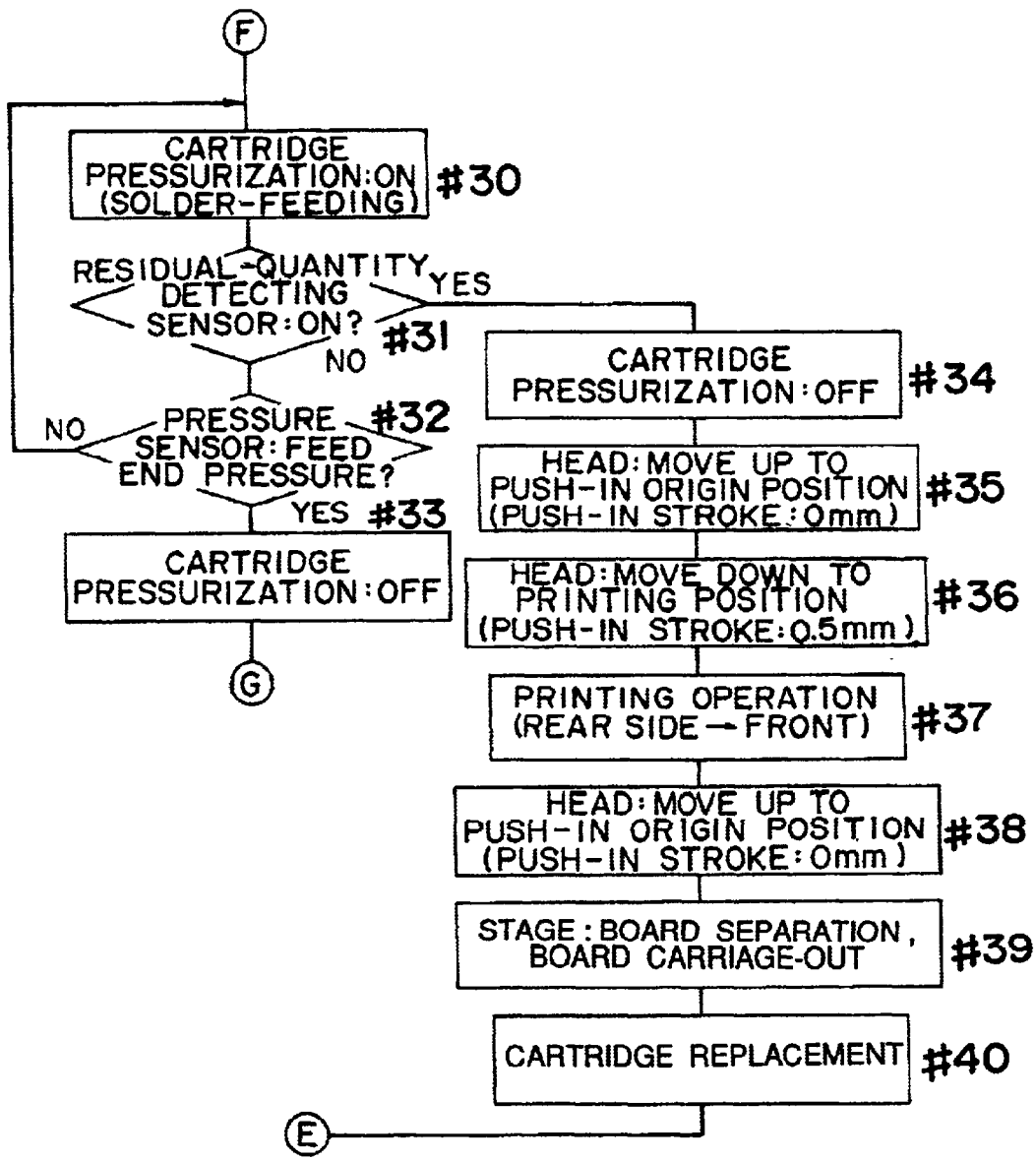

FIG. 68 is a front view of the viscous material application apparatus according to the seventh embodiment of the present invention as viewed from the front side, as in the case of FIGS. 51 to 52 or the like, showing a state in which the application unit 3, 3G, or the like, which is the head having the squeegee, is positioned at the squeegee push-in origin position. FIG. 69 is a front view of the viscous material application apparatus according to the seventh embodiment of the present invention as viewed from the front side, showing a state in which the application unit 3, 3G, or the like, which is the squeegee, is positioned at the squeegee printing position with the stage 502 lifted. FIG. 70 is a plan view of the viscous material application apparatus according to the seventh embodiment of the present invention, being an explanatory view for replacement of a solder cartridge 1b, where the replacement is done after the application unit 3, 3G, or the like is halted on the front side of an operator 591, or after the application unit 3, 3G, or the like is halted on the front side over a printing operation in the case where the application unit 3, 3G, or the like has been halted in the rear side. FIG. 71 is an exploded perspective view of the viscous material application apparatus according to the seventh embodiment of the present invention. FIG. 72 is a partial longitudinal-section front view of the viscous material application apparatus according to the seventh embodiment of the present invention. FIGS. 73A, 73B, and 73C are a longitudinal-section side view, a front view, and a plan view, respectively, of the sheet holder 550 in the viscous material application apparatus according to the seventh embodiment of the present invention.

The sheet holder 550, as shown in FIGS. 73A–73C, has through holes 550a corresponding to two sheets or bags 10, which constitute the sheet 10, and support protruding portions 550c which are formed by perimeters of the through holes 550a protruding outward and which serve to support the two sheets or bags 10 from their inner sides, respectively, in correspondence to the two sheets or bags 10. By these support protruding portions 550c, each sheet or bag 10 is securely prevented from reversing due to the pressing by the viscous material 4.

Further, the replacement of the solder cartridge 1b is performed after the application unit 3, 3G, or the like is halted on the front side of the operator 591, or in the case where the application unit 3, 3G, or the like has been halted in the rear side of the operator 591, after the application unit 3, 3G, or the like is halted on the front side over a printing operation. These operations are explained below with reference to flowcharts of FIGS. 74A, 74B, 74C, and 74D showing operations involved in replacing the solder cartridge in the viscous material application apparatus according to the seventh embodiment of the present invention.

(Apparatus Start-Up Operation)

At step #1, it is decided whether or not the head (application unit) 3 has already been up. If the head 3 has already been up, the program goes to step #2. If the head 3 has not yet been up, the program goes to step #21.

At step #2, the stage 502 is moved to the printing position without the board 50 being placed. This is intended to support the squeegee from below.

Next, at step #3, as shown in FIG. 70, the head 3 is moved to the front side of the operator 590.

Next, at step #4, the head 3 is moved down to the push-in origin position, setting the push-in stroke to 0 mm.

Next, at step #5, the head 3 is moved down to the feed position, setting the push-in stroke to 1.5 mm.

Next, at step #6, it is decided, in a solder-feeding state, by the pressure sensor 12 whether or not a feed end pressure has been reached. If the feed end pressure has been reached, the program goes to step #7; if not, the program goes to step #14.

At step #7, the head 3 is moved up to the push-in origin position, setting the push-in stroke to 0 mm.

Next, at step #8, the storage chamber H is tightly closed between the screen mask 53 and the squeegee, where the viscous material 4 is stirred in the storage chamber.

Next, at step #9, the board 50 is carried in onto the stage 502 and the stage 502 is moved to the printing position.

Next, at step #10, the head 3 is moved down to the printing position, setting the push-in stroke to 0.5 mm.

Next, at step #11, the printing operation is carried out from the front side to the rear side of the operator.

Next, at step #12, the head 3 is moved up to the push-in origin position, setting the push-in stroke to 0 mm.

Next, at step #13, the stage 502 is moved down, followed by board separation, i.e., with the board 50 separated from the screen mask 53, and thereafter the board 50 is carried out from the stage 502, and then this sequence of operations is ended.

(Solder-Feeding Operation)

In the case where it is decided at step #6 by the pressure sensor 12 that the feed end pressure has not been reached, cartridge pressurization is turned ON at step #14, by which solder is fed.

Next, at step #15, for detection of the residual quantity of solder within the cartridge, it is decided whether or not the residual-quantity detecting sensor has been turned ON. If the result on the residual-quantity detecting sensor is a NO, the program goes to step #16. If the result on the residual-quantity detecting sensor is a YES, the program goes to step #18.

Next, at step #16, it is decided whether or not the pressure sensor has reached the feed end pressure. If the feed end pressure has not been reached, the program returns to step #14. If the feed end pressure has been reached, the program goes to step #17.

Next, at step #17, cartridge pressurization is turned OFF, and then the program goes to step #7.

(Cartridge Replacement Operation)

At step #18, cartridge pressurization is turned OFF.

Next, at step #19, the solder cartridge is replaced. After the replacement, the program returns to step #14.

(Normal Printing Operation)

At step #21, the stage 502 performs carriage-in of the board 50, and moves to the printing position. That is, for moving-up of the head, at a start, the stage 502 is first moved to the printing position without carriage-in of the board, and the storage chamber is tightly closed between the screen mask 53 and the squeegee, where the solder is stirred in the storage chamber.

Next, at step #22, it is decided whether or not the head 3 is at the position on the rear side of the operator. If the head 3 is at the position on the rear side, the program goes to step #23. If not, the program goes to step #26.

If the head 3 is at the deep-side position, the head 3 is moved down to the solder-feeding position, setting the push-in stroke to 1.5 mm at step #23.

Next, at step #24, it is decided whether or not the pressure sensor has reached the feed end pressure. If the feed end pressure has been reached, the program goes to step #25; if not, the program goes to step #30.

At step #25, the head 3 is moved up to the push-in origin position, setting the push-in stroke to 0 mm.

Next, at step #26, the head 3 is moved down to the printing position, setting the push-in stroke to 0.5 mm. This means that the push-in stroke is distinguished between the use of a head push-in stroke for solder feeding and the use of a head push-in stroke for printing, at steps #22 and #26, respectively.

Next, at step #27, printing operation is performed.

Next, at step #28, the head 3 is moved up to the push-in origin position, setting the push-in stroke to 0 mm.

Next, at step #29, the stage 502 is moved down, followed by board separation, i.e., with the board 50 separated from the screen mask 53, and thereafter the board 50 is carried out from the stage 502, and then this sequence of operations is ended.

(Solder-Feeding Operation)

At step #30, cartridge pressurization is turned ON, i.e., solder feeding is performed.

Next, at step #31, for detection of the residual quantity of solder within the cartridge, it is decided whether or not the residual-quantity detecting sensor has been turned ON. If the result on the residual-quantity detecting sensor is a NO, the program goes to step #32. If the result on the residual-quantity detecting sensor is a YES, the program goes to step #34.

Next, at step #32, it is decided whether or not the pressure sensor has reached the feed end pressure. If the feed end pressure has not been reached, the program returns to step #30. If the feed end pressure has been reached, the program goes to step #33.

Next, at step #33, cartridge pressurization is turned OFF, and then the program goes to step #25.

(Cartridge Replacement Operation with Head on Operator Side)

If the result on the residual-quantity detecting sensor at step #31 is a YES, cartridge pressurization is turned OFF at step #34.

Next, at step #35, the head 3 is moved up to the push-in origin position, setting the push-in stroke to 0 mm.

Next, at step #36, the head 3 is moved down, setting the push-in stroke to 0.5 mm.

Next, at step #37, printing operation on the board 50 is performed by moving the head 3 laterally from the rear side to the front side of the operator.

At step #38, the head 3 is moved up to the push-in origin position, setting the push-in stroke to 0 mm.

At step #39, the stage 502 is moved down, followed by board separation, i.e., with the board 50 separated from the screen mask 53, and thereafter the board 50 is carried out from the stage 502.

At step #40, the solder cartridge is replaced with another, and then this sequence of operations is ended.

As shown above, since the replacement of the solder cartridge 1b is difficult to do when the head 3 is positioned on the rear side of the operator 590, the head 3 is moved from the rear side to the front side. Therefore, by printing only one board 50, the replacement of the solder cartridge 1b is performed necessarily when the head 3 is positioned on the front side of the operator 590. In addition, even if the amount of solder feed has become small, enough amount of solder to allow at least the printing of one board 50 is ensured as the amount for storage in the storage chamber H. Thus, printing operation on the board 50 printed in the case never results in faults.

Figure 75:
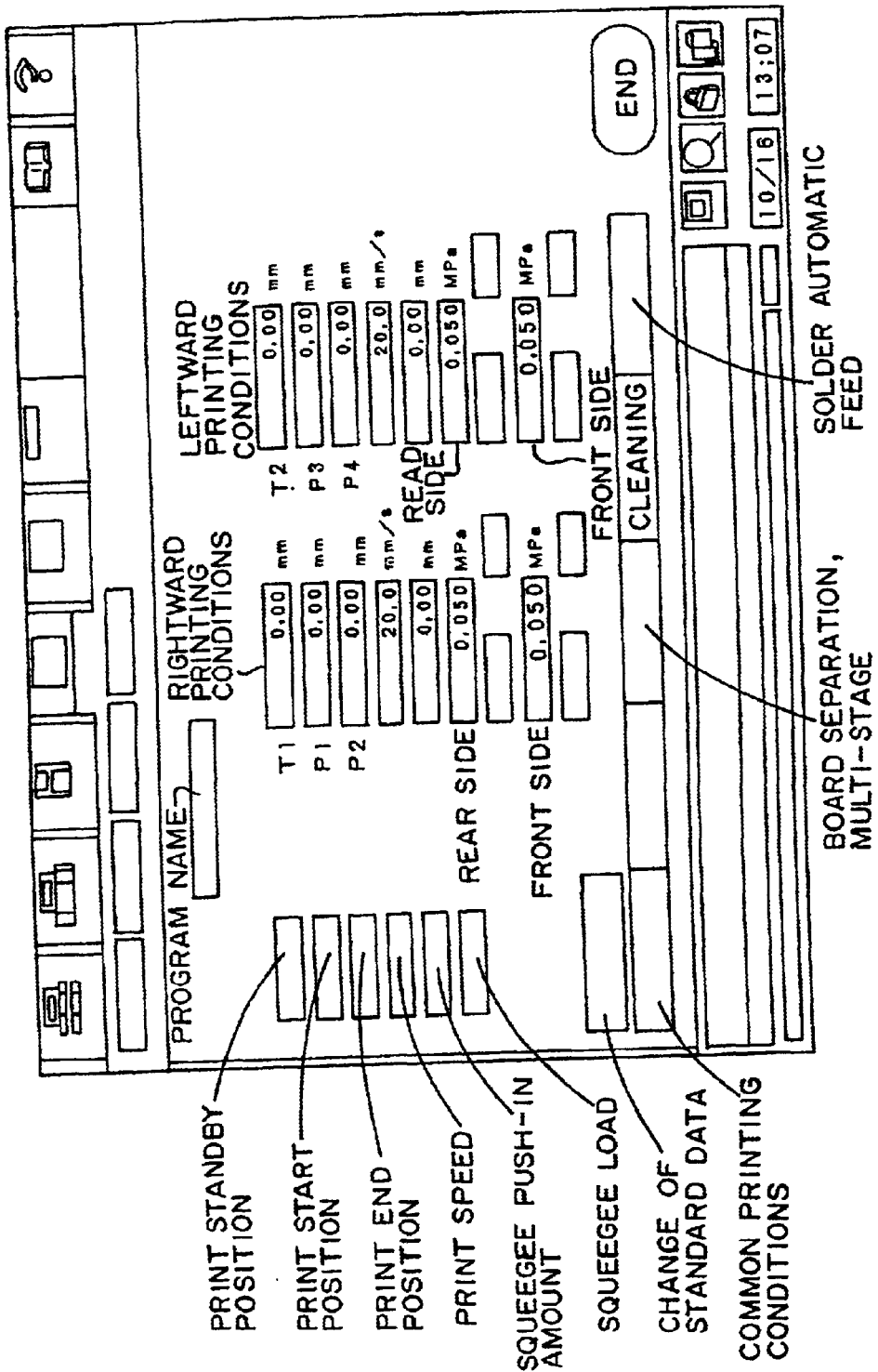

Also, FIGS. 75 and 76 are views of a data input screen and a table, respectively, in controlling the printing operation of the viscous material application apparatus according to the seventh embodiment of the present invention. For each of printing conditions in the lateral direction, that is, for each of right-and-left conditions, heights of the print standby position, the print start position, and the print end position can be entered in units of mm. Then, by entering printing speed (mm/s), squeegee push-in amount (mm), and squeegee loads (mPa) for rear side and front side of an operator, respectively, a desired operation can be fulfilled.

As shown in FIG. 76, in the case where conditions for such one printing operation prepared in many forms as data as to the printing methods according to the type of solder and the type of the pattern are preliminarily stored in a memory or the like, and where the memory is accessed from the control unit to read those data, proper printing operation can automatically be executed. As an example, there are prepared data which include printing patterns of normal pattern and fine pattern, as well as printing speeds of high speed, middle speed, and low speed for each of the patterns, and, on the other hand, the kinds of solder including type 'a,' type 'b' and type 'c' of solder made by A company, and type '1' and type '2' of solder made by B company, in combination with the above individual patterns. For instance, the normal pattern is applied to a CSP (Chip Size Package) in which the interterminal pitch of 0.8 mm as well as a QFP (Quad Flat Package) in which the interterminal pitch is 0.5 mm or more. The fine pattern is applied to a CSP in which the interterminal pitch is 0.65 mm or less, and a QFP in which the interterminal pitch is 0.4 mm or less.

According to this seventh embodiment, the viscous material 4 can automatically be fed into the solder storage chamber H without imposing burdens on the operator, and besides the pressurizing sheet 10 is enabled to operate stably even after the solder is fed, so that stable printing quality can be achieved at all times.

(Eighth Embodiment)

Next, a viscous material application apparatus according to an eighth embodiment of the present invention is described.

In the eighth embodiment, the blades 6 are made flexible so that the storage chamber H, in which the viscous material is to be stored, can be enhanced in its tight closability.

In the conventional screen printing method using one platy squeegee, since the viscous material overflows and accumulates at both ends of the squeegee during the printing, the operator would be required to work for periodically scraping up the overflowing viscous material. Further, it has been devised by operators to place outflow-preventing plates at both ends of the squeegee so as to prevent the viscous material from flowing out as much as possible.

However, it has been impossible to completely eliminate the possibility of outflow of the viscous material. When the viscous material remaining on the screen even in a slight amount is left for a long time, the viscous material would solidify, and when this solidified viscous material is mixed into normal viscous material, there would be a possibility of occurrence of such disadvantages as clogging of the screen mask. Further, in other aspects, the conventional screen printing method using the squeegee involves a state in which the viscous material is exposed to the atmospheric air at all times while being stirred. In the case of viscous materials that are liable to deteriorations due to vaporization or the like such as lead-free solder, the viscous material may deteriorate during continuous operation, so that printing quality may be unstable.

From these other reasons, as can be easily understood, it is ideal to provide a structure in which out of the viscous material stored in a completely tightly closed container, only a necessary amount of viscous material is filled into the screen opening, while excess viscous material is recycled in the container. For this tightly closed structure, various inventions have been reported so far. For example, there have already been publicized one in which, as shown in Unexamined Japanese Patent Publication through PCT (Tokuhyo-Hei) 10-512507, a rigid-body blade is pressed against the application object so that the tightly closed state is ensured, or one in which an excess part of viscous material filled into the openings of the screen is scraped up from the screen with a rigid-body blade so that the tightly closed state is ensured.

However, since the screen surface has pits and projections of several tens of $\mu$m to several hundreds of $\mu$m, not being flat, the above-mentioned rigid bodies would be unable to follow the pits and projections of the surface to maintain a complete tightly closed state, thus causing a possibility that the viscous material may leak from the apparatus main-body. Further, since the achievement of scraping is conditioned by tight closure, the above examples are insufficient to obtain a tight closure for stable continuous operation.

Therefore, an object of the eighth embodiment of the present invention is to provide a viscous material application apparatus which allows the viscous material to be securely prevented from leaking from the application apparatus of tightly closed structure onto the screen, saves the labor for the operator, and allows the viscous material to be stable in characteristics, so that a stable continuous operation can be offered resultantly.

Figure 77:
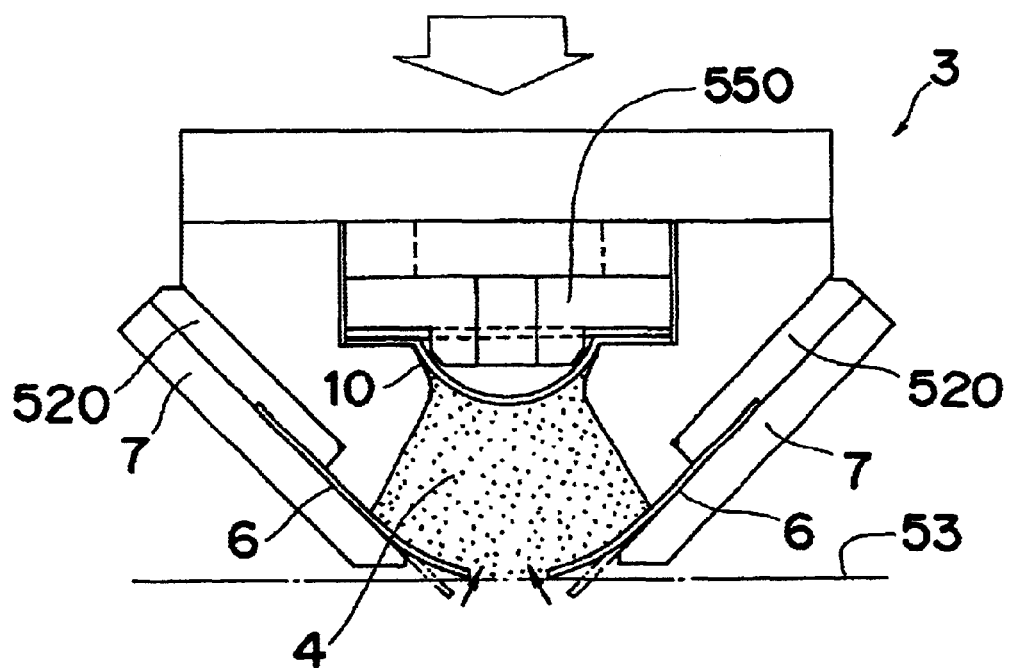
FIG. 77 is an enlarged longitudinal-section front view of a viscous material application apparatus according to an eighth embodiment of the present invention.

For this purpose, as shown in FIG. 77, two blades 6 opposed to a storage chamber H, and flexible stoppers 9 made of sealing material placed at both ends of the blades 6, are brought into contact with the screen mask 53, so that a tightly closed space for the viscous material can be obtained. In this case, the blades 6 are flexed in contact with the screen mask 53, thereby sealing the viscous material 4.

Figure 82:
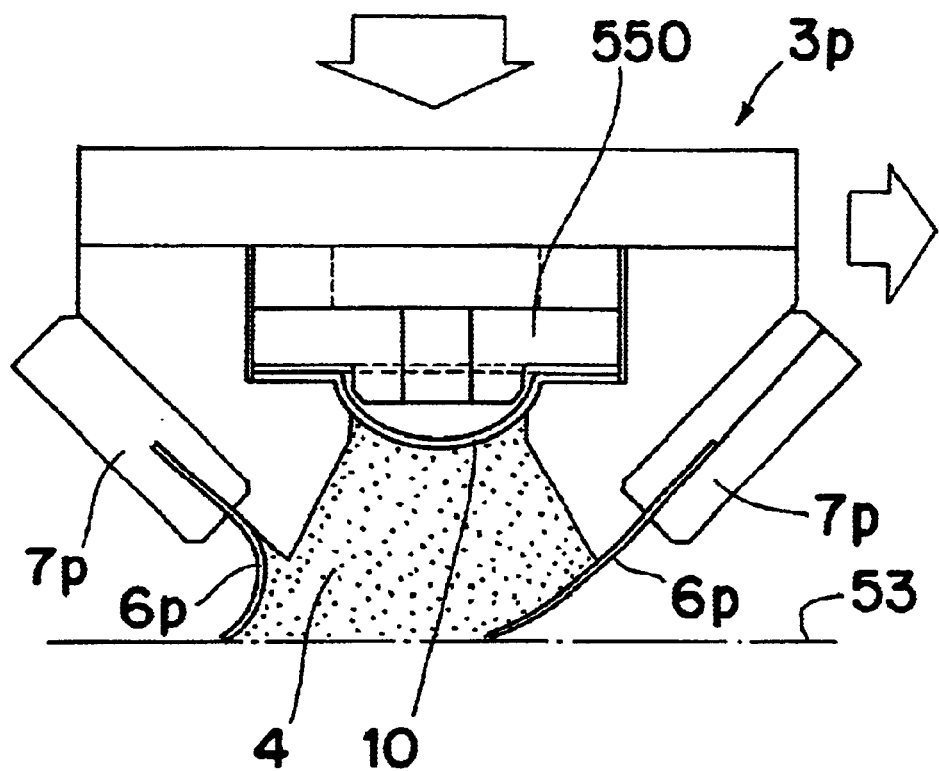
FIG. 82 is a view of a state in which the blade is flexed outward.

In addition, only by supporting the flexible blades 6p at ends with support members 7p, a blade 6p on the delay side (left side in FIG. 82) in the forward direction of the head, out of the blades 6p, may be flexed outward, which may cause the tight closure to be impaired significantly.

In this eighth embodiment, as expressly described in the foregoing embodiments such as the sixth embodiment and in FIG. 48 or the like, the blade 6 has its upper end portion sandwiched between the blade fixing plate 520 and a blade holder 7 by fixing the blade fixing plate 520 to the blade holder 7 with the fitting screws 522, and the blade fixing plate 520 and the blade holder 7 are fixed to the apparatus main-body 513 by the fitting screws 521. Accordingly, the lower end portion of the blade 6 projecting downward from the blade holder 7 is freely flexible inward with respect to the blade holder 7 but regulated by the blade holder 7 from flexing outward.

Figure 81:
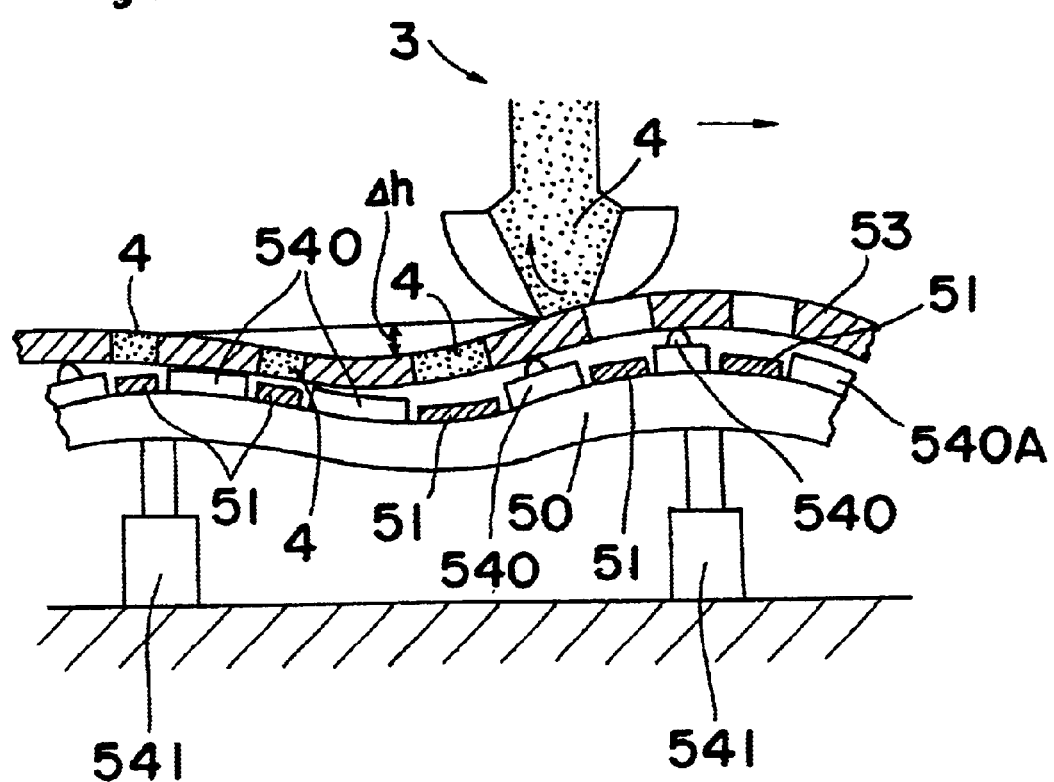
FIG. 81 is an explanatory view of a printing state with the board side flexed.

By so doing, for example as shown in FIG. 81, the flexible blades 6 is freely flexed while following the projections and recesses of the surface of the screen mask 53, thus capable of securely following the projections and recesses having flex amounts $\Delta h$ of several tens of $\mu$m to several hundreds of $\mu$m of the surface of the screen mask 53 supported by pin supports 541. In addition, reference numeral 51 denotes a pad, 540A denotes resist, and 540 denotes silk.

Figure 78:
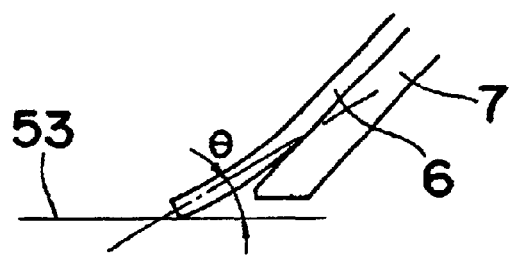
FIG. 78 is an enlarged view of a vicinity of a blade of FIG. 77.

As shown in FIG. 78, with respect to the flexure of the blades 6, in the case where an angle $\theta$ to which the blades 6 are flexed is preferably within a range of 10° to 70°, more preferably 30° to 40°, the tightly closed state can be maintained effectively.

As an example, the blades 6 may be formed of 0.3 mm thick polyimide resin.

Figure 79:
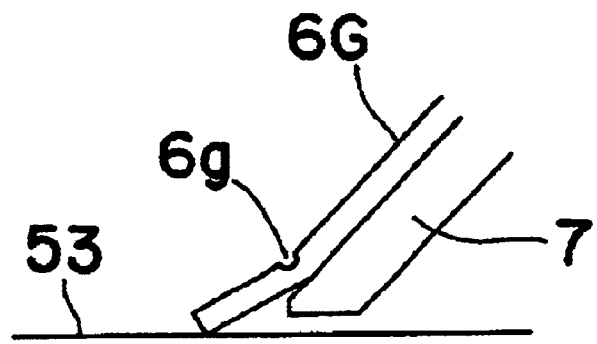
FIG. 79 is an enlarged view of a vicinity of the blade of FIG. 77 according to a first modification of the eighth embodiment.
Figure 80:
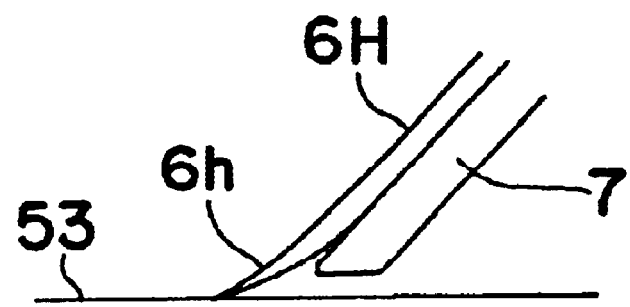
FIG. 80 is an enlarged view of a vicinity of the blade of FIG. 77 according to a second modification of the eighth embodiment.

For more flexure, a cut-in (crease) 6g of the blade 6 may be formed as shown in FIG. 79 as a first modification of the eighth embodiment, or a fore end portion thereof may be thinned as shown in FIG. 80 as a second modification of the eighth embodiment.

As shown above, according to the eighth embodiment, since the viscous material 4 is sealed in a tightly closed container with the blades 6, the operator's scraping work can be eliminated even in continuous operation, and moreover deteriorations of the viscous material 4 due to volatilization can be suppressed.

It is to be noted here that any embodiments among the foregoing various embodiments may be combined together, as required, so that their own effects can be fulfilled.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus for applying a viscous material, said apparatus comprising:

an apparatus main-body having a storage chamber for storing therein a viscous material in communication with a discharge hole;

a first viscous-material feeding device, placed at a first end of the storage chamber, for pressure-feeding the viscous material;

a second viscous-material feeding device, placed at a second end of the storage chamber, for pressure-feeding the viscous material;

an expandable discharge-pressure adjusting device which is placed in confrontation with an interior of the storage chamber or with the storage chamber, and which is to be expanded to adjust a discharge pressure when the viscous material stored in the storage chamber is pressurized and discharged;

a moving device for moving the apparatus main-body on an application object, relative to each other, along a plane parallel to an application surface of the application object when the viscous material is discharged; and a flow-regulating member for, in a discharge of the viscous material, providing a stagnation point in a flow of the viscous material within the storage chamber generated during movement along the surface parallel to the application surface of the application object while the viscous material in the storage chamber is pressurized by the discharge-pressure adjusting device, wherein each of the viscous-material feeding devices feeds the viscous material continuously by replacement of a viscous-material feed cartridge, and wherein in order that the replacement of the viscous-material feed cartridge is carried out on a front side of an operator, the viscous-material feed cartridge, if positioned on a rear side of the operator, is moved along the plane parallel to the application surface of the application object so as to be placed on the front side, while a printing operation for one piece of the application object is performed, and thereafter halted on the front side of the operator.

2. An apparatus for applying a viscous material, said apparatus comprising:

an apparatus main-body having a storage chamber for storing therein a viscous material in communication with a discharge hole;

viscous-material feeding devices placed at both ends of the storage chamber, respectively, for pressure-feeding the viscous material;

an expandable discharge-pressure adjusting device which is placed in confrontation with an interior of the storage chamber or with the storage chamber, and which is expandable to adjust a discharge pressure when the viscous material stored in the storage chamber is pressurized and discharged;

a moving device for moving the apparatus main-body on an application object, relative to each other, along a plane parallel to an application surface of the application object when the viscous material is discharged;

a plurality of blades placed in a lower part of the apparatus main-body so as to be opposed to each other with a constant slope; and sealing materials placed in vicinities of both ends of the blades, wherein the blades and the sealing materials of the apparatus main-body are brought into contact with the application object to flex the blades, thereby closing the storage chamber for the viscous material.

3. An apparatus for applying a viscous material according to claim 2, wherein an angle to which the blades are flexed is 10° to 70°.

4. An apparatus for applying a viscous material, said apparatus comprising:

an apparatus main-body having a storage chamber for storing therein a viscous material in communication with a discharge hole;

viscous-material feeding devices for pressure-feeding the viscous material, said viscous-material feeding devices being placed at both ends of the storage chamber, respectively;

an expandable discharge-pressure adjusting device which is placed in confrontation with an interior of the storage chamber or with the storage chamber, and which is to be expanded to adjust a discharge pressure when the viscous material stored in the storage chamber is pressurized and discharged;

a moving device for moving the apparatus main-body on an application object, relative to each other, along a plane parallel to an application surface of the application object when the viscous material is discharged; and an elevating-and-lowering driver device for elevating and lowering the apparatus main-body at least among a push-in origin position, a viscous-material feed position which is lower than the push-in origin position and at which the viscous material is fed, and a printing position which is lower than the push-in origin position and at which the viscous material is applied and printed onto the application object, wherein a push-in amount of the apparatus main-body to the application object at the viscous-material feed position is larger than a push-in amount of the apparatus main-body to the application object at the printing position.

5. An apparatus for applying a viscous material according to claim 1, wherein the expandable discharge-pressure adjusting device comprises at least one bag that can be inflated and deflated.

6. An apparatus for applying a viscous material according to claim 1, wherein the expandable discharge-pressure adjusting device comprises at least one flexible sheet that is connected to the apparatus main-body so as to form an inflatable and deflatable air chamber.

7. An apparatus for applying a viscous material according to claim 1, wherein the apparatus main-body includes an air port in fluid communication with the expandable discharge-pressure adjusting device.

8. An apparatus for applying a viscous material according to claim 2, wherein said the expandable discharge-pressure adjusting device comprises a bag that can be inflated and deflated.

9. An apparatus for applying a viscous material according to claim 2, wherein said the expandable discharge-pressure adjusting device comprises at least one flexible sheet that is connected to the apparatus main-body so as to form an inflatable and deflatable air chamber.

10. An apparatus for applying a viscous material according to claim 2, wherein the apparatus main-body includes an air port in fluid communication with the expandable discharge-pressure adjusting device.

11. An apparatus for applying a viscous material according to claim 4, wherein said the expandable discharge-pressure adjusting device comprises a bag that can be inflated and deflated.

12. An apparatus for applying a viscous material according to claim 4, wherein said the expandable discharge-pressure adjusting device comprises at least one flexible sheet that is connected to the apparatus main-body so as to form an inflatable and deflatable air chamber.

13. An apparatus for applying a viscous material according to claim 4, wherein the apparatus main-body includes an air port in fluid communication with the expandable discharge-pressure adjusting device.

* * * * *